(12) United States Patent
Ohsawa et al.

(10) Patent No.: US 12,178,119 B2
(45) Date of Patent: Dec. 24, 2024

(54) LIGHT-EMITTING DEVICE

(71) Applicant: SEMICONDUCTOR ENERGY LABORATORY CO., LTD., Atsugi (JP)

(72) Inventors: Nobuharu Ohsawa, Kanagawa (JP); Satoshi Seo, Kanagawa (JP)

(73) Assignee: Semiconductor Energy Laboratory Co., Ltd., Atsugi (JP)

( * ) Notice: Subject to any disclaimer, the term of this patent is extended or adjusted under 35 U.S.C. 154(b) by 851 days.

(21) Appl. No.: 17/289,340

(22) PCT Filed: Oct. 28, 2019

(86) PCT No.: PCT/IB2019/059205
§ 371 (c)(1),
(2) Date: Apr. 28, 2021

(87) PCT Pub. No.: WO2020/095141
PCT Pub. Date: May 14, 2020

(65) Prior Publication Data
US 2021/0343943 A1 Nov. 4, 2021

(30) Foreign Application Priority Data
Nov. 9, 2018 (JP) .................................. 2018-211101

(51) Int. Cl.
*H10K 85/60* (2023.01)
*H10K 85/30* (2023.01)
(Continued)

(52) U.S. Cl.
CPC ......... *H10K 85/633* (2023.02); *H10K 85/342* (2023.02); *H10K 85/346* (2023.02);
(Continued)

(58) Field of Classification Search
CPC .. H10K 85/633; H10K 85/342; H10K 85/346; H10K 85/40; H10K 85/622;
(Continued)

(56) References Cited

U.S. PATENT DOCUMENTS

| 5,759,444 A | 6/1998 | Enokida et al. |
| 6,376,107 B1 | 4/2002 | Heuer et al. |

(Continued)

FOREIGN PATENT DOCUMENTS

| JP | 2686418 | 12/1997 |
| JP | 2002-256168 A | 9/2002 |

(Continued)

OTHER PUBLICATIONS

International Search Report (Application No. PCT/IB2019/059205) Dated Feb. 10, 2020.

(Continued)

*Primary Examiner* — Caleb E Henry
(74) *Attorney, Agent, or Firm* — Fish & Richardson P.C.

(57) ABSTRACT

A light-emitting device with high emission efficiency and high reliability is provided. The light-emitting device includes a host material and a guest material in a light-emitting layer. The host material has a function of converting triplet excitation energy into light emission and the guest material emits fluorescence. The guest material has a molecular structure including a luminophore and protecting groups, and five or more protecting groups are included in one molecule of the guest materials. When the protecting groups are introduced into the molecule, triplet excitation energy transfer from the host material to the guest material by the Dexter mechanism is inhibited. As the protecting group, an alkyl group or a branched-chain alkyl group is used. A light-emitting device with improved emission effi- (Continued)

ciency can be obtained with the use of a material having a five-membered ring skeleton in the host material.

19 Claims, 48 Drawing Sheets

(51) Int. Cl.
  *H10K 85/40* (2023.01)
  *H10K 50/11* (2023.01)
  *H10K 50/15* (2023.01)
  *H10K 50/16* (2023.01)
  *H10K 101/10* (2023.01)
  *H10K 101/40* (2023.01)

(52) U.S. Cl.
  CPC ............ *H10K 85/40* (2023.02); *H10K 85/622* (2023.02); *H10K 85/636* (2023.02); *H10K 85/654* (2023.02); *H10K 85/6572* (2023.02); *H10K 85/6574* (2023.02); *H10K 50/11* (2023.02); *H10K 50/15* (2023.02); *H10K 50/16* (2023.02); *H10K 2101/10* (2023.02); *H10K 2101/40* (2023.02)

(58) Field of Classification Search
  CPC .............. H10K 85/636; H10K 85/654; H10K 85/6572; H10K 85/6574; H10K 50/11; H10K 50/15; H10K 50/16; H10K 2101/10; H10K 2101/40; H10K 2101/90; H10K 2101/20; H10K 85/615; H10K 59/40; Y02P 20/55
  See application file for complete search history.

(56) References Cited

U.S. PATENT DOCUMENTS

| | | | | |
|---|---|---|---|---|
| 7,378,151 B2* | 5/2008 | Sato | ........................ | C09K 11/68 977/773 |
| 7,586,006 B2 | 9/2009 | Funahashi | | |
| 7,919,012 B2* | 4/2011 | Peng | ........................ | H01S 5/30 252/301.4 R |
| 8,221,651 B2* | 7/2012 | Murase | ................... | C09K 11/02 977/819 |
| 8,664,637 B2* | 3/2014 | Jang | ........................ | H01L 33/06 257/99 |
| 8,709,613 B2 | 4/2014 | Funahashi | | |
| 9,276,228 B2 | 3/2016 | Seo et al. | | |
| 9,334,440 B2* | 5/2016 | Jang | ..................... | C09K 11/883 |
| 9,559,313 B2 | 1/2017 | Seo et al. | | |
| 9,947,885 B2 | 4/2018 | Seo et al. | | |
| 9,957,442 B2* | 5/2018 | Banin | .................. | C09K 11/883 |
| 10,505,132 B2 | 12/2019 | Seo et al. | | |
| 10,644,254 B2 | 5/2020 | Seo et al. | | |
| 10,734,594 B2 | 8/2020 | Seo et al. | | |
| 10,910,565 B2 | 2/2021 | Ogiwara et al. | | |
| 10,975,299 B2* | 4/2021 | Kim | ........................ | H10K 50/16 |
| 2008/0015399 A1 | 1/2008 | Funahashi | | |
| 2009/0049890 A1* | 2/2009 | Zhong | ................... | G01N 33/497 73/23.3 |
| 2010/0027192 A1* | 2/2010 | Perry | ........................ | C01G 1/02 977/773 |
| 2010/0051917 A1* | 3/2010 | Kippelen | ............. | H10K 10/478 257/E51.027 |
| 2014/0091278 A1* | 4/2014 | Sykora | .................. | H10K 30/151 257/14 |
| 2015/0083969 A1* | 3/2015 | Kim | ..................... | C09K 11/705 977/774 |
| 2015/0129838 A1* | 5/2015 | Lewis | ............. | H01L 31/035236 438/94 |
| 2015/0295194 A1* | 10/2015 | Kanatzidis | ............. | H10K 85/00 136/263 |
| 2015/0349284 A1* | 12/2015 | Seo | ........................ | H10K 50/82 257/40 |
| 2016/0172602 A1* | 6/2016 | Ogiwara | .............. | H10K 85/657 252/301.16 |
| 2016/0380136 A1* | 12/2016 | Ning | ..................... | C09K 11/02 252/519.4 |
| 2017/0092890 A1* | 3/2017 | Seo | ........................ | H10K 50/12 |
| 2017/0125747 A1* | 5/2017 | Lee | ........................ | H10K 71/00 |
| 2017/0179338 A1* | 6/2017 | Park | ..................... | H01L 33/04 |
| 2017/0222162 A1* | 8/2017 | Lee | ........................ | H10K 85/10 |
| 2017/0306227 A1* | 10/2017 | Ippen | .................... | C09K 11/70 |
| 2017/0324057 A1* | 11/2017 | Friend | .................... | H10K 85/30 |
| 2017/0342317 A1* | 11/2017 | Lee | ........................ | H10K 50/11 |
| 2017/0346024 A1* | 11/2017 | Lee | ........................ | H10K 30/35 |
| 2017/0358757 A1* | 12/2017 | Lee | ........................ | C01G 21/006 |
| 2017/0358759 A1* | 12/2017 | Lee | ........................ | C01G 21/16 |
| 2018/0090312 A1* | 3/2018 | Pickett | ................... | H10K 85/60 |
| 2018/0138416 A1* | 5/2018 | Seo | ........................ | H10K 50/121 |
| 2019/0162798 A1* | 5/2019 | Butzloff | ................ | C01B 33/405 |
| 2019/0280236 A1* | 9/2019 | Tabata | ................... | H10K 50/11 |
| 2020/0239769 A1* | 7/2020 | Jen-La Plante | ........ | C09K 11/56 |
| 2020/0299576 A1* | 9/2020 | Lim | ..................... | C09K 11/892 |
| 2021/0043840 A1 | 2/2021 | Seo et al. | | |
| 2021/0050545 A1 | 2/2021 | Seo et al. | | |
| 2021/0104680 A1 | 4/2021 | Ogiwara et al. | | |
| 2021/0343943 A1* | 11/2021 | Ohsawa | ............... | H10K 85/633 |

FOREIGN PATENT DOCUMENTS

| | | |
|---|---|---|
| JP | 4188369 | 11/2008 |
| JP | 4188401 | 11/2008 |
| JP | 2014-045179 A | 3/2014 |
| WO | WO-2015/198988 | 12/2015 |
| WO | WO-2018/097153 | 5/2018 |
| WO | WO-2018/186462 | 10/2018 |

OTHER PUBLICATIONS

Written Opinion (Application No. PCT/IB2019/059205) Dated Feb. 10, 2020.
Nakanotani.H et al., "High-efficiency organic light-emitting diodes with fluorescent emitters", Nature Communications, May 30, 2014, vol. 5, pp. 4016-1-4016-7.

* cited by examiner

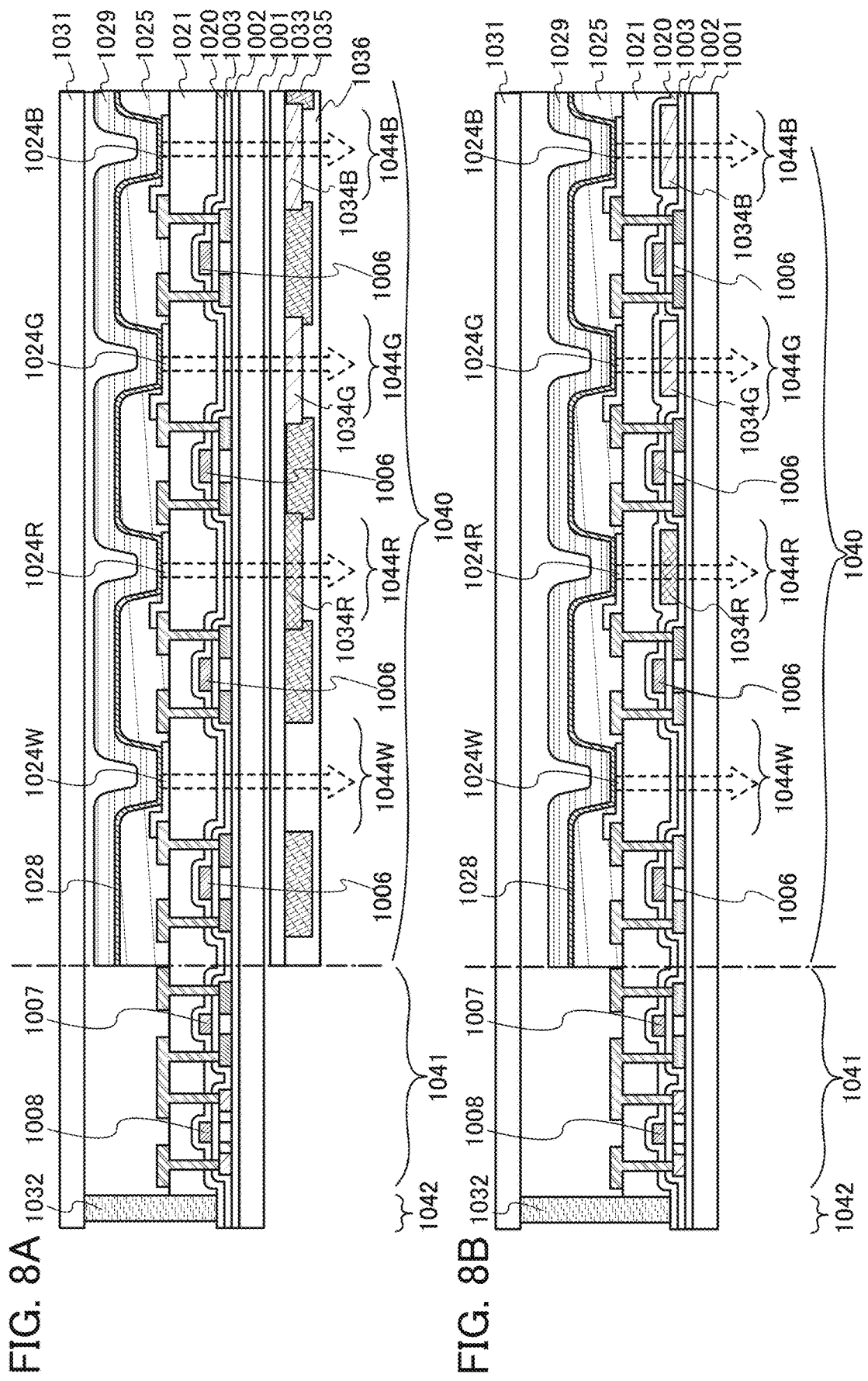

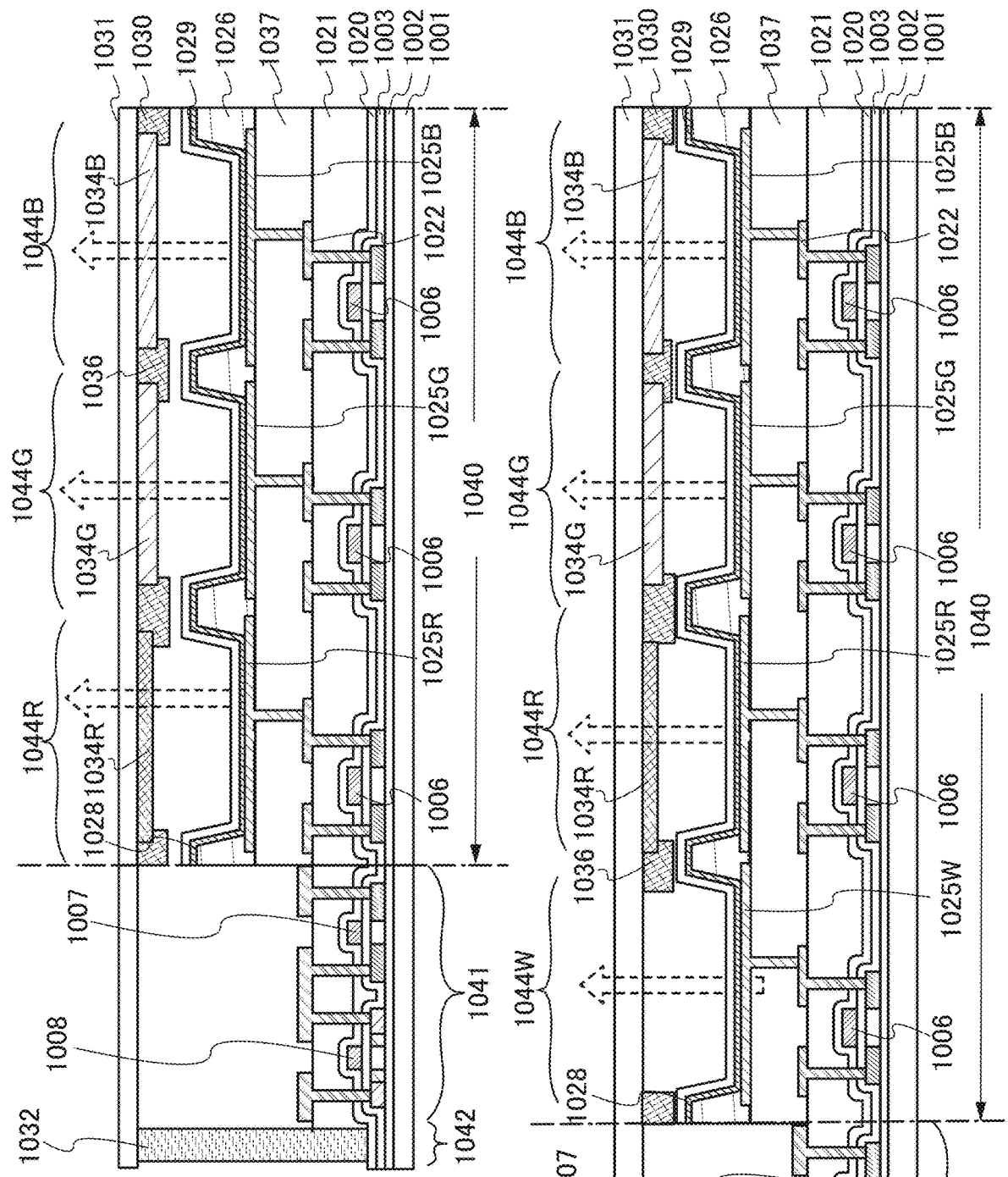

LIGHT-EMITTING DEVICE

CROSS REFERENCE TO RELATED APPLICATIONS

This application is a U.S. National Phase Application under 35 U.S.C. § 371 of International Application PCT/IB2019/059205, filed on Oct. 28, 2019, which is incorporated by reference and claims the benefit of a foreign priority application filed in Japan on Nov. 9, 2018, as Application No. 2018-211101.

TECHNICAL FIELD

One embodiment of the present invention relates to a light-emitting device, or a display device, an electronic appliance, and a lighting device including the light-emitting device.

Note that one embodiment of the present invention is not limited to the above technical field. The technical field of one embodiment of the invention disclosed in this specification and the like relates to an object, a method, or a manufacturing method. Alternatively, one embodiment of the present invention relates to a process, a machine, manufacture, or a composition of matter. Accordingly, specific examples of the technical field of one embodiment of the present invention disclosed in this specification include a semiconductor device, a display device, a liquid crystal display device, a light-emitting device, a lighting device, a power storage device, a memory device, a driving method thereof, and a manufacturing method thereof.

BACKGROUND ART

In recent years, research and development has been extensively conducted on light-emitting devices utilizing electroluminescence (EL). The basic structure of these light-emitting devices is a structure in which a layer containing a light-emitting substance (an EL layer) is interposed between a pair of electrodes. By application of a voltage between the electrodes of this device, light emission from the light-emitting substance can be obtained.

Since the above light-emitting device is a self-luminous type, a display device using this has advantages such as high visibility, no necessity of a backlight, and low power consumption. The display device also has advantages in that it can be fabricated to be thin and lightweight and has high response speed, for example.

In the case of a light-emitting device (e.g., an organic EL device) in which an organic compound is used as a light-emitting substance and an EL layer containing the light-emitting organic compound is provided between a pair of electrodes, application of a voltage between the pair of electrodes causes injection of electrons from a cathode and holes (holes) from an anode into the light-emitting EL layer and thus a current flows. Then, by recombination of the injected electrons and holes, the light-emitting organic compound is brought into an excited state, and light emission can be obtained from the excited light-emitting organic compound.

The types of excited states formed by an organic compound are a singlet excited state (S*) and a triplet excited state (T*); light emission from the singlet excited state is referred to as fluorescence, and light emission from the triplet excited state is referred to as phosphorescence. The statistical formation ratio of them in the light-emitting device is S*:T*=1:3. For this reason, a light-emitting device using a compound that emits phosphorescence (phosphorescent material) can have higher emission efficiency than a light-emitting device using a compound that emits fluorescence (fluorescent material). Therefore, light-emitting devices using phosphorescent materials capable of converting energy of the triplet excited state into light emission have been actively developed in recent years.

Among light-emitting devices using phosphorescent materials, a light-emitting device that emits blue light in particular has not yet been put into practical use because it is difficult to develop a stable compound having a high triplet excitation energy level. For this reason, the development of a light-emitting device using a fluorescent material, which is more stable, has been conducted and a technique for improving the emission efficiency of a light-emitting device using a fluorescent material (fluorescent element) has been searched.

As a material capable of converting part or all of energy of the triplet excited state into light emission, a thermally activated delayed fluorescent (TADF) material is known in addition to a phosphorescent material. In a thermally activated delayed fluorescent material, a singlet excited state is generated from a triplet excited state by reverse intersystem crossing, and the singlet excited state is converted into light emission.

In order to improve the emission efficiency of a light-emitting device using a thermally activated delayed fluorescent material, not only efficient generation of a singlet excited state from a triplet excited state but also efficient light emission from a singlet excited state, that is, high fluorescence quantum yield, is important in a thermally activated delayed fluorescent material. It is, however, difficult to design a light-emitting material that simultaneously meets these two.

A method in which in a light-emitting device containing a thermally activated delayed fluorescent material and a fluorescent material, singlet excitation energy of the thermally activated delayed fluorescent material is transferred to the fluorescent material and light emission is obtained from the fluorescent material has been proposed (see Patent Document 1). In other words, a light-emitting device in which a thermally activated delayed fluorescent material is used as a host material and a fluorescent material is used as a guest material has been proposed.

REFERENCE

Patent Document

[Patent Document 1] Japanese Published Patent Application No. 2014-45179

SUMMARY OF THE INVENTION

Problems to be Solved by the Invention

An example of a method for increasing the efficiency of a fluorescent light-emitting device is a method in which, in a light-emitting layer including a host material and a guest material, triplet excitation energy of the host material is converted into singlet excitation energy, and then the singlet excitation energy is transferred into a fluorescent material serving as the guest material to increase the light emission efficiency of the fluorescent light-emitting device. However, the process where the triplet excitation energy of the host material is converted into the singlet excitation energy is in competition with a process where the triplet excitation energy is deactivated. Therefore, the triplet excitation energy of the host material is not sufficiently converted into the singlet excitation energy in some cases. In the case where a fluorescent material is used as a guest material in a light-emitting layer of a light-emitting device, a possible pathway where the triplet excitation energy is deactivated is, for example, a deactivation pathway where the triplet excitation energy of a host material is transferred to the lowest triplet excitation energy level ($T_1$ level) of the fluorescent material. The energy transfer in the deactivation pathway does not contribute to light emission, which might decrease the emission efficiency of a fluorescent device. This deactivation pathway can be inhibited by a reduction in the guest material concentration, in which case, however, the rate of energy transfer from the host material to the singlet excited state of the guest material is also decreased. This is likely to cause quenching due to a degraded material and an impurity. Therefore, the luminance of the light-emitting device is likely to decrease, leading to a decrease in reliability.

An object of one embodiment of the present invention is to, in a host material and a guest material of a light-emitting layer of a light-emitting device, inhibit transfer of the triplet excitation energy of the host material to the $T_1$ level of the guest material and convert the triplet excitation energy of the host material into the singlet excitation energy of the guest material efficiently, so as to improve the fluorescence efficiency and reliability of the light-emitting device.

Another object of one embodiment of the present invention is to provide a light-emitting device having high emission efficiency. Another object of one embodiment of the present invention is to provide a light-emitting device with high reliability. Another object of one embodiment of the present invention is to provide a light-emitting device with reduced power consumption. Another object of one embodiment of the present invention is to provide a novel light-emitting device. Another object of one embodiment of the present invention is to provide a novel light-emitting apparatus. Another object of one embodiment of the present invention is to provide a novel display device.

Note that the description of the above objects does not disturb the existence of other objects. In one embodiment of the present invention, there is no need to achieve all of these objects. Other objects are apparent from the description of the specification and the like and can be derived from the description of the specification and the like.

Means for Solving the Problems

One embodiment of the present invention provides a light-emitting device including a light-emitting layer in which energy transfer by the Dexter mechanism of energy transfer between a host material (energy donor) and a guest material (energy acceptor) can be mainly inhibited in order to inhibit the triplet excitation energy of the host material from being transferred into the $T_1$ level of the guest material.

To inhibit the energy transfer by the Dexter mechanism, it is preferable that the energy donor and the energy acceptor in the light-emitting layer be away from each other far enough not to cause the energy transfer. Thus, one embodiment of the present invention provides a light-emitting device that includes an energy donor having a bulky structure and an energy acceptor having protecting groups in order that the energy donor and a luminophore of the energy acceptor can be away from each other far enough not to cause the energy transfer. In one embodiment of the present invention, the triplet level (T1 level) of the energy donor is preferably higher than the singlet level (S1 level) of the energy acceptor.

Note that in one embodiment of the present invention, a material having a substituent in a five-membered ring skeleton is used as the energy donor having a bulky structure. In addition, a fluorescent material is used as the energy acceptor, and the fluorescent material has a bulky structure because it has protecting groups. An imidazole skeleton or a triazole skeleton is particularly preferable as the five-membered ring skeleton of the energy donor.

Thus, one embodiment of the present invention is a light-emitting device including a light-emitting layer between a pair of electrodes. In the light-emitting device, the light-emitting layer includes a first material and a second material; the first material is capable of converting triplet excitation energy into light emission and has a five-membered ring skeleton; the second material is capable of converting singlet excitation energy into light emission and has a luminophore and five or more protecting groups; the luminophore is a condensed aromatic ring or a condensed heteroaromatic ring; the five or more protecting groups each independently include any one of an alkyl group having 1 to 10 carbon atoms, a substituted or unsubstituted cycloalkyl group having 3 to 10 carbon atoms, and a trialkylsilyl group having 3 to 12 carbon atoms; and the T1 level of the first material is higher than the S1 level of the second material.

In the above structure, it is preferable that at least four of the five or more protecting groups be each independently any one of an alkyl group having 3 to 10 carbon atoms, a substituted or unsubstituted cycloalkyl group having 3 to 10 carbon atoms, and a trialkylsilyl group having 3 to 10 carbon atoms.

Another embodiment of the present invention is a light-emitting device including a light-emitting layer between a pair of electrodes. In the light-emitting device, the light-emitting layer includes a first material and a second material; the first material is capable of converting triplet excitation energy into light emission and has a five-membered ring skeleton; the second material is capable of converting singlet excitation energy into light emission and has a luminophore and at least four protecting groups; the luminophore is a condensed aromatic ring or a condensed heteroaromatic ring; the four protecting groups are not directly bonded to the condensed aromatic ring or the condensed heteroaromatic ring; the four protecting groups each independently include any one of an alkyl group having 3 to 10 carbon atoms, a substituted or unsubstituted cycloalkyl group having 3 to 10 carbon atoms, and a trialkylsilyl group having 3 to 12 carbon atoms; and the T1 level of the first material is higher than the S1 level of the second material.

Another embodiment of the present invention is a light-emitting device including a light-emitting layer between a pair of electrodes. In the light-emitting device, the light-emitting layer includes a first material and a second material; the first material is capable of converting triplet excitation energy into light emission and has a five-membered ring skeleton; the second material is capable of converting singlet excitation energy into light emission and has a luminophore and two or more diarylamino groups; the luminophore is a condensed aromatic ring or a condensed heteroaromatic ring; the condensed aromatic ring or the condensed heteroaromatic ring is bonded to the two or more diarylamino groups; aryl groups in the two or more diarylamino groups each independently have at least one protecting group; the protecting groups each independently include any one of an alkyl group having 3 to 10 carbon atoms, a substituted or unsubstituted cycloalkyl group having 3 to 10 carbon atoms, and a trialkylsilyl group having 3 to 12 carbon atoms; and the T1 level of the first material is higher than the S1 level of the second material.

Another embodiment of the present invention is a light-emitting device including a light-emitting layer between a pair of electrodes. In the light-emitting device, the light-emitting layer includes a first material and a second material; the first material is capable of converting triplet excitation energy into light emission and has a five-membered ring skeleton; the second material is capable of converting singlet excitation energy into light emission and has a luminophore and two or more diarylamino groups; the luminophore is a condensed aromatic ring or a condensed heteroaromatic ring; the condensed aromatic ring or the condensed heteroaromatic ring is bonded to the two or more diarylamino groups; aryl groups in the two or more diarylamino groups each independently include at least two protecting groups; the protecting groups each independently include any one of an alkyl group having 3 to 10 carbon atoms, a substituted or unsubstituted cycloalkyl group having 3 to 10 carbon atoms, and a trialkylsilyl group having 3 to 12 carbon atoms; and the T1 level of the first material is higher than the S1 level of the second material.

In the above structure, the diarylamino groups are preferably diphenylamino groups.

Another embodiment of the present invention is a light-emitting device including a light-emitting layer between a pair of electrodes. In the light-emitting device, the light-emitting layer includes a first material and a second material; the first material is capable of converting triplet excitation energy into light emission and has a five-membered ring skeleton; the second material is capable of converting singlet excitation energy into light emission and has a luminophore and a plurality of protecting groups; the protecting groups each independently include any one of an alkyl group having 3 to 10 carbon atoms, a substituted or unsubstituted cycloalkyl group having 3 to 10 carbon atoms, and a trialkylsilyl group having 3 to 12 carbon atoms; the luminophore is a condensed aromatic ring or a condensed heteroaromatic ring; at least one of atoms of the protecting groups is positioned directly on one plane of the condensed aromatic ring or the condensed heteroaromatic ring, and at least one of the atoms of the plurality of protecting groups is positioned directly on the other plane of the condensed aromatic ring or the condensed heteroaromatic ring; and the T1 level of the first material is higher than the S1 level of the second material.

Another embodiment of the present invention is a light-emitting device including a light-emitting layer between a pair of electrodes. In the light-emitting device, the light-emitting layer includes a first material and a second material; the first material is capable of converting triplet excitation energy into light emission and has a five-membered ring skeleton; the second material is capable of converting singlet excitation energy into light emission and has a luminophore and two or more diphenylamino groups; the luminophore is a condensed aromatic ring or a condensed heteroaromatic ring; the condensed aromatic ring or the condensed heteroaromatic ring is bonded to the two or more diphenylamino groups; phenyl groups of the two or more diphenylamino groups each independently have protecting groups at 3- and 5-positions; the protecting groups each independently include any one of an alkyl group having 3 to 10 carbon atoms, a substituted or unsubstituted cycloalkyl group having 3 to 10 carbon atoms, and a trialkylsilyl group having 3 to 12 carbon atoms; and the T1 level of the first material is higher than the S1 level of the second material.

In the above structure, it is preferable that the five-membered ring skeleton have any one of a pyrazole skeleton, an imidazole skeleton, and a triazole skeleton, and it is further preferable that a nitrogen atom that is not involved in a double bond included in the imidazole skeleton and the triazole skeleton have a substituted or unsubstituted aromatic hydrocarbon group having 6 to 13 carbon atoms.

Another embodiment of the present invention is a light-emitting device including a light-emitting layer between a pair of electrodes. In the light-emitting device, the light-emitting layer includes a first material and a second material; the first material is capable of converting triplet excitation energy into light emission and has a five-membered ring skeleton; the second material is capable of converting singlet excitation energy into light emission and has a luminophore and two or more protecting groups; the luminophore is a condensed aromatic ring or a condensed heteroaromatic ring; the two or more protecting groups each independently include any one of an alkyl group having 1 to 10 carbon atoms, a substituted or unsubstituted cycloalkyl group having 3 to 10 carbon atoms, and a trialkylsilyl group having 3 to 12 carbon atoms, the first material has the five-membered ring skeleton; the five-membered ring skeleton has at least one of an imidazole skeleton and a triazole skeleton; a nitrogen atom that is not involved in a double bond included in the imidazole skeleton and the triazole skeleton includes a substituted or unsubstituted aromatic hydrocarbon group having 6 to 13 carbon atoms; and the T1 level of the first material is higher than the S1 level of the second material.

In the above structure, the aromatic hydrocarbon group is preferably a phenyl group.

In the above structure, the alkyl group is preferably a branched-chain alkyl group.

In the above structure, the branched-chain alkyl group preferably has quaternary carbon.

In the above structure, the condensed aromatic ring or the condensed heteroaromatic ring preferably includes any one of naphthalene, anthracene, fluorene, chrysene, triphenylene, pyrene, tetracene, perylene, coumarin, quinacridone, and naphthobisbenzofuran.

In the above structure, it is preferable that the light-emitting layer further include a third material and the first material and the third material form an exciplex.

In the above structure, the emission spectrum of the exciplex preferably overlap with an absorption band on a longest wavelength side of the second material.

In the above structure, the five-membered ring skeleton preferably has any one of a pyrazole skeleton, an imidazole skeleton, and a triazole skeleton.

In the above structure, the first material is preferably a metal complex. It is further preferable that the metal complex include a metal of Groups 8 to 10 and Periods 5 and 6 and the five-membered ring skeleton be coordinated to the metal.

In the above structure, the first material preferably exhibits phosphorescence.

In the above structure, the emission spectrum of the first material preferably overlaps with the absorption band on the longest wavelength side of the second material.

In the above structure, the concentration of the second material in the light-emitting layer is preferably higher than or equal to 2 wt % and lower than or equal to 30 wt %.

Another embodiment of the present invention is a light-emitting device including a light-emitting layer between a pair of electrodes. In the light-emitting device, the light-emitting layer includes an energy donor and an energy acceptor; the energy acceptor has a function of converting a triplet exciton into light emission; the energy acceptor has a five-membered ring skeleton; the energy acceptor includes a luminophore and five or more protecting groups; the luminophore is a condensed aromatic ring or a condensed heteroaromatic ring; the five or more protecting groups each independently include any one of an alkyl group having 1 to 10 carbon atoms, a substituted or unsubstituted cycloalkyl group having 3 to 10 carbon atoms, and a trialkylsilyl group having 3 to 12 carbon atoms; the T1 level of the energy donor is higher than the S1 level of the energy acceptor; and triplet excitation energy of the energy donor is converted into singlet excitation energy of the energy acceptor, whereby light emission derived from the energy acceptor is obtained.

In the above structure, it is preferable that the light emission derived from the energy acceptor be fluorescence.

Another embodiment of the present invention is a display device including the light-emitting device having any of the above structures and at least one of a color filter and a transistor. Another embodiment of the present invention is an electronic appliance including the display device and at least one of a housing and a touch sensor. Another embodiment of the present invention is a lighting device including the light-emitting device having any of the above structures and at least one of a housing and a touch sensor. The category of one embodiment of the present invention includes not only a light-emitting apparatus including a light-emitting device but also an electronic appliance including a light-emitting device. Accordingly, the light-emitting apparatus in this specification refers to an image display device or a light source (including a lighting device). In some cases, the light-emitting device includes a display module in which a connector, for example, an FPC (Flexible Printed Circuit) or a TCP (Tape Carrier Package), is connected to a light-emitting device, a display module in which a printed wiring board is provided on the tip of a TCP, or a display module in which an IC (integrated circuit) is directly mounted on a light-emitting device by a COG (Chip On Glass) method.

Effect of the Invention

According to one embodiment of the present invention, a light-emitting device having high emission efficiency can be provided. According to another embodiment of the present invention, a light-emitting device with high reliability can be provided. According to another embodiment of the present invention, a light-emitting device with reduced power consumption can be provided. According to another embodiment of the present invention, a novel light-emitting device can be provided. According to another embodiment of the present invention, a novel light-emitting apparatus can be provided. According to another embodiment of the present invention, a novel display device can be provided. According to another embodiment of the present invention, a novel organic compound can be provided.

Note that the description of these effects does not preclude the existence of other effects. Note that one embodiment of the present invention does not need to have all these effects. Other effects will be apparent from the description of the specification, the drawings, the claims, and the like, and other effects can be derived from the description of the specification, the drawings, the claims, and the like.

BRIEF DESCRIPTION OF THE DRAWINGS

FIG. 8A and FIG. 8B are schematic cross-sectional views illustrating display devices of one embodiment of the present invention.

FIG. 9A and FIG. 9B are schematic cross-sectional views illustrating display devices of one embodiment of the present invention.

MODE FOR CARRYING OUT THE INVENTION

Figure 1A:
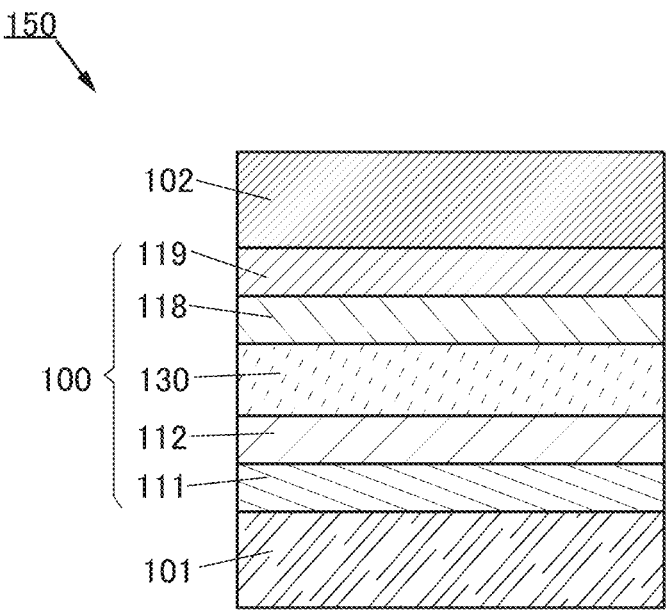
FIG. 1A and FIG. 1B are schematic cross-sectional views of a light-emitting layer of a light-emitting device of one embodiment of the present invention.

Embodiments of the present invention are described in detail below with reference to drawings. Note that the present invention is not limited to the following description, and the modes and details of the present invention can be modified in various ways without departing from the spirit and scope of the present invention. Therefore, the present invention should not be limited to description of the following embodiments and examples.

Note that the position, size, range, or the like of each component shown in drawings and the like is not accurately represented in some cases for easy understanding. Therefore, the disclosed invention is not necessarily limited to the position, size, range, or the like disclosed in drawings and the like.

In this specification and the like, the ordinal numbers such as first and second are used for convenience, and do not denote the order of steps or the stacking order of layers in some cases. Therefore, for example, description can be made even when "first" is replaced with "second", "third", or the like as appropriate. In addition, the ordinal numbers in this specification and the like do not sometimes correspond to the ordinal numbers that are used to specify one embodiment of the present invention.

In describing structures of the invention in this specification and the like with reference to drawings, common numerals are used for the same components in different drawings in some cases.

Moreover, in this specification and the like, the term "film" and the term "layer" can be interchanged with each other. For example, the term "conductive layer" can be changed into the term "conductive film" in some cases. As another example, the term "insulating film" can be changed into the term "insulating layer" in some cases.

In this specification and the like, a singlet excited state (S*) refers to a singlet state having excitation energy. An S1 level means the lowest level of the singlet excitation energy level, that is, the excitation energy level of the lowest singlet excited state (S1 state). A triplet excited state (T*) refers to a triplet state having excitation energy. A T1 level means the lowest level of the triplet excitation energy level, that is, the excitation energy level of the lowest triplet excited state (T1 state). Note that in this specification and the like, simple expressions singlet excited state and singlet excitation energy level mean the S1 state and the S1 level, respectively, in some cases. In addition, expressions triplet excited state and triplet excitation energy level mean the T1 state and the T1 level, respectively, in some cases.

In this specification and the like, a fluorescent material refers to a compound that supplies light emission in the visible light region when the relaxation from the singlet excited state to the ground state occurs. A phosphorescent material refers to a compound that supplies light emission in the visible light region at room temperature when the relaxation from the triplet excited state to the ground state occurs. In other words, a phosphorescent material refers to one of compounds that can convert triplet excitation energy into visible light.

In this specification and the like, a wavelength range of blue is greater than or equal to 400 nm and less than 490 nm, and blue light has at least one emission spectrum peak in that wavelength range. A wavelength range of green is greater than or equal to 490 nm and less than 580 nm, and green light has at least one emission spectrum peak in that wavelength range. A wavelength range of red is greater than or equal to 580 nm and less than or equal to 680 nm, and red light has at least one emission spectrum peak in that wavelength range.

Embodiment 1

In this embodiment, a light-emitting device of one embodiment of the present invention will be described below with reference to FIG. 1 to FIG. 5.

<Structure Example of Light-Emitting Device>

First, a structure of the light-emitting device of one embodiment of the present invention will be described below with reference to FIG. 1A to FIG. 1C.

FIG. 1A is a schematic cross-sectional view of a light-emitting device 150 of one embodiment of the present invention.

The light-emitting device 150 includes a pair of electrodes (an electrode 101 and an electrode 102) and an EL layer 100 between the pair of electrodes. The EL layer 100 includes at least a light-emitting layer 130.

The EL layer 100 illustrated in FIG. 1A includes functional layers such as a hole-injection layer 111, a hole-transport layer 112, an electron-transport layer 118, and an electron-injection layer 119, in addition to the light-emitting layer 130.

In this embodiment, although description is given assuming that the electrode 101 and the electrode 102 of the pair of electrodes serve as an anode and a cathode, respectively, the structure of the light-emitting device 150 is not limited thereto. That is, the electrode 101 may be a cathode, the electrode 102 may be an anode, and the stacking order of the layers between the electrodes may be reversed. In other words, the hole-injection layer 111, the hole-transport layer 112, the light-emitting layer 130, the electron-transport layer 118, and the electron-injection layer 119 may be stacked in this order from the anode side.

The structure of the EL layer 100 is not limited to the structure illustrated in FIG. 1A, as long as at least one selected from the hole-injection layer 111, the hole-transport layer 112, the electron-transport layer 118, and the electron-injection layer 119 is included. Alternatively, the EL layer 100 may include a functional layer which is capable of lowering a hole- or electron-injection barrier, improving a hole- or electron-transport property, inhibiting a hole- or electron-transport property, or suppressing a quenching phenomenon by an electrode, for example. Note that the functional layers may each be a single layer or stacked layers.

<Light Emission Mechanism of Light-Emitting Device>

Next, a light emission mechanism of the light-emitting layer 130 will be described below.

In the light-emitting device 150 of one embodiment of the present invention, voltage application between the pair of electrodes (the electrode 101 and the electrode 102) allows electrons and holes to be injected from the cathode and the anode, respectively, into the EL layer 100 and thus current flows. The ratio of singlet excitons to triplet excitons (hereinafter, exciton generation probability) which are generated by recombination of carriers (electrons and holes) is 1:3 according to the statistically obtained probability. In other words, the generation probability of singlet excitons is 25% and the generation probability of triplet excitons is 75%; thus, it is important to make the triplet excitons contribute to light emission in order to improve the emission efficiency of the light-emitting device. For this reason, a material that has a function of converting triplet excitation energy into light emission is preferably used for the light-emitting layer 130.

As the material that has a function of converting triplet excitation energy into light emission, a compound that can emit phosphorescence (hereinafter, also referred to as a phosphorescent material) can be given. A phosphorescent material in this specification and the like is a compound that exhibits phosphorescence but does not exhibit fluorescence at a temperature higher than or equal to a low temperature that can be obtained with liquid nitrogen (e.g., 77 K) and lower than or equal to room temperature. The phosphorescent material preferably contains a metal element with large spin-orbit interaction, specifically a transition metal element. It is particularly preferable that a platinum group element (an element of Groups 8 to 10 and Periods 5 and 6 (ruthenium (Ru), rhodium (Rh), palladium (Pd), osmium (Os), iridium (Ir), or platinum (Pt)), especially iridium, be contained, in which case the transition probability relating to direct transition between the singlet ground state and the triplet excited state can be increased.

As the material that has a function of converting triplet excitation energy into light emission, a TADF material is given. Note that the TADF material is a material that has a small difference between the S1 level and the T1 level and has a function of converting triplet excitation energy into singlet excitation energy by reverse intersystem crossing. Thus, it is possible to upconvert triplet excitation energy into singlet excitation energy (reverse intersystem crossing) using a little thermal energy (e.g., room temperature) and to efficiently generate a singlet excited state. An exciplex whose excited state is formed by two kinds of substances has an extremely small difference between the S1 level and the T1 level and functions as a TADF material that can convert triplet excitation energy into singlet excitation energy.

Note that a phosphorescent spectrum observed at low temperatures (e.g., 10 K) is used for an index of the T1 level. When the level of energy with a wavelength of the line obtained by extrapolating a tangent to the fluorescent spectrum at a tail on the short wavelength side is the S1 level and the level of energy with a wavelength of the line obtained by extrapolating a tangent to the phosphorescent spectrum at a tail on the short wavelength side is the T1 level, the difference between S1 and T1 of the TADF material is preferably smaller than or equal to 0.2 eV.

Figure 1B:
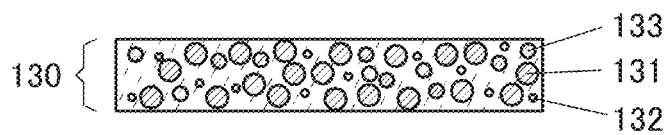

FIG. 1B is a schematic cross-sectional view illustrating the light-emitting layer 130 of the light-emitting device of one embodiment of the present invention. In one embodiment of the present invention, the light-emitting layer 130 contains a compound 131, a compound 132, and a compound 133. The compound 133 has a function of converting triplet excitation energy into light emission and has a five-membered ring skeleton. The compound 132 has a function of converting singlet excitation energy into light emission and has protecting groups. A fluorescent material has high stability; therefore, a fluorescent material is preferably used as the compound 132 in order to achieve high reliability of the light-emitting device. The compound 131 is a host material and it is preferable that carrier recombination occur on the compound 131. In the light-emitting device of one embodiment of the present invention, it is preferable that both the singlet excitation energy and the triplet excitation energy of excitons generated by carrier recombination in the compound 131 be finally transferred to the singlet excited state of the compound 132 through the compound 133, and the compound 132 emit light. Here, in the light-emitting layer 130, the compound 133 is an energy donor, and the compound 132 is an energy acceptor. In FIG. 1B, the light-emitting layer 130 is a fluorescent light-emitting layer in which the compound 131 is a host material and the compound 132 is a guest material. The compound 133 functions as an energy donor. In addition, light emission derived from the compound 132 serving as a guest material can be obtained from the light-emitting layer 130.

Structure Example 1 of Light-Emitting Layer

Figure 1C:
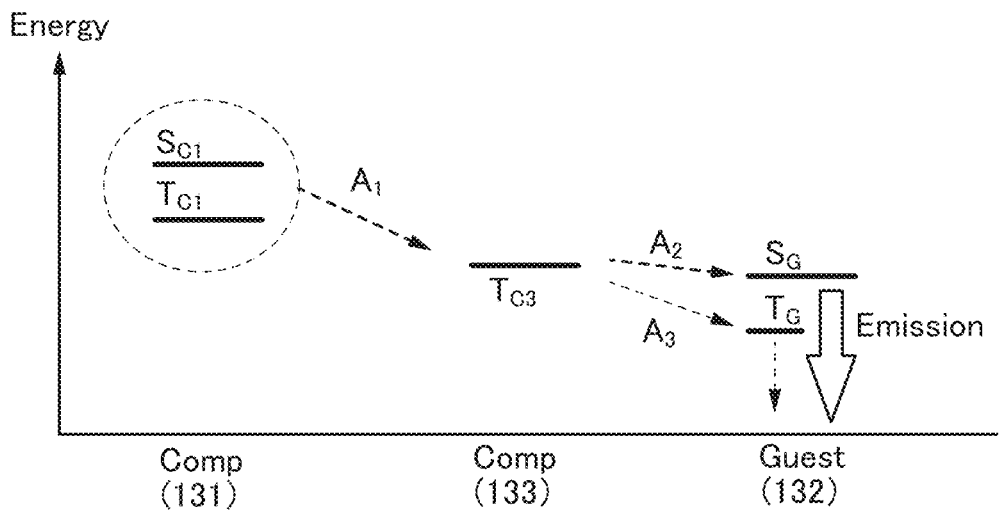
FIG. 1C is a diagram showing the correlation between energy levels of the light-emitting device of one embodiment of the present invention.

FIG. 1C is an example of the correlation between energy levels in the light-emitting layer 130 of the light-emitting device 150 of one embodiment of the present invention. The light-emitting layer 130 illustrated in FIG. 1B contains the compound 131, the compound 132, and also the compound 133. In one embodiment of the present invention, the compound 132 is a fluorescent material having protecting groups. The compound 133 has a function of converting triplet excitation energy into light emission. In this structure example, the case where the compound 133 is a phosphorescent material is described.

FIG. 1C shows the correlation between the energy levels of the compound 131 and the compound 132 in the light-emitting layer 130. The following explains what the terms and numerals in FIG. 1C represent.

Comp (131): compound 131
Comp (133): compound 133
Guest (132): compound 132
$S_{C1}$: S1 level of compound 131
$T_{C1}$: T1 level of compound 131
$T_{C3}$: T1 level of compound 133
$T_G$: T1 level of compound 132
$S_G$: S1 level of compound 132

In the light-emitting device of one embodiment of the present invention, when carrier recombination mainly occurs in the compound 131 contained in the light-emitting layer 130, singlet excitons and triplet excitons are generated. Since the compound 133 is a phosphorescent material, selecting materials that have a relation of $T_{C3} \leq T_{C1}$ allows both of the singlet excitation energy and the triplet excitation energy generated in the compound 131 to be transferred to the $T_{C3}$ level of the compound 133 (Route $A_1$ in FIG. 1C). Some of the carriers can be recombined in the compound 133.

Note that the phosphorescent material used in the above structure preferably contains a heavy atom such as Ir, Pt, Os, Ru, or Pd. In this structure example, a phosphorescent material serves as an energy donor as described above; thus, the quantum yield can be either high or low. A phosphorescent material is preferably used as the compound 133 (energy donor), in which case energy transfer from the triplet excitation energy level of the energy donor to the singlet excitation energy level of the guest material (energy acceptor) is allowable transition. Thus, the triplet excitation energy of the compound 133 can be transferred to the S1 level ($S_G$) of the compound 132 serving as the guest material through the process of Route $A_2$. In Route $A_2$, the compound 133 functions as an energy donor and the compound 132 functions as an energy acceptor. In that case, $T_{C3} \geq S_G$ is preferable because the excitation energy of the compound 133 is efficiently transferred to the singlet excited state of the compound 132 serving as a guest material. Specifically, when the level of energy with a wavelength of the line obtained by extrapolating a tangent to the phosphorescent spectrum of the compound 133 at a tail on the short wavelength side is $T_{C3}$ and the level of energy with a wavelength of the absorption edge of the absorption spectrum of the compound 132 or the level of energy with a wavelength of the line obtained by extrapolating a tangent to the emission spectrum at a tail on the short wavelength side is $S_G$, $T_{C3} \geq S_G$ is preferably satisfied.

Here, the compound 131, the compound 132, and the compound 133 are mixed in the light-emitting layer 130. Thus, a process where the triplet excitation energy of the compound 133 is converted into the triplet excitation energy of the compound 132 (Route $A_3$ in FIG. 1C) is likely to occur in competition with Route $A_1$ and Route $A_2$ described above. Since the compound 132 is a fluorescent material, the triplet excitation energy of the compound 132 does not contribute to light emission. In other words, when the energy transfer through Route $A_3$ occurs, the emission efficiency of the light-emitting device decreases. Note that in practice, the energy transfer process $A_3$ from $T_{C3}$ to $T_G$ can be, not a direct route, a pathway where $T_{C3}$ is once transferred to the triplet excited state at a level higher than $T_G$ of the compound 132 and then the triplet excited state is converted into $T_G$ by internal conversion; the process is omitted in the drawing. Hereinafter, the same applies to all undesired thermal deactivation processes, that is, all the energy transfer processes to $T_G$ in this specification.

Fluorescence resonance energy transfer (also referred to as FRET or the Förster mechanism (dipole-dipole interaction)) and the Dexter mechanism (electron exchange interaction) are known as intermolecular energy transfer mechanisms. Since the compound 132 serving as an energy acceptor is a fluorescent material, the Dexter mechanism is dominant as the mechanism of energy transfer through Route $A_3$. In general, the Dexter mechanism occurs significantly when the distance between the compound 131 serving as an energy donor and the compound 132 serving as an energy acceptor is less than or equal to 1 nm. Therefore, to inhibit Route $A_3$, it is important that the distance between the host material and the guest material, that is, the energy donor and the energy acceptor be large.

Note that since direct transition from a singlet ground state to a triplet excited state in the compound 132 is forbidden, energy transfer from the singlet excitation energy level ($S_{C1}$) of the compound 131 to the triplet excitation energy level ($T_G$) of the compound 132 is unlikely to be a main energy transfer process; thus, the energy transfer is not illustrated.

$T_G$ in FIG. 1C is the energy level derived from a luminophore in the energy acceptor in many cases. Therefore, specifically, to inhibit Route $A_3$, it is important that the energy donor and the luminophore of the energy acceptor be made away from each other. A general method for making the energy donor and the luminophore of the energy acceptor away from each other is to lower the concentration of the energy acceptor in a mixed film of these compounds. However, lowering the concentration of the energy acceptor in the mixed film inhibits not only energy transfer based on the Dexter mechanism from the energy donor to the energy acceptor but also energy transfer based on the Förster mechanism from the energy donor to the energy acceptor. In that case, a problem such as a decrease in the emission efficiency and reliability of the light-emitting device is caused because Route $A_2$ is based on the Förster mechanism.

In view of the above, the present inventors have found that the use of a fluorescent material having protecting groups, as an energy acceptor, for keeping a distance from the energy donor can inhibit the above-described decrease in the emission efficiency. By including the protecting groups, the fluorescent material can be a bulky energy acceptor.

<Concept of Fluorescent Material Having Protecting Groups>

Figure 2A:
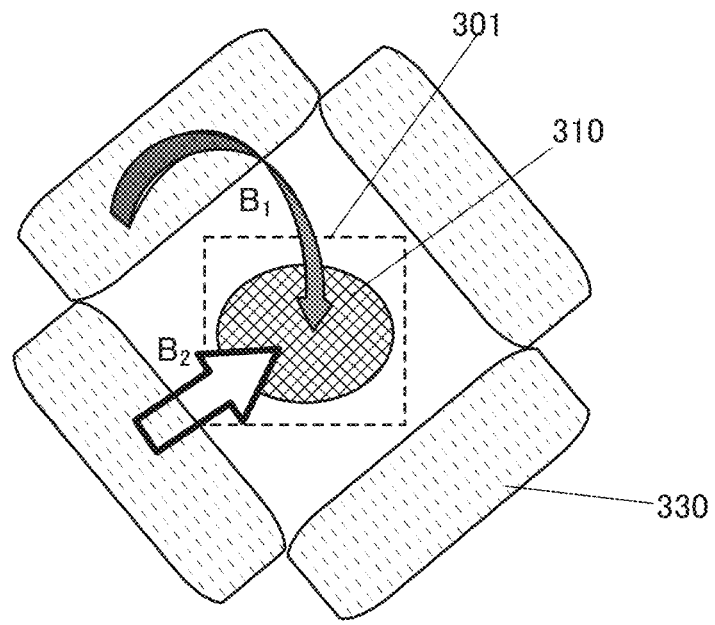
FIG. 2A is a conceptual diagram of a conventional guest material.
Figure 2B:
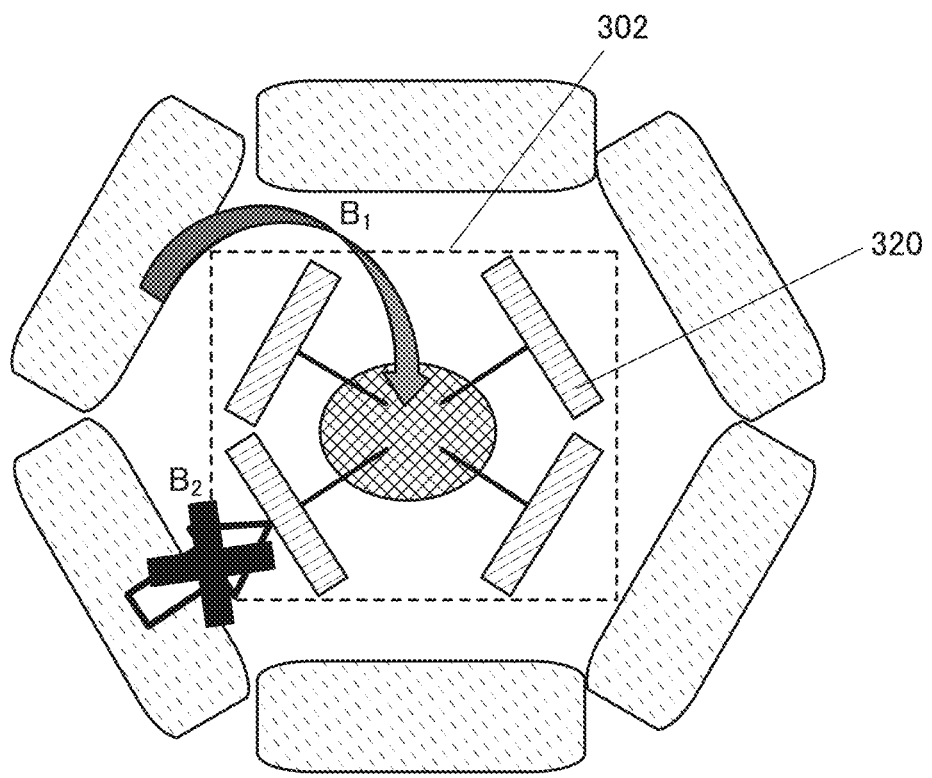
FIG. 2B is a conceptual diagram of a guest material used in a light-emitting device of one embodiment of the present invention.

FIG. 2A is a conceptual diagram illustrating the case where a typical fluorescent material having no protecting group is dispersed as a guest material to a host material, and FIG. 2B is a conceptual diagram illustrating the case where a fluorescent material having protecting groups, which is used for the light-emitting device of one embodiment of the present invention, is dispersed as a guest material to a host material. The host material may be rephrased as an energy donor, and the guest material may be replaced with an energy acceptor. Here, the protecting groups have a function of making a luminophore and the host material away from each other. In FIG. 2A, a guest material 301 includes a luminophore 310. The guest material 301 has a function of an energy acceptor. In FIG. 2B, a guest material 302 includes the luminophore 310 and protecting groups 320. In FIG. 2A and FIG. 2B, the guest material 301 and the guest material 302 are surrounded by host materials 330. Since the luminophore is close to the host materials in FIG. 2A, both energy transfer by the Forster mechanism (Route $B_1$ in FIG. 2A and FIG. 2B) and energy transfer by the Dexter mechanism (Route $B_2$ in FIG. 2A and FIG. 2B) can occur as the energy transfer from the host materials 330 to the guest material 301. In the case where the guest material is a fluorescent material, when the triplet excitation energy transfer from the host material to the guest material is caused by the Dexter mechanism and the triplet exited state of the guest material is generated, non-radiative decay of the triplet excitation energy occurs, contributing to a reduction in the emission efficiency.

In contrast, the guest material 302 in FIG. 2B has the protecting groups 320. Thus, the luminophore 310 and the host materials 330 can be kept away from each other. This inhibits energy transfer by the Dexter mechanism (Route $B_2$).

Here, in order that the guest material 302 emits light, the guest material 302 needs to receive energy from the host materials 330 by the Førster mechanism because the Dexter mechanism is inhibited. In other words, it is preferable that energy transfer by the Førster mechanism be efficiently utilized while energy transfer by the Dexter mechanism is inhibited. It is known that energy transfer by the Forster mechanism is also affected by the distance between a host material and a guest material. In general, the Dexter mechanism is dominant when the distance between the host material 330 and the luminophore 310 of the guest material 302 is less than or equal to 1 nm, and the Forster mechanism is dominant when the distance therebetween is greater than or equal to 1 nm and less than or equal to 10 nm. Energy transfer is generally unlikely to occur when the distance between the host material 330 and the luminophore 310 of the guest material 302 is greater than or equal to 10 nm.

Thus, the protecting groups 320 preferably extend within a range from 1 nm to 10 nm from the luminophore 310. A range from 1 nm to 5 nm is more preferable. With such a structure, energy transfer by the Førster mechanism from the host material 330 to the guest material 302 can be efficiently utilized while energy transfer by the Dexter mechanism is inhibited. Thus, a light-emitting device with high emission efficiency can be fabricated.

Furthermore, in order to improve the efficiency of energy transfer (increase the energy transfer rate) by the Førster mechanism, the concentration of the guest material 301 or the guest material 302 with respect to the host material 330 is preferably increased. However, as the concentration of the guest material is increased, the rate of energy transfer by the Dexter mechanism is usually increased, resulting in a decrease in emission efficiency. It is thus difficult to increase the concentration of the guest material. As a fluorescent light-emitting device using a material having a function of converting triplet excitation energy into light emission as a host material, a light-emitting device having a small guest material concentration of lower than or equal to 1 wt % has been reported.

In contrast, in the light-emitting device of one embodiment of the present invention, a guest material in which a luminophore has protecting groups is used for a light-emitting layer. Therefore, energy transfer by the Forster mechanism can be efficiently utilized while energy transfer by the Dexter mechanism inhibited; thus, the concentration of the guest material serving as an energy acceptor can be increased. As a result, increasing the rate of energy transfer by the Førster mechanism and inhibiting energy transfer by the Dexter mechanism, which are originally conflicting phenomena, can be concurrently caused. The concentration of the guest material with respect to the host material is preferably higher than or equal to 2 wt % and lower than or equal to 30 wt %, further preferably higher than or equal to 5 wt % and lower than or equal to 20 wt %, still further preferably higher than or equal to 5 wt % and lower than or equal to 15 wt %. With such a structure, the rate of energy transfer by the Førster mechanism can be increased; thus, a light-emitting device with high emission efficiency can be obtained. In addition, the use of a material having a function of converting triplet excitation energy into light emission as a host material allows fabrication of a fluorescent light-emitting device having emission efficiency as high as that of a phosphorescent light-emitting device. Since the emission efficiency can be improved using a fluorescent material having high stability, a highly reliable light-emitting device can be fabricated.

In particular, the effect of the light-emitting device of one embodiment of the present invention is not only an increase in reliability owing to the use of a fluorescent material with high stability. The energy transfer described above always conflicts with a quenching process due to the influence of a degraded material and an impurity. As the quenching rate constant of the quenching process increases over time, the proportion of light emission from the light-emitting device decreases. That is, the luminance of the light-emitting device deteriorates. However, as described above, the rate of energy transfer by the Førster mechanism can be more increased than in a conventional light-emitting device while the energy transfer by the Dexter mechanism is inhibited in one embodiment of the present invention; thus, the influence of conflict with the quenching process can be reduced, so that the lifetime of the light-emitting device can be increased.

Here, the luminophore refers to an atomic group (skeleton) that causes light emission in a fluorescent material. The luminophore generally has a π bond and preferably has an aromatic ring, further preferably a condensed aromatic ring or a condensed heteroaromatic ring. As another embodiment, the luminophore can be regarded as an atomic group (skeleton) having an aromatic ring having a transition dipole vector on a ring plane.

As the condensed aromatic ring or the condensed heteroaromatic ring, a phenanthrene skeleton, a stilbene skeleton, an acridone skeleton, a phenoxazine skeleton, a phenothiazine skeleton, and the like are given. Specifically, fluorescent materials having a naphthalene skeleton, an anthracene skeleton, a fluorene skeleton, a chrysene skeleton, a triphenylene skeleton, a tetracene skeleton, a pyrene skeleton, a perylene skeleton, a coumarin skeleton, a quinacridone skeleton, and a naphthobisbenzofuran skeleton are preferable because of their high fluorescence quantum yields.

The protecting group needs to have a triplet excitation energy level higher than the T1 levels of the luminophore and the host material. Thus, a saturated hydrocarbon group can be favorably used. This is because a substituent having no π bond has a high triplet excitation energy level. In addition, a substituent having no π bond does not have a function of transporting carriers (electrons or holes). Thus, a saturated hydrocarbon group can make the luminophore and the host material away from each other with little influence on the excited state or the carrier-transport property of the host material. In an organic compound including a substituent having no 7C bond and a substituent having a π-conjugated system, frontier orbitals {HOMO (Highest Occupied Molecular Orbital) and LUMO (Lowest Unoccupied Molecular Orbital)} are present on the side of the substituent having a π-conjugated system in many cases; in particular, the luminophore tends to have the frontier orbitals. As described later, the overlap of the HOMOs of the energy donor and the energy acceptor and the overlap of the LUMOs of the energy donor and the energy acceptor are important for energy transfer by the Dexter mechanism. Therefore, the use of a saturated hydrocarbon group as the protecting group enables a large distance between the frontier orbitals of the host material serving as an energy donor and the frontier orbitals of the guest material serving as an energy acceptor, leading to inhibition of energy transfer by the Dexter mechanism.

A specific example of the protecting group is an alkyl group having 1 to 10 carbon atoms. In addition, the protecting group is preferably a bulky substituent because the luminophore and the host material need to be away from each other. In other words, a substituent with larger steric hindrance is preferable. Thus, an alkyl group having 3 to 10 carbon atoms, a substituted or unsubstituted cycloalkyl group having 3 to 10 carbon atoms, or a trialkylsilyl group having 3 to 10 carbon atoms can be favorably used. In particular, the alkyl group is preferably a bulky branched-chain alkyl group. Furthermore, the substituent preferably has quaternary carbon, in which case it becomes a bulky substituent.

One luminophore preferably has five or more protecting groups. With such a structure, the luminophore can be entirely covered with the protecting groups, so that the distance between the host material and the luminophore can be adjusted as appropriate. In FIG. 2B, the protecting groups are directly bonded to the luminophore; however, the protecting groups are preferably not directly bonded to the luminophore. For example, the protecting groups may each be bonded to the luminophore via a substituent with a valence of 2 or more, such as an arylene group or an amino group. Bonding of each of the protecting groups to the luminophore via the substituent can effectively make the luminophore away from the host material. Thus, in the case where the protecting groups are not directly bonded to the luminophore, four or more protecting groups for one luminophore can effectively inhibit energy transfer by the Dexter mechanism.

Furthermore, the substituent with a valence of 2 or more that bonds the luminophore and each of the protecting groups is preferably a substituent having a π-conjugated system. With such a structure, the physical properties of the guest material, such as the emission color, the HOMO level, and the glass transition point, can be adjusted. Note that the protecting groups are preferably positioned on the outermost side when the molecular structure is observed with the luminophore positioned at the center.

<Examples of Fluorescent Material Having Protecting Groups and its Molecular Structure>

Here, a structure of N,N'-[(2-tert-butylanthracene)-9,10-diyl]-N,N'-bis(3,5-di-tert-butylphenyl)amine (abbreviation: 2tBu-mmtBuDPhA2Anth), a fluorescent material that is represented by Structural formula (102) shown below and can be used for the light-emitting device of one embodiment of the present invention, is shown. In 2tBu-mmtBuDPhA2Anth, an anthracene ring is a luminophore and tertiary butyl (tBu) groups serve as protecting groups.

[Chemical formula 1]

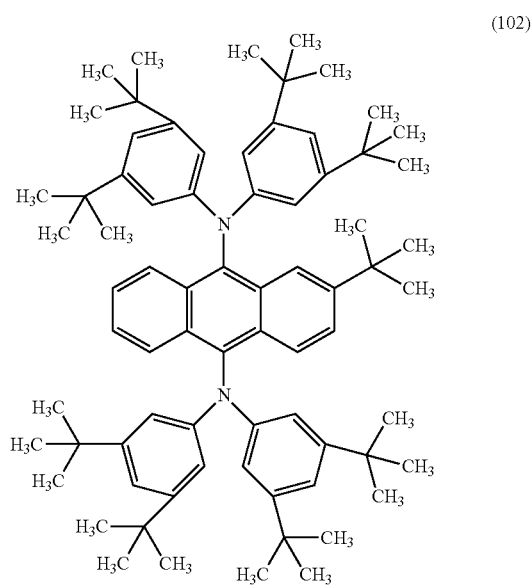

(102)

Figure 3A:
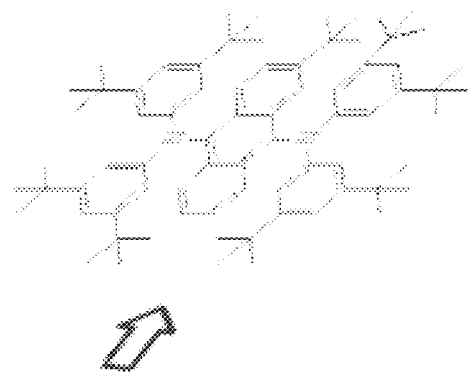
FIG. 3A is a structural formula of a guest material used in a light-emitting device of one embodiment of the present invention.
Figure 3B:
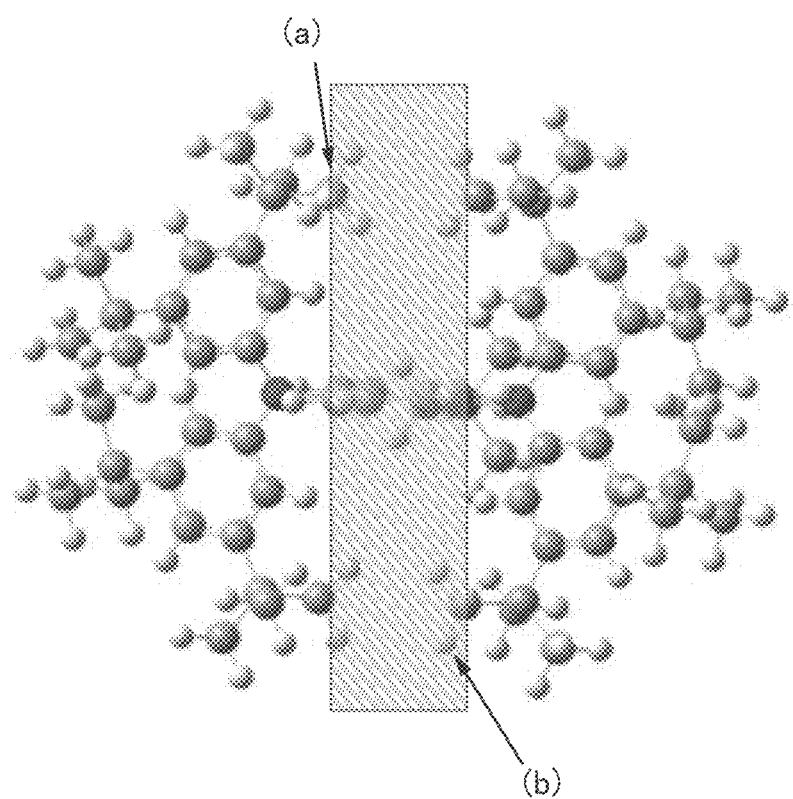
FIG. 3B is a ball-and-stick diagram of the guest material used in the light-emitting device of one embodiment of the present invention.

FIG. 3B shows a ball-and-stick model image of 2tBu-mmtBuDPhA2Anth shown above. Note that FIG. 3B shows the state where 2tBu-mmtBuDPhA2Anth is viewed in the direction indicated by an arrow in FIG. 3A (the direction parallel to the anthracene ring plane). The hatched portion in FIG. 3B represents an overhead portion of the anthracene ring plane, which is a luminophore, and the overhead portion includes a region overlapping with tBu groups, which are protecting groups. For example, in FIG. 3B, an atom indicated by an arrow (a) is a carbon atom of the tBu group overlapping with the hatched portion, and an atom indicated by an arrow (b) is a hydrogen atom of the tBu group overlapping with the hatched portion. In other words, in 2tBu-mmtBuDPhA2Anth, atoms included in protecting groups are positioned directly on one plane of the luminophore, and atoms included in protecting groups are also positioned directly on the other plane. With such a structure, even in the state where a guest material is dispersed in a host material, the anthracene ring, which is the luminophore, and the host material can be away from each other in both the horizontal direction and the vertical direction of the anthracene ring, leading to inhibition of energy transfer by the Dexter mechanism.

In addition, for example, when the transition related to energy transfer is transition between HOMO and LUMO, the overlap of the HOMOs of the host material and the guest material and the overlap of LUMOs of the host material and the guest material are important for energy transfer by the Dexter mechanism. The overlap of the HOMOs of both of the materials and the overlap of LUMOs thereof significantly cause the Dexter mechanism. Therefore, it is important to prevent the overlap of the HOMOs of both of the materials and the overlap of LUMOs thereof in order to inhibit the Dexter mechanism. In other words, it is important that the distance between the skeleton and the host material, which are related to the excited state, be large. In a fluorescent material, both HOMO and LUMO are included in a luminophore in many cases. For example, in the case where the HOMO and LUMO of a guest material extend above and below the luminophore plane (above and below the anthracene ring in 2tBu-mmtBuDPhA2Anth), it is important that the upper and lower planes of the luminophore be covered with protecting groups in the molecular structure.

A condensed aromatic ring and a condensed heteroaromatic ring serving as a luminophore, such as a pyrene ring or an anthracene ring, has a transition dipole vector on the ring plane. Thus, in FIG. 3B, 2tBu-mmtBuDPhA2Anth preferably includes a region overlapping with a tBu group, which is a protecting group, on the plane where the transition dipole vector is present, that is, directly on the plane of the anthracene ring. Specifically, at least one of atoms of a plurality of protecting groups (the tBu groups in FIG. 3A and FIG. 3B) is positioned directly on one plane of a condensed aromatic ring or a condensed heteroaromatic ring (the anthracene ring in FIG. 3A and FIG. 3B), and at least one of atoms of the plurality of protecting groups is positioned directly on the other plane of the condensed aromatic ring or the condensed heteroaromatic ring. With such a structure, even in the state where a guest material is dispersed in a host material, the luminophore and the host material can be away from each other, leading to inhibition of energy transfer by the Dexter mechanism. Furthermore, tBu groups are preferably positioned to cover a luminophore such as an anthracene ring.

<Reason for Use of Phosphorescent Material Having Five-Membered Ring Skeleton>

Next, an energy donor is discussed. The present inventors have found that energy transfer by the Førster mechanism can be utilized effectively when a material having a five-membered ring skeleton is used as a phosphorescent material that is used as an energy donor. As will be described later, a phosphorescent material having a five-membered ring skeleton can be favorably used as a bulky energy donor.

A heteroaromatic ring skeleton is preferable as the five-membered ring skeleton; for example, a pyrrole skeleton, a pyrazole skeleton, an imidazole skeleton, a triazole skeleton, a tetrazole skeleton, a benzimidazole skeleton, and a naphthoimidazole skeleton can be given. In particular, a phosphorescent material having an imidazole skeleton, a triazole skeleton, a benzimidazole skeleton, or a naphthoimidazole skeleton is preferable, and most of all, a metal complex having the skeleton as a ligand is preferable. It is preferable that the skeleton be included as a ligand, and a metal of Groups 8 to 10 and Periods 5 and 6 (Ru, Rh, Pd, Os, Ir, or Pt) be included as a center metal; most of all, an Ir complex is preferable. Note that a benzimidazole skeleton and a naphthoimidazole skeleton are examples of a skeleton having an imidazole skeleton.

The phosphorescent material having a five-membered ring skeleton as the ligand tends to have a high HOMO level. In the case where a material with a high HOMO level is used as the above-described compound 133 (energy donor) in the light-emitting layer 130, when current flows in the light-emitting device 150, it is possible to inhibit holes from being captured by the compound 132 serving as the guest material (energy acceptor), i.e., to inhibit the compound 132 from being positively charged. The excitation of a compound due to current is caused by capturing of a hole and an electron on the same molecule, except for the exciplex. Thus, when a material having a high HOMO level is used as the compound 133, current excitation on the compound 132 (direct excitation of the compound 132) can be inhibited. Since the compound 132 is a fluorescent material, when the compound 132 is excited directly, generated triplet excitons do not contribute to light emission, resulting in a decrease in the emission efficiency. Therefore, in the case where the HOMO level of the phosphorescent material having a five-membered ring skeleton is high, the use of the phosphorescent material as the compound 133 can inhibit a decrease in the emission efficiency of the light-emitting device 150.

<Phosphorescent Material Having Five-Membered Ring Skeleton as Bulky Energy Donor>

Here, examples of the Ir complex having a five-membered ring skeleton as the ligand are described below as the phosphorescent material having a five-membered ring skeleton as the ligand, which can be used in one embodiment of the present invention. Ir(mpptz-diPrp)$_3$ is an Ir complex having a triazole skeleton as a five-membered ring skeleton, and fac-Ir(pbi-diBup)$_3$ is an Ir complex having an imidazole skeleton as a five-membered ring skeleton.

[Chemical formulae 2]

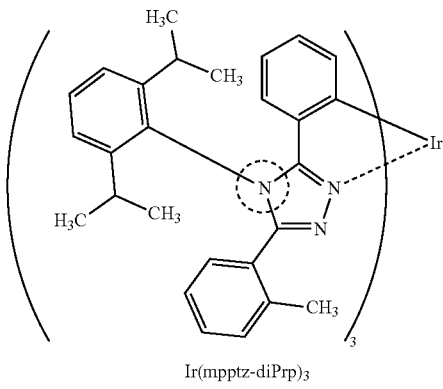

Ir(mpptz-diPrp)$_3$

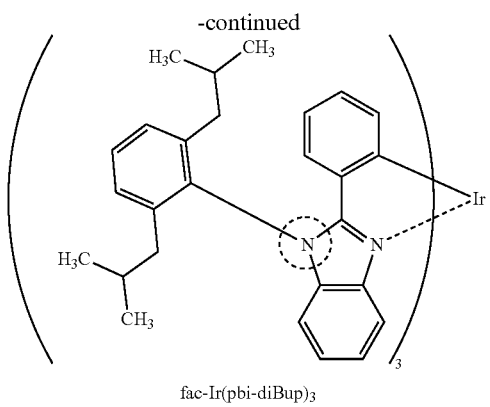

fac-Ir(pbi-diBup)₃

As in the case of the above Ir complexes, in the case where a skeleton including two or more nitrogen atoms in a five-membered ring skeleton, such as an imidazole skeleton or a triazole skeleton, is used as the five-membered ring skeleton of a ligand, nitrogen that is not coordinated to a metal exists. At least one nitrogen that is not coordinated to the metal is not involved in a double bond, and therefore, it can have a substituent while an aromatic ring is kept (a nitrogen atom denoted by a circle in each of the above Ir complexes). A variety of substituents such as hydrogen, an alkyl group, and an aromatic hydrocarbon group can be given as the substituent, and a substituted or unsubstituted aromatic hydrocarbon group having 6 to 13 carbon atoms is preferable. An unsubstituted phenyl group or a phenyl group having one or more alkyl groups having 1 to 6 carbon atoms is particularly preferable. An electron-withdrawing group such as fluorine, a cyano group, or an alkyl fluoride group may further be bonded to the phenyl group. This structure can improve thermal stability and sublimability of the Ir complex.

Thus, in the case of using the compound having a five-membered ring skeleton as the ligand of the Ir complex, the nitrogen atom preferably has a substituted or unsubstituted aromatic hydrocarbon group having 6 to 13 carbon atoms as a substituent. With the substituent, the ligand has a bulky structure with large steric hindrance. As a result, the Ir complex has a bulky structure. In other words, when the compound having a five-membered ring skeleton is used as the ligand of the phosphorescent material, the Ir complex tends to have a bulky structure.

Here, the case where the Ir complex is excited is described. In many cases, in the Ir complex, which is a phosphorescent material, the lowest triplet excited level is derived from triplet MLCT. Thus, triplet excitation energy exists in the vicinity of an Ir atom and a portion coordinated to the Ir atom in a ligand (a nitrogen atom coordinated to Ir or an ortho-metalated carbon atom) in many cases.

Here, the case where the Ir complex having a bulky ligand is dispersed in the light-emitting layer is considered. Owing to the bulky ligand, an Ir atom in the Ir complex and a material around the Ir complex can be away from each other. That is, deactivation of the triplet excitation energy by the Dexter mechanism can be inhibited.

Here, the case where the bulky Ir complex is used as the above-described compound 133 is described. As described above, deactivation of excitation energy by the Dexter mechanism from the compound 133 to the compound 132 (Route $A_3$) can be inhibited. Therefore, the energy transfer through Route $A_2$ (energy transfer by the Førster mechanism) can be utilized efficiently. Accordingly, with the use of the Ir complex having a five-membered ring skeleton as the ligand, a light-emitting device with high emission efficiency can be obtained.

When the Ir complex having a five-membered ring skeleton as the ligand is used as the energy donor as described above, excitation energy transfer by the Dexter mechanism can be inhibited. Thus, in the case where the Ir complex having a five-membered ring as the ligand is used as the energy donor, even when the number of protecting groups of the energy acceptor serving as the guest material is small, energy transfer through Route $A_2$ can be utilized efficiently. In this case, the energy acceptor preferably has at least two protecting groups, further preferably three or more protecting groups, still further preferably four or more protecting groups, for one luminophore. As the five-membered ring skeleton used as the ligand of the Ir complex, an imidazole skeleton or a triazole skeleton is preferable. It is further preferable that the Ir complex have a structure in which a substituted or unsubstituted aromatic hydrocarbon group having 6 to 13 carbon atoms be bonded as a substituent to a nitrogen atom that is not bonded to Ir and is not involved in a double bond. In addition, in the case where the aromatic hydrocarbon group is a phenyl group and the phenyl group has a substituent, it is further preferable that an alkyl group having 1 to 6 carbon atoms be included as the substituent.

Specific examples of the aromatic hydrocarbon group having 6 to 13 carbon atoms include a phenyl group, a biphenyl group, a naphthyl group, and a fluorenyl group. Examples of the alkyl group having 1 to 6 carbon atoms include a methyl group, an ethyl group, a propyl group, a pentyl group, a hexyl group, a cyclohexyl group, a norbornyl group, an adamantyl group, an isopropyl group, a sec-butyl group, an isobutyl group, a tert-butyl group, an isopentyl group, a sec-pentyl group, a tert-pentyl group, a neopentyl group, an isohexyl group, a 3-methylpentyl group, a 2-methylpentyl group, a 2-ethylbutyl group, a 1,2-dimethylbutyl group, and a 2,3-dimethylbutyl group. Note that the aromatic hydrocarbon group having 6 to 13 carbon atoms and the alkyl group having 1 to 6 carbon atoms are not limited to them.

The triplet excitation energy of the Ir complex having a five-membered ring skeleton as the ligand tends to be higher than that of an Ir complex composed of only a six-membered ring skeleton. Thus, in the case where a fluorescent material that exhibits light emission with a relatively short wavelength, such as green light or blue light, is used as the compound 132 serving as an energy acceptor, the Ir complex having a five-membered ring skeleton as the ligand can be favorably used as an energy donor.

As will be described later, as for the energy transfer by the Førster mechanism, it is preferable that the absorption spectrum (absorption band on the longest wavelength side (absorption band mainly derived from the S1 level)) of the energy acceptor largely overlap with the emission spectrum of the energy donor. In the case where a fluorescent material having an emission peak on a relatively short wavelength side from blue to green (400 nm to 580 nm) is used, the absorption band of the fluorescent material is also located on the short wavelength side. Therefore, an energy donor having a high triplet excitation energy is preferably used in order that the absorption band and the emission spectrum of the energy donor largely overlap with each other.

When a phosphorescent material having a five-membered ring skeleton is used as the compound 133, energy transfer by the Førster mechanism can be utilized efficiently while energy transfer by the Dexter mechanism is inhibited; therefore, when the compound 133 serving as the energy donor is added to the light-emitting layer 130, the concentration thereof can be increased. As a result, increasing the rate of energy transfer by the Förster mechanism and inhibiting energy transfer by the Dexter mechanism, which are originally conflicting phenomena, can be concurrently caused. The concentration of the compound 133 with respect to the host material is preferably higher than or equal to 2 wt % and lower than or equal to 30 wt %, further preferably higher than or equal to 5 wt % and lower than or equal to 20 wt %, still further preferably higher than or equal to 5 wt % and lower than or equal to 15 wt %. With such a structure, the rate of energy transfer by the Forster mechanism can be increased; thus, a light-emitting device with high emission efficiency can be obtained. Since the emission efficiency can be improved using a fluorescent material having high stability, a highly reliable light-emitting device can be fabricated. The concentration of the compound 133 and the concentration of the compound 132, which is a fluorescent material, are preferably high. In addition, the concentration of the compound 133 is preferably as high as the concentration of the compound 132. Specifically, the concentration ratio of the compound 133 to the compound 132 is preferably greater than or equal to 1:0.2 and less than or equal to 1:5, further preferably greater than or equal to 1:0.5 and less than or equal to 1:2.

Structure Example 2 of Light-Emitting Layer

Figure 4A:
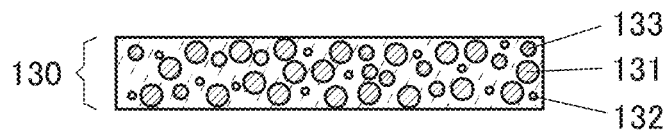
FIG. 4A is a schematic cross-sectional view of a light-emitting layer of a light-emitting device of one embodiment of the present invention.
Figure 4B:
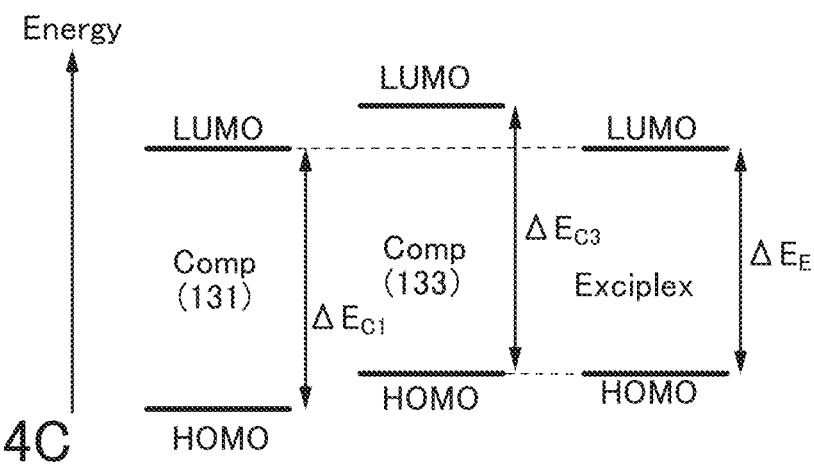
FIG. 4B and FIG. 4C are diagrams showing the correlation between energy levels of the light-emitting device of one embodiment of the present invention.
Figure 4C:
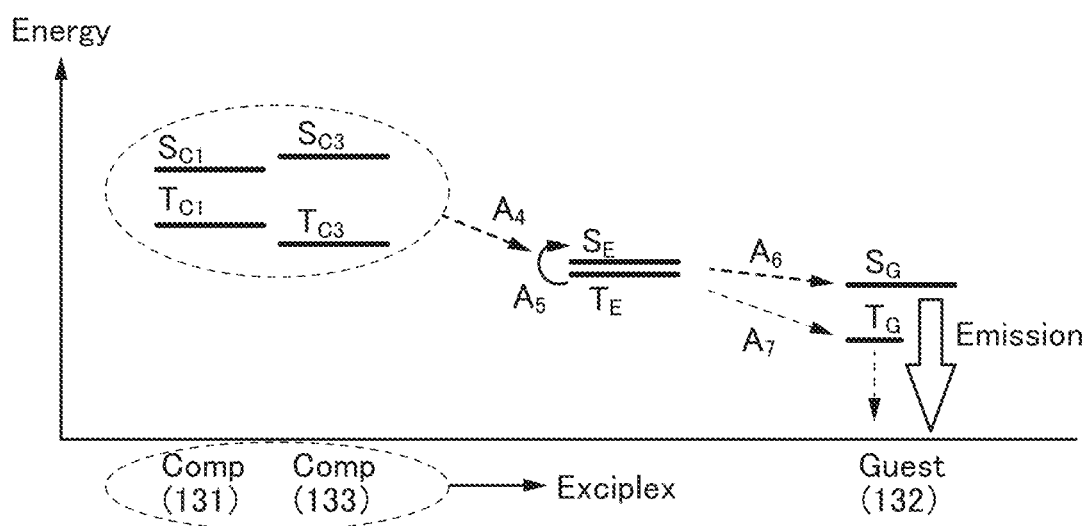

FIG. 4C shows an example of the correlation between energy levels in the light-emitting layer 130 of the light-emitting device 150 of one embodiment of the present invention. The light-emitting layer 130 illustrated in FIG. 4A contains the compound 131, the compound 132, and also the compound 133. In one embodiment of the present invention, the compound 132 is preferably a fluorescent material. In this structure example, the compound 131 and the compound 133 form an exciplex in combination. Note that the case where the compound 133 is a phosphorescent material having a five-membered ring skeleton is described below.

Although any combination of the compound 131 and the compound 133 that can form an exciplex is acceptable, it is further preferable that one of them be a compound having a function of transporting holes (hole-transport property) and the other be a compound having a function of transporting electrons (electron-transport property). In this case, a donor-acceptor exciplex is easily formed; thus, efficient formation of an exciplex is possible. In the case where the combination of the compound 131 and the compound 133 is a combination of a compound having a hole-transport property and a compound having an electron-transport property, the carrier balance can be easily controlled by the mixture ratio. Specifically, the ratio of the compound having a hole-transport property to the compound having an electron-transport property is preferably within a range of 1:9 to 9:1 (weight ratio). Since the carrier balance can be easily controlled with the structure, a carrier recombination region can also be controlled easily. The phosphorescent material having a five-membered ring skeleton is likely to have a high HOMO level. Therefore, it can be favorably used as a material having a hole-transport property.

For the combination of host materials for forming an exciplex efficiently, it is preferable that the HOMO level of one of the compound 131 and the compound 133 be higher than the HOMO level of the other and the LUMO level of the one of the compounds be higher than the LUMO level of the other. Note that the HOMO level of the compound 131 may be equivalent to the HOMO level of the compound 133, or the LUMO level of the compound 131 may be equivalent to the LUMO level of the compound 133.

Note that the LUMO levels and the HOMO levels of the compounds can be derived from the electrochemical characteristics (reduction potentials and oxidation potentials) of the compounds that are measured by cyclic voltammetry (CV) measurement.

When the compound 133 has a hole-transport property and the compound 131 has an electron-transport property, for example, it is preferable that the HOMO level of the compound 133 be higher than the HOMO level of the compound 131 and that the LUMO level of the compound 133 be higher than the LUMO level of the compound 131, as in an energy band diagram in FIG. 4B. Such energy level correlation is suitable because holes and electrons that are carriers injected from the pair of electrodes (the electrode 101 and the electrode 102) are easily injected into the compound 133 and the compound 131, respectively.

As to terms and reference numerals in FIG. 4B, Comp (131) represents the compound 131, Comp (133) represents the compound 133, $\Delta E_{C1}$ represents the energy difference between the LUMO level and the HOMO level of the compound 131, $\Delta E_{C3}$ represents the energy difference between the LUMO level and the HOMO level of the compound 133, and $\Delta E_E$ represents the energy difference between the LUMO level of the compound 131 and the HOMO level of the compound 133.

The exciplex formed by the compound 131 and the compound 133 is an exciplex that has HOMO of the molecular orbital in the compound 133 and LUMO of the molecular orbital in the compound 131. The excitation energy of the exciplex substantially corresponds to the energy difference ($\Delta E_E$) between the LUMO level of the compound 131 and the HOMO level of the compound 133, which is smaller than the energy difference ($\Delta E_{C1}$) between the LUMO level and the HOMO level of the compound 131 and the energy difference ($\Delta E_{C3}$) between the LUMO level and the HOMO level of the compound 133. Thus, when the compound 131 and the compound 133 form an exciplex, an excited state can be formed with lower excitation energy. Having lower excitation energy, the exciplex can form a stable excited state.

FIG. 4C shows the correlation between the energy levels of the compound 131, the compound 132, and the compound 133 in the light-emitting layer 130. The following explains what the terms and numerals in FIG. 4C represent.

Comp (131): compound 131
Comp (133): compound 133
Guest (132): compound 132
$S_{C1}$: S1 level of compound 131
$T_{C1}$: T1 level of compound 131
$S_{C3}$: S1 level of compound 133
$T_{C3}$: S1 level of compound 133
$S_G$: S1 level of compound 132
$T_G$: T1 level of compound 132
$S_E$: S1 level of exciplex
$T_E$: T1 level of exciplex In the light-emitting device of one embodiment of the present invention, the compound 131 and the compound 133 contained in the light-emitting layer 130 form an exciplex. The S1 level ($S_E$) of the exciplex and the T1 level ($T_E$) of the exciplex are energy levels adjacent to each other (see Route $A_4$ in FIG. 4C).

Because the excitation energy levels ($S_E$ and $T_E$) of the exciplex are lower than the S1 levels ($S_{C1}$ and $S_{C3}$) of the substances (the compound 131 and the compound 133) that form an exciplex, an excited state can be formed with lower excitation energy. Accordingly, the driving voltage of the light-emitting device 150 can be reduced.

Since the S1 level ($S_E$) and the T1 level ($T_E$) of the exciplex are energy levels adjacent to each other, reverse intersystem crossing occurs easily, i.e., the exciplex has a TADF property. Therefore, the exciplex has a function of converting triplet excitation energy into singlet excitation energy by upconversion (Route $A_5$ in FIG. 4C). The singlet excitation energy of the exciplex can rapidly be transferred to the compound 132 (Route $A_6$ in FIG. 4C). At this time, $S_E$ $S_G$ is preferable. In Route $A_6$, the exciplex serves as an energy donor and the compound 132 serves as an energy acceptor. Specifically, when the level of energy with a wavelength of the line obtained by extrapolating a tangent to the fluorescence spectrum of the exciplex at a tail on the short wavelength side is $S_E$ and the level of energy with a wavelength of the absorption edge of the absorption spectrum of the compound 132 or the level of energy with a wavelength of the line obtained by extrapolating a tangent to the fluorescence spectrum at a tail on the short wavelength side is $S_G$, $S_E$ $S_G$ is preferably satisfied.

Note that in order to improve the TADF property, it is preferable that the T1 levels of both of the compound 131 and the compound 133, that is, $T_{C1}$ and $T_{C3}$ be higher than or equal to $T_E$. As the index for them, the emission peak wavelengths of the phosphorescent spectra of the compound 131 and the compound 133 on the shortest wavelength side are each preferably less than or equal to the maximum emission peak wavelength of the exciplex. When the level of energy with a wavelength of the line obtained by extrapolating a tangent to the emission spectrum of the exciplex at a tail on the short wavelength side is $T_E$ and the levels of energies with wavelengths of the lines obtained by extrapolating tangents to the phosphorescence spectra of the compound 131 and the compound 133 at a tail on the short wavelength side are $T_{C1}$ and $T_{C3}$, respectively, $T_E-T_{C1} \leq 0.2$ eV and $T_E-T_{C3} \leq 0.2$ eV are preferably satisfied.

In this structure example, a compound containing a heavy atom is used as one of the compounds that form an exciplex. Thus, intersystem crossing between a singlet state and a triplet state is promoted. Thus, an exciplex that is capable of converting the triplet excitation energy into light emission can be formed. In this case, the triplet excitation energy level ($T_E$) of the exciplex can be the level of an energy donor; thus, $T_E$ is preferably higher than or equal to the singlet excitation energy level ($S_G$) of the compound 132, which is a light-emitting material. Specifically, when the level of energy with a wavelength of the line obtained by extrapolating a tangent to the emission spectrum of the exciplex containing a heavy atom at a tail on the short wavelength side is $T_E$ and the level of energy with a wavelength of the absorption edge of the absorption spectrum of the compound 132 or the level of the energy with a wavelength of the line obtained by extrapolating a tangent to the emission spectrum at a tail on the short wavelength side is $S_G$, $T_E \geq S_G$ is preferably satisfied.

With such energy level correlation, the triplet excitation energy of the formed exciplex can be transferred from the triplet excitation energy level ($T_E$) of the exciplex to the singlet excitation energy level ($S_G$) of the compound 132 directly or via the singlet excitation energy level ($S_E$). Note that it is difficult to clearly distinguish fluorescence and phosphorescence from each other in an emission spectrum in some cases because the S1 level ($S_E$) and the T1 level ($T_E$) of the exciplex are energy levels adjacent to each other. In that case, fluorescence and phosphorescence can be sometimes distinguished from each other by the emission lifetime.

Triplet excitation energy generated in the light-emitting layer 130 is transferred through Route $A_4$ and from the S1 level of the exciplex to the S1 level of the guest material (Route $A_6$), resulting in light emission of the guest material. Thus, the use of a combination of materials that form an exciplex in the light-emitting layer 130 can improve the emission efficiency of the fluorescent light-emitting device.

Note that the compound containing a heavy atom used in the above structure preferably contains a heavy atom such as Ir, Pt, Os, Ru, or Pd. The compound containing the heavy atom is preferably a phosphorescent material. In contrast, in this structure example, a phosphorescent material serves as an energy donor and is one of the materials that form an exciplex; thus, the quantum yield can be either high or low. That is, energy transfer from the triplet excitation energy level of the exciplex to the singlet excitation energy level of the guest material directly or via the singlet excitation energy level is acceptable as long as it is allowable transition. The energy transfer from the phosphorescent material or the exciplex formed using a phosphorescent material to the guest material is preferred, in which case energy transfer from the triplet excitation energy level of the energy donor to the singlet excitation energy level of the guest material (energy acceptor) is allowable transition. Thus, there is a pathway in which the triplet excitation energy of the exciplex is transferred to the S1 level ($S_G$) of the guest material through the process of Route $A_6$ without through the process of Route $A_5$ in FIG. 4C. In Route $A_6$, the exciplex serves as an energy donor and the compound 132 serves as an energy acceptor.

In the light-emitting device of one embodiment of the present invention, a guest material in which a luminophore has protecting groups is used as the compound 132. Such a structure can inhibit energy transfer by the Dexter mechanism that is represented by Route $A_7$ as described above, leading to inhibition of deactivation of triplet excitation energy. Thus, a fluorescent light-emitting device with high emission efficiency can be obtained.

In one embodiment of the present invention, the phosphorescent material having a five-membered ring skeleton is used. Such a structure can inhibit energy transfer by the Dexter mechanism that is represented by Route $A_7$ as described above, leading to inhibition of deactivation of triplet excitation energy. Furthermore, recombination of carriers in the compound 132 can be inhibited. Thus, a fluorescent light-emitting device with high emission efficiency can be obtained.

The above-described processes through Routes $A_4$ to $A_6$ may be referred to as ExSET (Exciplex-Singlet Energy Transfer) or ExEF (Exciplex-Enhanced Fluorescence) in this specification and the like. In other words, in the light-emitting layer 130, excitation energy is supplied from the exciplex to the fluorescent material.

Structure Example 3 of Light-Emitting Layer

Figure 5A:
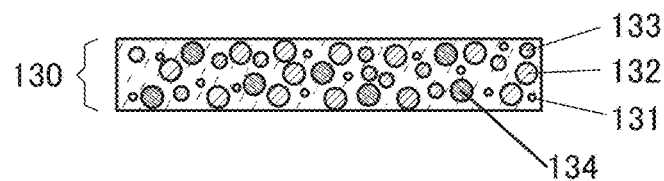
FIG. 5A is a schematic cross-sectional view of a light-emitting layer of a light-emitting device of one embodiment of the present invention.

FIG. 5A illustrates the case where four kinds of materials are used in the light-emitting layer 130. The light-emitting layer 130 in FIG. 5A contains the compound 131, the compound 132, the compound 133, and a compound 134. In one embodiment of the present invention, the compound 133 has a function of converting triplet excitation energy into light emission. In this structure example, the case where the compound 133 is a phosphorescent material having a five-membered ring skeleton is described. The compound 132 is a guest material that emits fluorescence. The compound 131 is an organic compound that forms an exciplex together with the compound 134.

Figure 5B:
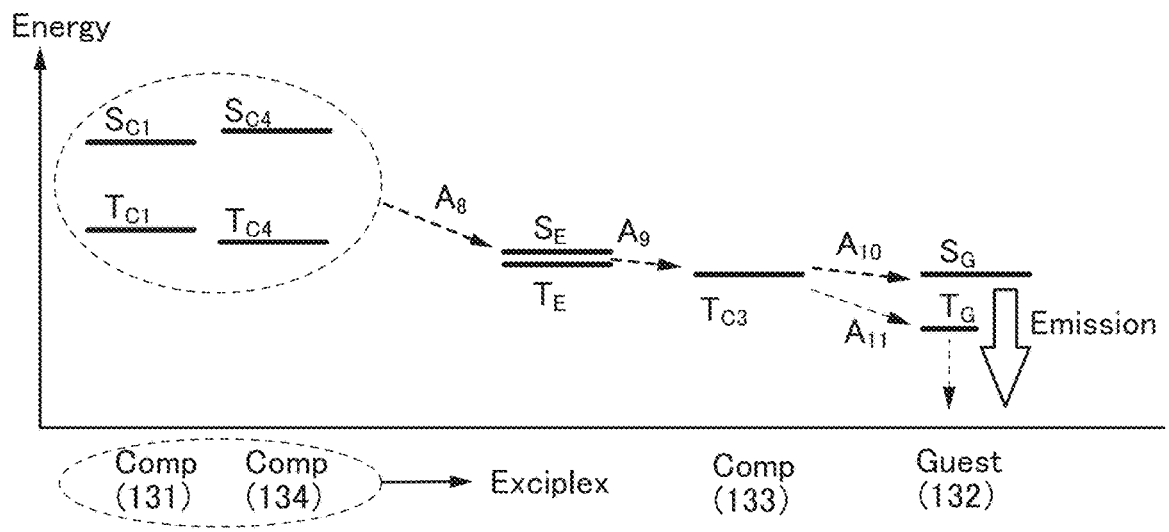
FIG. 5B and FIG. 5C are diagram showing correlation between energy levels of the light-emitting device of one embodiment of the present invention.

FIG. 5B shows the correlation between the energy levels of the compound 131, the compound 132, the compound 133, and the compound 134 in the light-emitting layer 130. The following explains what terms and signs in FIG. 5B represent, and the other terms and signs are the same as the terms and the signs in FIG. 2B.

$S_{C4}$: S1 level of compound 134
$T_{C4}$: T1 level of compound 134

In the light-emitting device of one embodiment of the present invention described in this structure example, the compound 131 and the compound 134 contained in the light-emitting layer 130 form an exciplex. The S1 level ($S_E$) of the exciplex and the T1 level ($T_E$) of the exciplex are energy levels adjacent to each other (see Route $A_8$ in FIG. 5B).

As described above, when the exciplex formed through the above process loses excitation energy, the two substances that have formed the exciplex individually behave as the original separate substances.

Because the excitation energy levels ($S_E$ and $T_E$) of the exciplex are lower than the S1 levels ($S_{C1}$ and $S_{C4}$) of the substances (the compound 131 and the compound 134) that form an exciplex, an excited state can be formed with lower excitation energy. Accordingly, the driving voltage of the light-emitting device 150 can be reduced.

Here, when the compound 133 is a phosphorescent material, intersystem crossing between a singlet state and a triplet state is allowed. Hence, both the singlet excitation energy and the triplet excitation energy of the exciplex are rapidly transferred to the compound 133 (Route $A_9$). At this time, $T_E \geq T_{C3}$ is preferably satisfied. In addition, the triplet excitation energy of the compound 133 can be efficiently converted into the singlet excitation energy of the compound 132 (Route $A_{10}$). Here, $T_E \geq T_{C3} \geq S_G$ as shown in FIG. 5B is preferable, in which case the excitation energy of the compound 133 is efficiently transferred as the singlet excitation energy to the compound 132 serving as the guest material. Specifically, when the level of energy with a wavelength of the line obtained by extrapolating a tangent to the phosphorescence spectrum of the compound 133 at a tail on the short wavelength side is $T_{C3}$ and the level of energy with a wavelength of the absorption edge of the absorption spectrum of the compound 132 or the level of the energy with a wavelength of the line obtained by extrapolating a tangent to the fluorescence spectrum at a tail on the short wavelength side is $S_G$, $T_{C3} \geq S_G$ is preferably satisfied. In Route $A_{10}$, the compound 133 serves as an energy donor and the compound 132 serves as an energy acceptor.

Although any combination of the compound 131 and the compound 134 that can form an exciplex is acceptable, it is further preferable that one of them be a compound having a hole-transport property and the other be a compound having an electron-transport property.

For the combination of materials for forming an exciplex efficiently, it is preferable that the HOMO level of one of the compound 131 and the compound 134 be higher than the HOMO level of the other and the LUMO level of the one of the compounds be higher than the LUMO level of the other.

The correlation between the energy levels of the compound 131 and the compound 134 is not limited to that shown in FIG. 5B. In other words, the singlet excitation energy level ($S_{C1}$) of the compound 131 may be higher or lower than the singlet excitation energy level ($S_{C4}$) of the compound 134. The triplet excitation energy level ($T_{C1}$) of the compound 131 may be higher or lower than the triplet excitation energy level ($T_{C4}$) of the compound 134.

In the light-emitting device of one embodiment of the present invention, the compound 131 preferably has a π-electron deficient skeleton. Such a composition lowers the LUMO level of the compound 131, which is suitable for formation of an exciplex.

In the light-emitting device of one embodiment of the present invention, the compound 131 preferably has a π-electron rich skeleton. Such a composition increases the HOMO level of the compound 131, which is suitable for formation of an exciplex.

In the light-emitting device of one embodiment of the present invention, a guest material in which a luminophore has protecting groups is used as the compound 132. Such a structure can inhibit energy transfer by the Dexter mechanism that is represented by Route $A_{11}$ as described above, leading to inhibition of deactivation of triplet excitation energy. Thus, a fluorescent light-emitting device with high emission efficiency can be obtained.

In one embodiment of the present invention, a phosphorescent material having a five-membered ring skeleton is used as the compound 133. Such a structure can inhibit energy transfer by the Dexter mechanism that is represented by Route $A_{11}$ as described above, leading to inhibition of deactivation of triplet excitation energy. Furthermore, recombination of carriers in the compound 132 can be inhibited. Thus, a fluorescent light-emitting device with high emission efficiency can be obtained.

Note that the above-described processes through Routes $A_8$ and $A_9$ may be referred to as ExTET (Exciplex-Triplet Energy Transfer) in this specification and the like. In other words, in the light-emitting layer 130, excitation energy is supplied from the exciplex to the compound 133. Thus, this structure example can be referred to as a structure in which a fluorescent material having protecting groups is mixed in a light-emitting layer capable of utilizing ExTET.

Structure Example 4 of Light-Emitting Layer

In this structure example, the case where a material having a TADF property is used as the compound 134 described in above Structure example 3 of light-emitting layer will be described.

Figure 5C:
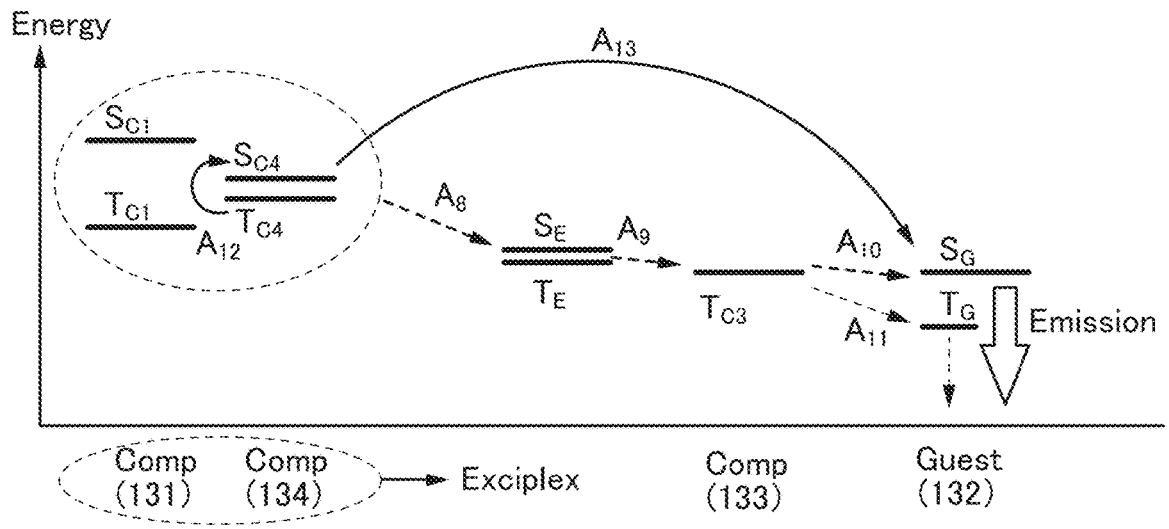

FIG. 5C shows the case where four kinds of materials are used in the light-emitting layer 130. The light-emitting layer 130 in FIG. 5C contains the compound 131, the compound 132, the compound 133, and the compound 134. In one embodiment of the present invention, the compound 133 has a function of converting triplet excitation energy into light emission. The compound 132 is a guest material that emits fluorescence. The compound 131 is an organic compound that forms an exciplex together with the compound 134. In this structure example, the case where the compound 133 is a phosphorescent material having a five-membered ring skeleton is described.

Here, since the compound 134 is the TADF material, the compound 134 that does not form an exciplex has a function of converting triplet excitation energy into singlet excitation energy by upconversion (Route Au in FIG. 5C). The singlet excitation energy of the compound 134 can be rapidly transferred to the compound 132 (Route $A_{13}$ in FIG. 5C). At this time, $S_{C4} S_G$ is preferably satisfied. Specifically, when the level of energy with a wavelength of the line obtained by extrapolating a tangent to the fluorescence spectrum of the compound 134 at a tail on the short wavelength side is $S_{C4}$ and the level of energy with a wavelength of the absorption edge of the absorption spectrum of the compound 132 or the level of the energy with a wavelength of the line obtained by extrapolating a tangent to the fluorescence spectrum at a tail on the short wavelength side is $S_G$, $S_{C4} \geq S_G$ is preferably satisfied.

As described in the above structure example of the light-emitting layer, the light-emitting device of one embodiment of the present invention has a pathway where the triplet excitation energy is transferred to the compound 132 serving as a guest material through Route $A_8$ to Route $A_{10}$ in FIG. 5B and a pathway where the triplet excitation energy is transferred to the compound 132 through Route $A_{11}$ and Route $A_{13}$ in FIG. 5C. A plurality of pathways through each of which the triplet excitation energy is transferred to the fluorescent material can further improve the emission efficiency. In Route $A_{10}$, the compound 133 serves as an energy donor and the compound 132 serves as an energy acceptor. In Route $A_{13}$, the compound 134 serves as an energy donor and the compound 132 serves as an energy acceptor.

In the light-emitting device of one embodiment of the present invention, a guest material in which a luminophore has protecting groups is used as the compound 132. Such a structure can inhibit energy transfer by the Dexter mechanism that is represented by Route $A_{11}$ as described above, leading to inhibition of deactivation of triplet excitation energy. Thus, a fluorescent light-emitting device with high emission efficiency can be obtained.

In one embodiment of the present invention, a phosphorescent material having a five-membered ring skeleton is used as the compound 133. Such a structure can inhibit energy transfer by the Dexter mechanism that is represented by Route $A_{11}$ as described above, leading to inhibition of deactivation of triplet excitation energy. Furthermore, recombination of carriers in the compound 132 can be inhibited. Thus, a fluorescent light-emitting device with high emission efficiency can be obtained.

<Energy Transfer Mechanism>

Here, the Førster mechanism and the Dexter mechanism will be described. As to supply of excitation energy from a first material in an excited state to a second material in a ground state, an intermolecular energy transfer process between the first material and the second material will be described here; the same can be applied to the case where one of them is an exciplex.

<<FøRster Mechanism>>

In the Forster mechanism, energy transfer does not require direct intermolecular contact and energy is transferred through a resonant phenomenon of dipolar oscillation between a first material and a second material. By the resonant phenomenon of dipolar oscillation, the first material provides energy to the second material, and thus, the first material in an excited state is brought into a ground state and the second material in a ground state is brought into an excited state. Note that the rate constant $k_{h^* \to g}$ of the Førster mechanism is expressed by Equation (1).

[Equation 1]

$$k_{h^* \to g} = \frac{9000c^4 K^2 \phi \ln 10}{128\pi^5 n^4 N \tau R^6} \int \frac{f'_h{}^{(\nu)} \varepsilon'_g{}^{(\nu)}}{\nu^4} d\nu \quad (1)$$

In Equation (1), v denotes a frequency; $f_h(\nu)$, a normalized emission spectrum of the first material (a fluorescent spectrum in the case where energy transfer from a singlet excited state is discussed, or a phosphorescent spectrum in the case where energy transfer from a triplet excited state is discussed); $\varepsilon_g(\nu)$ a molar absorption coefficient of the second material; N, Avogadro's number; n, a refractive index of a medium; R, an intermolecular distance between the first material and the second material; τ, a measured lifetime of an excited state (fluorescence lifetime or phosphorescence lifetime); c, the speed of light; φ, a luminescence quantum yield (a fluorescence quantum yield in the case where energy transfer from a singlet excited state is discussed, or a phosphorescence quantum yield in the case where energy transfer from a triplet excited state is discussed); and $K^2$, a coefficient (0 to 4) of orientation of a transition dipole moment between the first material and the second material. Note that $K^2 = 2/3$ in random orientation.

<<Dexter Mechanism>>

In the Dexter mechanism, the first material and the second material are close to a contact effective range where their orbitals overlap, and the first material in an excited state and the second material in a ground state exchange their electrons, which leads to energy transfer. Note that the rate constant $k_{h^* \to g}$ of the Dexter mechanism is expressed by Equation (2).

[Equation 2]

$$k_{h^* \to g} = \left(\frac{2\pi}{h}\right) K^2 \exp\left(-\frac{2R}{L}\right) \int f'_h{}^{(\nu)} \varepsilon'_g{}^{(\nu)} d\nu \quad (2)$$

In Equation (2), h denotes a Planck constant; K, a constant having an energy dimension; v, a frequency; $f_h(\nu)$, a normalized emission spectrum of the first material (the fluorescent spectrum in the case where energy transfer from a singlet excited state is discussed, or the phosphorescent spectrum in the case where energy transfer from a triplet excited state is discussed), $\varepsilon'_g(\nu)$, a normalized absorption spectrum of the second material; L, an effective molecular radius; and R, an intermolecular distance between the first material and the second material.

Here, the efficiency of energy transfer $\phi_{ET}$ from the first material to the second material is expressed by Equation (3). Note that $k_r$ denotes a rate constant of a light-emission process (fluorescence in the case where energy transfer from a singlet excited state is discussed, or phosphorescence in the case where energy transfer from a triplet excited state is discussed) of the first material; $k_n$, a rate constant of a non-light-emission process (thermal deactivation or intersystem crossing) of the second material; and z, a measured lifetime of an excited state of the first material.

[Equation 3]

$$\phi_{ET} = \frac{k_{h^* \to g}}{k_r + k_n + k_{h^* \to g}} = \frac{k_{h^* \to g}}{\left(\frac{1}{\tau}\right) + k_{h^* \to g}} \quad (3)$$

According to Equation (3), it is found that the energy transfer efficiency $\phi_{ET}$ can be increased by increasing the rate constant $k_{h^* \to g}$ of energy transfer so that another competing rate constant $k_r + k_n$ ($=1/\tau$) becomes relatively small.

<<Concept for Promoting Energy Transfer>>

First, energy transfer by the Forster mechanism is considered. When Equation (1) is substituted into Equation (3), τ can be eliminated. Thus, in the case of the Førster mechanism, the energy transfer efficiency $\phi_{ET}$ does not depend on the lifetime τ of the excited state of the first material. Furthermore, it can be said that high energy transfer efficiency $\phi_{ET}$ is obtained when the emission quantum yield φ is high.

Furthermore, it is preferable that the emission spectrum of the first material largely overlap with the absorption spectrum of the second material (absorption corresponding to transition from a singlet ground state to a singlet excited state). Moreover, it is preferable that the molar absorption coefficient of the second material be also high. This means that the emission spectrum of the first material overlaps with the absorption band of the second material which is on the longest wavelength side. Note that since direct transition from the singlet ground state to the triplet excited state of the second material is forbidden, the molar absorption coefficient of the second material in the triplet excited state can be ignored. Thus, a process of energy transfer from an excited state of the first material to a triplet excited state of the second material by the Førster mechanism can be ignored, and only a process of energy transfer to a singlet excited state of the second material is considered.

The rate of energy transfer by the Forster mechanism is inversely proportional to the 6th power of the intermolecular distance R between the first material and the second material, according to Equation (1). As described above, when R is less than or equal to 1 nm, energy transfer by the Dexter mechanism is dominant. Therefore, to increase the rate of energy transfer by the Førster mechanism while inhibiting energy transfer by the Dexter mechanism, the intermolecular distance is preferably greater than or equal to 1 nm and less than or equal to 10 nm. This requires the above protecting groups to be not too bulky; thus, the number of carbon atoms of the protecting groups is preferably 3 to 10.

Next, energy transfer by the Dexter mechanism is considered. According to Equation (2), in order to increase the rate constant $k_{h^* \to g}$, it is preferable that the emission spectrum of the first material (the fluorescence spectrum in the case where energy transfer from a singlet excited state is discussed, or the phosphorescence spectrum in the case where energy transfer from a triplet excited state is discussed) largely overlap with an absorption spectrum of the second material (absorption corresponding to transition from a singlet ground state to a singlet excited state). Therefore, the energy transfer efficiency can be optimized by making the emission spectrum of the first material overlap with the absorption band of the second material which is on the longest wavelength side.

When Equation (2) is substituted into Equation (3), it is found that the energy transfer efficiency $\phi_{ET}$ in the Dexter mechanism depends on τ. In the Dexter mechanism, which is a process of energy transfer based on the electron exchange, as well as the energy transfer from the singlet excited state of the first material to the singlet excited state of the second material, energy transfer from the triplet excited state of the first material to the triplet excited state of the second material occurs.

In the light-emitting device of one embodiment of the present invention in which the second material is a fluorescent material, the efficiency of energy transfer to the triplet excited state of the second material is preferably low. That is, the efficiency of energy transfer based on the Dexter mechanism from the first material to the second material is preferably low and the efficiency of energy transfer based on the Forster mechanism from the first material to the second material is preferably high.

As described above, the energy transfer efficiency in the Førster mechanism does not depend on the lifetime τ of the excited state of the first material. In contrast, the energy transfer efficiency in the Dexter mechanism depends on the excitation lifetime τ of the first material; to reduce the energy transfer efficiency in the Dexter mechanism, the excitation lifetime τ of the first material is preferably short.

Thus, in one embodiment of the present invention, an exciplex, a phosphorescent material, or a TADF material is used as the first material. These materials each have a function of converting triplet excitation energy into light emission. The energy transfer efficiency of the Førster mechanism depends on the emission quantum yield of the energy donor; thus, the excitation energy of the first material capable of converting the triplet excited state energy into light emission, such as a phosphorescent material, an exciplex, or a TADF material, can be transferred to the second material by the Forster mechanism. Meanwhile, with the structure of one embodiment of the present invention, reverse intersystem crossing from the triplet excited state to the singlet excited state of the first material (exciplex or TADF material) can be promoted, and the excitation lifetime τ of the triplet excited state of the first material can be short. Furthermore, transition from the triplet excited state to the singlet ground state of the first material (phosphorescent material or exciplex using a phosphorescent material) can be promoted, and the excitation lifetime τ of the triplet excited state of the first material can be short. As a result, the energy transfer efficiency from the triplet excited state of the first material to the triplet excited state of the fluorescent material (second material) in the Dexter mechanism can be reduced.

In the light-emitting device of one embodiment of the present invention, a fluorescent material having protecting groups is used as the second material, as described above. Therefore, the intermolecular distance between the first material and the second material can be large. In the light-emitting device of one embodiment of the present invention, a material having a function of converting triplet excitation energy into light emission is used as the first material, and a fluorescent material having protecting groups is used as the second material, whereby the efficiency of energy transfer by the Dexter mechanism can be reduced. As a result, non-radiative decay of the triplet excitation energy in the light-emitting layer 130 can be inhibited, so that a light-emitting device with high emission efficiency can be provided.

<Materials>

Next, the components of the light-emitting device of one embodiment of the present invention will be described in detail below.

<<Light-Emitting Layer>>

Materials that can be used for the light-emitting layer 130 are described below. In the light-emitting layer of the light-emitting device of one embodiment of the present invention, an energy acceptor having a function of converting triplet excitation energy into light emission and an energy donor in which a luminophore has protecting groups are used. As the material having a function of converting triplet excitation energy into light emission, a TADF material and a phosphorescent material are given.

Examples of the luminophore included in the compound 132 serving as an energy acceptor include a phenanthrene skeleton, a stilbene skeleton, an acridone skeleton, a phenoxazine skeleton, and a phenothiazine skeleton. Specifically, fluorescent compounds having a naphthalene skeleton, an anthracene skeleton, a fluorene skeleton, a chrysene skeleton, a triphenylene skeleton, a tetracene skeleton, a pyrene skeleton, a perylene skeleton, a coumarin skeleton, a quinacridone skeleton, and a naphthobisbenzofuran skeleton are preferable because of their high fluorescence quantum yields.

The protecting group is preferably an alkyl group having 1 to 10 carbon atoms, a cycloalkyl group having 3 to 10 carbon atoms, a branched-chain alkyl group having 3 to 10 carbon atoms, or a trialkylsilyl group having 3 to 12 carbon atoms.

Examples of the alkyl group having 1 to 10 carbon atoms include a methyl group, an ethyl group, a propyl group, a pentyl group, and a hexyl group; a branched-chain alkyl group having 3 to 10 carbon atoms, which is described later, is particularly preferable. Note that the alkyl group is not limited thereto.

Examples of the cycloalkyl group having 3 to 10 carbon atoms include a cyclopropyl group, a cyclobutyl group, a cyclohexyl group, a norbornyl group, and an adamantyl group. The cycloalkyl group is not limited thereto. In the case where the cycloalkyl group has a substituent, examples of the substituent include an alkyl group having 1 to 7 carbon atoms, such as a methyl group, an ethyl group, a propyl group, an isopropyl group, a butyl group, an isobutyl group, a sec-butyl group, a tert-butyl group, a pentyl group, or a hexyl group, a cycloalkyl group having 5 to 7 carbon atoms, such as a cyclopentyl group, a cyclohexyl group, a cycloheptyl group, or a 8,9,10-trinorbornanyl group, and an aryl group having 6 to 12 carbon atoms, such as a phenyl group, a naphthyl group, or a biphenyl group.

Examples of the branched-chain alkyl group having 3 to 10 carbon atoms include an isopropyl group, a sec-butyl group, an isobutyl group, a tert-butyl group, an isopentyl group, a sec-pentyl group, a tert-pentyl group, a neopentyl group, an isohexyl group, a 3-methylpentyl group, a 2-methylpentyl group, a 2-ethylbutyl group, a 1,2-dimethylbutyl group, and a 2,3-dimethylbutyl group. The branched-chain alkyl group is not limited thereto.

Examples of the trialkylsilyl group having 3 to 12 carbon atoms include a trimethylsilyl group, a triethylsilyl group, and a tert-butyl dimethylsilyl group. The trialkylsilyl group is not limited thereto.

In the molecular structure of the energy acceptor, it is preferable that two or more diarylamino groups be bonded to a luminophore and aryl groups of the diarylamino groups each have at least one protecting group. It is further preferable that at least two protecting groups be bonded to each of the aryl groups. This is because a larger number of protecting groups more effectively inhibit energy transfer by the Dexter mechanism in the case where the guest material is used for the light-emitting layer. To inhibit an increase in molecular weight and keep the sublimation property, the diarylamino groups are preferably diphenylamino groups.

Furthermore, when two or more amino groups are bonded to a luminophore, a fluorescent material whose emission color can be adjusted and which has a high quantum yield can be obtained. The amino groups are preferably bonded to the luminophore at symmetric positions. With such a structure, the fluorescent material can have a high quantum yield.

The protecting groups may be introduced to the luminophore via the aryl groups of the diarylamine, not directly introduced to the luminophore. Such a structure is preferably employed, in which case the protecting groups can be arranged to cover the luminophore, allowing the host material and the luminophore to be away from each other from any direction. In the case where the protecting groups are not directly bonded to the luminophore, four or more protecting groups are preferably introduced to one luminophore.

Furthermore, it is preferable that at least one of atoms of the plurality of protecting groups be positioned directly on one plane of the luminophore, that is, the condensed aromatic ring or the condensed heteroaromatic ring, and at least one of atoms of the plurality of protecting groups be positioned directly on the other plane of the condensed aromatic ring or the condensed heteroaromatic ring, as shown in FIG. 3B. The following structure is given as a specific method. In other words, the condensed aromatic ring or the condensed heteroaromatic ring, which is a luminophore, is bonded to two or more diphenylamino groups, and the phenyl groups of the two or more diphenylamino groups each independently have protecting groups at the 3-position and the 5-position.

Such a structure enables a steric configuration in which the protecting groups at the 3-position and the 5-position of the phenyl groups are positioned directly on the condensed aromatic ring or the condensed heteroaromatic ring, which is a luminophore, as shown in FIG. 3B. As a result, the upper and lower planes of the condensed aromatic ring or the condensed heteroaromatic ring can be efficiently covered, inhibiting energy transfer by the Dexter mechanism.

As the energy acceptor material described above, the organic compound represented by General formula (G1) or (G2) shown below can be favorably used.

[Chemical formulae 3]

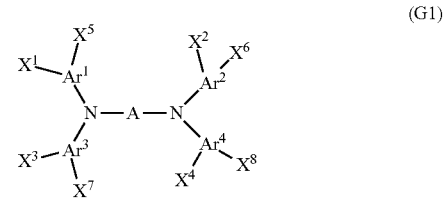

(G1)

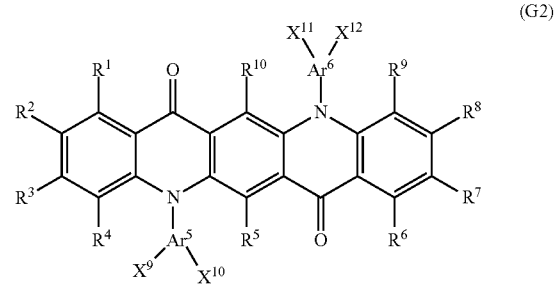

(G2)

In General formulae (G1) and (G2), A represents a substituted or unsubstituted condensed aromatic ring having 10 to 30 carbon atoms or a substituted or unsubstituted condensed heteroaromatic ring having 10 to 30 carbon atoms, $Ar^1$ to $Ar^6$ each independently represent a substituted or unsubstituted aromatic hydrocarbon group having 6 to 13 carbon atoms, $X^1$ to $X^{12}$ each independently represent any one of a branched-chain alkyl group having 3 to 10 carbon atoms, a substituted or unsubstituted cycloalkyl group having 3 to 10 carbon atoms, and a trialkylsilyl group having 3 to 10 carbon atoms, and $R^1$ to $R^{10}$ each independently represent any one of hydrogen, an alkyl group having 3 to 10 carbon atoms, a substituted or unsubstituted cycloalkyl group having 3 to 10 carbon atoms, and a trialkylsilyl group having 3 to 12 carbon atoms.

Examples of the aromatic hydrocarbon group having 6 to 13 carbon atoms include a phenyl group, a biphenyl group, a naphthyl group, and a fluorenyl group. Note that the aromatic hydrocarbon group is not limited thereto. In the case where the aromatic hydrocarbon group has a substituent, examples of the substituent include an alkyl group having 1 to 7 carbon atoms, such as a methyl group, an ethyl group, a propyl group, an isopropyl group, a butyl group, an isobutyl group, a sec-butyl group, a tert-butyl group, a pentyl group, or a hexyl group, a cycloalkyl group having 5 to 7 carbon atoms, such as a cyclopentyl group, a cyclohexyl group, a cycloheptyl group, or an 8,9,10-trinorbornanyl group, and an aryl group having 6 to 12 carbon atoms, such as a phenyl group, a naphthyl group, or a biphenyl group.

In General formula (G1), the substituted or unsubstituted condensed aromatic ring having 10 to 30 carbon atoms or the substituted or unsubstituted condensed heteroaromatic ring having 10 to 30 carbon atoms represents the luminophore; any of the above skeletons can be used. In General formulae (G1) and (G2), $X^1$ to $X^{12}$ represent protecting groups.

In General formula (G2), the protecting groups are bonded to a quinacridone skeleton, which is a luminophore, via arylene groups. With this structure, the protecting groups can be arranged to cover the luminophore; thus, energy transfer by the Dexter mechanism can be inhibited. Note that any of the protecting groups may be directly bonded to the luminophore.

As the energy acceptor material, an organic compound represented by General formula (G3) or (G4) can be suitably used.

[Chemical formulae 4]

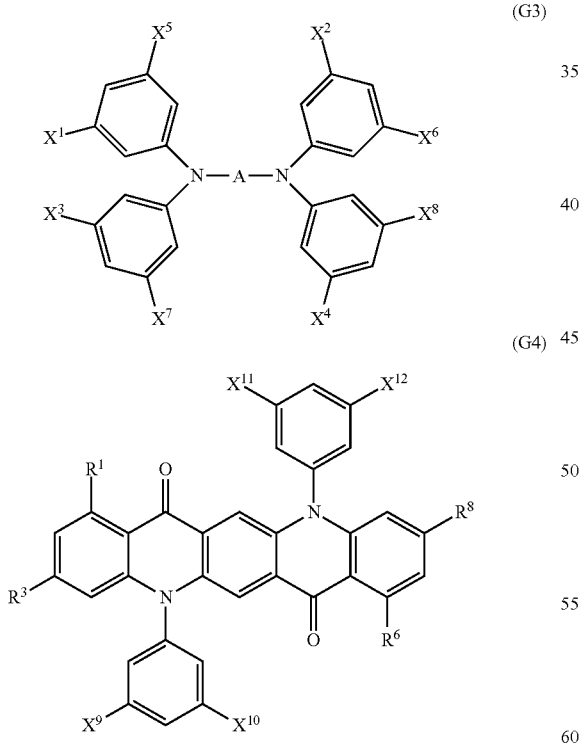

In General formulae (G3) and (G4), A represents a substituted or unsubstituted condensed aromatic ring having 10 to 30 carbon atoms or a substituted or unsubstituted condensed heteroaromatic ring having 10 to 30 carbon atoms, and $X^1$ to $X^{12}$ each independently represent any one of a branched-chain alkyl group having 3 to 10 carbon atoms, a substituted or unsubstituted cycloalkyl group having 3 to 10 carbon atoms, and a trialkylsilyl group having 3 to 10 carbon atoms.

The protecting groups are each preferably bonded to the luminophore via a phenyl group. With this structure, the protecting groups can be arranged to cover the luminophore; thus, energy transfer by the Dexter mechanism can be inhibited. In the case where the protecting groups are each bonded to the luminophore via a phenylene group and two protecting groups are bonded to the phenylene group, the two protecting groups are preferably bonded to the phenylene group at the meta-positions as shown in General formulae (G3) and (G4). With such a structure, the luminophore can be efficiently covered; thus, energy transfer by the Dexter mechanism can be inhibited. An example of the organic compound represented by General formula (G3) is 2tBu-mmtBuDPhA2Anth described above. That is, in one embodiment of the present invention, (G3) is a particularly preferable example.

As the energy acceptor material, an organic compound represented by General formula (G5) shown below can be suitably used.

[Chemical formula 5]

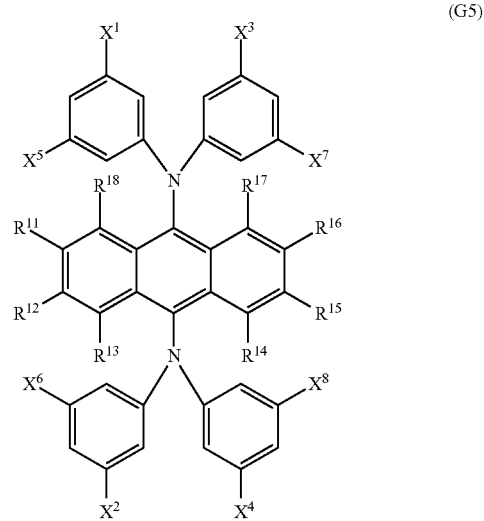

In General formula (G5), $X^1$ to $X^8$ each independently represent any one of a branched-chain alkyl group having 3 to 10 carbon atoms, a substituted or unsubstituted cycloalkyl group having 3 to 10 carbon atoms, and a trialkylsilyl group having 3 to 10 carbon atoms, and $R^{11}$ to $R^{18}$ each independently represent any one of hydrogen, a branched-chain alkyl group having 3 to 10 carbon atoms, a substituted or unsubstituted cycloalkyl group having 3 to 10 carbon atoms, a trialkylsilyl group having 3 to 10 carbon atoms, and a substituted or unsubstituted aryl group having 6 to 25 carbon atoms.

Examples of the aryl group having 6 to 25 carbon atoms include a phenyl group, a naphthyl group, a biphenyl group, a fluorenyl group, and a spirofluorenyl group. Note that an aryl group having 6 to 25 carbon atoms is not limited thereto. In the case where the aryl group has a substituent, the alkyl group having 1 to 10 carbon atoms, the branched-chain alkyl group having 3 to 10 carbon atoms, the substituted or unsubstituted cycloalkyl group having 3 to 10 carbon atoms, and the trialkylsilyl group having 3 to 10 carbon atoms, which are described above, can be given.

An anthracene compound has a high emission quantum yield and a small area of the luminophore; therefore, the upper and lower planes of anthracene can be efficiently covered with the protecting groups. An example of the organic compound represented by General formula (G5) is 2tBu-mmtBuDPhA2Anth described above.

Examples of the compounds represented by General formulae (G1) to (G5) are shown by Structural formulae (102) to (105) and (200) to (249) below. Note that the compounds represented by General formulae (G1) to (G5) are not limited thereto. The compounds represented by Structural formulae (102) to (105) and (200) to (249) can be suitably used as a guest material of the light-emitting device of one embodiment of the present invention. Note that the guest material is not limited thereto.

[Chemical formulae 6]

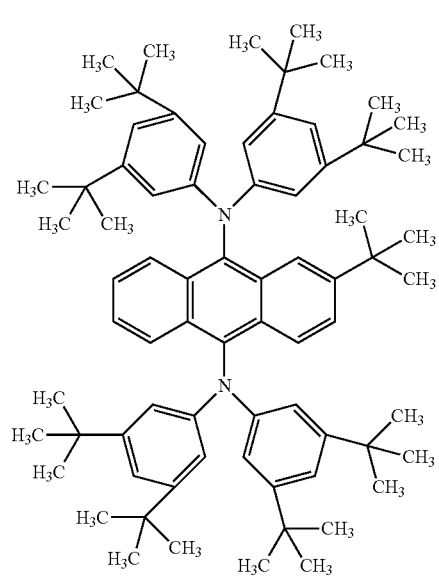
(102)

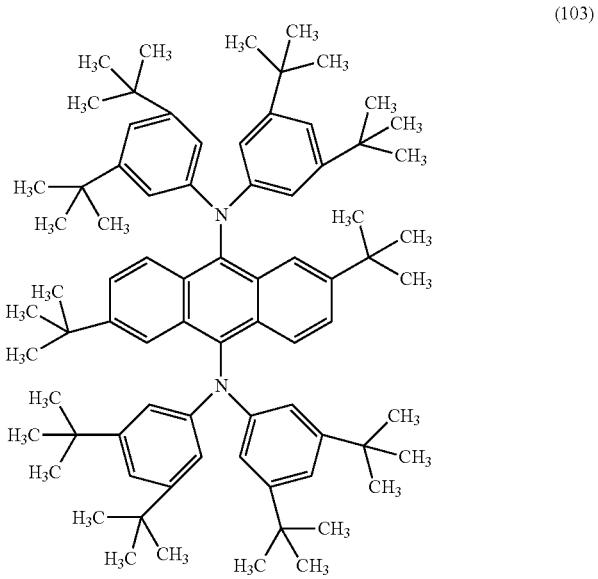
(103)

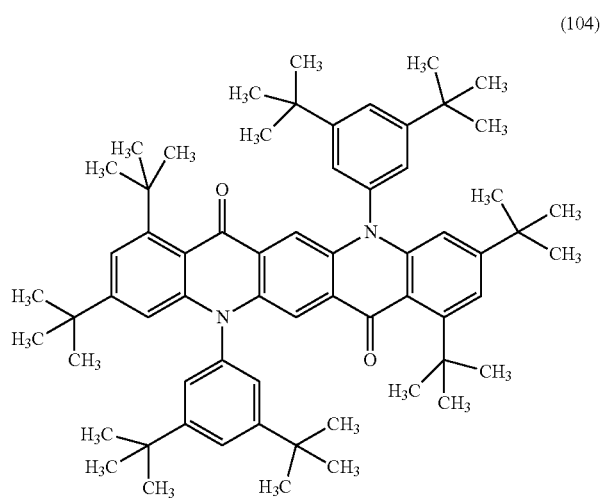
(104)

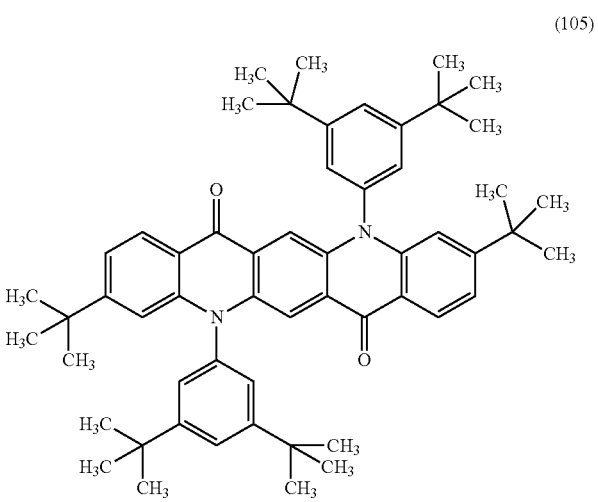
(105)

[Chemical formulae 7]
(200) 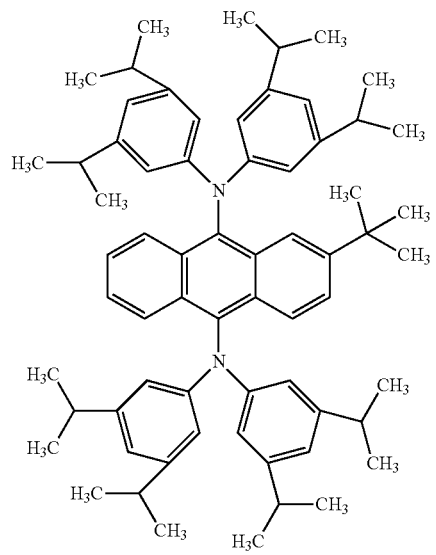
(201) 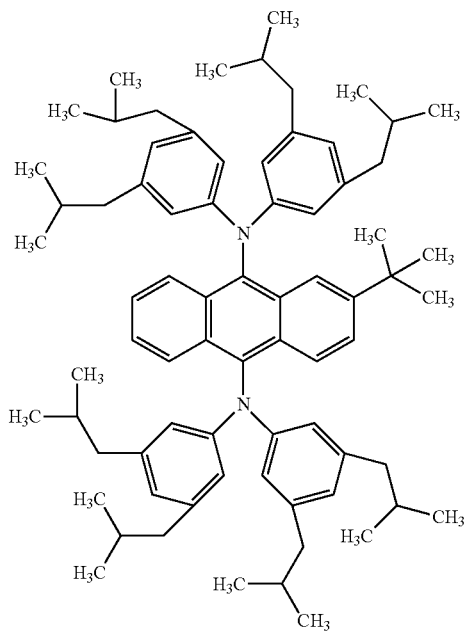
(202) 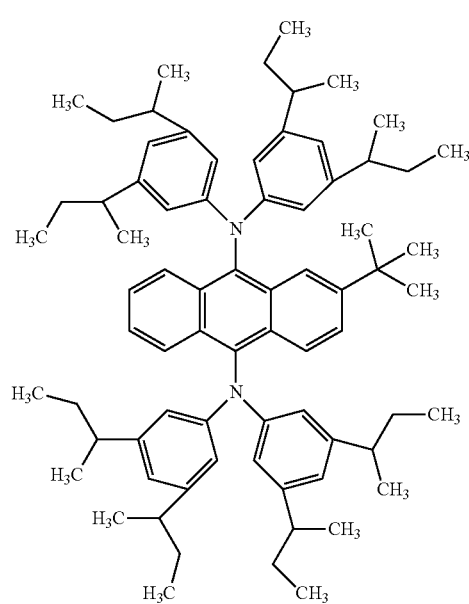
(203) 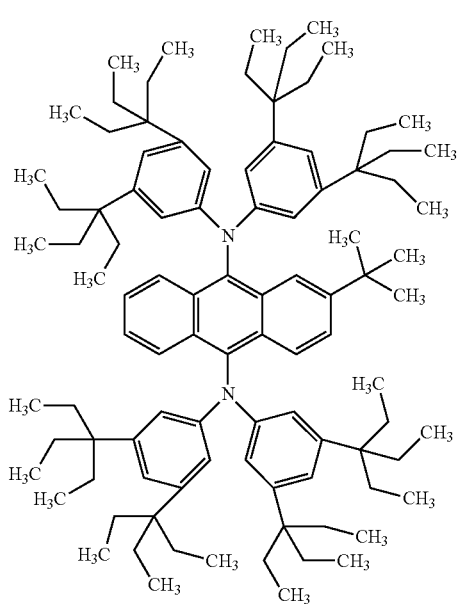

[Chemical formulae 8]
(204)
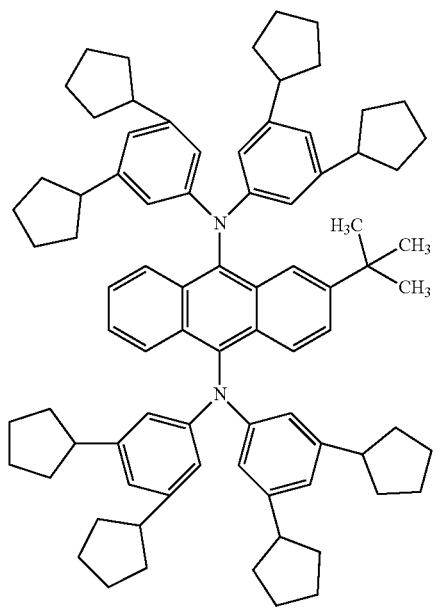
(205)
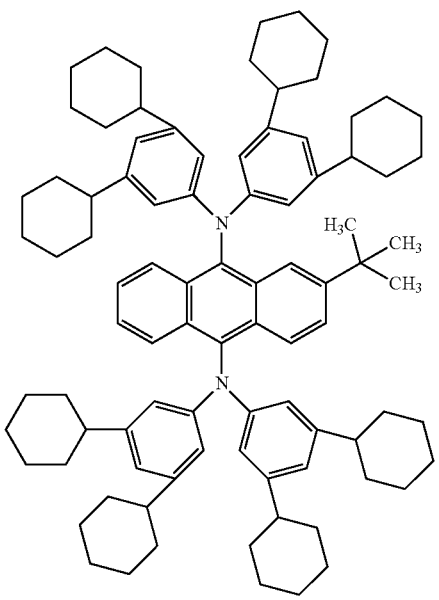
-continued
(206)
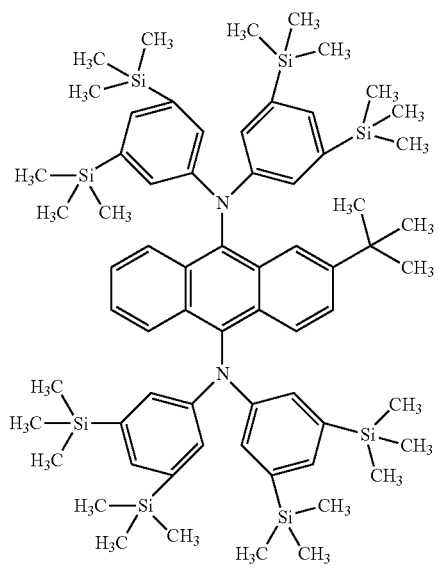
(207)
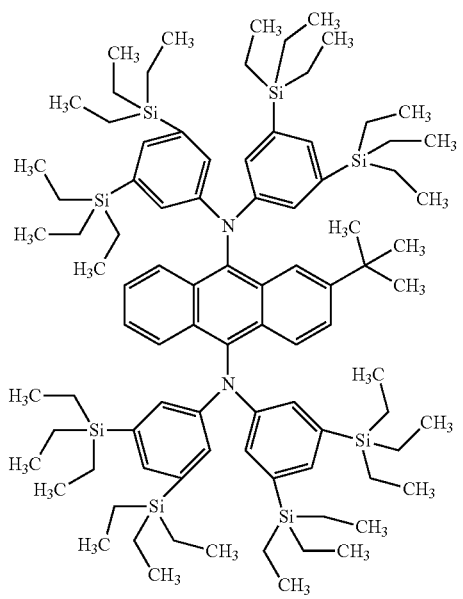

[Chemical formulae 9]
(208)
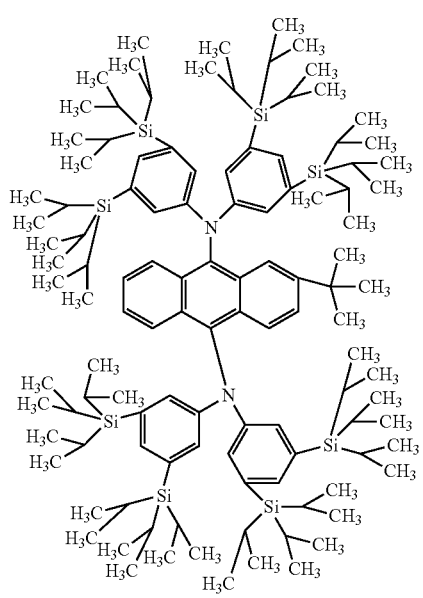
(209)
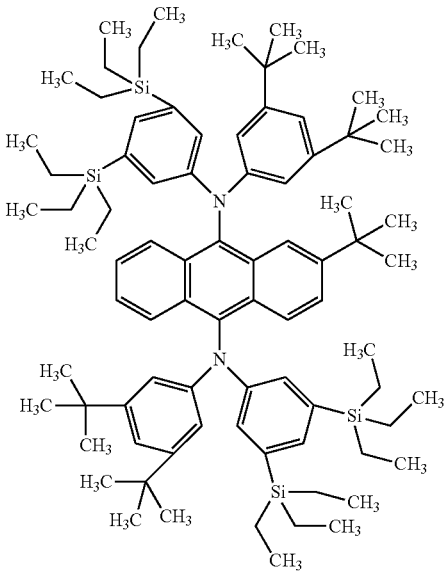
(210)
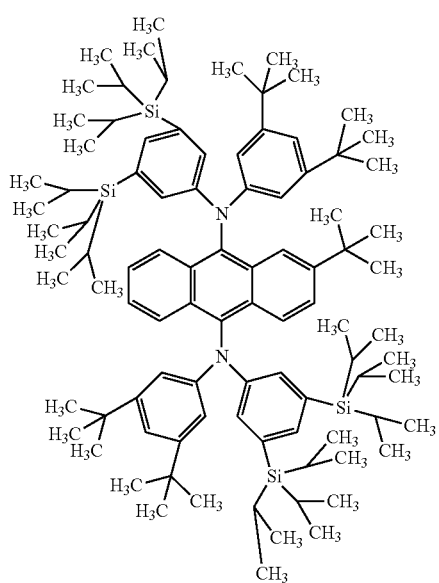
(211)
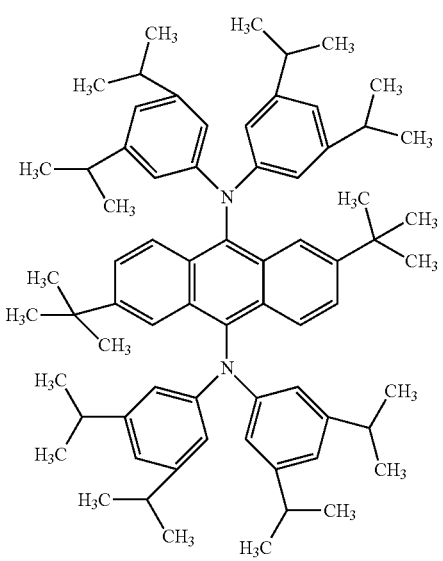

[Chemical formulae 10]
(212) 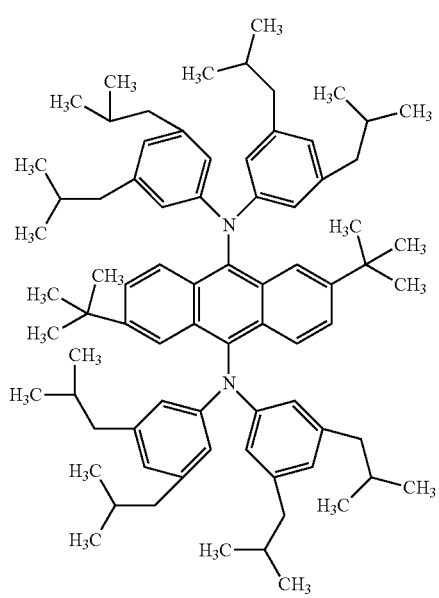
(213) 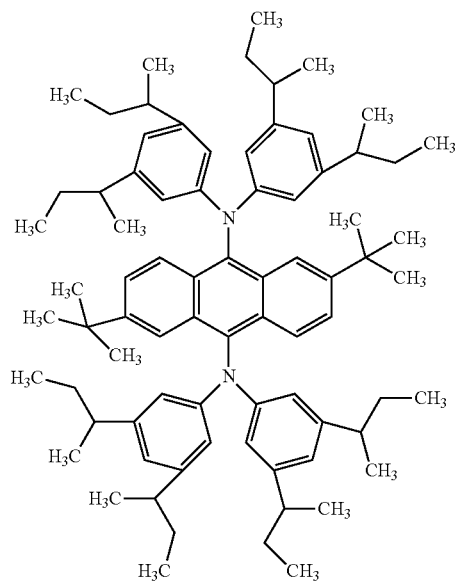
(214) 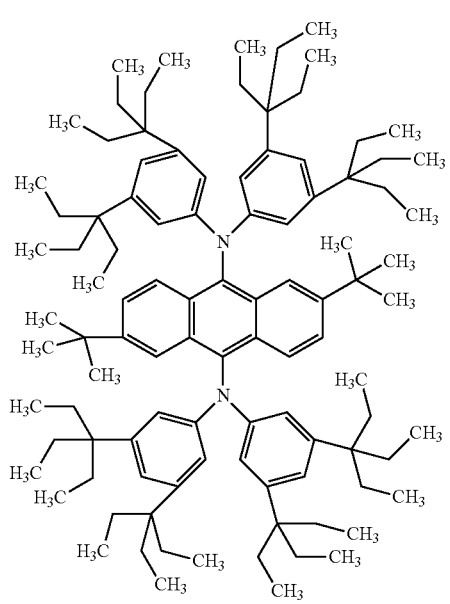
(215) 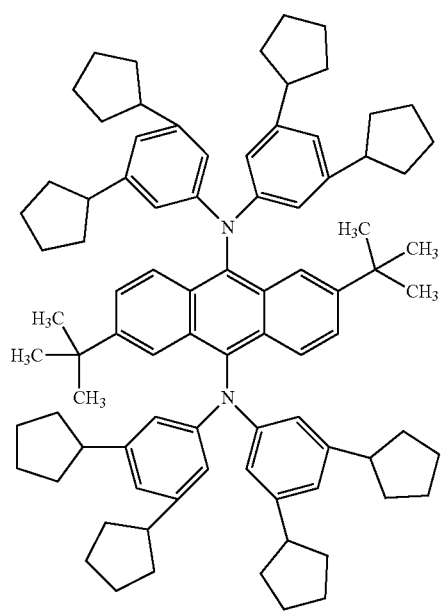

[Chemical formulae 11]
(216) 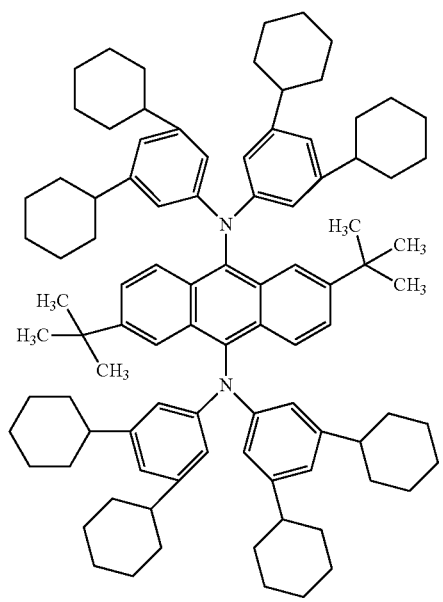
(217) 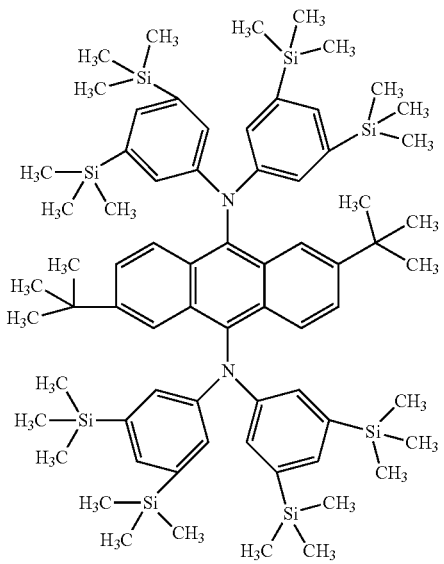
(218) 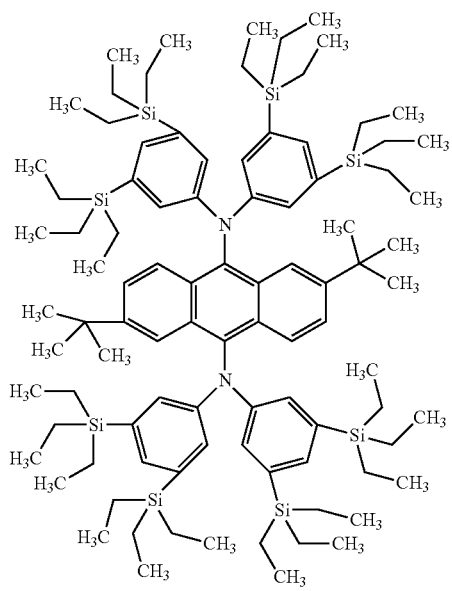
(219) 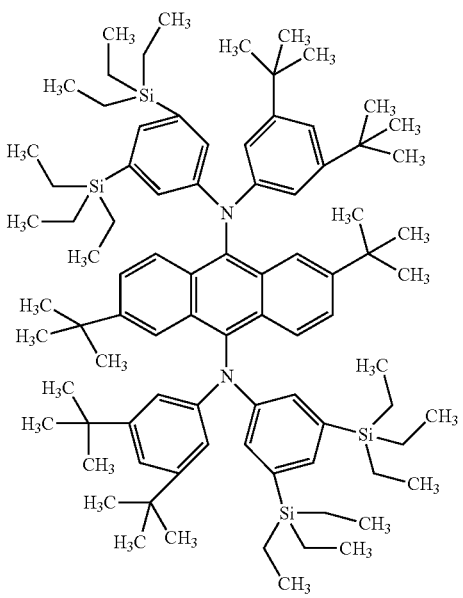

[Chemical formulae 12]
(220)
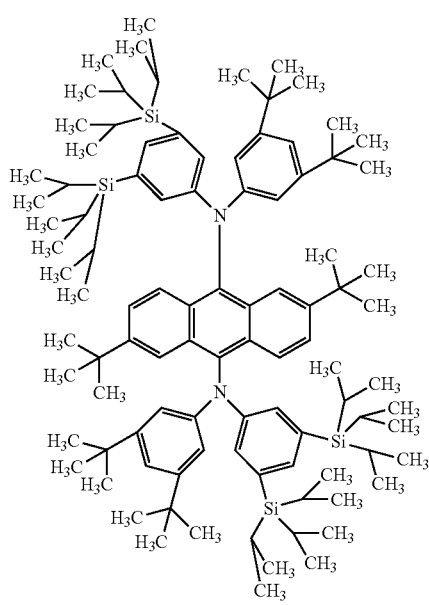
(221)
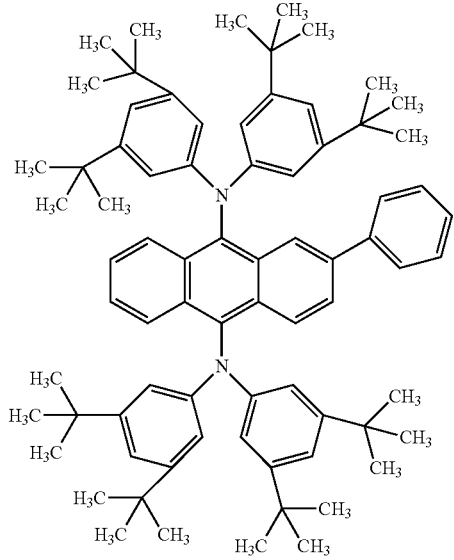
(222)
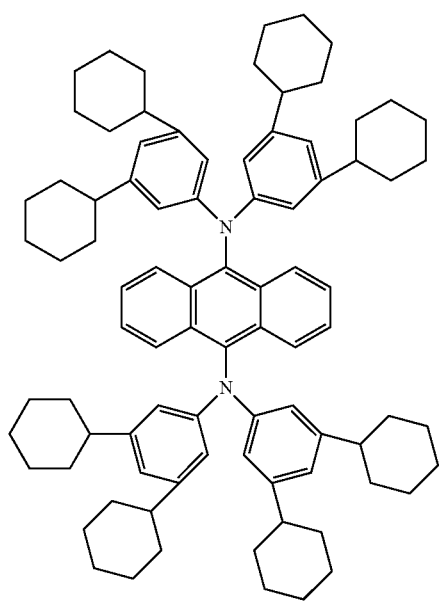
(223)
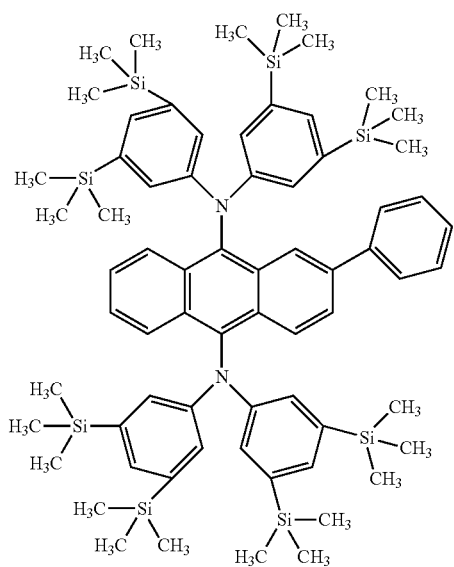

[Chemical formulae 13]
(224)
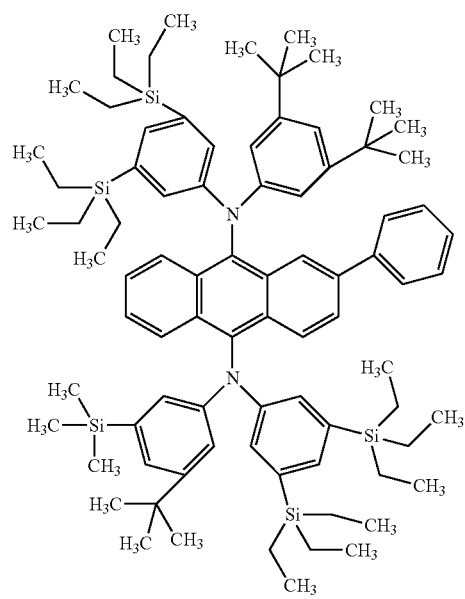
(225)
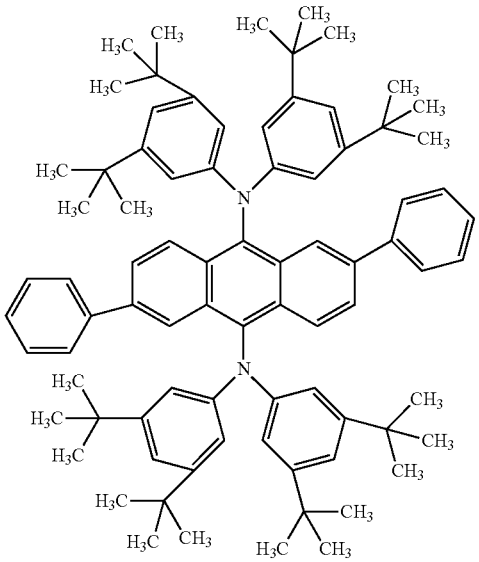
(226)
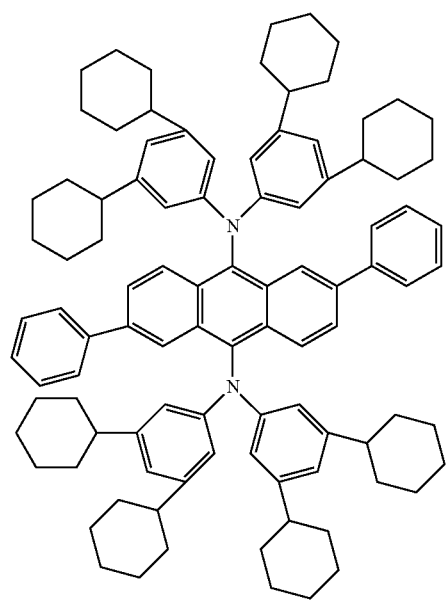
(227)
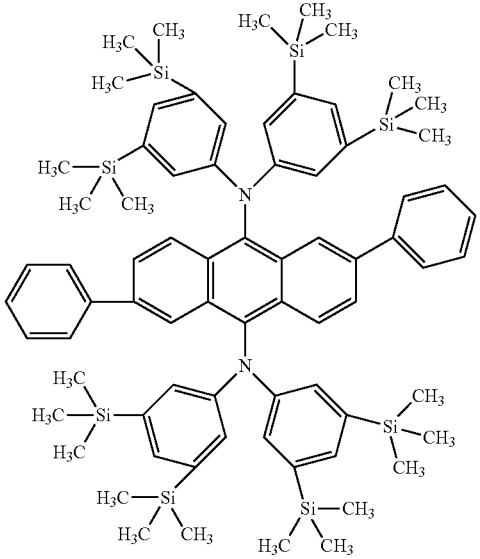

[Chemical formulae 14]
(228) 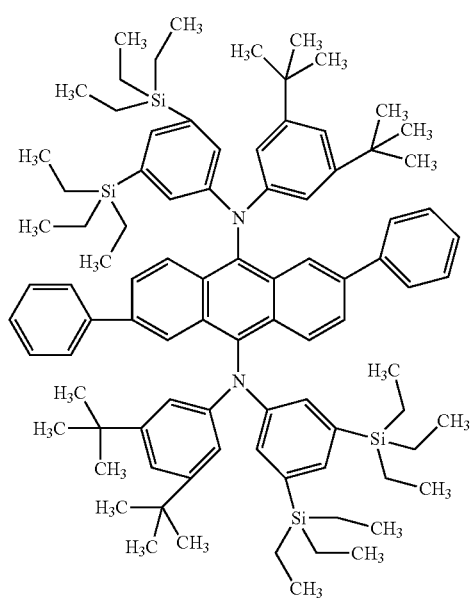
(229) 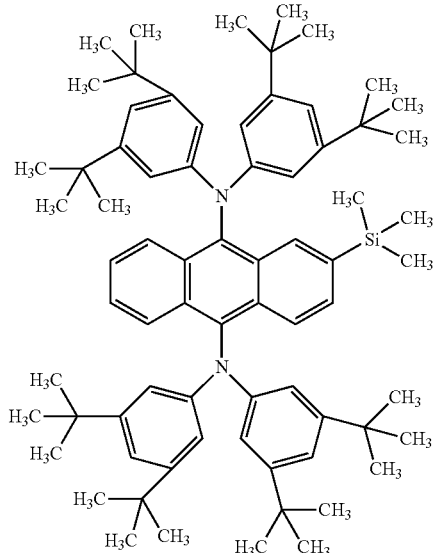
(230) 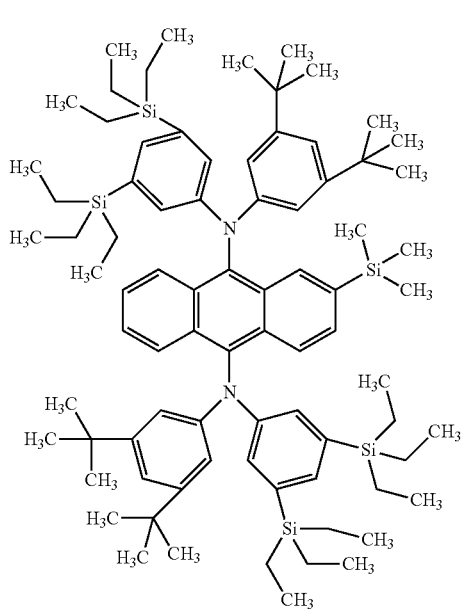
(231) 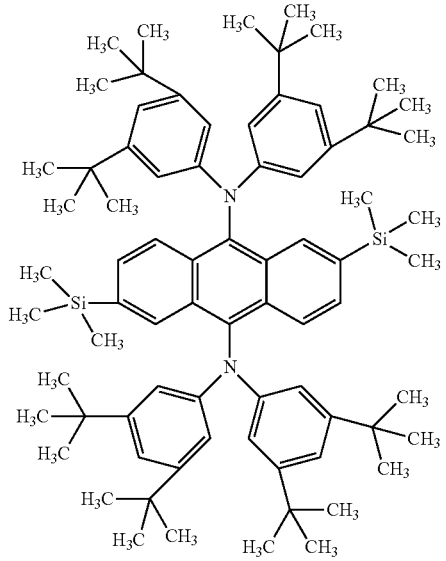

[Chemical formulae 15]
(232) 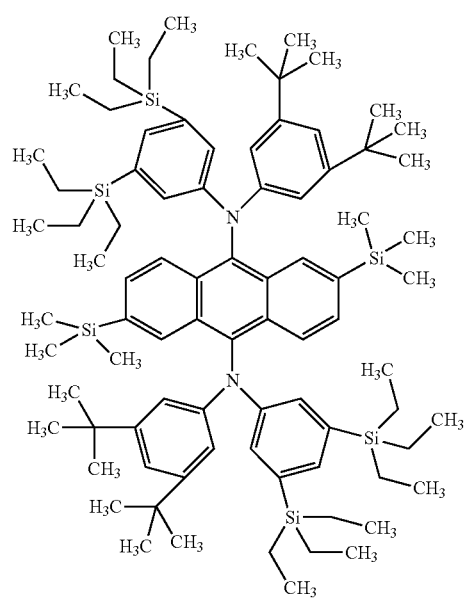
(233) 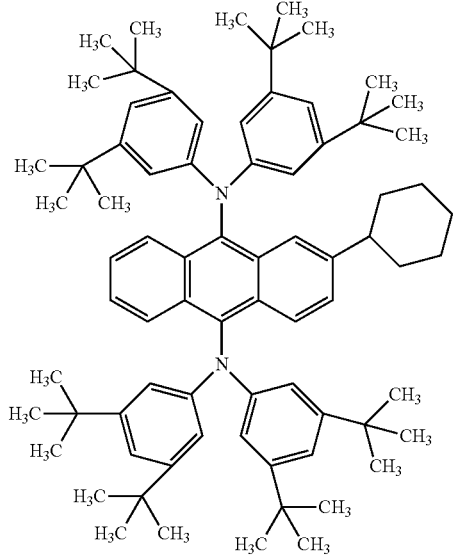
(234) 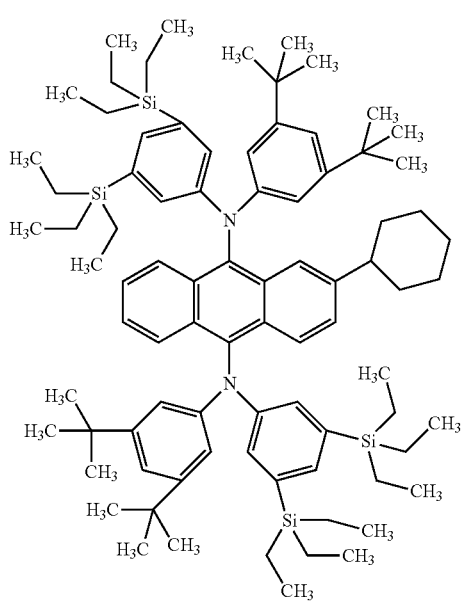
(235) 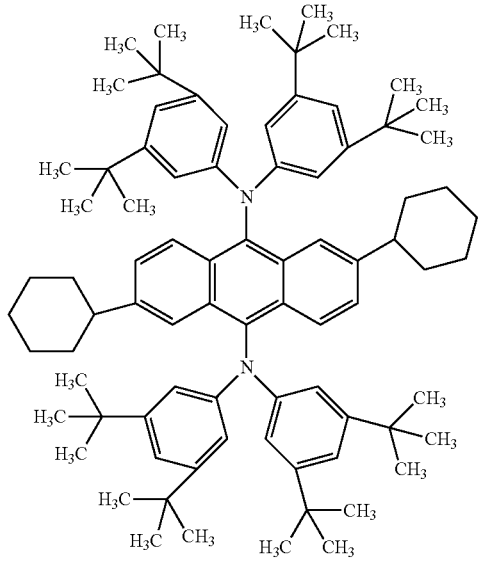

[Chemical formulae 16]
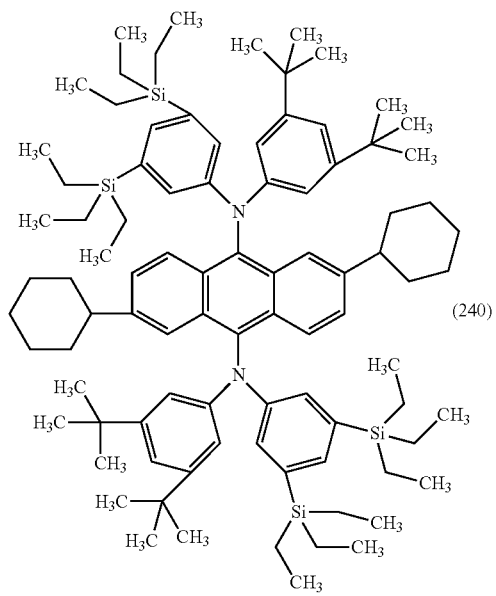
(236)
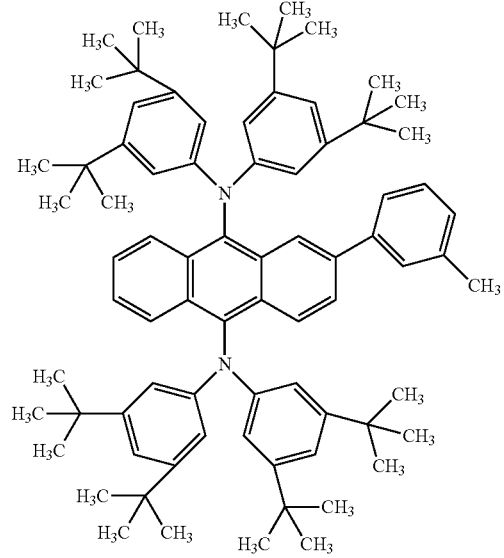
(237)
(240)
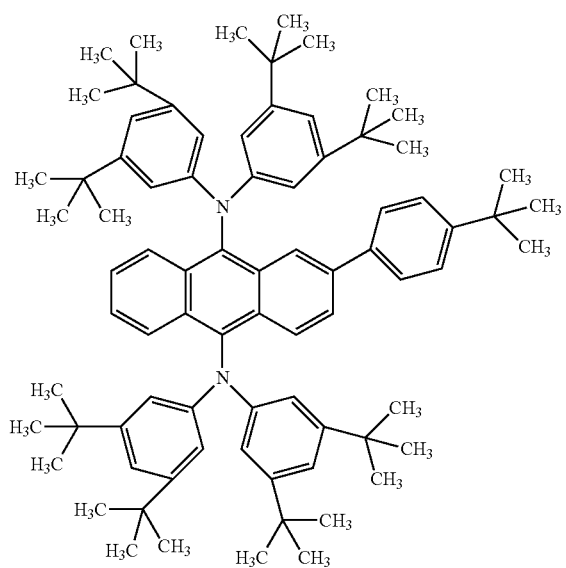
(238)
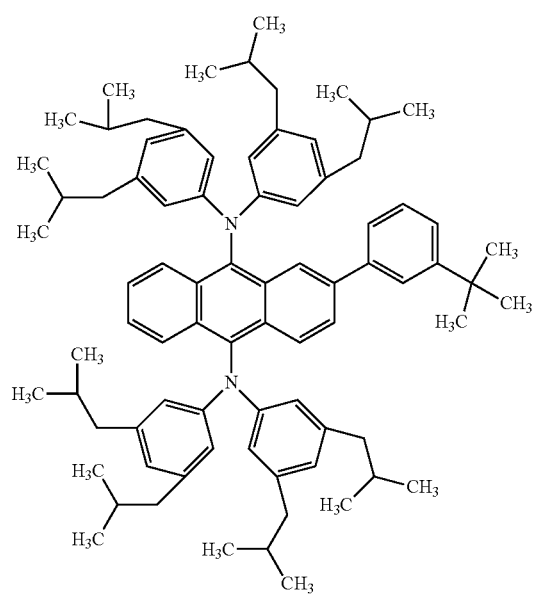
(239)

-continued
(240)
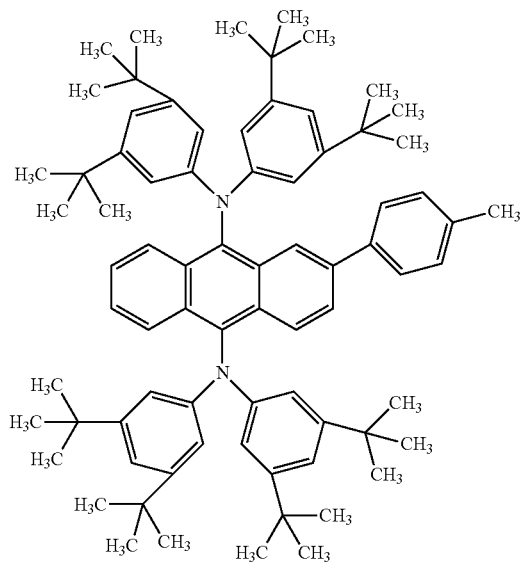
(241)
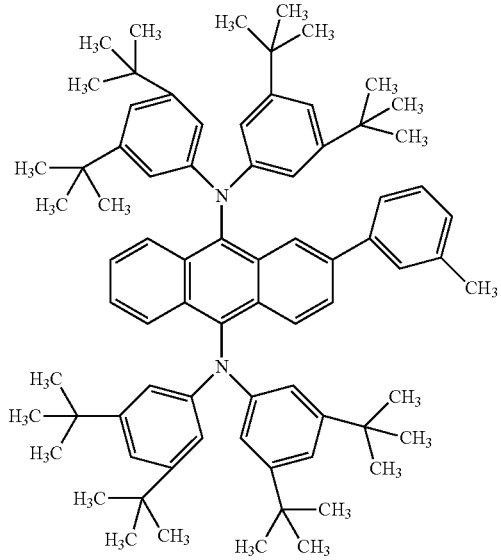
[Chemical formulae 17]
(242)
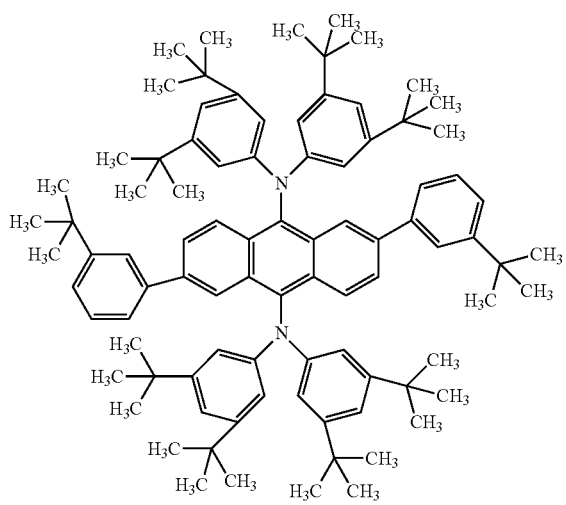
(243)
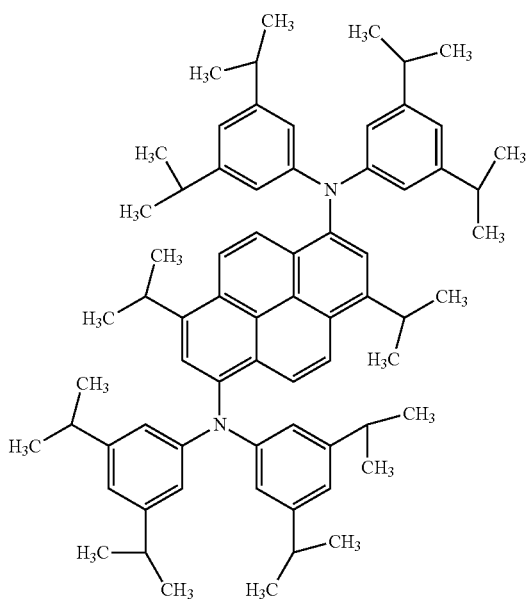

(244)
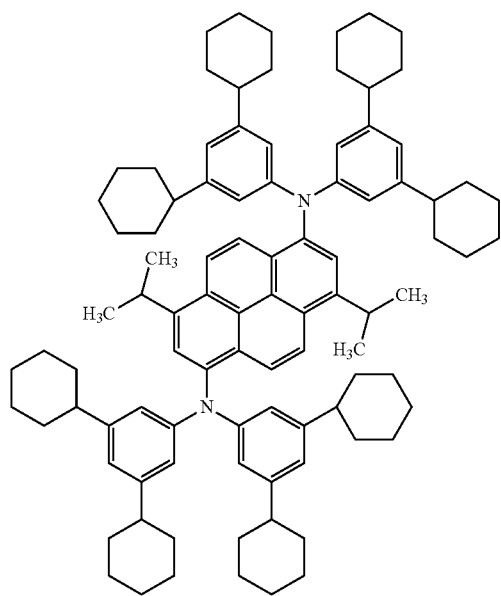
(245)
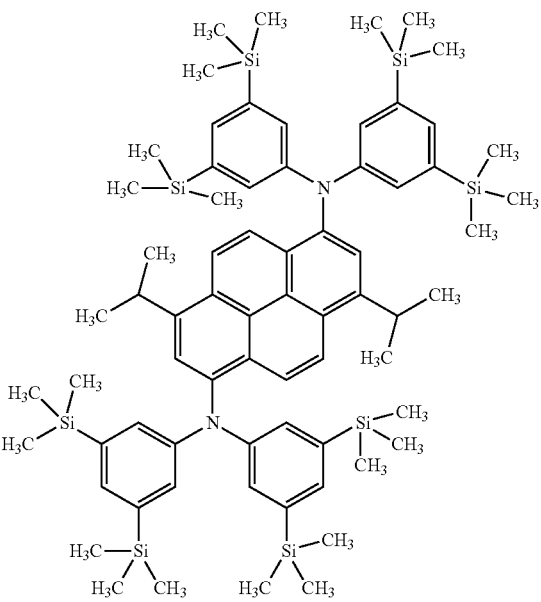
[Chemical formulae 18]
(246)
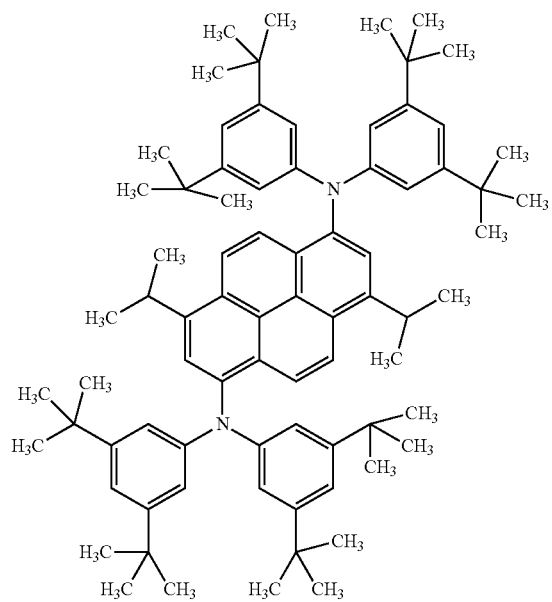
(247)
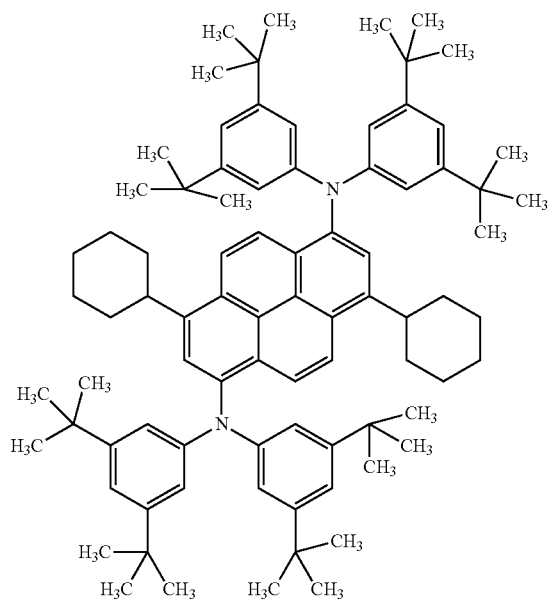

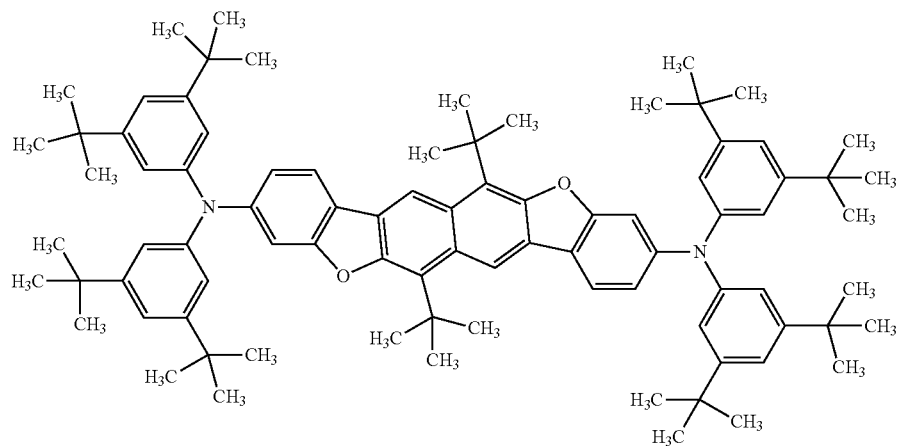
(248)
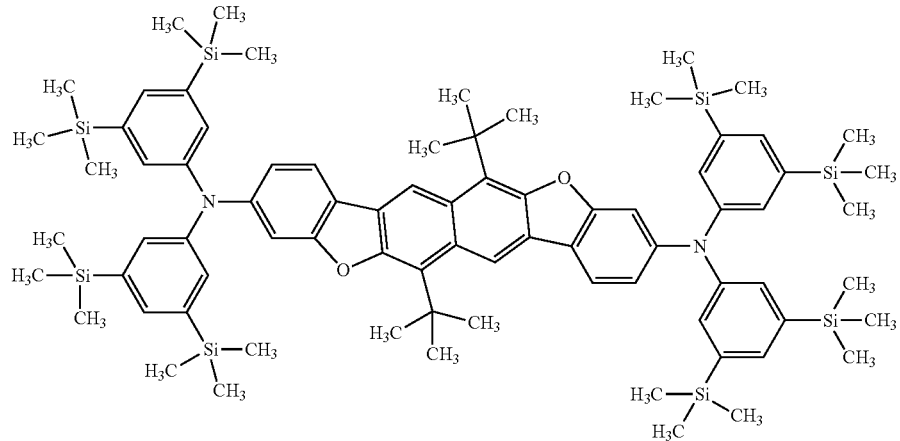
(249)

Examples of materials that can be suitably used as a guest material of the light-emitting device of one embodiment of the present invention are shown by Structural formulae (100) and (101). Note that the guest material is not limited thereto.

[Chemical formulae 19]

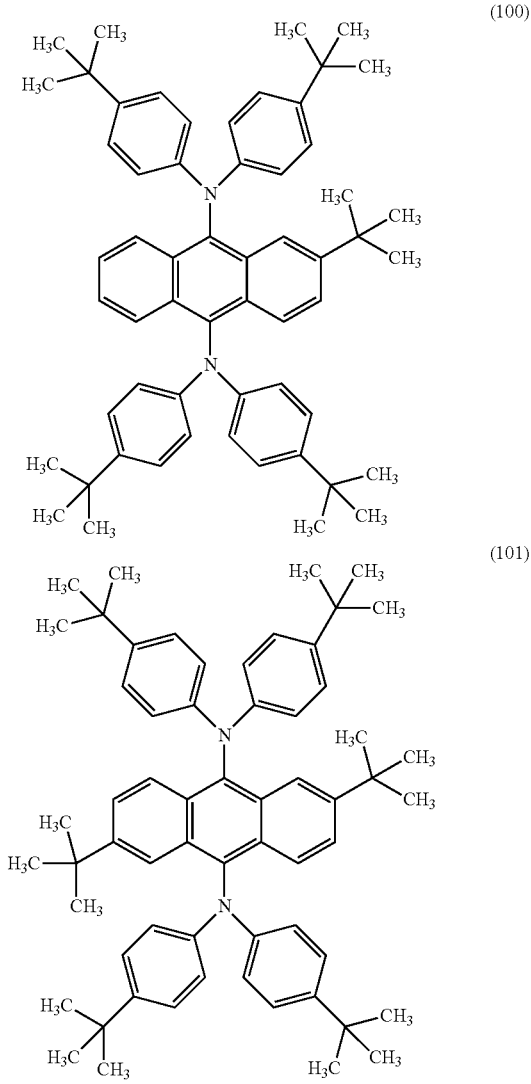

(100)

(101)

A phosphorescent material having a five-membered ring skeleton can be used as the compound 133. Examples of the phosphorescent material include an iridium-, rhodium-, or platinum-based organometallic complex and metal complex. Another example is a platinum complex or organoiridium complex having a porphyrin ligand; in particular, an organoiridium complex such as an iridium-based ortho-metalated complex is preferable, for example. Examples of an ortho-metalated ligand include a pyrrole ligand, a pyrazole ligand, a 4H-triazole ligand, a 1H-triazole ligand, an imidazole ligand, a benzimidazole ligand, and a naphthoimidazole ligand. In that case, the compound 133 (phosphorescent material) has an absorption band of triplet MLCT (Metal to Ligand Charge Transfer) transition. It is preferable that the compound 133 and the compound 132 (fluorescent material) be selected such that the emission peak of the compound 133 overlaps with an absorption band on the longest wavelength side (low energy side) of the compound 132 (fluorescent material). This makes it possible to provide a light-emitting device with drastically improved emission efficiency. Even in the case where the compound 133 is a phosphorescent material, it may form an exciplex together with the compound 131. When an exciplex is formed, the phosphorescent material does not need to emit light at room temperature and emits light at room temperature after an exciplex is formed. In this case, for example, tris[2-(1H-pyrazol-1-yl-κN2)phenyl-κC]iridium(III) (abbreviation: Ir(ppz)$_3$) can be used as the phosphorescent material.

Examples of a substance having an emission peak in blue or green include an organometallic iridium complex having a 4H-triazole skeleton, such as tris{2-[5-(2-methylphenyl)-4-(2,6-dimethylphenyl)-4H-1,2,4-triazol-3-yl-κN2]phenyl-κC}iridium(III) (abbreviation: Ir(mpptz-dmp)$_3$), tris(5-methyl-3,4-diphenyl-4H-1,2,4-triazolato)iridium(III) (abbreviation: Ir(Mptz)$_3$), tris[4-(3-biphenyl)-5-isopropyl-3-phenyl-4H-1,2,4-triazolato]iridium(III) (abbreviation: Ir(iPrptz-3b)$_3$), tris[3-(5-biphenyl)-5-isopropyl-4-phenyl-4H-1,2,4-triazolato]iridium(III) (abbreviation: Ir(iPr5btz)$_3$), tris{2-[4-(4-cyano-2,6-diisobutylphenyl)-5-(2-methylphenyl)-4H-1,2,4-triazol-3-yl-κN2]phenyl-κC}iridium(III) (abbreviation: Ir(mpptz-diBuCNp)$_3$), or tris{2-[5-(2-methylphenyl)-4-(2,6-diisopropylphenyl)-4H-1,2,4-triazol-3-yl-κN2]phenyl-κC}iridium(III) (abbreviation: Ir(mpptz-diPrp)$_3$); an organometallic iridium complex having a 1H-triazole skeleton, such as tris[3-methyl-1-(2-methylphenyl)-5-phenyl-1H-1,2,4-triazolato]iridium(III) (abbreviation: Ir(Mptz1-mp)$_3$) or tris(1-methyl-5-phenyl-3-propyl-1H-1,2,4-triazolato)iridium(III) (abbreviation: Ir(Prptz1-Me)$_3$); an organometallic iridium complex having an imidazole skeleton, such as fac-tris[1-(2,6-diisopropylphenyl)-2-phenyl-1H-imidazole]iridium(III) (abbreviation: Ir(iPrpmi)$_3$) or tris[3-(2,6-dimethylphenyl)-7-methylimidazo[1,2-f]phenanthridinato]iridium(III) (abbreviation: Ir(dmpimpt-Me)$_3$); an organometallic iridium complex having a benzimidazole skeleton, such as tris{2-[1-(4-cyano-2,6-diisobutylphenyl)-1H-benzimidazol-2-yl-κN3]phenyl-κC}iridium(III) (abbreviation: Ir(pbi-diBuCNp)$_3$) or (OC-6-22)-tris{2-[1-(2,6-diisobutylphenyl)-1H-benzimidazol-2-yl-κN3]phenyl-κC}iridium(III) (abbreviation: Ir(pbi-diBup)$_3$); and an organometallic iridium complex having a naphthoimidazole skeleton, such as bis{2-[1-(2,6-diisobutylphenyl)-1H-naphtho[1,2-d]imidazol-2-yl-κN3]phenyl-κC}[2-(4-methyl-5-phenyl-2-pyridyl-κN2)phenyl-κC]iridium(III) (abbreviation: Ir(pni-diBup)$_2$(mdppy)) or tris{2-[1-(2,6-diisobutylphenyl)-1H-naphtho[1,2-d]imidazole-2-yl-κN3]phenyl-κC}iridium(III) (abbreviation: Ir(pni-diBup)$_3$). Among the materials given above, the organometallic iridium complexes including a nitrogen-containing five-membered heterocyclic skeleton, such as a 4H-triazole skeleton, a 1H-triazole skeleton, an imidazole skeleton, a benzimidazole skeleton, or a naphthoimidazole skeleton, have high triplet excitation energy, reliability, and emission efficiency and are thus especially preferable. Note that a platinum complex such as 2,3,7,8,12,13,17,18-octaethyl-21H,23H-porphyrinplatinum(II) (abbreviation: PtOEP), or a rare earth metal complex such as tris[1-(2-thenoyl)-3,3,3-trifluoroacetonato](monophenanthroline)europium(III) (abbreviation: Eu(TTA)$_3$(Phen)) can also be used.

For example, a TADF material can be used as the compound 134. The energy difference between the S1 level and the T1 level of the compound 134 is preferably small, specifically, greater than 0 eV and less than or equal to 0.2 eV.

The compound 134 preferably has a skeleton with a hole-transport property and a skeleton with an electron-transport property. Alternatively, the compound 134 preferably has a π-electron rich skeleton or an aromatic amine skeleton, and a π-electron deficient skeleton. In that case, a donor-acceptor excited state is easily formed in a molecule. Furthermore, to improve both the donor property and the acceptor property in the molecule of the compound 134, the skeleton with an electron-transport property and the skeleton with a hole-transport property are preferably directly bonded to each other. Alternatively, the π-electron deficient skeleton is preferably directly bonded to the π-electron rich skeleton or the aromatic amine skeleton. By improving both the donor property and the acceptor property in the molecule, an overlap between a region where the HOMO is distributed and a region where the LUMO is distributed in the compound 134 can be small, and the energy difference between the singlet excitation energy level and the triplet excitation energy level of the compound 134 can be small. Moreover, the triplet excitation energy level of the compound 134 can be kept high.

In the case where a TADF material is composed of one kind of material, the following materials can be used, for example.

First, a fullerene, a derivative thereof, an acridine derivative such as proflavine, eosin, and the like can be given. Other examples include a metal-containing porphyrin such as a porphyrin containing magnesium (Mg), zinc (Zn), cadmium (Cd), tin (Sn), platinum (Pt), indium (In), or palladium (Pd). Examples of the metal-containing porphyrin include a protoporphyrin-tin fluoride complex ($SnF_2$(Proto IX)), a mesoporphyrin-tin fluoride complex ($SnF_2$(Meso IX)), a hematoporphyrin-tin fluoride complex ($SnF_2$(Hemato IX)), a coproporphyrin tetramethyl ester-tin fluoride complex ($SnF_2$(Copro III-4Me)), an octaethylporphyrin-tin fluoride complex ($SnF_2$(OEP)), an etioporphyrin-tin fluoride complex ($SnF_2$(Etio I)), and an octaethylporphyrin-platinum chloride complex ($PtCl_2$OEP).

[Chemical formulae 20]

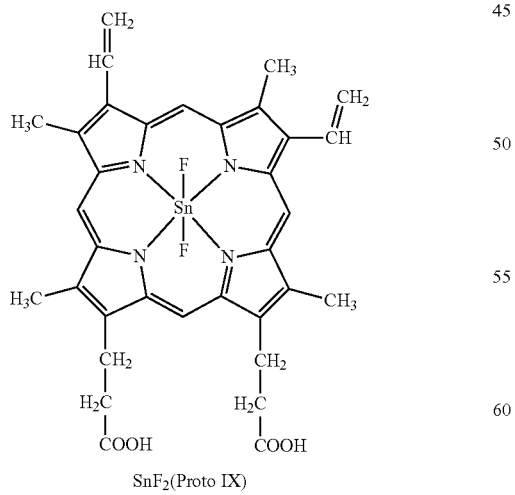

SnF$_2$(Proto IX)

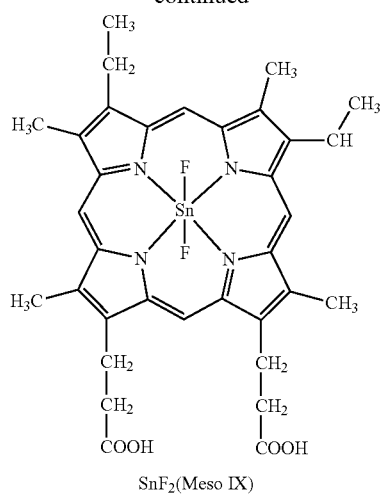

SnF$_2$(Meso IX)

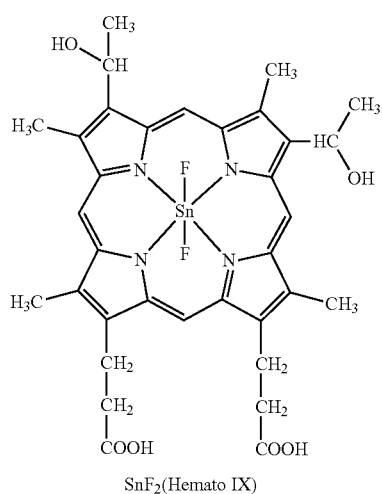

SnF$_2$(Hemato IX)

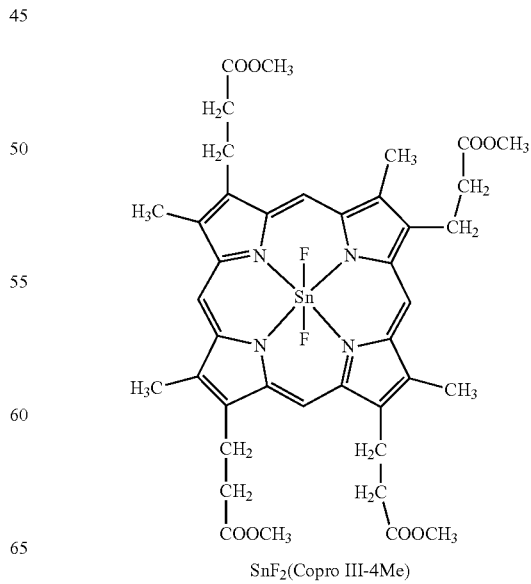

SnF$_2$(Copro III-4Me)

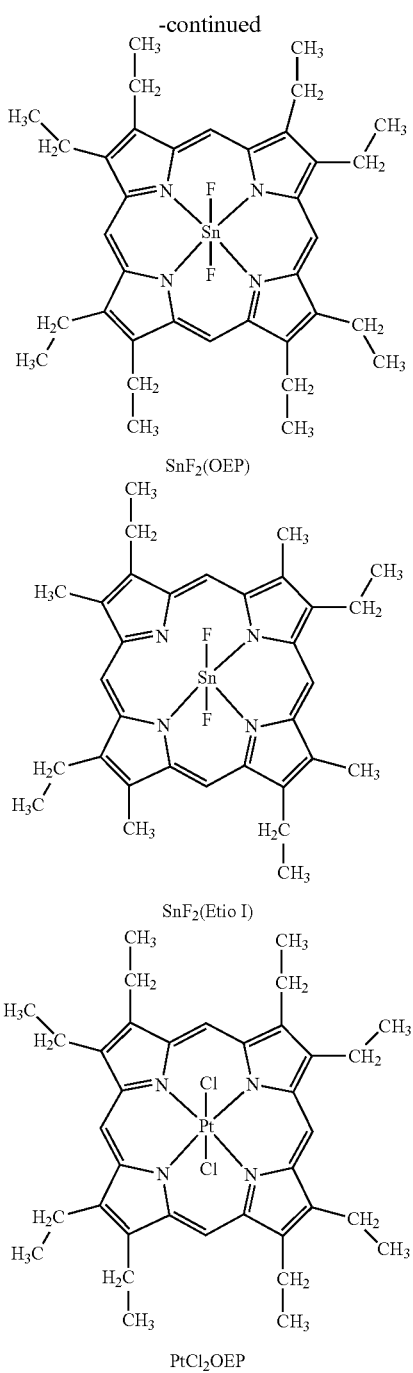

SnF₂(OEP)

SnF₂(Etio I)

PtCl₂OEP

As a thermally activated delayed fluorescent material composed of one kind of material, a heterocyclic compound having a π-electron rich skeleton and a π-electron deficient skeleton can also be used. Specific examples include a heterocyclic compound having one or both of a π-electron rich heteroaromatic ring and a π-electron deficient heteroaromatic ring, such as 2-(biphenyl-4-yl)-4,6-bis(12-phenylindolo[2,3-a]carbazol-11-yl)-1,3,5-triazine (abbreviation: PIC-TRZ), 2-{4-[3-(N-phenyl-9H-carbazol-3-yl)-9H-carbazol-9-yl]phenyl}-4,6-diphenyl-1,3,5-triazine (abbreviation: PCCzPTzn), 2-[4-(10H-phenoxazin-10-yl)phenyl]-4,6-diphenyl-1,3,5-triazine (abbreviation: PXZ-TRZ), 3-[4-(5-phenyl-5,10-dihydrophenazin-10-yl)phenyl]-4,5-diphenyl-1,2,4-triazole (abbreviation: PPZ-3TPT), 3-(9,9-dimethyl-9H-acridin-10-yl)-9H-xanthen-9-one (abbreviation: ACRXTN), bis[4-(9,9-dimethyl-9,10-dihydroacridine)phenyl]sulfone (abbreviation: DMAC-DP S), 10-phenyl-10H,10'H-spiro[acridin-9,9'-anthracen]-10'-one (abbreviation: ACRSA), 4-(9'-phenyl-3,3'-bi-9H-carbazol-9-yl)benzofuro[3,2-d]pyrimidine (abbreviation: 4PCCzBfpm), 4-[4-(9'-phenyl-3,3'-bi-9H-carbazol-9-yl)phenyl]benzofuro[3,2-d]pyrimidine (abbreviation: 4PCCzPBfpm), or 9-[3-(4,6-diphenyl-1,3,5-triazin-2-yl)phenyl]-9'-phenyl-2,3'-bi-9H-carbazole (abbreviation: mPCCzPTzn-02). The heterocyclic compound is preferable because of its high electron-transport property and hole-transport property due to the π-electron rich heteroaromatic ring and the π-electron deficient heteroaromatic ring contained therein. Among skeletons having a π-electron deficient heteroaromatic ring, a pyridine skeleton, a diazine skeleton (a pyrimidine skeleton, a pyrazine skeleton, or a pyridazine skeleton) and a triazine skeleton are particularly preferable because of their high stability and reliability. In particular, a benzofuropyrimidine skeleton, a benzothienopyrimidine skeleton, a benzofuropyrazine skeleton, and a benzothienopyrazine skeleton are preferable because of their high acceptor property and reliability. Among skeletons having a π-electron rich heteroaromatic ring, an acridine skeleton, a phenoxazine skeleton, a phenothiazine skeleton, a furan skeleton, a thiophene skeleton, and a pyrrole skeleton have high stability and reliability; therefore, at least one of these skeletons is preferably included. Note that a dibenzofuran skeleton and a dibenzothiophene skeleton are preferable as the furan skeleton and the thiophene skeleton, respectively. Furthermore, as a pyrrole skeleton, an indole skeleton, a carbazole skeleton, a bicarbazole skeleton, and a 3-(9-phenyl-9H-carbazol-3-yl)-9H-carbazole skeleton are particularly preferable. Note that a substance in which the π-electron rich heteroaromatic ring is directly bonded to the π-electron deficient heteroaromatic ring is particularly preferable because the donor property of the π-electron rich heteroaromatic ring and the acceptor property of the π-electron deficient heteroaromatic ring are both improved and the difference between the level of the singlet excited state and the level of the triplet excited state becomes small. Note that an aromatic ring to which an electron-withdrawing group such as a cyano group is bonded may be used instead of the π-electron deficient heteroaromatic ring. As a π-electron rich skeleton, an aromatic amine skeleton, a phenazine skeleton, or the like can be used. As a π-electron deficient skeleton, a xanthene skeleton, a thioxanthene skeleton, a dioxide skeleton, an oxadiazole skeleton, a triazole skeleton, an imidazole skeleton, an anthraquinone skeleton, a boron-containing skeleton such as phenylborane or boranthrene, an aromatic ring or a heteroaromatic ring having a nitrile group or a cyano group, such as benzonitrile or cyanobenzene, a carbonyl skeleton such as benzophenone, a phosphine oxide skeleton, a sulfone skeleton, or the like can be used. As described above, a π-electron deficient skeleton and a π-electron rich skeleton can be used instead of at least one of the π-electron deficient heteroaromatic ring and the π-electron rich heteroaromatic ring.

[Chemical formula 21]
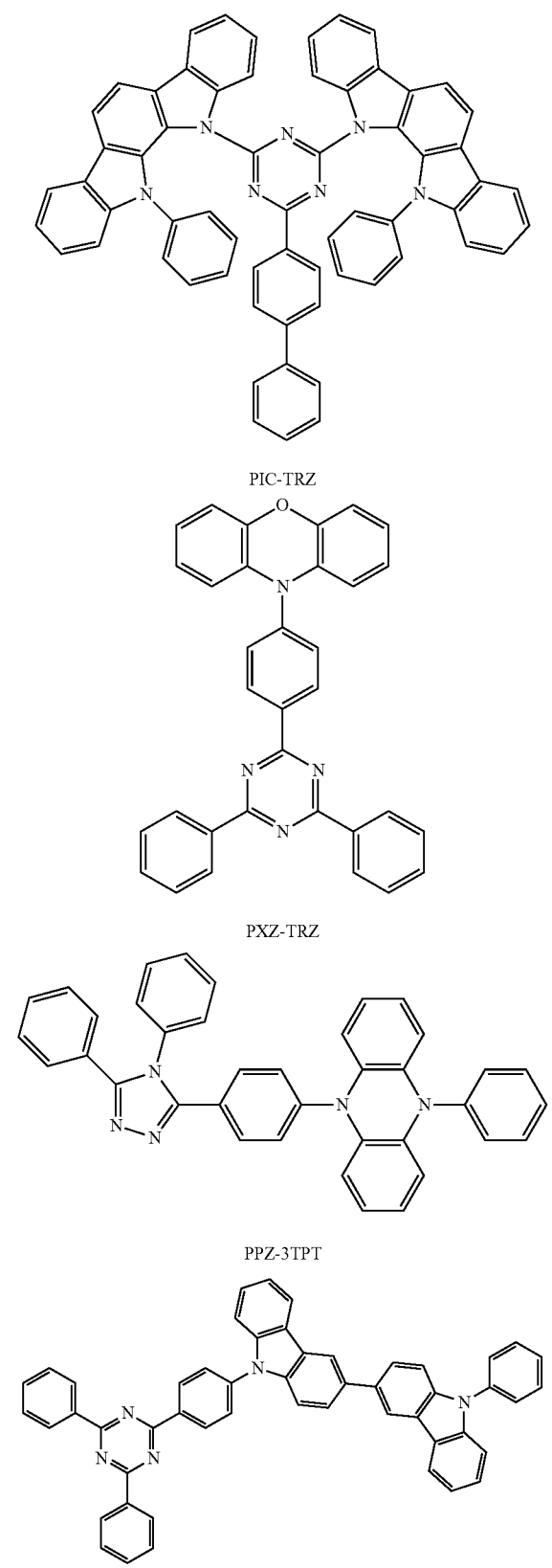
PIC-TRZ
PXZ-TRZ
PPZ-3TPT
PCCzPTzn
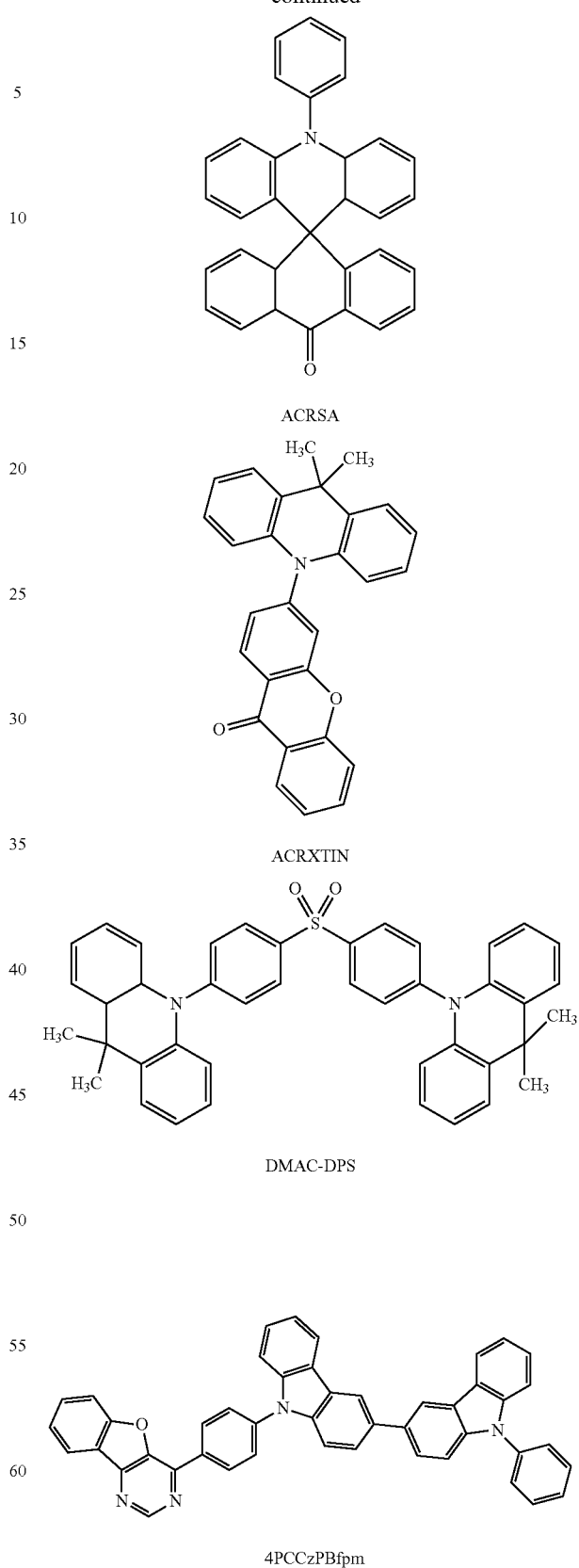
ACRSA
ACRXTIN
DMAC-DPS
4PCCzPBfpm

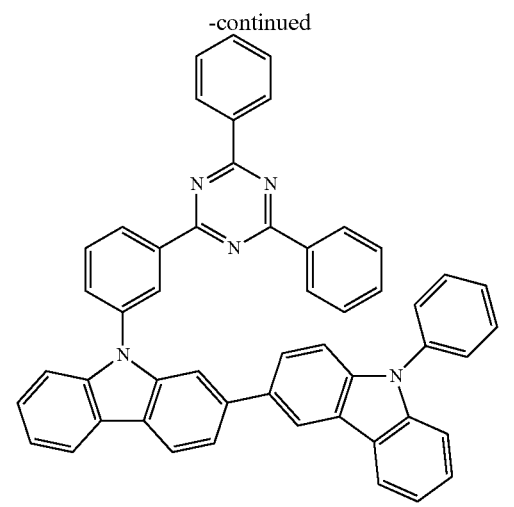

mPCCzPTzn-02

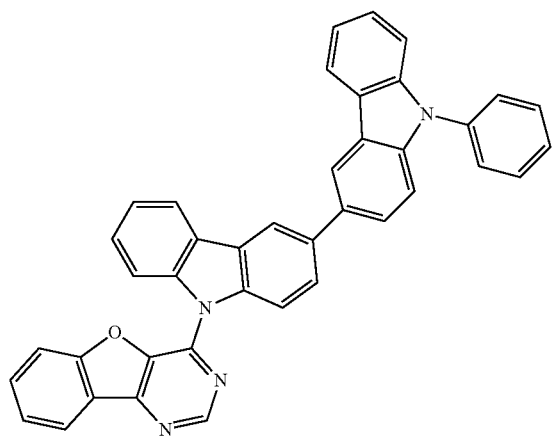

4PCCzBfpm

In the case where the compound 134 does not have a function of converting triplet excitons into light emission, a combination of the compound 131 and the compound 133 or the compound 131 and the compound 134 is preferably, but is not particularly limited to, a combination that forms an exciplex. It is preferable that one have a function of transporting electrons and the other have a function of transporting holes.

Examples of the compound 131 include, in addition to zinc- and aluminum-based metal complexes, an oxadiazole derivative, a triazole derivative, a benzimidazole derivative, a quinoxaline derivative, a dibenzoquinoxaline derivative, a dibenzothiophene derivative, a dibenzofuran derivative, a pyrimidine derivative, a triazine derivative, a pyridine derivative, a bipyridine derivative, and a phenanthroline derivative. Other examples include an aromatic amine and a carbazole derivative.

In addition, the following hole-transport materials and electron-transport materials can be used.

A material having a property of transporting more holes than electrons can be used as the hole-transport material, and a material having a hole mobility of $1\times10^{-6}$ cm$^2$/Vs or higher is preferable. Specifically, an aromatic amine, a carbazole derivative, an aromatic hydrocarbon, a stilbene derivative, or the like can be used. Furthermore, the hole-transport material may be a high molecular compound.

Examples of the aromatic amine compound, which is a material having a high hole-transport property, include N,N'-di(p-tolyl)-N,N'-diphenyl-p-phenylenediamine (abbreviation: DTDPPA), 4,4'-bis[N-(4-diphenylaminophenyl)-N-phenylamino]biphenyl (abbreviation: DPAB), N,N'-bis{4-[bis(3-methylphenyl)amino]phenyl}-N,N'-diphenyl-(1,1'-biphenyl)-4,4'-diamine (abbreviation: DNTPD), and 1,3,5-tris[N-(4-diphenylaminophenyl)-N-phenylamino]benzene (abbreviation: DPA3B).

Specific examples of the carbazole derivative are 3-[N-(4-diphenylaminophenyl)-N-phenylamino]-9-phenylcarbazole (abbreviation: PCzDPA1), 3,6-bis[N-(4-diphenylaminophenyl)-N-phenylamino]-9-phenylcarbazole (abbreviation: PCzDPA2), 3,6-bis[N-(4-diphenylaminophenyl)-N-(1-naphthyl)amino]-9-phenylcarbazole (abbreviation: PCzTPN2), 3-[N-(9-phenylcarbazol-3-yl)-N-phenylamino]-9-phenylcarbazole (abbreviation: PCzPCA1), 3,6-bis[N-(9-phenylcarbazol-3-yl)-N-phenylamino]-9-phenylcarbazole (abbreviation: PCzPCA2), 3-[N-(1-naphthyl)-N-(9-phenylcarbazol-3-yl)amino]-9-phenylcarbazole (abbreviation: PCzPCN1), and the like.

Other examples of the carbazole derivative are 4,4'-di(N-carbazolyl)biphenyl (abbreviation: CBP), 1,3,5-tris[4-(N-carbazolyl)phenyl]benzene (abbreviation: TCPB), 9-[4-(10-phenyl-9-anthryl)phenyl]-9H-carbazole (abbreviation: CzPA), 1,4-bis[4-(N-carbazolyl)phenyl]-2,3,5,6-tetraphenylbenzene, and the like.

Examples of the aromatic hydrocarbon include 2-tert-butyl-9,10-di(2-naphthyl)anthracene (abbreviation: t-BuDNA), 2-tert-butyl-9,10-di(1-naphthyl)anthracene, 9,10-bis(3,5-diphenylphenyl)anthracene (abbreviation: DPPA), 2-tert-butyl-9,10-bis(4-phenylphenyl)anthracene (abbreviation: t-BuDBA), 9,10-di(2-naphthyl)anthracene (abbreviation: DNA), 9,10-diphenylanthracene (abbreviation: DPAnth), 2-tert-butylanthracene (abbreviation: t-BuAnth), 9,10-bis(4-methyl-1-naphthyl)anthracene (abbreviation: DMNA), 2-tert-butyl-9,10-bis[2-(1-naphthyl)phenyl]anthracene, 9,10-bis[2-(1-naphthyl)phenyl]anthracene, 2,3,6,7-tetramethyl-9,10-di(1-naphthyl)anthracene, 2,3,6,7-tetramethyl-9,10-di(2-naphthyl)anthracene, 9,9'-bianthryl, 10,10'-diphenyl-9,9'-bianthryl, 10,10'-bis(2-phenylphenyl)-9,9'-bianthryl, 10,10'-bis[(2,3,4,5,6-pentaphenyl)phenyl]-9,9'-bianthryl, anthracene, tetracene, rubrene, perylene, and 2,5,8,11-tetra(tert-butyl)perylene. Other examples include pentacene and coronene. The aromatic hydrocarbon having a hole mobility of $1\times10^{-6}$ cm$^2$/Vs or higher and having 14 to 42 carbon atoms is particularly preferably used.

The aromatic hydrocarbon may have a vinyl skeleton. Examples of the aromatic hydrocarbon having a vinyl group include 4,4'-bis(2,2-diphenylvinyl)biphenyl (abbreviation: DPVBi) and 9,10-bis[4-(2,2-diphenylvinyl)phenyl]anthracene (abbreviation: DPVPA).

Other examples include high molecular compounds such as poly(N-vinylcarbazole) (abbreviation: PVK), poly(4-vinyltriphenylamine) (abbreviation: PVTPA), poly[N-(4-{N-[4-(4-diphenylamino)phenyl]phenyl-N-phenylamino}phenyl)methacrylamide] (abbreviation: PTPDMA), and poly[N,N'-bis(4-butylphenyl)-N,N'-bis(phenyl)benzidine](abbreviation: Poly-TPD).

Examples of the material having a high hole-transport property include aromatic amine compounds such as 4,4'-bis[N-(1-naphthyl)-N-phenylamino]biphenyl (abbreviation: NPB or α-NPD), N,N'-bis(3-methylphenyl)-N,N'-diphenyl-[1,1'-biphenyl]-4,4'-diamine (abbreviation: TPD), 4,4',4''-tris(carbazol-9-yl)triphenylamine (abbreviation: TCTA), 4,4',4''-tris[N-(1-naphthyl)-N-phenylamino]triphenylamine (abbreviation: 1'-TNATA), 4,4',4"-tris(N,N-diphenylamino) triphenylamine (abbreviation: TDATA), 4,4',4"-tris[N-(3-methylphenyl)-N-phenylamino]triphenylamine (abbreviation: MTDATA), 4,4'-bis[N-(spiro-9,9'-bifluoren-2-yl)-N-phenylamino]biphenyl (abbreviation: BSPB), 4-phenyl-4'-(9-phenylfluoren-9-yl)triphenylamine (abbreviation: BPAFLP), 4-phenyl-3'-(9-phenylfluoren-9-yl)triphenylamine (abbreviation: mBPAFLP), N-(9,9-dimethyl-9H-fluoren-2-yl)-N-{9,9-dimethyl-2-[N'-phenyl-N'-(9,9-dimethyl-9H-fluoren-2-yl)amino]-9H-fluoren-7-yl}phenylamine (abbreviation: DFLADFL), N-(9,9-dimethyl-2-diphenylamino-9H-fluoren-7-yl)diphenylamine (abbreviation: DPNF), 2-[N-(4-diphenylaminophenyl)-N-phenylamino]spiro-9,9'-bifluorene (abbreviation: DPASF), 4-phenyl-4'-(9-phenyl-9H-carbazol-3-yl)triphenylamine (abbreviation: PCBA1BP), 4,4'-diphenyl-4"-(9-phenyl-9H-carbazol-3-yl)triphenylamine (abbreviation: PCBBi1BP), 4-(1-naphthyl)-4'-(9-phenyl-9H-carbazol-3-yl)-triphenylamine (abbreviation: PCBANB), 4,4'-di(1-naphthyl)-4"-(9-phenyl-9H-carbazol-3-yl)triphenylamine (abbreviation: PCBNBB), 4-phenyldiphenyl-(9-phenyl-9H-carbazol-3-yl)amine (abbreviation: PCA1BP), N,N'-bis(9-phenylcarbazol-3-yl)-N,N'-diphenylbenzene-1,3-diamine (abbreviation: PCA2B), N,N',N"-triphenyl-N,N',N"-tris(9-phenylcarbazol-3-yl)benzene-1,3,5-triamine (abbreviation: PCA3B), N-(4-biphenyl)-N-(9,9-dimethyl-9H-fluoren-2-yl)-9-phenyl-9H-carbazol-3-amine (abbreviation: PCBiF), N-(1,1'-biphenyl-4-yl)-N-[4-(9-phenyl-9H-carbazol-3-yl)phenyl]-9,9-dimethyl-9H-fluoren-2-amine (abbreviation: PCBBiF), 9,9-dimethyl-N-phenyl-N-[4-(9-phenyl-9H-carbazol-3-yl)phenyl]-fluoren-2-amine (abbreviation: PCBAF), N-phenyl-N-[4-(9-phenyl-9H-carbazol-3-yl)phenyl]-spiro-9,9'-bifluoren-2-amine (abbreviation: PCBASF), 24N-(9-phenylcarbazol-3-yl)-N-phenylaminolspiro-9,9'-bifluorene (abbreviation: PCASF), 2,7-bis[N-(4-diphenylaminophenyl)-N-phenylamino]spiro-9,9'-bifluorene (abbreviation: DPA2SF), N-[4-(9H-carbazol-9-yl)phenyl]-N-(4-phenyl)phenylaniline (abbreviation: YGA1BP), and N,N'-bis[4-(carbazol-9-yl)phenyl]-N,N'-diphenyl-9,9-dimethylfluorene-2,7-diamine (abbreviation: YGA2F). It is also possible to use an amine compound, a carbazole compound, a thiophene compound, a furan compound, a fluorene compound, a triphenylene compound, a phenanthrene compound, or the like such as 3-[4-(1-naphthyl)-phenyl]-9-phenyl-9H-carbazole (abbreviation: PCPN), 3-[4-(9-phenanthryl)-phenyl]-9-phenyl-9H-carbazole (abbreviation: PCPPn), 3,3'-bis(9-phenyl-9H-carbazole) (abbreviation: PCCP), 1,3-bis(N-carbazolyl)benzene (abbreviation: mCP), 3,6-bis(3,5-diphenylphenyl)-9-phenylcarbazole (abbreviation: CzTP), 4-{3-[3-(9-phenyl-9H-fluoren-9-yl)phenyl]phenyl}dibenzofuran (abbreviation: mmDBFFLBi-II), 4,4',4"-(benzene-1,3,5-triyl)tri(dibenzofuran) (abbreviation: DBF3P-II), 1,3,5-tri(dibenzothiophen-4-yl)-benzene (abbreviation: DBT3P-II), 2,8-diphenyl-4-[4-(9-phenyl-9H-fluoren-9-yl)phenyl]dibenzothiophene (abbreviation: DBTFLP-III), 4-[4-(9-phenyl-9H-fluoren-9-yl)phenyl]-6-phenyldibenzothiophene (abbreviation: DBTFLP-IV), or 4-[3-(triphenylen-2-yl)phenyl]dibenzothiophene (abbreviation: mDBTPTp-II). The substances given here are mainly substances having a hole mobility of $1 \times 10^{-6}$ cm$^2$/Vs or higher. However, other substances may also be used as long as they have a property of transporting more holes than electrons.

A material having a property of transporting more electrons than holes can be used as the electron-transport material, and a material having an electron mobility of $1 \times 10^{-6}$ cm$^2$/Vs or higher is preferable. A π-electron deficient type heteroaromatic such as a nitrogen-containing heteroaromatic compound, a metal complex, or the like can be used as the material that easily accepts electrons (the material having an electron-transport property). Specific examples include metal complexes having a quinoline ligand, a benzoquinoline ligand, an oxazole ligand, and a thiazole ligand; an oxadiazole derivative; a triazole derivative; a phenanthroline derivative; a pyridine derivative; a bipyridine derivative; and a pyrimidine derivative.

Examples include metal complexes having a quinoline skeleton or a benzoquinoline skeleton, such as tris(8-quinolinolato)aluminum(III) (abbreviation: Alq), tris(4-methyl-8-quinolinolato)aluminum(III) (abbreviation: Almq$_3$), bis(10-hydroxybenzo[h]quinolinato)beryllium(II) (abbreviation: BeBq$_2$), bis(2-methyl-8-quinolinolato)(4-phenylphenolato)aluminum(III) (abbreviation: BAlq), and bis(8-quinolinolato)zinc(II) (abbreviation: Znq). Alternatively, a metal complex having an oxazole-based or thiazole-based ligand, such as bis[2-(2-benzoxazolyl)phenolato]zinc(II) (abbreviation: ZnPBO) or bis[2-(2-benzothiazolyl)phenolato]zinc(II) (abbreviation: ZnBTZ), or the like can be used. Furthermore, other than the metal complexes, it is possible to use a heterocyclic compound such as 2-(4-biphenylyl)-5-(4-tert-butylphenyl)-1,3,4-oxadiazole (abbreviation: PBD), 1,3-bis[5-(p-tert-butylphenyl)-1,3,4-oxadiazol-2-yl]benzene (abbreviation: OXD-7), 9-[4-(5-phenyl-1,3,4-oxadiazol-2-yl)phenyl]-9H-carbazole (abbreviation: CO11), 3-(4-biphenylyl)-4-phenyl-5-(4-tert-butylphenyl)-1,2,4-triazole (abbreviation: TAZ), 2,2',2"-(1,3,5-benzenetriyl)tris(1-phenyl-1H-benzimidazole) (abbreviation: TOBI), 2-[3-(dibenzothiophen-4-yl)phenyl]-1-phenyl-1H-benzimidazole (abbreviation: mDBTBIm-II), bathophenanthroline (abbreviation: BPhen), 2,9-bis(naphthalen-2-yl)-4,7-diphenyl-1,10-phenanthroline (abbreviation: NBPhen), or bathocuproine (abbreviation: BCP); a heterocyclic compound having a diazine skeleton, such as 2-[3-(dibenzothiophen-4-yl)phenyl]dibenzo[f,h]quinoxaline (abbreviation: 2mDBTPDBq-II), 2-[3'-(dibenzothiophen-4-yl)biphenyl-3-yl]dibenzo[f,h]quinoxaline (abbreviation: 2mDBTBPDBq-II), 2-[3'-(9H-carbazol-9-yl)biphenyl-3-yl]dibenzo[f,h]quinoxaline (abbreviation: 2mCzBPDBq), 2-[4-(3,6-diphenyl-9H-carbazol-9-yl)phenyl]dibenzo[f,h]quinoxaline (abbreviation: 2CzPDBq-III), 7-[3-(dibenzothiophen-4-yl)phenyl]dibenzo[f,h]quinoxaline (abbreviation: 7mDBTPDBq-II), 6-[3-(dibenzothiophen-4-yl)phenyl]dibenzo[f,h]quinoxaline (abbreviation: 6mDBTPDBq-II), 4,6-bis[3-(phenanthren-9-yl)phenyl]pyrimidine (abbreviation: 4,6mPnP2Pm), 4,6-bis[3-(4-dibenzothienyl)phenyl]pyrimidine (abbreviation: 4,6mDBTP2Pm-II), or 4,6-bis[3-(9H-carbazol-9-yl)phenyl]pyrimidine (abbreviation: 4,6mCzP2Pm); a heterocyclic compound having a triazine skeleton, such as 2-{4-[3-(N-phenyl-9H-carbazol-3-yl)-9H-carbazol-9-yl]phenyl}-4,6-diphenyl-1,3,5-triazine (abbreviation: PCCzPTzn); a heterocyclic compound having a pyridine skeleton, such as 3,5-bis[3-(9H-carbazol-9-yl)phenyl]pyridine (abbreviation: 35DCzPPy) or 1,3,5-tri[3-(3-pyridyl)phenyl]benzene (abbreviation: TmPyPB); or a heteroaromatic compound such as 4,4'-bis(5-methylbenzoxazol-2-yl)stilbene (abbreviation: BzOs). Furthermore, a high-molecular compound such as poly(2,5-pyridinediyl) (abbreviation: PPy), poly[(9,9-dihexylfluorene-2,7-diyl)-co-(pyridine-3,5-diyl)] (abbreviation: PF-Py), or poly[(9,9-dioctylfluorene-2,7-diyl)-co-(2,2'-bipyridine-6,6'-diyl)] (abbreviation: PF-BPy) can be used. The substances described here are mainly substances having an electron mobility of $1 \times 10^{-6}$ cm$^2$/Vs or higher. Note that other substances may also be used as long as their electron-transport properties are higher than their hole-transport properties.

As the compound 134, a substance that can form an exciplex together with the compound 131 is preferably used. Specifically, the hole-transport materials and electron-transport materials given above can be used. In that case, it is preferable that the compound 131, the compound 134, and the compound 133 (phosphorescent material having a five-membered ring skeleton) be selected such that the emission peak of the exciplex formed by the compound 131 and the compound 134 overlaps with an absorption band on the longest wavelength side (low energy side) of the compound 133 (phosphorescent material having a five-membered ring skeleton). This makes it possible to provide a light-emitting device with drastically improved emission efficiency.

The light-emitting layer 130 can also be formed of two or more layers. For example, in the case where the light-emitting layer 130 is formed by stacking a first light-emitting layer and a second light-emitting layer in this order from the hole-transport layer side, a substance having a hole-transport property is used as the host material of the first light-emitting layer and a substance having an electron-transport property is used as the host material of the second light-emitting layer.

The light-emitting layer 130 may contain a material (a compound 135) in addition to the compound 131, the compound 132, the compound 133, and the compound 134. In that case, in order for the compound 131 and the compound 133 (or the compound 134) to efficiently form an exciplex, it is preferable that the HOMO level of one of the compound 131 and the compound 133 (or the compound 134) be the highest HOMO level of the materials in the light-emitting layer 130 and that the LUMO level of the other be the lowest LUMO level of the materials in the light-emitting layer 130. With such an energy level correlation, the reaction for forming an exciplex by the compound 131 and the compound 135 can be inhibited.

In the case where, for example, the compound 131 has a hole-transport property and the compound 133 (or the compound 134) has an electron-transport property, the HOMO level of the compound 131 is preferably higher than the HOMO level of the compound 133 and the HOMO level of the compound 135, and the LUMO level of the compound 133 is preferably lower than the LUMO level of the compound 131 and the LUMO level of the compound 135. In this case, the LUMO level of the compound 135 may be higher or lower than the LUMO level of the compound 131. Furthermore, the HOMO level of the compound 135 may be higher or lower than the HOMO level of the compound 133.

Examples of the material (the compound 135) that can be used for the light-emitting layer 130 are, but not particularly limited to, metal complexes such as tris(8-quinolinolato)aluminum(III) (abbreviation: Alq), tris(4-methyl-8-quinolinolato)aluminum(III) (abbreviation: Almq$_3$), bis(10-hydroxybenzo[h]quinolinato)beryllium(II) (abbreviation: BeBq$_2$), bis(2-methyl-8-quinolinolato)(4-phenyl phenolato)aluminum(III) (abbreviation: BAlq), bis(8-quinolinolato) zinc (II) (abbreviation: Znq), bis[2-(2-benzoxazolyl)phenolato]zinc(II) (abbreviation: ZnPBO), and bis[2-(2-benzothiazolyl)phenolato]zinc(II) (abbreviation: ZnBTZ); heterocyclic compounds such as 2-(4-biphenylyl)-5-(4-tert-butylphenyl)-1,3,4-oxadiazole (abbreviation: PBD), 1,3-bis[5-(p-tert-butylphenyl)-1,3,4-oxadiazol-2-yl]benzene (abbreviation: OXD-7), 3-(4-biphenylyl)-4-phenyl-5-(4-tert-butylphenyl)-1,2,4-triazole (abbreviation: TAZ), 2,2',2"-(1,3,5-benzenetriyl)tris(1-phenyl-1H-benzimidazole) (abbreviation: TPBI), bathophenanthroline (abbreviation: BPhen), bathocuproine (abbreviation: BCP), and 9-[4-(5-phenyl-1,3,4-oxadiazol-2-yl)phenyl]-9H-carbazole (abbreviation: CO11); and aromatic amine compounds such as 4,4'-bis[N-(1-naphthyl)-N-phenylamino]biphenyl (abbreviation: NPB or α-NPD), N,N'-bis(3-methylphenyl)-N,N'-diphenyl-[1,1'-biphenyl]-4,4'-diamine (abbreviation: TPD), and 4,4'-bis[N-(spiro-9,9'-bifluoren-2-yl)-N-phenylamino] biphenyl (abbreviation: BSPB). Other examples include condensed polycyclic aromatic compounds such as anthracene derivatives, phenanthrene derivatives, pyrene derivatives, chrysene derivatives, and dibenzo[g,p]chrysene derivatives, and specific examples include 9,10-diphenylanthracene (abbreviation: DPAnth), N,N'-diphenyl-9-[4-(10-phenyl-9-anthryl)phenyl]-9H-carbazol-3-amine (abbreviation: CzAlPA), 4-(10-phenyl-9-anthryl)triphenylamine (abbreviation: DPhPA), 4-(9H-carbazol-9-yl)-4'-(10-phenyl-9-anthryl)triphenylamine (abbreviation: YGAPA), N,9-diphenyl-N-[4-(10-phenyl-9-anthryl)phenyl]-9H-carbazol-3-amine (abbreviation: PCAPA), N,9-diphenyl-N-{4-[4-(10-phenyl-9-anthryl)phenyl]phenyl}-9H-carbazol-3-amine (abbreviation: PCAPBA), N,9-diphenyl-N-(9,10-diphenyl-2-anthryl)-9H-carbazol-3-amine (abbreviation: 2PCAPA), 6,12-dimethoxy-5,11-diphenylchrysene, N,N,N',N',N",N",N'",N'"-octaphenyldibenzo[g,p]chrysene-2,7,10,15-tetraamine (abbreviation: DBC1), 9-[4-(10-phenyl-9-anthryl) phenyl]-9H-carbazole (abbreviation: CzPA), 3,6-diphenyl-9-[4-(10-phenyl-9-anthryl)phenyl]-9H-carbazole (abbreviation: DPCzPA), 9,10-bis(3,5-diphenylphenyl)anthracene (abbreviation: DPPA), 9,10-di(2-naphthyl)anthracene (abbreviation: DNA), 2-tert-butyl-9,10-di(2-naphthyl) anthracene (abbreviation: t-BuDNA), 9,9'-bianthryl (abbreviation: BANT), 9,9'-(stilbene-3,3'-diyl)diphenanthrene (abbreviation: DPNS), 9,9'-(stilbene-4,4'-diyl)diphenanthrene (abbreviation: DPNS2), and 1,3,5-tri(1-pyrenyl)benzene (abbreviation: TPB3). One or more substances having a wider energy gap than the compound 131 and the compound 132 are selected from these substances and known substances.

<<Pair of Electrodes>>

The electrode 101 and the electrode 102 have functions of injecting holes and electrons into the light-emitting layer 130. The electrode 101 and the electrode 102 can be formed using a metal, an alloy, or a conductive compound, a mixture or a stack thereof, or the like. As the metal, aluminum (Al) is a typical example; besides, a transition metal such as silver (Ag), tungsten, chromium, molybdenum, copper, or titanium, an alkali metal such as lithium (Li) or cesium, or a Group 2 metal such as calcium or magnesium (Mg) can be used. As the transition metal, a rare earth metal such as ytterbium (Yb) may be used. An alloy containing the above metal can be used as the alloy; examples are MgAg and AlLi. Examples of the conductive compound include metal oxides such as indium tin oxide (hereinafter ITO), indium tin oxide containing silicon or silicon oxide (abbreviation: ITSO), indium zinc oxide, and indium oxide containing tungsten and zinc. It is also possible to use an inorganic carbon-based material such as graphene as the conductive compound. As described above, one or both of the electrode 101 and the electrode 102 may be formed by stacking two or more of these materials.

Light emission obtained from the light-emitting layer 130 is extracted through one or both of the electrode 101 and the electrode 102. Therefore, at least one of the electrode 101 and the electrode 102 has a function of transmitting visible light. An example of a conductive material having a function of transmitting light is a conductive material having a visible light transmittance higher than or equal to 40% and lower than or equal to 100%, preferably higher than or equal to 60% and lower than or equal to 100% and a resistivity lower than or equal to $1\times10^{-2}$ Ω·cm. The electrode through which light is extracted may be formed using a conductive material having a function of transmitting light and a function of reflecting light. As the conductive material, a conductive material having a visible light reflectivity higher than or equal to 20% and lower than or equal to 80%, preferably higher than or equal to 40% and lower than or equal to 70%, and a resistivity lower than or equal to $1\times10^{-2}$ Ω·cm can be used. In the case where a material with low light transmittance, such as metal or alloy, is used for the electrode through which light is extracted, one or both of the electrode 101 and the electrode 102 are formed to a thickness that is thin enough to transmit visible light (e.g., a thickness of 1 nm to 10 nm).

Note that in this specification and the like, for the electrode having a function of transmitting light, a material that has a function of transmitting visible light and has conductivity is used; examples include, in addition to a layer of an oxide conductor typified by ITO mentioned above, an oxide semiconductor layer and an organic conductor layer containing an organic substance. Examples of the organic conductor layer containing an organic substance include a layer containing a composite material in which an organic compound and an electron donor (donor) are mixed and a layer containing a composite material in which an organic compound and an electron acceptor (acceptor) are mixed. The resistivity of the transparent conductive layer is preferably lower than or equal to $1\times10^{5}$ Ω·cm, further preferably lower than or equal to $1\times10^{4}$ Ω·cm.

As a method for forming the electrode 101 and the electrode 102, a sputtering method, an evaporation method, a printing method, a coating method, an MBE (Molecular Beam Epitaxy) method, a CVD method, a pulsed laser deposition method, an ALD (Atomic Layer Deposition) method, or the like can be used as appropriate.

<<Hole-Injection Layer>>

The hole-injection layer 111 has a function of lowering a barrier for hole injection from one of the pair of electrodes (the electrode 101 or the electrode 102) to promote hole injection and is formed using a transition metal oxide, a phthalocyanine derivative, or an aromatic amine, for example. As the transition metal oxide, molybdenum oxide, vanadium oxide, ruthenium oxide, tungsten oxide, manganese oxide, and the like can be given. As the phthalocyanine derivative, phthalocyanine, metal phthalocyanine, and the like can be given. As the aromatic amine, a benzidine derivative, a phenylenediamine derivative, and the like can be given. It is also possible to use a high molecular compound such as polythiophene or polyaniline; a typical example thereof is poly(ethylenedioxythiophene)/poly(styrenesulfonic acid), which is self-doped polythiophene.

As the hole-injection layer 111, a layer containing a composite material of a hole-transport material and a material having a property of accepting electrons from the hole-transport material can also be used. Alternatively, a stack of a layer containing a material having an electron-accepting property and a layer containing a hole-transport material may also be used. In a steady state or in the presence of an electric field, electric charge can be transferred between these materials. As examples of the material having an electron-accepting property, organic acceptors such as a quinodimethane derivative, a chloranil derivative, and a hexaazatriphenylene derivative can be given. A specific example is a compound having an electron-withdrawing group (in particular, a cyano group or a halogen group such as a fluoro group), such as 7,7,8,8-tetracyano-2,3,5,6-tetrafluoroquinodimethane (abbreviation: F4-TCNQ), chloranil, 2,3,6,7,10,11-hexacyano-1,4,5,8,9,12-hexaazatriphenylene (abbreviation: HAT-CN), and 1,3,4,5,7,8-hexafluorotetracyano-naphthoquinodimethane (abbreviation: F6-TCNNQ). A compound in which electron-withdrawing groups are bonded to a condensed aromatic ring having a plurality of hetero atoms, such as HAT-CN, is particularly preferable because it is thermally stable. A [3]radialene derivative having an electron-withdrawing group (in particular, a cyano group or a halogen group such as a fluoro group) is preferable because of having a very high electron-accepting property. Specific examples include α,α',α"-1,2,3-cyclopropanetriylidenetris[4-cyano-2,3,5,6-tetrafluorobenzeneacetonitrile], α,α',α"-1,2,3-cyclopropanetriylidenetris[2,6-dichloro-3,5-difluoro-4-(trifluoromethyl)benzeneacetonitrile], and α,α',α"-1,2,3-cyclopropanetriylidenetris[2,3,4,5,6-pentafluorobenzeneacetonitrile]. Alternatively, a transition metal oxide such as an oxide of a metal from Group 4 to Group 8 can be used. Specifically, vanadium oxide, niobium oxide, tantalum oxide, chromium oxide, molybdenum oxide, tungsten oxide, manganese oxide, rhenium oxide, or the like can be used. In particular, molybdenum oxide is preferable because it is stable in the air, has a low hygroscopic property, and is easily handled.

A material having a property of transporting more holes than electrons can be used as the hole-transport material, and a material having a hole mobility of $1\times10^{-6}$ cm$^2$/Vs or higher is preferable. Specifically, the aromatic amines and the carbazole derivatives given as the hole-transport material that can be used for the light-emitting layer 130 can be used. Alternatively, the aromatic hydrocarbons, the stilbene derivatives, and the like can be used. Furthermore, the hole-transport material may be a high molecular compound.

Examples of the aromatic hydrocarbon include 2-tert-butyl-9,10-di(2-naphthyl)anthracene (abbreviation: t-BuDNA), 2-tert-butyl-9,10-di(1-naphthyl)anthracene, 9,10-bis(3,5-diphenylphenyl)anthracene (abbreviation: DPPA), 2-tert-butyl-9,10-bis(4-phenylphenyl)anthracene (abbreviation: t-BuDBA), 9,10-di(2-naphthyl)anthracene (abbreviation: DNA), 9,10-diphenylanthracene (abbreviation: DPAnth), 2-tert-butylanthracene (abbreviation: t-BuAnth), 9,10-bis(4-methyl-1-naphthyl)anthracene (abbreviation: DMNA), 2-tert-butyl-9,10-bis[2-(1-naphthyl)phenyl]anthracene, 9,10-bis[2-(1-naphthyl)phenyl]anthracene, 2,3,6,7-tetramethyl-9,10-di(1-naphthyl)anthracene, 2,3,6,7-tetramethyl-9,10-di(2-naphthyl)anthracene, 9,9'-bianthryl, 10,10'-diphenyl-9,9'-bianthryl, 10,10'-bis(2-phenylphenyl)-9,9'-bianthryl, 10,10'-bis[(2,3,4,5,6-pentaphenyl)phenyl]-9,9'-bianthryl, anthracene, tetracene, rubrene, perylene, and 2,5,8,11-tetra(tert-butyl)perylene. Other examples include pentacene and coronene. Thus, the use of the aromatic hydrocarbon having a hole mobility of $1\times10^{-6}$ cm$^2$/Vs or higher and having 14 to 42 carbon atoms is further preferable.

The aromatic hydrocarbon may have a vinyl skeleton. Examples of the aromatic hydrocarbon having a vinyl group include 4,4'-bis(2,2-diphenylvinyl)biphenyl (abbreviation: DPVBi) and 9,10-bis[4-(2,2-diphenylvinyl)phenyl]anthracene (abbreviation: DPVPA).

Other examples include high molecular compounds such as poly(N-vinylcarbazole) (abbreviation: PVK), poly(4-vinyltriphenylamine) (abbreviation: PVTPA), poly[N-(4-{N-[4-(4-diphenylamino)phenyl]phenyl-N-phenylamino}phenyl)methacrylamide] (abbreviation:

PTPDMA), and poly[N,N'-bis(4-butylphenyl)-N,N'-bis(phenyl)benzidine] (abbreviation: Poly-TPD).

<<Hole-Transport Layer>>

The hole-transport layer 112 is a layer containing a hole-transport material and can be formed using the materials given as examples of the materials of the hole-injection layer 111. In order that the hole-transport layer 112 has a function of transporting holes injected into the hole-injection layer 111 to the light-emitting layer 130, the hole-transport layer 112 preferably has a HOMO level equal or close to the HOMO level of the hole-injection layer 111.

As the hole-transport material, the materials given as examples of the material of the hole-injection layer 111 can be used. A substance having a hole mobility of $1 \times 10^{-6}$ cm$^2$/Vs or higher is preferred. Note that other substances may also be used as long as they have a property of transporting more holes than electrons. The layer containing a substance having a high hole-transport property is not limited to a single layer, and two or more layers containing the aforementioned substances may be stacked.

<<Electron-Transport Layer>>

The electron-transport layer 118 has a function of transporting, to the light-emitting layer 130, electrons injected from the other of the pair of electrodes (the electrode 101 or the electrode 102) through the electron-injection layer 119. A material having a property of transporting more electrons than holes can be used as the electron-transport material, and a material having an electron mobility of $1 \times 10^{-6}$ cm$^2$/Vs or higher is preferable. As a compound that easily accepts electrons (a material having an electron-transport property), a π-electron deficient heteroaromatic compound such as a nitrogen-containing heteroaromatic compound or a metal complex can be used, for example. Specifically, the metal complex having a quinoline ligand, a benzoquinoline ligand, an oxazole ligand, or a thiazole ligand, which is given as the electron-transport material that can be used for the light-emitting layer 130, can be given. Furthermore, an oxadiazole derivative, a triazole derivative, a phenanthroline derivative, a pyridine derivative, a bipyridine derivative, a pyrimidine derivative, and the like can be given. A substance having an electron mobility of $1 \times 10^{-6}$ cm$^2$/Vs or higher is preferable. Note that other than these substances, any substance that has a property of transporting more electrons than holes may be used for the electron-transport layer. The electron-transport layer 118 is not limited to a single layer, and two or more layers containing the aforementioned substances may be stacked.

A layer that controls transfer of electron carriers may be provided between the electron-transport layer 118 and the light-emitting layer 130. The layer that controls transfer of electron carriers is a layer in which a small amount of a substance having a high electron-trapping property is added to the above-described material having a high electron-transport property, and is capable of adjusting carrier balance by suppressing transfer of electron carriers. Such a structure is very effective in preventing a problem (such as a reduction in device lifetime) caused when electrons pass through the light-emitting layer.

<<Electron-Injection Layer>>

The electron-injection layer 119 has a function of reducing a barrier for electron injection from the electrode 102 to promote electron injection, and a Group 1 metal, a Group 2 metal, or an oxide, a halide, a carbonate, or the like of them can be used, for example. Alternatively, a composite material containing the electron-transport material described above and a material having a property of donating electrons to the electron-transport material can also be used. As the material having an electron-donating property, a Group 1 metal, a Group 2 metal, an oxide of any of the metals, and the like can be given. Specifically, an alkali metal, an alkaline earth metal, or a compound thereof, such as lithium fluoride (LiF), sodium fluoride (NaF), cesium fluoride (CsF), calcium fluoride (CaF$_2$), or lithium oxide (LiO$_x$), can be used. A rare earth metal compound like erbium fluoride (ErF$_3$) can also be used. Electride may also be used for the electron-injection layer 119. Examples of the electride include a substance in which electrons are added at high concentration to a mixed oxide of calcium and aluminum. The electron-injection layer 119 can be formed using the substance that can be used for the electron-transport layer 118.

A composite material in which an organic compound and an electron donor (donor) are mixed may also be used for the electron-injection layer 119. Such a composite material is excellent in an electron-injection property and an electron-transport property because electrons are generated in the organic compound by the electron donor. In this case, the organic compound is preferably a material that is excellent in transporting the generated electrons; specifically, the above-listed substances contained in the electron-transport layer 118 (the metal complexes, heteroaromatic compounds, and the like) can be used, for example. As the electron donor, a substance showing an electron-donating property with respect to an organic compound is used. Specifically, an alkali metal, an alkaline earth metal, and a rare earth metal are preferable, and lithium, cesium, magnesium, calcium, erbium, ytterbium, and the like are given. In addition, an alkali metal oxide and an alkaline earth metal oxide are preferable, and lithium oxide, calcium oxide, barium oxide, and the like are given. Alternatively, a Lewis base such as magnesium oxide can be used. Further alternatively, an organic compound such as tetrathiafulvalene (abbreviation: TTF) can be used.

Note that the light-emitting layer, the hole-injection layer, the hole-transport layer, the electron-transport layer, and the electron-injection layer described above can each be formed by a method such as an evaporation method (including a vacuum evaporation method), an inkjet method, a coating method, a nozzle printing method, or gravure printing. Other than the above-described materials, an inorganic compound such as a quantum dot or a high molecular compound (an oligomer, a dendrimer, a polymer, or the like) may be used for the light-emitting layer, the hole-injection layer, the hole-transport layer, the electron-transport layer, and the electron-injection layer described above.

As the quantum dot, a colloidal quantum dot, an alloyed quantum dot, a core-shell quantum dot, a core quantum dot, or the like may be used. Moreover, a quantum dot containing elements belonging to Groups 2 and 16, Groups 13 and 15, Groups 13 and 17, Groups 11 and 17, or Groups 14 and 15 may be used. Alternatively, a quantum dot containing an element such as cadmium (Cd), selenium (Se), zinc (Zn), sulfur (S), phosphorus (P), indium (In), tellurium (Te), lead (Pb), gallium (Ga), arsenic (As), or aluminum (Al) may be used.

As the liquid medium used for the wet process, an organic solvent of ketones such as methyl ethyl ketone and cyclohexanone; fatty acid esters such as ethyl acetate; halogenated hydrocarbons such as dichlorobenzene; aromatic hydrocarbons such as toluene, xylene, mesitylene, and cyclohexylbenzene; aliphatic hydrocarbons such as cyclohexane, decalin, and dodecane; dimethylformamide (DMF); dimethyl sulfoxide (DMSO); or the like can be used.

Examples of the high molecular compound that can be used for the light-emitting layer include polyphenylenevinylene (PPV) derivatives such as poly[2-methoxy-5-(2-ethylhexyloxy)-1,4-phenylenevinylene] (abbreviation: MEH-PPV) and poly(2,5-dioctyl-1,4-phenylenevinylene); polyfluorene derivatives such as poly(9,9-di-n-octylfluorenyl-2,7-diyl) (abbreviation: PF8), poly[(9,9-di-n-octylfluorenyl-2,7-diyl)-alt-(benzo[2,1,3]thiadiazole-4,8-diyl)] (abbreviation: F8BT), poly[(9,9-di-n-octylfluorenyl-2,7-diyl)-alt-(2,2'-bithiophene-5,5'-diyl)] (abbreviation: F8T2), poly[(9,9-dioctyl-2,7-divinylenefluorenylene)-alt-(9,10-anthracene)], or poly[(9,9-dihexylfluorene-2,7-diyl)-alt-(2,5-dimethyl-1,4-phenylene)]; a polyalkylthiophene (PAT) derivative such as poly(3-hexylthiophene-2,5-diyl) (abbreviation: P3HT); and a polyphenylene derivative. These high molecular compounds and high molecular compounds such as poly(N-vinylcarbazole) (abbreviation: PVK), poly(2-vinylnaphthalene), and poly[bis(4-phenyl) (2,4,6-trimethylphenyl)amine](abbreviation: PTAA) may be doped with a light-emitting compound and used for the light-emitting layer. As the light-emitting compound, the light-emitting compounds given above can be used.

<<Substrate>>

A light-emitting device of one embodiment of the present invention is formed over a substrate of glass, plastic, or the like. As for the order of forming layers over the substrate, layers may be sequentially stacked from the electrode 101 side or sequentially stacked from the electrode 102 side.

For the substrate over which the light-emitting device of one embodiment of the present invention can be formed, glass, quartz, plastic, or the like can be used, for example. Alternatively, a flexible substrate can be used. The flexible substrate is a substrate that can be bent (is flexible), such as a plastic substrate made of polycarbonate or polyarylate, for example. Furthermore, a film, an inorganic vapor deposition film, or the like can be used. Note that materials other than these may be used as long as they function as a support in a manufacturing process of the light-emitting device and an optical device. Alternatively, another material may be used as long as it has a function of protecting the light-emitting device and the optical device.

In this specification and the like, a light-emitting device can be formed using any of a variety of substrates, for example. The type of a substrate is not limited particularly. Examples of the substrate include a semiconductor substrate (e.g., a single-crystal substrate or a silicon substrate), an SOI substrate, a glass substrate, a quartz substrate, a plastic substrate, a metal substrate, a stainless steel substrate, a substrate including stainless steel foil, a tungsten substrate, a substrate including tungsten foil, a flexible substrate, an attachment film, cellulose nanofiber (CNF) and paper which include a fibrous material, and a base material film. Examples of the glass substrate include barium borosilicate glass, aluminoborosilicate glass, and soda lime glass. Examples of the flexible substrate, the attachment film, the base material film, and the like are as follows. The examples include plastics typified by polyethylene terephthalate (PET), polyethylene naphthalate (PEN), polyether sulfone (PES), and polytetrafluoroethylene (PTFE). Another example is a resin such as acrylic. Other examples are polypropylene, polyester, polyvinyl fluoride, and polyvinyl chloride. Other examples are polyamide, polyimide, aramid, epoxy, an inorganic vapor deposition film, paper, and the like.

Furthermore, a flexible substrate may be used as the substrate and the light-emitting device may be formed directly on the flexible substrate. Alternatively, a separation layer may be provided between the substrate and the light-emitting device. The separation layer can be used when part or the whole of a light-emitting device formed over the separation layer is separated from the substrate and transferred onto another substrate. In such a case, the light-emitting device can be transferred to a substrate having low heat resistance or a flexible substrate as well. For the above separation layer, a stack including inorganic films, which are a tungsten film and a silicon oxide film, or a structure in which a resin film of polyimide or the like is formed over a substrate can be used, for example.

In other words, after the light-emitting device is formed using a substrate, the light-emitting device may be transferred to another substrate. Examples of the substrate to which the light-emitting device is transferred are, in addition to the above substrates, a cellophane substrate, a stone substrate, a wood substrate, a cloth substrate (including a natural fiber (e.g., silk, cotton, or hemp), a synthetic fiber (e.g., nylon, polyurethane, or polyester), a regenerated fiber (e.g., acetate, cupro, rayon, or regenerated polyester), and the like), a leather substrate, a rubber substrate, and the like. With the use of such a substrate, a light-emitting device with high durability, a light-emitting device with high heat resistance, a light-emitting device with reduced weight, or a light-emitting device with reduced thickness can be obtained.

The light-emitting device 150 may be formed over an electrode electrically connected to a field-effect transistor (FET), for example, that is formed over any of the above-described substrates. Accordingly, an active matrix display device in which the FET controls the driving of the light-emitting device can be fabricated.

The structure described above in this embodiment can be used in appropriate combination with the other embodiments.

Embodiment 2

In this embodiment, examples of a method for synthesizing an organic compound that is favorably used for the light-emitting device of one embodiment of the present invention will be described giving the organic compounds represented by General formulae (G1) and (G2) as an example.

<Method for Synthesizing Organic Compound Represented by General Formula (G1)>

The organic compound represented by General formula (G1) shown above can be synthesized by a synthesis method using a variety of reactions. For example, the organic compound can be synthesized by Synthesis schemes (S-1) and (S-2) shown below. A compound 1, an arylamine (compound 2), and an arylamine (compound 3) are coupled, whereby a diamine compound (compound 4) is obtained.

Next, the diamine compound (compound 4), halogenated aryl (compound 5), and halogenated aryl (compound 6) are coupled, whereby the organic compound represented by General formula (G1) can be obtained.

[Chemical formula 22]

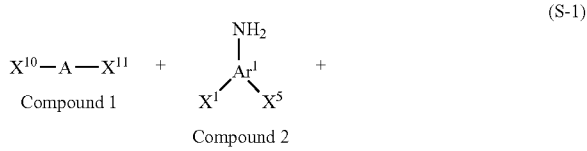

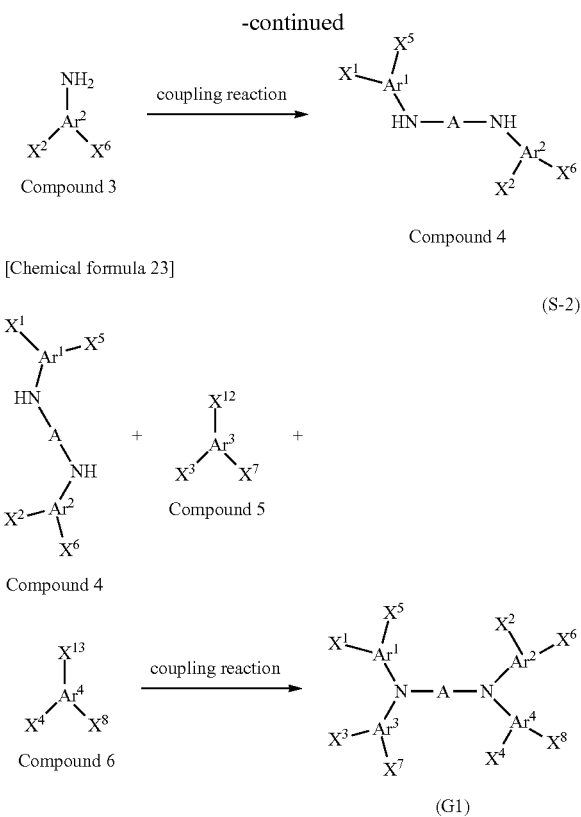

In Synthesis schemes (S-1) and (S-2) shown above, A represents a substituted or unsubstituted condensed aromatic ring having 10 to 30 carbon atoms or a substituted or unsubstituted condensed heteroaromatic ring having 10 to 30 carbon atoms, $Ar^1$ to $Ar^4$ each independently represent a substituted or unsubstituted aromatic hydrocarbon group having 6 to 13 carbon atoms, $X^1$ to $X^8$ each independently represent any one of an alkyl group having 3 to 10 carbon atoms, a substituted or unsubstituted cycloalkyl group having 3 to 10 carbon atoms, and a trialkylsilyl group having 3 to 12 carbon atoms. Examples of the condensed ring or condensed heteroaromatic ring include chrysene, phenanthrene, stilbene, acridone, phenoxazine, and phenothiazine. In particular, anthracene, pyrene, coumarin, quinacridone, perylene, tetracene, and naphthobisbenzofuran are preferable.

In the case where a Buchwald-Hartwig reaction using a palladium catalyst is performed in Synthesis schemes (S-1) and (S-2) shown above, $X^{10}$ to $X^{13}$ each represent a halogen group or a triflate group, and the halogen is preferably iodine, bromine, or chlorine. In the reaction, a palladium compound such as bis(dibenzylideneacetone)palladium(0) or palladium(II) acetate and a ligand such as tri(tert-butyl)phosphine, tri(n-hexyl)phosphine, tricyclohexylphosphine, di(1-adamantyl)-n-butylphosphine, or 2-dicyclohexylphosphino-2',6'-dimethoxy-1,1'-biphenyl can be used. In addition, an organic base such as sodium tert-butoxide, an inorganic base such as potassium carbonate, cesium carbonate, sodium carbonate, or the like can be used. Furthermore, toluene, xylene, mesitylene, benzene, tetrahydrofuran, dioxane, or the like can be used as a solvent. Reagents that can be used in the reaction are not limited thereto.

The reaction performed in Synthesis schemes (S-1) and (S-2) shown above is not limited to the Buchwald-Hartwig reaction. A Migita-Kosugi-Stille coupling reaction using an organotin compound, a coupling reaction using a Grignard reagent, an Ullmann reaction using copper or a copper compound, or the like can be used.

In the case where the compound 2 and the compound 3 have different structures in Synthesis scheme (S-1) shown above, it is preferred that the compound 1 and the compound 2 be reacted first to form a coupling product and then the obtained coupling product and the compound 3 be reacted. In the case where the compound 1 is reacted with the compound 2 and the compound 3 in different stages, it is preferred that the compound 1 be a dihalogen compound and and $X^1$ be different halogens and selectively subjected to amination reactions one by one.

Furthermore, in the case where the compound 5 and the compound 6 have different structures in Synthesis scheme (S-2), it is preferable that the compound 4 and the compound 5 be reacted first to form a coupling product and then the obtained coupling product and the compound 6 be reacted.

<Method for Synthesizing Organic Compound Represented by General Formula (G2)>

The organic compound represented by General formula (G2) can be synthesized by utilizing a variety of organic reactions. Two kinds of methods are shown below as examples.

The first method consists of Synthesis schemes (S-3) to (S-8) below. The first step is a step in which a condensation reaction of an aniline compound (compound 7) and a 1,4-cyclohexadiene-1,4-dicarboxylic acid compound (compound 8) gives an amine compound (compound 9). The step is shown in Scheme (S-3). Note that in the case where two aniline compounds (compounds 7) having the same substituent can be condensed and an amino group having the same substituent is introduced in one step, the reaction is preferably performed with two equivalents of the aniline compound (compound 7). In that case, one object can be obtained even when a carbonyl group of the compound 8 does not have reaction selectivity.

Next, a condensation reaction of the amine compound (compound 9) and an aniline derivative (compound 10) gives a 1,4-cyclohexadiene compound (compound 11). The step for obtaining the compound 11 is shown in Scheme (S-4).

Then, the 1,4-cyclohexadiene compound (compound 11) is oxidized in the air, whereby a terephthalic acid compound (compound 12) can be obtained. The step for obtaining the compound 12 is shown in Scheme (S-5).

Next, a ring of the terephthalic acid compound (compound 12) is fused using acid, whereby a quinacridone compound (compound 13) can be obtained. The step for obtaining the compound 13 is shown in Scheme (S-6).

Then, the quinacridone compound (compound 13) and a halogenated aryl (compound 14) are coupled, whereby a quinacridone compound (compound 15) can be obtained. The step for obtaining the compound 15 is shown in Scheme (S-7). Note that in the case where two halogenated aryls (compounds 8) having the same substituent can be coupled and an amino group having the same substituent is introduced in one step, the reaction is preferably performed with two equivalents of the halogenated aryl (compound 14). In that case, one object can be obtained even when an amino group of the compound 14 does not have reaction selectivity.

Then, the quinacridone compound (compound 15) and a halogenated aryl (compound 16) are coupled, whereby the organic compound represented by General formula (G2) shown above can be obtained. The step is shown in Scheme (S-8).

[Chemical formulae 24]
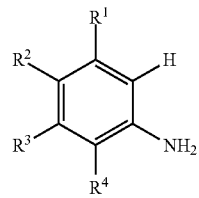
Compound 7
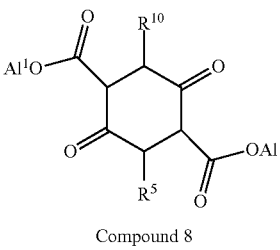
Compound 8
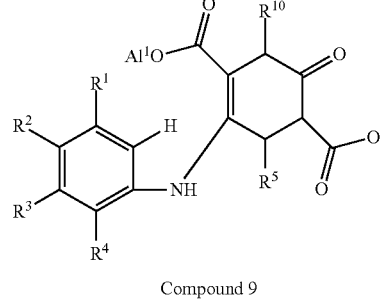
Compound 9
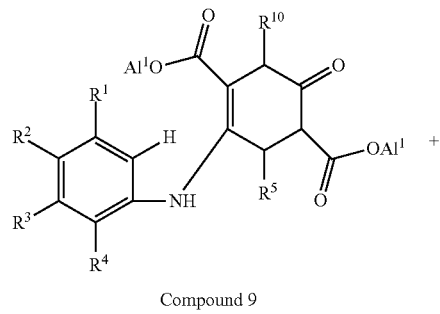
Compound 9
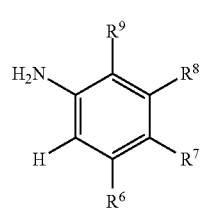
Compound 10
(S-3)
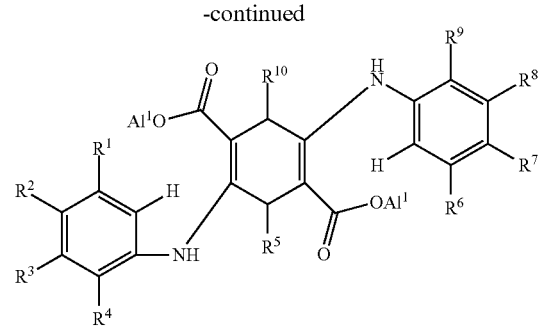
Compound 11
(S-4)
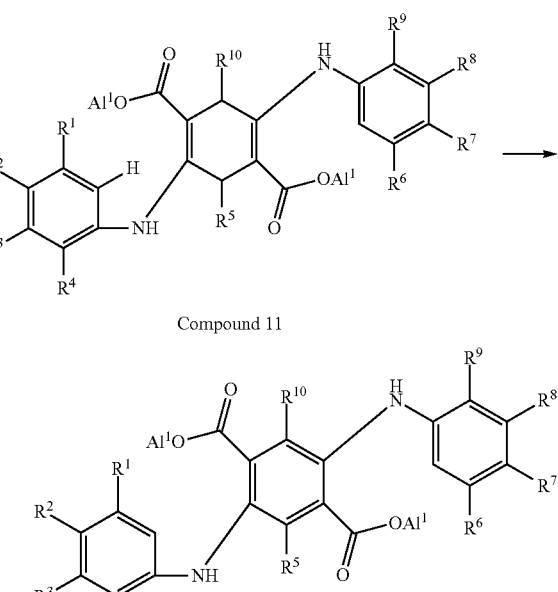
Compound 11
Compound 12
[Chemical formulae 25]
(S-5)
(S-6)
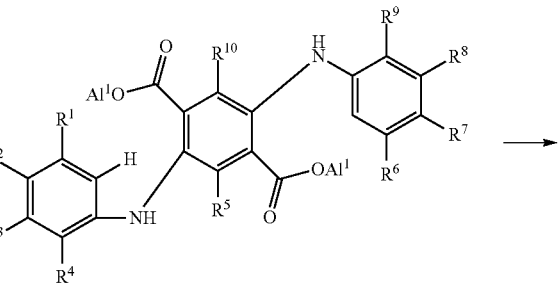
Compound 12
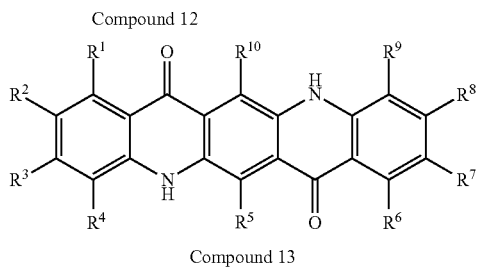
Compound 13

-continued

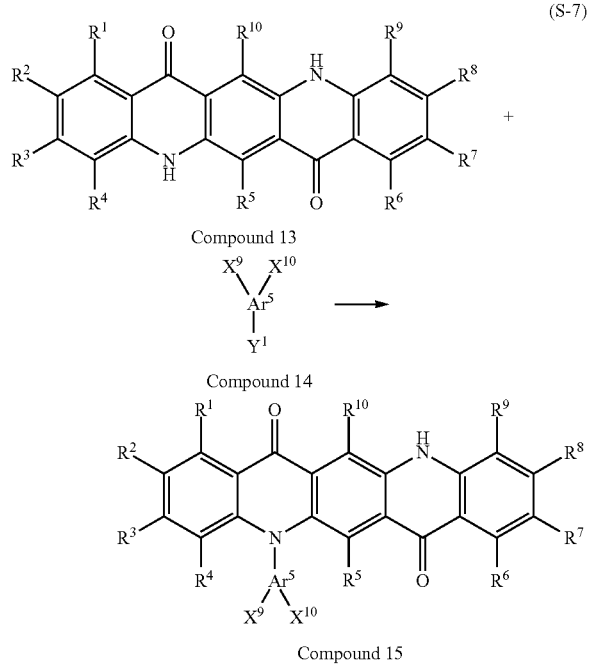

(S-7)

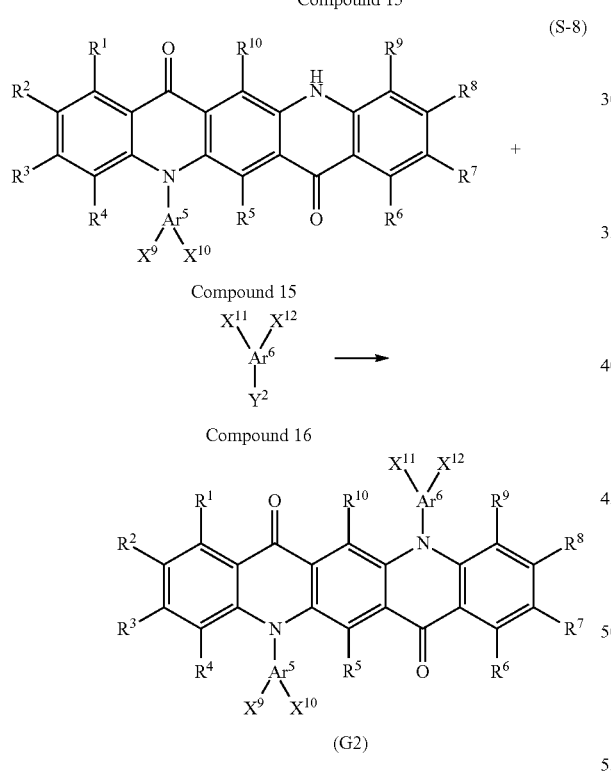

nated aryl (compound 14). In that case, one object can be obtained even when an amino group of the compound 12 does not have reaction selectivity.

Next, the diamine compound (compound 17) and the halogenated aryl (compound 16) are coupled, whereby a diamine compound (compound 18) can be obtained. The step for obtaining the compound 18 is shown in Scheme (S-10).

Finally, a ring of the diamine compound (compound 18) is fused using acid, whereby the organic compound represented by General formula (G2) shown above can be obtained. The step is shown in Scheme (S-11). Note that in the annelation reaction, hydrogen at the ortho position of $Ar^5$ or $Ar^6$ may be reacted and an isomer of the organic compound represented by General formula (G2) shown above may be generated.

The diamine compound (compound 18) having a symmetrical structure is used in Scheme (S-11), whereby the organic compound represented by General formula (G2) shown above can be synthesized.

[Chemical formulae 26]

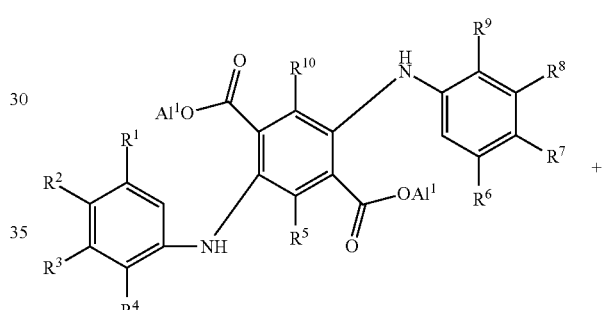

The second method consists of Synthesis schemes (S-3) to (S-5), (S-9), (S-10), and (S-11) shown below. The description of (S-3) to (S-5) is as described above. The terephthalic acid compound (compound 12) and the halogenated aryl (compound 14) are coupled, whereby a diamine compound (compound 17) can be obtained. The step for obtaining the compound 17 is shown in Scheme (S-9). Note that in the case where two halogenated aryl molecules having the same substituent can be coupled and an amino group having the same substituent is introduced in one step, the reaction is preferably performed with two equivalents of the haloge-

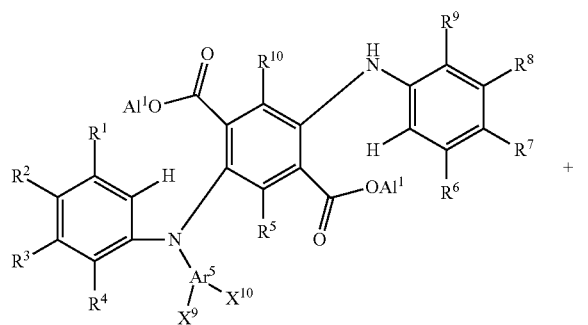

Compound 17

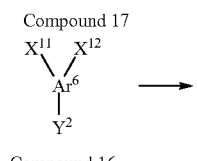

Compound 16

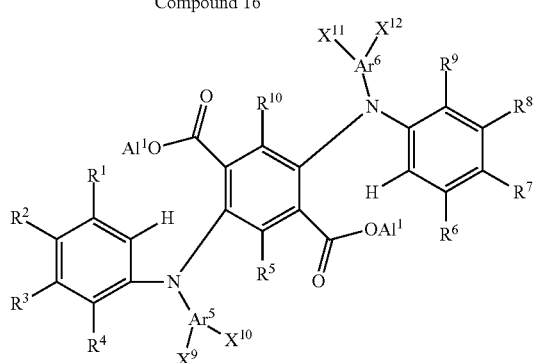

Compound 18

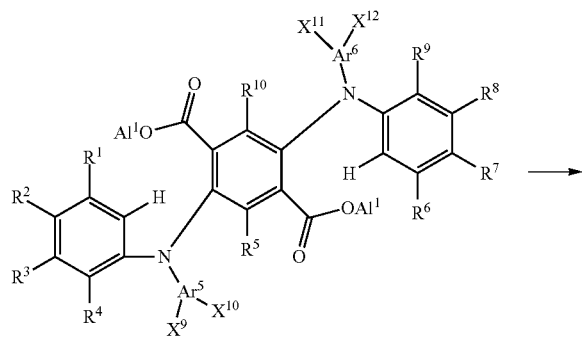

Compound 18

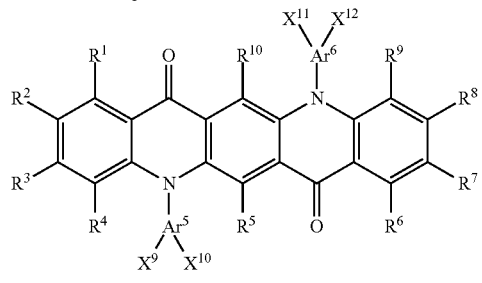

(G2)

In Synthesis schemes (S-3) to (S-6) and (S-9) to (S-11), $Al^1$ represents an alkyl group such as a methyl group.

In Synthesis schemes (S-7) to (S-10), $Y^1$ and $Y^2$ each represent chlorine, bromine, iodine, or a triflate group.

In Synthesis schemes (S-7) to (S-10), the Ullmann reaction is preferably performed because the reaction can proceed at high temperatures and a target compound can be obtained in a relatively high yield. In the reaction, copper or a copper compound can be used as a reagent, and an inorganic base such as potassium carbonate or sodium hydride can be used as a base. Examples of the solvent that can be used in the reaction include 2,2,6,6-tetramethyl-3,5-heptanedione, 1,3-dimethyl-3,4,5,6-tetrahydro-2(1H)pyrimidinone (DMPU), toluene, xylene, and benzene. In the Ullmann reaction, the objective substance can be obtained in a shorter time and in a higher yield when the reaction temperature is 100° C. or higher; therefore, it is preferable to use 2,2,6,6-tetramethyl-3,5-heptanedione, DMPU, or xylene, which has high boiling temperatures. A reaction temperature of 150° C. or higher is further preferred, and accordingly, DMPU is further preferably used. Reagents that can be used in the reaction are not limited to the above-described reagents.

In Synthesis schemes (S-7) to (S-10), the Buchwald-Hartwig reaction using a palladium catalyst can be performed. In the reaction, a palladium compound such as bis(dibenzylideneacetone)palladium(0), palladium(II) acetate, [1,1-bis(diphenylphosphino)ferrocene]palladium (II) dichloride, tetrakis(triphenylphosphine)palladium(0), or allylpalladium(II) chloride (dimer) and a ligand such as tri(tert-butyl)phosphine, tri(n-hexyl)phosphine, tricyclohexylphosphine, di(1-adamantyl)-n-butylphosphine, 2-dicyclohexylphosphino-2',6'-dimethoxybiphenyl, tri(ortho-tolyl) phosphine, or (S)-(6,6'-dimethoxybiphenyl-2,2'-diyl)bis (diisopropylphosphine) (abbreviation: cBRIDP (registered trademark)) can be used, for example. In the reaction, an organic base such as sodium tert-butoxide, an inorganic base such as potassium carbonate, cesium carbonate, or sodium carbonate, or the like can be used. In the reaction, toluene, xylene, benzene, tetrahydrofuran, dioxane, or the like can be used as a solvent. Reagents that can be used in the reaction are not limited to the above-described reagents.

The method for synthesizing the organic compound represented by General formula (G2) of the present invention is not limited to Synthesis schemes (S-1) to (S-11).

Specific examples of $R^1$ to $R^{10}$ substituted at the quinacridone skeleton include an n-propyl group, an isopropyl group, an n-butyl group, an isobutyl group, a tert-butyl group, a cyclopropyl group, a cyclobutyl group, a cyclopentyl group, a cyclohexyl group, a trimethylsilyl group, a triethylsilyl group, and a tributylsilyl group.

Specific examples of $Ar^5$ at which $X^9$ and $X^{10}$ are substituted and $Ar^6$ at which $X^{11}$ and $X^{12}$ are substituted include a 2-isopropylphenyl group, a 2-butylphenyl group, a 2-isobutylphenyl group, a 2-tert-butylphenyl group, a 2-isopropylphenyl group, a 2-butylphenyl group, a 3-propylphenyl group, a 3-isobutylphenyl group, a 3-tert-butylphenyl group, a 4-propylphenyl group, a 4-isopropylphenyl group, a 4-butylphenyl group, a 4-isobutylphenyl group, a 4-tert-butylphenyl group, a 3,5-dipropylphenyl group, a 3,5-diisopropylphenyl group, a 3,5-dibutylphenyl group, a 3,5-diisobutylphenyl group, a (3,5-di-tert-butyl)phenyl group, a 1,3-dipropylphenyl group, a 1,3-di-isopropylphenyl group, a 1,3-dibutylphenyl group, a 1,3-di-isobutylphenyl group, a (1,3-di-tert-butyl)phenyl group, a 1,3,5-triisopropylphenyl group, a (1,3,5-tri-tert-butyl)phenyl group, and a 4-cyclohexylphenyl group.

The above is the description of the methods for synthesizing the organic compounds which are embodiments of the present invention and are represented by General formula (G1) and General formula (G2); however, the present invention is not limited thereto and the synthesis may be performed by another synthesis method.

Embodiment 3

In this embodiment, a light-emitting device having a structure different from the structure of the light-emitting device described in Embodiment 1 will be described below with reference to FIG. 6. Note that in FIG. 6, a portion having a function similar to that in FIG. 1A is represented by the same hatch pattern and a reference numeral thereof is omitted in some cases. In addition, common reference numerals are used for portions having similar functions, and a detailed description thereof is omitted in some cases.

Structure Example 2 of Light-Emitting Device

Figure 6:
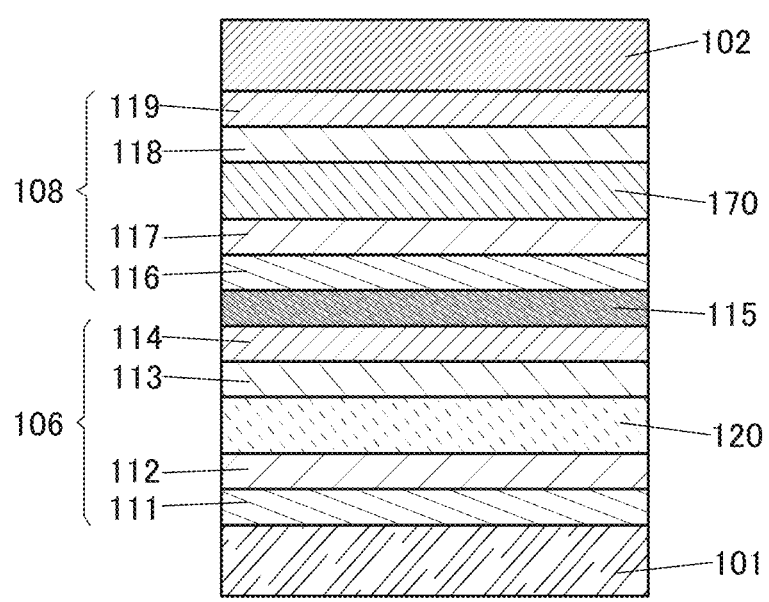
FIG. 6 is a schematic cross-sectional view of a light-emitting device of one embodiment of the present invention.

FIG. 6 is a schematic cross-sectional view of a light-emitting device 250.

The light-emitting device 250 illustrated in FIG. 6 includes a plurality of light-emitting units (a light-emitting unit 106 and a light-emitting unit 108) between a pair of electrodes (the electrode 101 and the electrode 102). Any one of the plurality of light-emitting units preferably has a structure similar to that of the EL layer 100 illustrated in FIG. 1A. That is, it is preferable that the light-emitting device 150 illustrated in FIG. 1A include one light-emitting unit, while the light-emitting device 250 include a plurality of light-emitting units. Note that the electrode 101 functions as an anode and the electrode 102 functions as a cathode in the light-emitting device 250 in the following description; however, the functions may be reversed as the structure of the light-emitting device 250.

Moreover, in the light-emitting device 250 illustrated in FIG. 6, the light-emitting unit 106 and the light-emitting unit 108 are stacked, and a charge-generation layer 115 is provided between the light-emitting unit 106 and the light-emitting unit 108. Note that the light-emitting unit 106 and the light-emitting unit 108 may have the same structure or different structures. For example, it is preferable to use a structure similar to that of the EL layer 100 for the light-emitting unit 108.

The light-emitting device 250 includes a light-emitting layer 120 and a light-emitting layer 170. The light-emitting unit 106 includes the hole-injection layer 111, the hole-transport layer 112, an electron-transport layer 113, and an electron-injection layer 114 in addition to the light-emitting layer 120. The light-emitting unit 108 includes a hole-injection layer 116, a hole-transport layer 117, the electron-transport layer 118, and the electron-injection layer 119 in addition to the light-emitting layer 170.

In the light-emitting device 250, any layer included in each of the light-emitting unit 106 and the light-emitting unit 108 contains the compound of one embodiment of the present invention. Note that the layer containing the compound is preferably the light-emitting layer 120 or the light-emitting layer 170.

The charge-generation layer 115 may have either a structure in which a substance having an acceptor property, which is an electron acceptor, is added to a hole-transport material or a structure in which a substance having a donor property, which is an electron donor, is added to an electron-transport material. Alternatively, both of these structures may be stacked.

In the case where the charge-generation layer 115 contains a composite material of an organic compound and a substance having an acceptor property, the composite material that can be used for the hole-injection layer 111 described in Embodiment 1 is used as the composite material. As the organic compound, a variety of compounds such as an aromatic amine compound, a carbazole compound, an aromatic hydrocarbon, and a high molecular compound (an oligomer, a dendrimer, a polymer, or the like) can be used. Note that a substance having a hole mobility of $1 \times 10^{-6}$ cm$^2$/Vs or higher is preferably used as the organic compound. However, other substances may also be used as long as they have a property of transporting more holes than electrons. Since the composite material of an organic compound and a substance having an acceptor property has excellent carrier-injection and carrier-transport properties, low-voltage driving or low-current driving can be achieved. Note that in the case where a surface of a light-emitting unit on the anode side is in contact with the charge-generation layer 115, the charge-generation layer 115 can also serve as a hole-injection layer or a hole-transport layer of the light-emitting unit; thus, a structure in which a hole-injection layer or a hole-transport layer is not provided in the light-emitting unit may be employed. Alternatively, in the case where a surface of a light-emitting unit on the cathode side is in contact with the charge-generation layer 115, the charge-generation layer 115 can also serve as an electron-injection layer or an electron-transport layer of the light-emitting unit; thus, a structure in which an electron-injection layer or an electron-transport layer is not provided in the light-emitting unit may be employed.

Note that the charge-generation layer 115 may have a stacked-layer structure combining a layer containing the composite material of an organic compound and a substance having an acceptor property and a layer formed of another material. For example, a layer containing the composite material of an organic compound and a substance having an acceptor property and a layer containing one compound selected from electron-donating substances and a compound having a high electron-transport property may be combined. Moreover, a layer containing the composite material of an organic compound and a substance having an acceptor property and a layer containing a transparent conductive film may be combined.

Note that the charge-generation layer 115 sandwiched between the light-emitting unit 106 and the light-emitting unit 108 injects electrons into one of the light-emitting units and injects holes into the other of the light-emitting units when voltage is applied to the electrode 101 and the electrode 102. For example, in FIG. 6, the charge-generation layer 115 injects electrons into the light-emitting unit 106 and injects holes into the light-emitting unit 108 when voltage is applied such that the potential of the electrode 101 is higher than the potential of the electrode 102.

Note that in terms of light extraction efficiency, the charge-generation layer 115 preferably has a property of transmitting visible light (specifically, the transmittance of visible light through the charge-generation layer 115 is higher than or equal to 40%). Moreover, the charge-generation layer 115 functions even when it has lower conductivity than the pair of electrodes (the electrode 101 and the electrode 102).

Forming the charge-generation layer 115 using the above-described materials can inhibit an increase in drive voltage in the case where the light-emitting layers are stacked.

The light-emitting device having two light-emitting units is described with reference to FIG. 6; however, a light-emitting device in which three or more light-emitting units are stacked can be similarly employed. With a plurality of light-emitting units partitioned by the charge-generation layer between a pair of electrodes as in the light-emitting device 250, it is possible to achieve a light-emitting device that can emit high-luminance light with the current density kept low and has a long lifetime. Moreover, a light-emitting device having low power consumption can be achieved.

Note that in each of the above structures, the emission colors exhibited by the guest materials used in the light-emitting unit 106 and the light-emitting unit 108 may be the same or different. In the case where guest materials having a function of exhibiting light emission of the same color are used for the light-emitting unit 106 and the light-emitting unit 108, the light-emitting device 250 can exhibit high emission luminance at a small current value, which is preferable. In the case where guest materials having a function of exhibiting light emission of different colors are used for the light-emitting unit 106 and the light-emitting unit 108, the light-emitting device 250 can exhibit multi-color light emission, which is preferable. In this case, with the use of a plurality of light-emitting materials with different emission wavelengths in one or both of the light-emitting layer 120 and the light-emitting layer 170, the light-emitting device 250 emits light obtained by synthesizing light emission having different emission peaks; thus, its emission spectrum has at least two local maximum values.

The above structure is also suitable for obtaining white light emission. When the light-emitting layer 120 and the light-emitting layer 170 emit light of complementary colors, white light emission can be obtained. It is particularly suitable to select the guest materials so that white light emission with high color rendering properties or light emission of at least red, green, and blue can be obtained.

One or both of the light-emitting layer 120 and the light-emitting layer 170 preferably have the structure of the light-emitting layer 130 described in Embodiment 1. With such a structure, a light-emitting device with favorable emission efficiency and favorable reliability can be obtained. The guest material contained in the light-emitting layer 130 is a fluorescent material. Thus, when one or both of the light-emitting layer 120 and the light-emitting layer 170 have the structure of the light-emitting layer 130 described in Embodiment 1, a light-emitting device with high efficiency and high reliability can be obtained.

In the case of a light-emitting device in which three or more light-emitting units are stacked, colors of light emitted from guest materials used in the light-emitting units may be the same or different from each other. In the case where a plurality of light-emitting units that emit light of the same color are included, these light-emitting units can emit light with high intensity with a small current value. Such a structure can be suitably used for adjustment of emission colors. The structure is particularly suitable when guest materials that emit light of different colors with different emission efficiencies are used. For example, when three layers of light-emitting units are included, the emission intensity of fluorescence and phosphorescence can be adjusted with two layers of light-emitting units that contain a fluorescent material of the same color and one layer of a light-emitting unit that contains a phosphorescent material that exhibits an emission color different from that of the fluorescent material. That is, the intensity of emitted light of each color can be adjusted with the number of light-emitting units.

In the case of the light-emitting device including two layers of fluorescent units and one layer of phosphorescent unit, a light-emitting device including two layers of light-emitting units containing a blue fluorescent material and one layer of light-emitting unit containing a yellow phosphorescent material, a light-emitting device including two layers of light-emitting units containing a blue fluorescent material and one layer of light-emitting unit containing a red phosphorescent material and a green phosphorescent material, or a light-emitting device including two layers of light-emitting units containing a blue fluorescent material and one layer of light-emitting unit containing a red phosphorescent material, a yellow phosphorescent material, and a green phosphorescent material is preferably used, in which case white light emission can be obtained efficiently. Thus, the light-emitting device of one embodiment of the present invention can be combined with a phosphorescent light-emitting layer, as appropriate.

In the above-described light-emitting device including two layers of fluorescent units and one layer of phosphorescent unit, the phosphorescent unit can be replaced with a light-emitting unit having the structure of the light-emitting layer 130 described in Embodiment 1. This is because a fluorescent layer having emission efficiency equivalent to that of a phosphorescent layer can be obtained with the use of the structure of the light-emitting layer 130 described in Embodiment 1.

At least one of the light-emitting layer 120 and the light-emitting layer 170 may further be divided into layers and the divided layers may contain different light-emitting materials. That is, at least one of the light-emitting layer 120 and the light-emitting layer 170 can consist of two or more layers. For example, in the case where the light-emitting layer is formed by stacking a first light-emitting layer and a second light-emitting layer in this order from the hole-transport layer side, the first light-emitting layer is formed using a material having a hole-transport property as the host material and the second light-emitting layer is formed using a material having an electron-transport property as the host material. In this case, the light-emitting materials contained in the first light-emitting layer and the second light-emitting layer may be the same or different, and may have functions of exhibiting light emission of the same color or exhibiting light emission of different colors. White light emission with high color rendering properties that is formed of three primary colors or four or more emission colors can also be obtained by using a plurality of light-emitting materials having functions of exhibiting light emission of different colors.

For example, the following phosphorescent materials can be used as the guest material of the light-emitting layer of the phosphorescent unit described in Embodiment 3.

Examples of the phosphorescent material that has an emission peak in blue or green include organometallic iridium complexes having a 4H-triazole skeleton, such as tris{2-[5-(2-methylphenyl)-4-(2,6-dimethylphenyl)-4H-1,2,4-triazol-3-yl-κN2]phenyl-κC}iridium(III) (abbreviation: Ir(mpptz-dmp)$_3$), tris(5-methyl-3,4-diphenyl-4H-1,2,4-triazolato)iridium(III) (abbreviation: Ir(Mptz)$_3$), tris[4-(3-biphenyl)-5-isopropyl-3-phenyl-4H-1,2,4-triazolato]iridium(III) (abbreviation: Ir(iPrptz-3b)$_3$), and tris[3-(5-biphenyl)-5-isopropyl-4-phenyl-4H-1,2,4-triazolato]iridium(III) (abbreviation: Ir(iPr5btz)$_3$); organometallic iridium complexes having a 1H-triazole skeleton, such as tris[3-methyl-1-(2-methylphenyl)-5-phenyl-1H-1,2,4-triazolato]iridium(III) (abbreviation: Ir(Mptzl-mp)$_3$) and tris(1-methyl-5-phenyl-3-propyl-1H-1,2,4-triazolato)iridium(III) (abbreviation: Ir(Prptz1-Me)$_3$); organometallic iridium complexes having an imidazole skeleton, such as fac-tris[1-(2, 6-diisopropylphenyl)-2-phenyl-1H-imidazole]iridium(III) (abbreviation: Ir(iPrpmi)$_3$) and tris[3-(2,6-dimethylphenyl)-7-methylimidazo[1,2-f]phenanthridinato]iridium(III) (abbreviation: Ir(dmpimpt-Me)$_3$); and organometallic iridium complexes in which a phenylpyridine derivative having an electron-withdrawing group is a ligand, such as bis[2-(4',6'-difluorophenyl)pyridinato-N,C$^{2'}$]iridium(III) tetrakis(1-pyrazolyl)borate (abbreviation: FIr6), bis[2-(4',6'-difluorophenyl)pyridinato-N,C$^{2'}$]iridium(III) picolinate (abbreviation: FIrpic), bis{2-[3',5'-bis(trifluoromethyl)phenyl]pyridinato-N,C$^{2'}$}iridium(III) picolinate (abbreviation: Ir(CF$_3$ppy)$_2$(pic)), and bis[2-(4',6'-difluorophenyl)pyridinato-N,C$^{2'}$]iridium(III) acetylacetonate (abbreviation: FIr(acac)). Among the materials given above, the organometallic iridium complexes including a nitrogen-containing five-membered heterocyclic skeleton, such as a 4H-triazole skeleton, a 1H-triazole skeleton, or an imidazole skeleton have high triplet excitation energy, reliability, and emission efficiency and are thus especially preferable. Note that a platinum complex such as 2,3,7,8,12,13,17,18-octaethyl-21H, 23H-porphyrinplatinum(II) (abbreviation: PtOEP), or a rare earth metal complex such as tris[1-(2-thenoyl)-3,3,3-trifluoroacetonato](monophenanthroline)europium(III) (abbreviation: Eu(TTA)$_3$(Phen)) can also be used.

Examples of the substance that has an emission peak in green or yellow include organometallic iridium complexes including a pyrimidine skeleton, such as tris(4-methyl-6-phenylpyrimidinato)iridium(III) (abbreviation: Ir(mppm)$_3$), tris(4-t-butyl-6-phenylpyrimidinato)iridium(III) (abbreviation: Ir(tBuppm)$_3$), (acetylacetonato)bis(6-methyl-4-phenylpyrimidinato)iridium(III) (abbreviation: Ir(mppm)$_2$(acac)), (acetylacetonato)bis(6-tert-butyl-4-phenylpyrimidinato)iridium(III) (abbreviation: Ir(tBuppm)$_2$(acac)), (acetylacetonato)bis[4-(2-norbornyl)-6-phenylpyrimidinato]iridium(III) (abbreviation: Ir(nbppm)$_2$(acac)), (acetylacetonato)bis[5-methyl-6-(2-methylphenyl)-4-phenylpyrimidinato]iridium(III) (abbreviation: Ir(mpmppm)$_2$(acac)), (acetylacetonato)bis{4,6-dimethyl-2-[6-(2,6-dimethylphenyl)-4-pyrimidinyl-κN3]phenyl-κC}iridium(III) (abbreviation: Ir(dmppm-dmp)$_2$(acac)), and (acetylacetonato)bis(4,6-diphenylpyrimidinato)iridium(III) (abbreviation: Ir(dppm)$_2$(acac)); organometallic iridium complexes including a pyrazine skeleton, such as (acetylacetonato)bis(3,5-dimethyl-2-phenylpyrazinato)iridium(III) (abbreviation: Ir(mppr-Me)$_2$(acac)) and (acetylacetonato)bis(5-isopropyl-3-methyl-2-phenylpyrazinato)iridium(III) (abbreviation: Ir(mppr-iPr)$_2$(acac)); organometallic iridium complexes including a pyridine skeleton, such as tris(2-phenylpyridinato-N,C$^{2'}$)iridium(III) (abbreviation: Ir(ppy)$_3$), bis(2-phenylpyridinato-N,C$^{2'}$)iridium(III) acetylacetonate (abbreviation: Ir(ppy)$_2$(acac)), bis(benzo[h]quinolinato)iridium(III) acetylacetonate (abbreviation: Ir(bzq)$_2$(acac)), tris(benzo[h]quinolinato)iridium(III) (abbreviation: Ir(bzq)$_3$), tris(2-phenylquinolinato-N,C$^{2'}$)iridium(III) (abbreviation: Ir(pq)$_3$), and bis(2-phenylquinolinato-N,C$^{2'}$)iridium(III) acetylacetonate (abbreviation: Ir(pq)$_2$(acac)); organometallic iridium complexes such as bis(2,4-diphenyl-1,3-oxazolato-N,C$^{2'}$)iridium(III) acetylacetonate (abbreviation: Ir(dpo)$_2$(acac)), bis{2-[4'-(perfluorophenyl)phenyl]pyridinato-N,C$^{2'}$}iridium(III) acetylacetonate (abbreviation: Ir(p-PF-ph)$_2$(acac)), and bis(2-phenylbenzothiazolato-N, C$^{2'}$)iridium(III) acetylacetonate (abbreviation: Ir(bt)$_2$(acac)); and a rare earth metal complex such as tris(acetylacetonato)(monophenanthroline)terbium(III) (abbreviation: Tb(acac)$_3$(Phen)). Among the substances given above, the organometallic iridium complexes having a pyrimidine skeleton have distinctively high reliability and light emission efficiency and are thus particularly preferable.

Examples of the substance that has an emission peak in yellow or red include organometallic iridium complexes having a pyrimidine skeleton, such as (diisobutyrylmethanato)bis[4,6-bis(3-methylphenyl)pyrimidinato]iridium(III) (abbreviation: Ir(5mdppm)$_2$(dibm)), bis[4,6-bis(3-methylphenyl)pyrimidinato](dipivaloylmethanato)iridium(III) (abbreviation: Ir(5mdppm)$_2$(dpm)), and bis[4,6-di(naphthalen-1-yl)pyrimidinato] (dipivaloylmethanato)iridium(III) (abbreviation: Ir(dlnpm)$_2$(dpm)); organometallic iridium complexes having a pyrazine skeleton, such as (acetylacetonato)bis(2,3,5-triphenylpyrazinato)iridium(III) (abbreviation: Ir(tppr)$_2$(acac)), bis(2,3,5-triphenylpyrazinato)(dipivaloylmethanato)iridium(III) (abbreviation: Ir(tppr)$_2$(dpm)), and (acetylacetonato)bis[2,3-bis(4-fluorophenyl)quinoxalinato]iridium(III) (abbreviation: Ir(Fdpq)$_2$(acac)); organometallic iridium complexes having a pyridine skeleton, such as tris(1-phenylisoquinolinato-N,C$^{2'}$)iridium(III) (abbreviation: Ir(piq)$_3$) and bis(1-phenylisoquinolinato-N, C$^{2'}$)iridium(III) acetylacetonate (abbreviation: Ir(piq)$_2$(acac)); a platinum complex such as 2,3,7,8,12,13,17,18-octaethyl-21H,23H-porphyrin platinum(II) (abbreviation: PtOEP); and rare earth metal complexes such as tris(1,3-diphenyl-1,3-propanedionato) (monophenanthroline)europium(III) (abbreviation: Eu(DBM)$_3$(Phen)) and tris[1-(2-thenoyl)-3,3,3-trifluoroacetonato] (monophenanthroline) europium(III) (abbreviation: Eu(TTA)$_3$(Phen)). Among the substances given above, the organometallic iridium complexes having a pyrimidine skeleton have distinctively high reliability and light emission efficiency and are thus particularly preferable. Furthermore, the organometallic iridium complexes having a pyrazine skeleton can provide red light emission with favorable chromaticity.

As the host material of the phosphorescent unit, the above-described hole-transport material and/or the above-described electron-transport material can be used.

A structure other than the structure of the light-emitting layer 130 described in Embodiment 1 can also be used for the fluorescent unit. Although a guest material used for the fluorescent unit is not particularly limited, an anthracene derivative, a tetracene derivative, a chrysene derivative, a phenanthrene derivative, a pyrene derivative, a perylene derivative, a stilbene derivative, an acridone derivative, a coumarin derivative, a phenoxazine derivative, a phenothiazine derivative, or the like is preferable as a fluorescent compound, and for example, the following substances can be used.

Specifically, the following examples can be given: 5,6-bis[4-(10-phenyl-9-anthryl)phenyl]-2,2'-bipyridine (abbreviation: PAP2BPy), 5,6-bis[4'-(10-phenyl-9-anthryl)biphenyl-4-yl]-2,2'-bipyridine (abbreviation: PAPP2BPy), N,N'-diphenyl-N,N'-bis[4-(9-phenyl-9H-fluoren-9-yl)phenyl] pyrene-1,6-diamine (abbreviation: 1,6FLPAPm), N,N'-bis (3-methylphenyl)-N,N'-bis[3-(9-phenyl-9H-fluoren-9-yl) phenyl]pyrene-1,6-diamine (abbreviation: 1,6mMemFLPAPm), N,N'-bis[4-(9-phenyl-9H-fluoren-9-yl)phenyl]-N,N'-bis(4-tert-butylphenyl)-pyrene-1,6-diamine (abbreviation: 1,6tBu-FLPAPm), N,N'-bis[4-(9-phenyl-9H-fluoren-9-yl)phenyl]-N,N'-diphenyl-3,8-dicyclohexylpyrene-1,6-diamine (abbreviation: ch-1,6FLPAPm), N,N'-bis[4-(9H-carbazol-9-yl)phenyl]-N,N'-diphenylstilbene-4, 4'-diamine (abbreviation: YGA2S), 4-(9H-carbazol-9-yl)-4'-(10-phenyl-9-anthryl)triphenylamine (abbreviation: YGAPA), 4-(9H-carbazol-9-yl)-4'-(9,10-diphenyl-2-anthryl)triphenylamine (abbreviation: 2YGAPPA), N,9-diphenyl-N-[4-(10-phenyl-9-anthryl)phenyl]-9H-carbazol-3- amine (abbreviation: PCAPA), perylene, 2,5,8,11-tetra(tert-butyl)perylene (abbreviation: TBP), 4-(10-phenyl-9-anthryl)-4'-(9-phenyl-9H-carbazol-3-yl)triphenylamine (abbreviation: PCBAPA), N,N'-(2-tert-butylanthracene-9,10-diyldi-4,1-phenylene)bis[N,N,N'-triphenyl-1,4-phenylenediamine] (abbreviation: DPABPA), N,9-diphenyl-N-[4-(9,10-diphenyl-2-anthryl)phenyl]-9H-carbazol-3-amine (abbreviation: 2PCAPPA), N-[4-(9,10-diphenyl-2-anthryl)phenyl]-N,N',N'-triphenyl-1,4-phenylenediamine (abbreviation: 2DPAPPA), N,N,N',N',N'',N'',N''',N'''-octaphenyldibenzo[g,p]chrysene-2,7,10,15-tetraamine (abbreviation: DBC1), coumarin 30, N-(9,10-diphenyl-2-anthryl)-N, 9-diphenyl-9H-carbazol-3-amine (abbreviation: 2PCAPA), N-[9,10-bis(1,1'-biphenyl-2-yl)-2-anthryl]-N, 9-diphenyl-9H-carbazol-3-amine (abbreviation: 2PCABPhA), N-(9,10-diphenyl-2-anthryl)-N,N',N'-triphenyl-1,4-phenylenediamine (abbreviation: 2DPAPA), N-[9,10-bis(1,1'-biphenyl-2-yl)-2-anthryl]-N,N',N'-triphenyl-1,4-phenylenediamine (abbreviation: 2DPABPhA), 9,10-bis(1,1'-biphenyl-2-yl)-N-[4-(9H-carbazol-9-yl)phenyl]-N-phenylanthracen-2-amine (abbreviation: 2YGABPhA), N,N,9-triphenylanthracen-9-amine (abbreviation: DPhAPhA), coumarin 6, coumarin 545T, N,N'-diphenylquinacridone (abbreviation: DPQd), rubrene, 2,8-di-tert-butyl-5,11-bis(4-tert-butylphenyl)-6,12-diphenyltetracene (abbreviation: TBRb), Nile red, 5,12-bis(1,1'-biphenyl-4-yl)-6,11-diphenyltetracene (abbreviation: BPT), 2-(2-{2-[4-(dimethylamino)phenyl]ethenyl}-6-methyl-4H-pyran-4-ylidene)propanedinitrile (abbreviation: DCM1), 2-{2-methyl-6-[2-(2,3,6,7-tetrahydro-1H,5H-benzo quinolizin-9-yl)ethenyl]-4H-pyran-4-ylidene}propanedinitrile (abbreviation: DCM2), N,N,N',N'-tetrakis(4-methylphenyl)tetracene-5,11-diamine (abbreviation: p-mPhTD), 7,14-diphenyl-N,N,N',N'-tetrakis(4-methylphenyl)acenaphtho[1,2-a]fluoranthene-3,10-diamine (abbreviation: p-mPhAFD), 2-{2-isopropyl-6-[2-(1,1,7,7-tetramethyl-2,3,6,7-tetrahydro-1H,5H-benzo quinolizin-9-yl)ethenyl]-4H-pyran-4-ylidene}propanedinitrile (abbreviation: DCJTI), 2-{2-tert-butyl-6-[2-(1,1,7,7-tetramethyl-2,3,6,7-tetrahydro-1H,5H-benzo[ij]quinolizin-9-yl)ethenyl]-4H-pyran-4-ylidene}propanedinitrile (abbreviation: DCJTB), 2-(2,6-bis{2-[4-(dimethylamino)phenyl]ethenyl}-4H-pyran-4-ylidene)propanedinitrile (abbreviation: BisDCM), 2-{2,6-bis[2-(8-methoxy-1,1,7,7-tetramethyl-2,3,6,7-tetrahydro-1H,5H-benzo[ij]quinolizin-9-yl)ethenyl]-4H-pyran-4-ylidene}propanedinitrile (abbreviation: BisDCJTM), and 5,10,15,20-tetraphenylbisbenzo[5,6]indeno[1,2,3-cd:1',2',3'-lm]perylene (abbreviation: DBP).

In addition, the above-described hole-transport material and/or the above-described electron-transport material can be used as the host material of the fluorescent unit. Note that this embodiment can be combined as appropriate with any of the other embodiments.

Embodiment 4

In this embodiment, a light-emitting apparatus including the light-emitting device described in Embodiment 1 and Embodiment 3 will be described with reference to FIG. 7A and FIG. 7B.

Figure 7A:
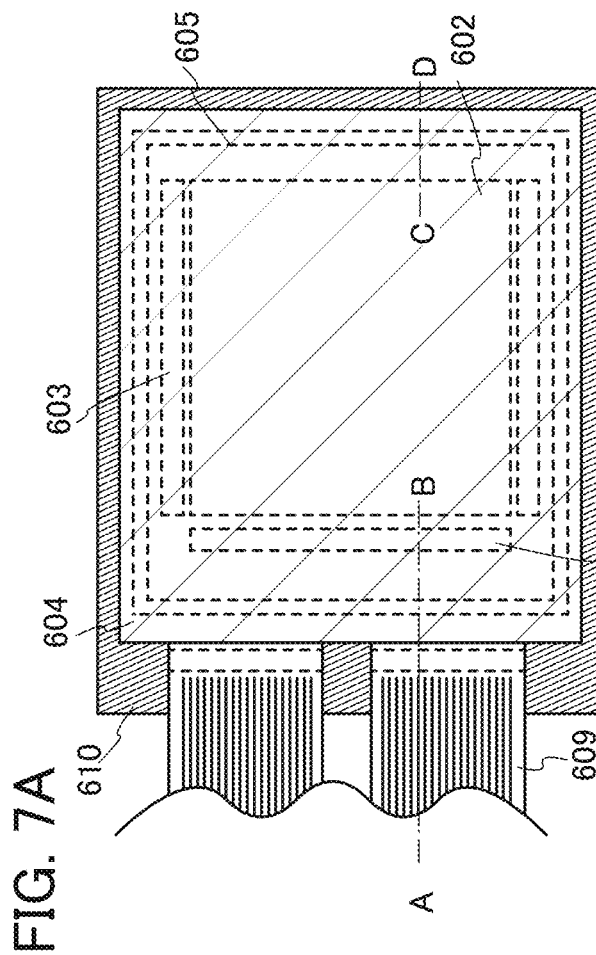
FIG. 7A is a top view illustrating a display device of one embodiment of the present invention.
Figure 7B:
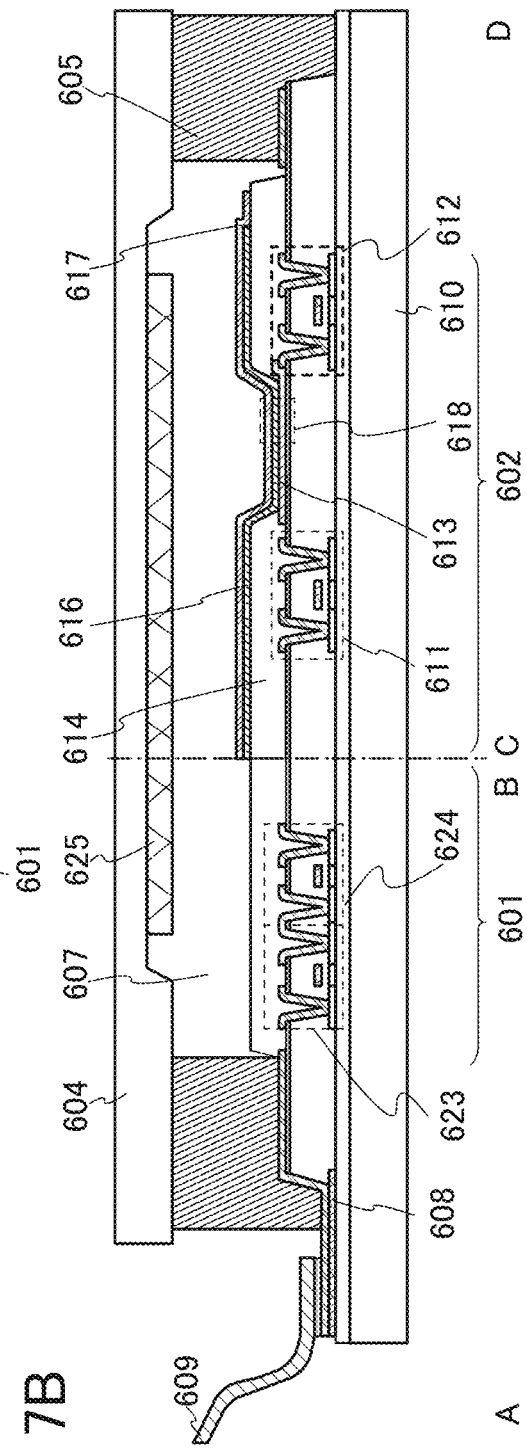
FIG. 7B is a schematic cross-sectional view illustrating the display device of one embodiment of the present invention.

FIG. 7A is a top view of a light-emitting apparatus, and FIG. 7B is a cross-sectional view taken along A-B and C-D in FIG. 7A. This light-emitting apparatus includes a driver circuit portion (a source side driver circuit) 601, a pixel portion 602, and a driver circuit portion (a gate side driver circuit) 603, which are indicated by dotted lines, as components controlling light emission from a light-emitting device. Furthermore, 604 denotes a sealing substrate, 625 denotes a desiccant, 605 denotes a sealant, and a portion surrounded by the sealant 605 is a space 607.

Note that a lead wiring 608 is a wiring for transmitting signals to be input to the source side driver circuit 601 and the gate side driver circuit 603 and receives a video signal, a clock signal, a start signal, a reset signal, and the like from an FPC (flexible printed circuit) 609 serving as an external input terminal. Although only the FPC is illustrated here, a printed wiring board (PWB) may be attached to the FPC. The light-emitting apparatus in this specification includes not only the light-emitting apparatus itself but also the state where the FPC or the PWB is attached thereto.

Next, a cross-sectional structure of the above light-emitting apparatus is described with reference to FIG. 7B. Here, the source driver circuit 601, which is the driver circuit portion, and one pixel of the pixel portion 602 are illustrated.

Note that in the source side driver circuit 601, a CMOS circuit in which an n-channel TFT 623 and a p-channel TFT 624 are combined is formed. The driver circuit may be formed of various CMOS circuits, PMOS circuits, or NMOS circuits. Although a driver-integrated type where the driver circuit is formed over the substrate is described in this embodiment, the driver circuit is not necessarily integrated and can be formed not over the substrate but outside the substrate.

The pixel portion 602 is formed of pixels including a switching TFT 611, a current controlling TFT 612, and a first electrode 613 electrically connected to a drain thereof. Note that an insulator 614 is formed to cover an end portion of the first electrode 613. The insulator 614 can be formed using a positive photosensitive resin film.

In order to improve the coverage with a film formed over the insulator 614, the insulator 614 is formed to have a surface with curvature at its upper end portion or lower end portion. For example, in the case where a photosensitive acrylic is used as a material of the insulator 614, only the upper end portion of the insulator 614 preferably has a curved surface. The radius of curvature of the curved surface is preferably greater than or equal to 0.2 μm and less than or equal to 0.3 μm. Either a negative photosensitive material or a positive photosensitive material can be used as the insulator 614.

An EL layer 616 and a second electrode 617 are formed over the first electrode 613. Here, as a material used for the first electrode 613 functioning as an anode, a material with a high work function is desirably used. For example, a single-layer film of an ITO film, an indium tin oxide film containing silicon, an indium oxide film containing zinc oxide at 2 wt % or higher and 20 wt % or lower, a titanium nitride film, a chromium film, a tungsten film, a Zn film, a Pt film, or the like, a stacked layer of titanium nitride and a film containing aluminum as its main component, a three-layer structure of a titanium nitride film, a film containing aluminum as its main component, and a titanium nitride film, or the like can be used. Note that the stacked-layer structure achieves low wiring resistance, a favorable ohmic contact, and a function as an anode.

The EL layer 616 is formed by any of a variety of methods such as an evaporation method using an evaporation mask, an inkjet method, and a spin coating method. A material included in the EL layer 616 may be a low molecular compound or a high molecular compound (including an oligomer or a dendrimer).

As a material used for the second electrode 617, which is formed over the EL layer 616 and functions as a cathode, a material with a low work function (e.g., Al, Mg, Li, Ca, or an alloy or a compound thereof, MgAg, MgIn, or AlLi) is preferably used. Note that in the case where light generated in the EL layer 616 passes through the second electrode 617, a stacked layer of a thin metal film with a reduced thickness and a transparent conductive film (e.g., ITO, indium oxide containing zinc oxide at 2 wt % or higher and 20 wt % or lower, indium tin oxide containing silicon, or zinc oxide (ZnO)) is preferably used for the second electrode 617.

Note that the first electrode 613, the EL layer 616, and the second electrode 617 constitute a light-emitting device 618. The light-emitting device 618 is preferably the light-emitting device having the structure described in Embodiment 1 and Embodiment 2. In the light-emitting apparatus of this embodiment, the pixel portion, which includes a plurality of light-emitting devices, may include both the light-emitting device with the structure described in Embodiment 1 and Embodiment 3 and a light-emitting device with another structure.

The sealing substrate 604 and a substrate 610 of the light-emitting device are attached to each other using the sealant 605, so that a structure in which a light-emitting device 618 is provided in the space 607 surrounded by the substrate 610, the sealing substrate 604, and the sealant 605 is employed. Note that the space 607 is filled with a filler, and may be filled with an inert gas (nitrogen, argon, or the like) or a resin and/or a desiccant.

Note that an epoxy-based resin or glass frit is preferably used for the sealant 605. Furthermore, these materials are preferably materials that transmit moisture or oxygen as little as possible. As a material used for the sealing substrate 604, in addition to a glass substrate and a quartz substrate, a plastic substrate formed of FRP (Fiber Reinforced Plastics), PVF (polyvinyl fluoride), polyester, acrylic, or the like can be used.

As described above, the light-emitting apparatus using the light-emitting device described in Embodiment 1 and Embodiment 3 can be obtained.

Structure Example 1 of Light-Emitting Device

As an example of a display device, FIG. 8 shows a light-emitting apparatus in which a light-emitting device exhibiting white light emission is formed and a coloring layer (a color filter) is formed.

FIG. 8A illustrates a substrate 1001, a base insulating film 1002, a gate insulating film 1003, gate electrodes 1006, 1007, and 1008, a first interlayer insulating film 1020, a second interlayer insulating film 1021, a peripheral portion 1042, a pixel portion 1040, a driver circuit portion 1041, first electrodes 1024W, 1024R, 1024G, and 1024B of light-emitting devices, an EL layer 1028, a second electrode 1029 of the light-emitting devices, a sealing substrate 1031, a sealant 1032, a red pixel 1044R, a green pixel 1044G, a blue pixel 1044B, a white pixel 1044W, and the like.

In FIG. 8A and FIG. 8B, coloring layers (a red coloring layer 1034R, a green coloring layer 1034G, and a blue coloring layer 1034B) are provided on a transparent base material 1033. A black layer (black matrix) 1035 may be additionally provided. The transparent base material 1033 provided with the coloring layers and the black layer is positioned and fixed to the substrate 1001. Note that the coloring layers and the black layer are covered with an overcoat layer 1036. In FIG. 8A, some light-emitting layers emit light that goes outside without passing through the coloring layers, while the other light-emitting layer emits light that passes through the respective coloring layers to go outside. The light that does not pass through the coloring layers is white, and the light that passes through the coloring layers is red, green, and blue, so that an image can be expressed with the pixels of four color FIG. 8B shows an example in which the red coloring layer 1034R, the green coloring layer 1034G, and the blue coloring layer 1034B are formed between the gate insulating film 1003 and the first interlayer insulating film 1020. As shown in FIG. 8B, the coloring layers may be provided between the substrate 1001 and the sealing substrate 1031.

The above-described light-emitting apparatus is a light-emitting device having a structure in which light is extracted from the substrate 1001 side where the TFTs are formed (a bottom emission type), but may be a light-emitting device having a structure in which light is extracted from the sealing substrate 1031 side (a top emission type).

Structure Example 2 of Light-Emitting Device

FIG. 9A and FIG. 9B each show a cross-sectional view of a top-emission light-emitting apparatus. In this case, a substrate that does not transmit light can be used as the substrate 1001. The process up to the formation of a connection electrode that connects the TFT and the anode of the light-emitting device is performed in a manner similar to that of a bottom-emission-type light-emitting apparatus. Then, a third interlayer insulating film 1037 is formed to cover an electrode 1022. This insulating film may have a planarization function. The third interlayer insulating film 1037 can be formed using a material similar to that of the second interlayer insulating film 1021 or using other various materials.

A lower electrode 1025W, a lower electrode 1025R, a lower electrode 1025G, and a lower electrode 1025B of the light-emitting device are anodes here, but may be cathodes. Furthermore, in the case of the top-emission light-emitting apparatus as illustrated in FIG. 9A and FIG. 9B, the lower electrode 1025W, the lower electrode 1025R, the lower electrode 1025G, and the lower electrode 1025B are preferably reflective electrodes. Note that the second electrode 1029 preferably has a function of reflecting light and a function of transmitting light. It is preferable that a microcavity structure be used between the second electrode 1029, and the lower electrode 1025W, the lower electrode 1025R, the lower electrode 1025G, and the lower electrode 1025B, in which case a function of amplifying light with a specific wavelength is included. The structure of the EL layer 1028 is a device structure similar to the structures described in Embodiment 1 and Embodiment 3, with which white light emission can be obtained.

In FIG. 8A, FIG. 8B, FIG. 9A, and FIG. 9B, the structure of the EL layer for providing white light emission can be achieved by, for example, using a plurality of light-emitting layers or using a plurality of light-emitting units. Note that the structure for providing white light emission is not limited thereto.

In a top emission structure as shown in FIG. 9A and FIG. 9B, sealing can be performed with the sealing substrate 1031 on which the coloring layers (the red coloring layer 1034R, the green coloring layer 1034G, and the blue coloring layer 1034B) are provided. The sealing substrate 1031 may be provided with the black layer (black matrix) 1030 which is positioned between pixels. The coloring layers (the red coloring layer 1034R, the green coloring layer 1034G, and the blue coloring layer 1034B) and the black layer (black matrix) may be covered with the overcoat layer. Note that a substrate having a light-transmitting property is used as the sealing substrate 1031.

FIG. 9A illustrates a structure in which full color display is performed using three colors of red, green, and blue; alternatively, full color display may be performed using four colors of red, green, blue, and white as illustrated in FIG. 9B. Note that the structure for performing full color display is not limited to them. For example, full color display using four colors of red, green, blue, and yellow may be performed.

In the light-emitting device of one embodiment of the present invention, a fluorescent material is used as a guest material. Since a fluorescent material has a sharper spectrum than a phosphorescent material, light emission with high color purity can be obtained. Accordingly, when the light-emitting device is used for the light-emitting apparatus described in this embodiment, a light-emitting device with high color reproducibility can be obtained.

Embodiment 5

In this embodiment, electronic appliances and display devices of embodiments of the present invention will be described.

In addition, an electronic appliance and a display device that have a flat surface, high emission efficiency, and high reliability can be manufactured according to one embodiment of the present invention. In addition, an electronic appliance and a display device that have a curved surface, high emission efficiency, and high reliability can be manufactured according to one embodiment of the present invention. Moreover, a light-emitting device having high color reproducibility can be obtained as described above.

Examples of the electronic appliances include a television device, a desktop or laptop personal computer, a monitor of a computer or the like, a digital camera, a digital video camera, a digital photo frame, a mobile phone, a portable game machine, a portable information terminal, an audio reproducing device, and a large game machine such as a pachinko machine.

Figure 10A:
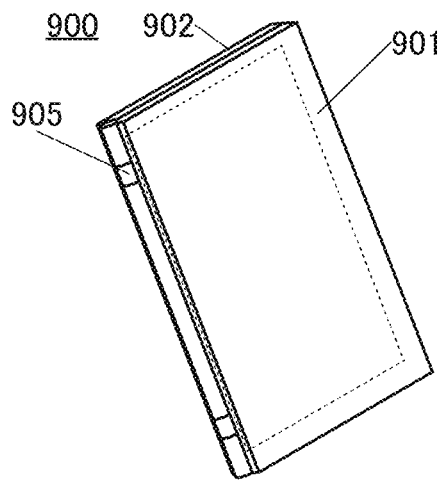
FIG. 10A to FIG. 10D are perspective views illustrating display modules of one embodiment of the present invention.
Figure 10B:
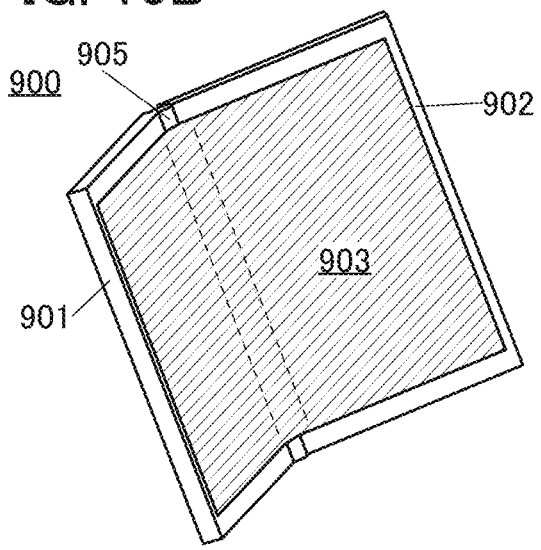

A portable information terminal 900 illustrated in FIG. 10A and FIG. 10B includes a housing 901, a housing 902, a display portion 903, a hinge portion 905, and the like.

The housing 901 and the housing 902 are joined together by the hinge portion 905. The portable information terminal 900 can be opened as illustrated in FIG. 10B from a folded state (FIG. 10A). Thus, the portable information terminal 900 has high portability when carried and excellent visibility with its large display region when used.

In the portable information terminal 900, the flexible display portion 903 is provided across the housing 901 and the housing 902 which are joined together by the hinge portion 905.

The light-emitting apparatus manufactured using one embodiment of the present invention can be used for the display portion 903. Thus, a highly reliable portable information terminal can be manufactured.

The display portion 903 can display at least one of text information, a still image, a moving image, and the like. When text information is displayed on the display portion, the portable information terminal 900 can be used as an e-book reader.

When the portable information terminal 900 is opened, the display portion 903 is held in a state with a large radius of curvature. For example, the display portion 903 is held while including a curved portion with a radius of curvature of greater than or equal to 1 mm and less than or equal to 50 mm, preferably greater than or equal to 5 mm and less than or equal to 30 mm. Part of the display portion 903 can display an image while being curved since pixels are continuously arranged from the housing 901 to the housing 902.

The display portion 903 functions as a touch panel and can be controlled with a finger, a stylus, or the like.

The display portion 903 is preferably formed using one flexible display. Thus, a seamless continuous image can be displayed between the housing 901 and the housing 902. Note that each of the housing 901 and the housing 902 may be provided with a display.

The hinge portion 905 preferably includes a locking mechanism so that an angle formed between the housing 901 and the housing 902 does not become larger than a predetermined angle when the portable information terminal 900 is opened. For example, an angle at which they become locked (they are not opened any further) is preferably greater than or equal to 90° and less than 180° and can be typically 90°, 120°, 135°, 150°, 175°, or the like. In this way, the convenience, safety, and reliability of the portable information terminal 900 can be improved.

When the hinge portion 905 includes a locking mechanism, excessive force is not applied to the display portion 903; thus, breakage of the display portion 903 can be prevented. Therefore, a highly reliable portable information terminal can be achieved.

The housing 901 and the housing 902 may be provided with a power button, an operation button, an external connection port, a speaker, a microphone, or the like.

One of the housing 901 and the housing 902 is provided with a wireless communication module, and data can be transmitted and received through a computer network such as the Internet, a LAN (Local Area Network), or Wi-Fi (registered trademark).

Figure 10C:
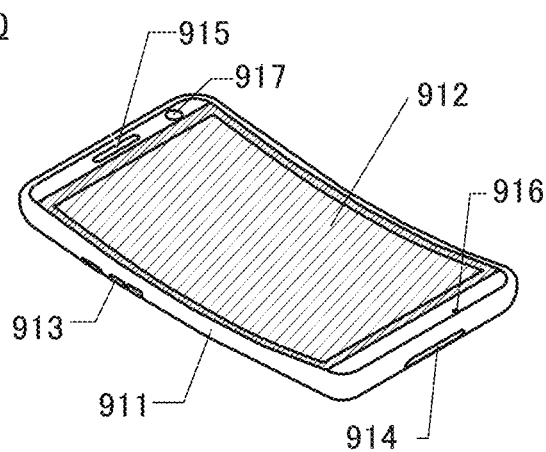

A portable information terminal 910 illustrated in FIG. 10C includes a housing 911, a display portion 912, an operation button 913, an external connection port 914, a speaker 915, a microphone 916, a camera 917, and the like.

The light-emitting apparatus fabricated using one embodiment of the present invention can be used for the display portion 912. Thus, the portable information terminal can be manufactured with a high yield.

The portable information terminal 910 includes a touch sensor in the display portion 912. A variety of operations such as making a call and inputting a character can be performed by touch on the display portion 912 with a finger, a stylus, or the like.

In addition, the operation of the operation button 913 can switch the power ON and OFF operations and types of images displayed on the display portion 912. For example, switching from a mail creation screen to a main menu screen can be performed.

When a sensing device such as a gyroscope sensor or an acceleration sensor is provided inside the portable information terminal 910, the direction of display on the screen of the display portion 912 can be automatically switched by determining the orientation (horizontal or vertical) of the portable information terminal 910. Furthermore, the direction of display on the screen can be switched by touch on the display portion 912, operation of the operation button 913, sound input using the microphone 916, or the like.

The portable information terminal 910 has, for example, one or more functions selected from a telephone set, a notebook, an information browsing system, and the like. Specifically, the portable information terminal can be used as a smartphone. The portable information terminal 910 is capable of executing a variety of applications such as mobile phone calls, e-mailing, text viewing and writing, music replay, video replay, Internet communication, and games, for example.

Figure 10D:
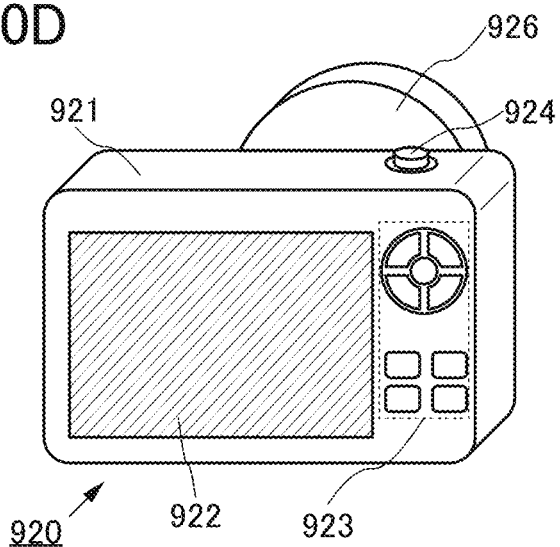

A camera 920 illustrated in FIG. 10D includes a housing 921, a display portion 922, operation buttons 923, a shutter button 924, and the like. Furthermore, a detachable lens 926 is attached to the camera 920.

The light-emitting apparatus manufactured using one embodiment of the present invention can be used for the display portion 922. Thus, a highly reliable camera can be fabricated.

Although the camera 920 here is configured such that the lens 926 is detachable from the housing 921 for replacement, the lens 926 may be integrated with the housing 921.

A still image or a moving image can be taken with the camera 920 at the press of the shutter button 924. In addition, the display portion 922 has a function of a touch panel, and images can also be taken by the touch on the display portion 922.

Note that a stroboscope, a viewfinder, or the like can be additionally attached to the camera 920. Alternatively, these may be incorporated into the housing 921.

Figure 11A:
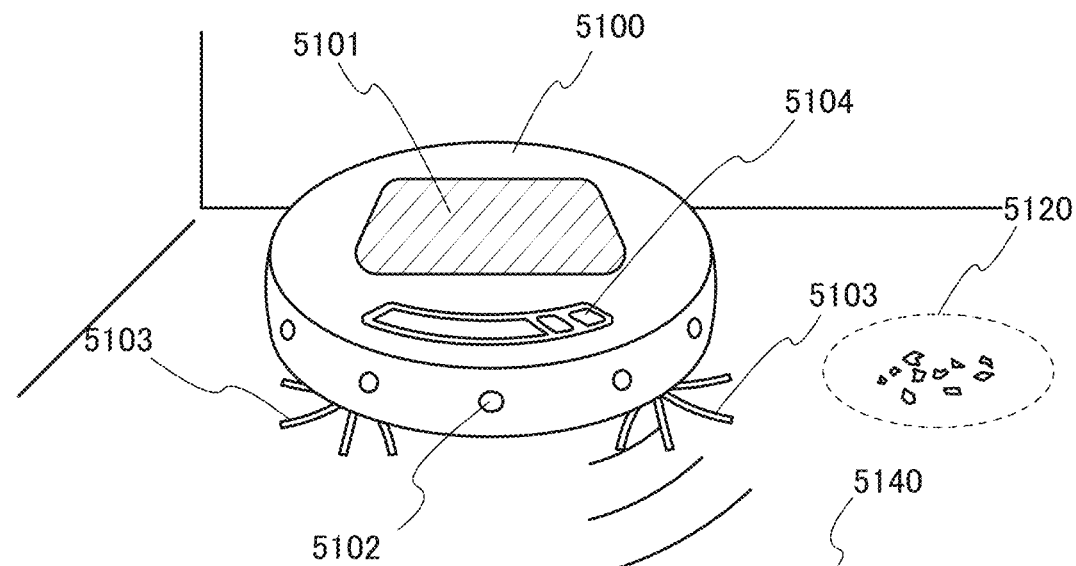
FIG. 11A to FIG. 11C are diagrams illustrating electronic appliances of one embodiment of the present invention.

FIG. 11A is a schematic view showing an example of a cleaning robot.

A cleaning robot 5100 includes a display 5101 placed on its top surface, a plurality of cameras 5102 placed on its side surface, a brush 5103, and an operation button 5104. Although not illustrated, the bottom surface of the cleaning robot 5100 is provided with a tire, an inlet, and the like. Furthermore, the cleaning robot 5100 includes various sensors such as an infrared sensor, an ultrasonic sensor, an acceleration sensor, a piezoelectric sensor, an optical sensor, and a gyroscope sensor. In addition, the cleaning robot 5100 has a wireless communication means.

The cleaning robot 5100 is self-propelled, detects dust 5120, and can suck up the dust through the inlet provided on the bottom surface.

The cleaning robot 5100 can determine whether there is an obstacle such as a wall, furniture, or a step by analyzing images taken by the cameras 5102. When an object that is likely to be caught in the brush 5103, such as a wire, is detected by image analysis, the rotation of the brush 5103 can be stopped.

The display 5101 can display the remaining capacity of a battery, the amount of vacuumed dust, and the like. The display 5101 may display the path on which the cleaning robot 5100 has run. The display 5101 may be a touch panel, and the operation button 5104 may be provided on the display 5101.

The cleaning robot 5100 can communicate with a portable electronic appliance 5140 such as a smartphone. The portable electronic appliance 5140 can display images taken by the cameras 5102. Accordingly, an owner of the cleaning robot 5100 can monitor the room even from the outside. The display on the display 5101 can be checked by the portable electronic appliance 5140 such as a smartphone.

The light-emitting apparatus of one embodiment of the present invention can be used for the display 5101.

Figure 11B:
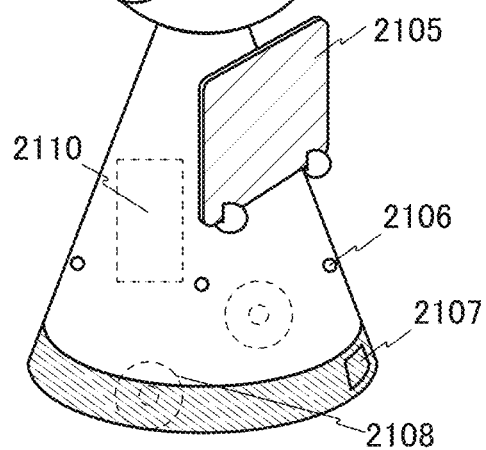

A robot 2100 illustrated in FIG. 11B includes an arithmetic device 2110, an illuminance sensor 2101, a microphone 2102, an upper camera 2103, a speaker 2104, a display 2105, a lower camera 2106, an obstacle sensor 2107, and a moving mechanism 2108.

The microphone 2102 has a function of detecting a speaking voice of a user, an environmental sound, and the like. The speaker 2104 has a function of outputting sound. The robot 2100 can communicate with a user using the microphone 2102 and the speaker 2104.

The display 2105 has a function of displaying various kinds of information. The robot 2100 can display information desired by a user on the display 2105. The display 2105 may be provided with a touch panel. Moreover, the display 2105 may be a detachable information terminal, in which case charging and data communication can be performed when the display 2105 is set at the home position of the robot 2100.

The upper camera 2103 and the lower camera 2106 each have a function of taking an image of the surroundings of the robot 2100. The obstacle sensor 2107 can detect the presence of an obstacle in the direction where the robot 2100 advances with the moving mechanism 2108. The robot 2100 can move safely by recognizing the surroundings with the upper camera 2103, the lower camera 2106, and the obstacle sensor 2107.

The light-emitting apparatus of one embodiment of the present invention can be used for the display 2105.

Figure 11C:
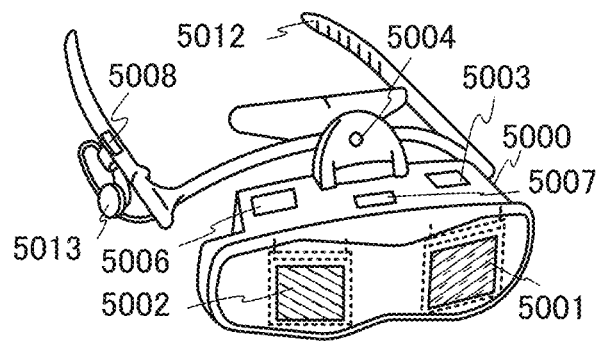

FIG. 11C illustrates an example of a goggle-type display. The goggle-type display includes, for example, a housing 5000, a display portion 5001, a speaker 5003, an LED lamp 5004, operation keys (including a power switch or an operation switch), a connection terminal 5006, a sensor 5007 (a sensor having a function of measuring force, displacement, position, speed, acceleration, angular velocity, rotational frequency, distance, light, liquid, magnetism, temperature, chemical substance, sound, time, hardness, electric field, current, voltage, power, radiation, flow rate, humidity, gradient, oscillation, odor, or infrared ray), a microphone 5008, a second display portion 5002, a support 5012, and an earphone 5013.

The light-emitting apparatus of one embodiment of the present invention can be used for the display portion 5001 and the second display portion 5002.

Figure 12A:
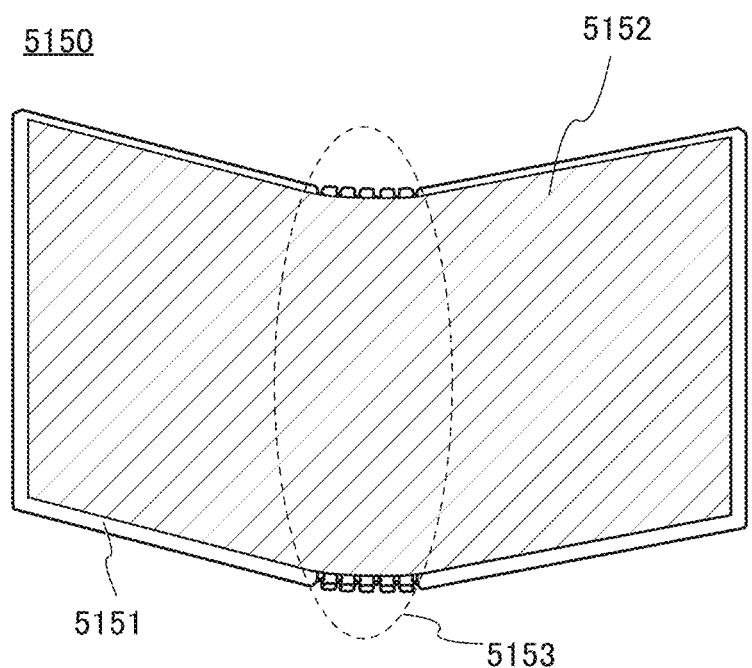
FIG. 12A and FIG. 12B are perspective views illustrating a display device of one embodiment of the present invention.
Figure 12B:
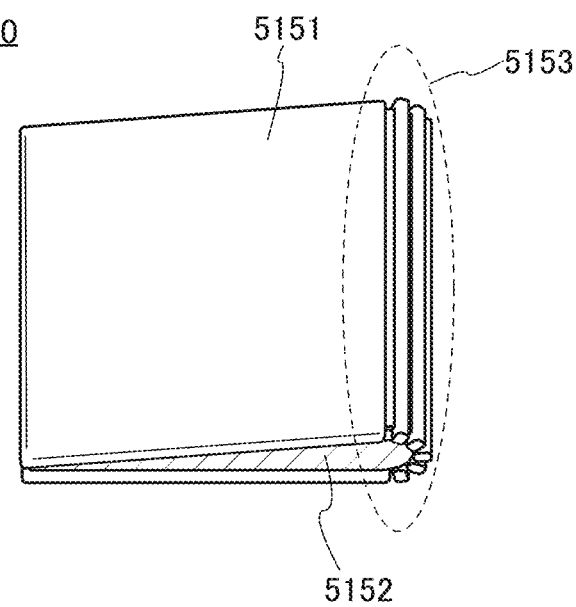

FIG. 12A and FIG. 12B illustrate a foldable portable information terminal 5150. The foldable portable information terminal 5150 includes a housing 5151, a display region 5152, and a bend portion 5153. FIG. 12A illustrates the portable information terminal 5150 that is opened. FIG. 12B illustrates the portable information terminal 5150 that is folded. Despite its large display region 5152, the portable information terminal 5150 is compact in size and has excellent portability when folded.

The display region 5152 can be folded in half with the bend portion 5153. The bend portion 5153 is formed of a stretchable member and a plurality of supporting members, and in the case where the display region is folded, the stretchable member stretches and the bend portion 5153 has a radius of curvature of 2 mm or more, preferably 5 mm or more.

Note that the display region 5152 may be a touch panel (an input/output device) including a touch sensor (an input device). The light-emitting device of one embodiment of the present invention can be used for the display region 5152.

This embodiment can be combined with the other embodiments as appropriate.

Embodiment 6

In this embodiment, examples in which the light-emitting device of one embodiment of the present invention is used for various lighting devices will be described with reference to FIG. 13. With the use of the light-emitting device of one embodiment of the present invention, a highly reliable lighting device with high emission efficiency can be manufactured.

Fabricating the light-emitting device of one embodiment of the present invention over a substrate having flexibility enables an electronic appliance or a lighting device that has a light-emitting region with a curved surface to be obtained.

Furthermore, a light-emitting apparatus in which the light-emitting device of one embodiment of the present invention is used can also be used for lighting for motor vehicles; for example, such lighting can be provided on a windshield, a ceiling, and the like.

Figure 13:
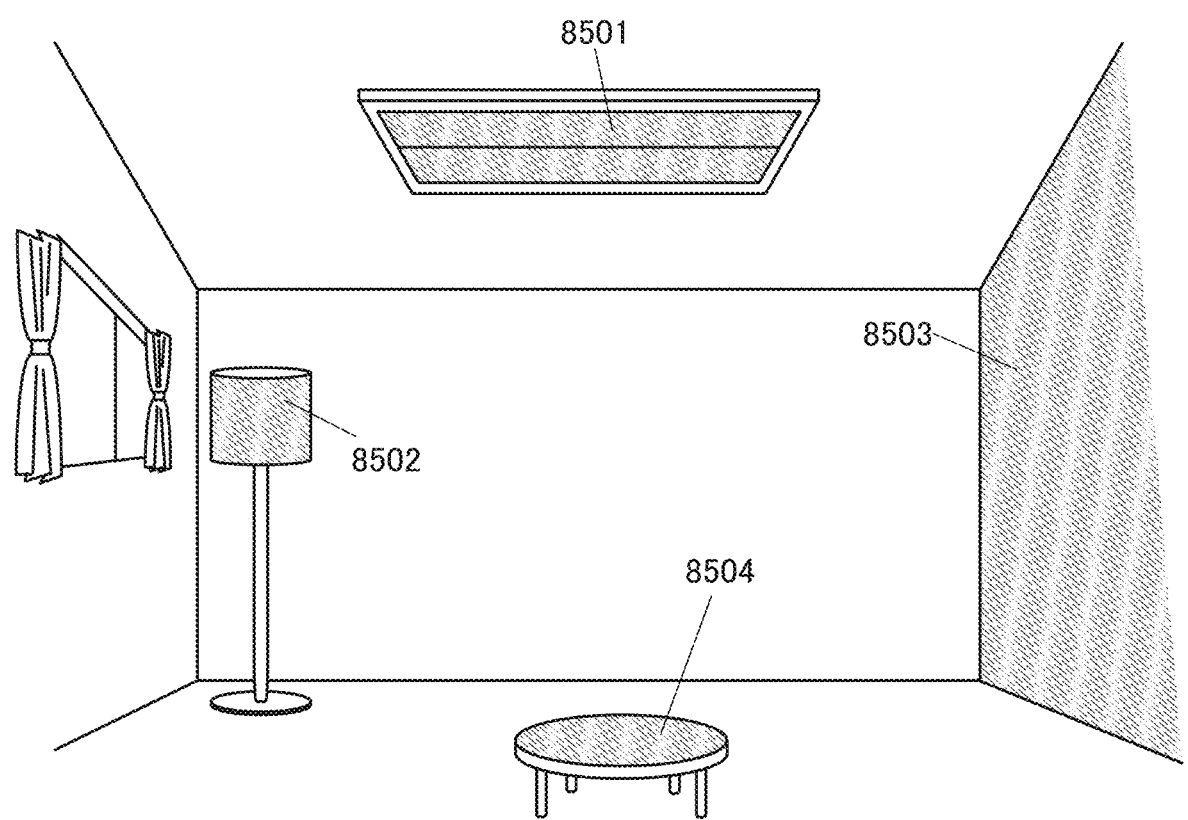
FIG. 13 is a diagram illustrating lighting devices of one embodiment of the present invention.
Figure 14:
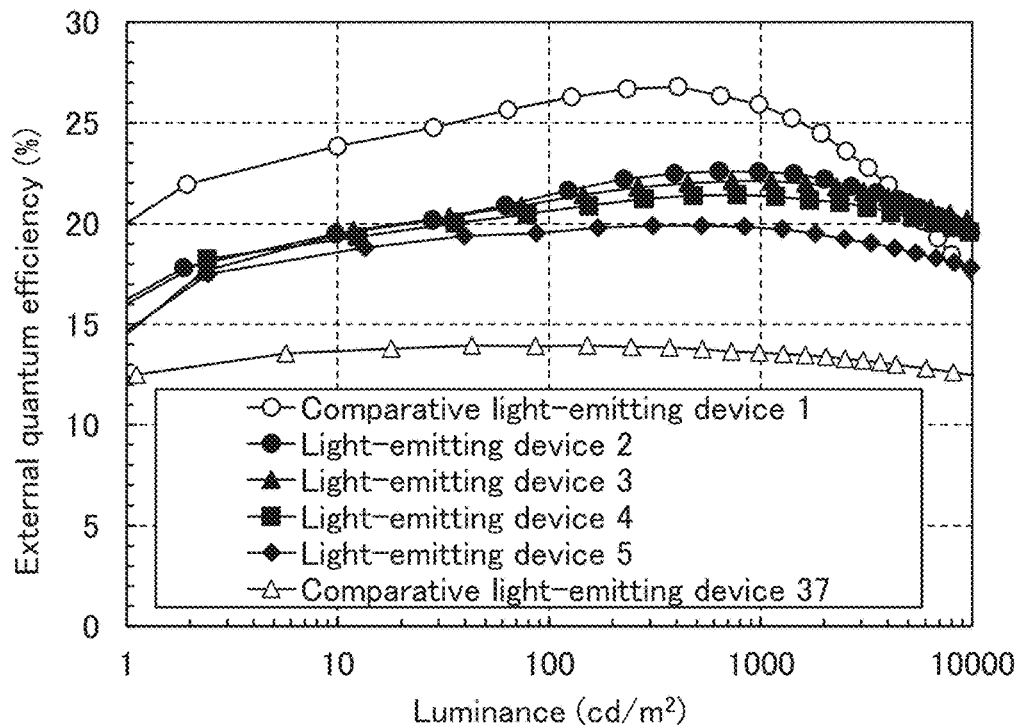
FIG. 14 is a diagram showing external quantum efficiency-luminance characteristics of light-emitting devices in Example.

FIG. 13 illustrates an example in which the light-emitting device is used for an indoor lighting device 8501. Since the light-emitting device can have a larger area, a lighting device having a large area can also be formed. In addition, a lighting device 8502 in which a light-emitting region has a curved surface can also be formed with the use of a housing with a curved surface. A light-emitting device described in this embodiment is in the form of a thin film, which allows the housing to be designed more freely. Thus, the lighting device can be elaborately designed in a variety of ways. Furthermore, a wall of the room may be provided with a large-sized lighting device 8503. The lighting devices 8501, 8502, and 8503 may be provided with a touch sensor with which power-on or off is performed.

Moreover, when the light-emitting device is used on the surface side of a table, a lighting device 8504 which has a function as a table can be obtained. When the light-emitting device is used as part of other furniture, a lighting device having a function of the furniture can be obtained.

As described above, lighting devices and electronic appliances can be obtained by application of the light-emitting device of one embodiment of the present invention. Note that the light-emitting device can be used for electronic appliances in a variety of fields without being limited to the lighting devices and the electronic appliances described in this embodiment.

The structures described in this embodiment can be used in an appropriate combination with the structures described in the other embodiments.

Example 1

In this example, fabrication examples of the light-emitting devices of one embodiment of the present invention and comparative light-emitting devices and the characteristics of the light-emitting devices will be described. The structures of the light-emitting devices fabricated in this example are the same as that in FIG. 1A. Table 1 to Table 6 show detailed device structures. Note that a value represented by $x_1$ in Table 1 to Table 4 correspond to values shown in Table 5, and a value represented by $x_2$ corresponds to values shown in Table 6. The structures and abbreviations of compounds that were used are shown below.

[Chemical formulae 27]

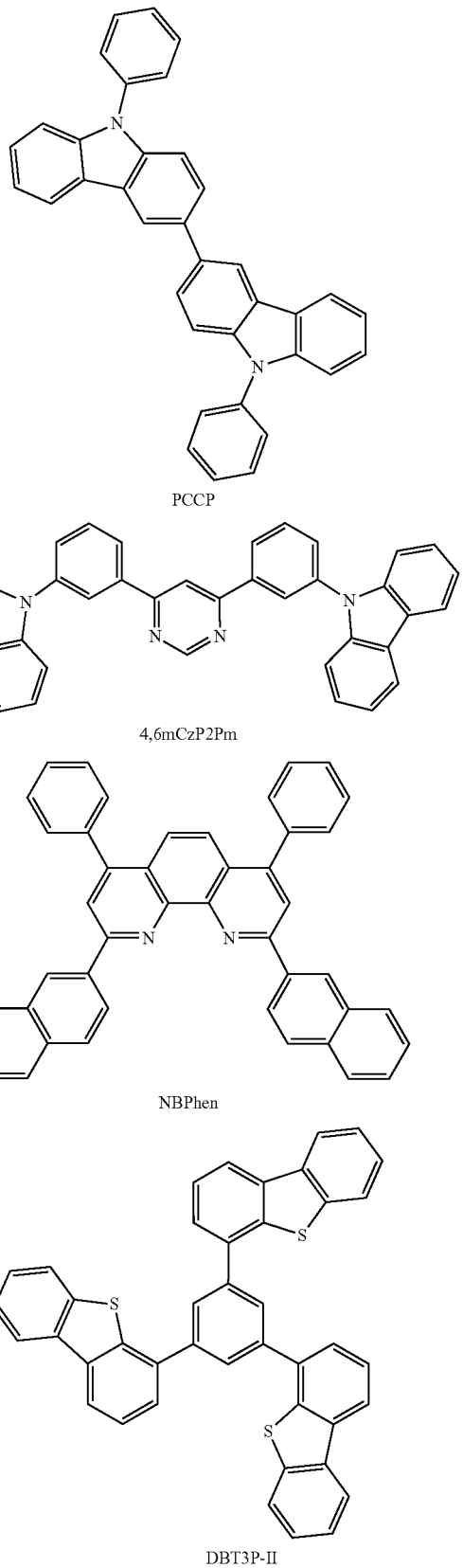

-continued
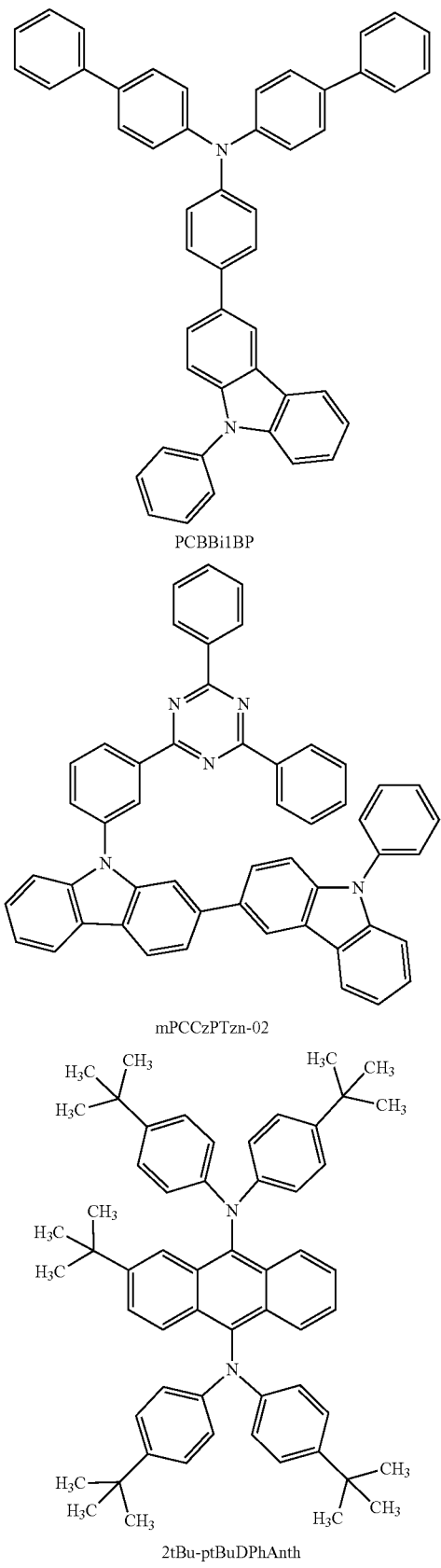
PCBBi1BP
mPCCzPTzn-02
2tBu-ptBuDPhAnth
[Chemical formulae 28]
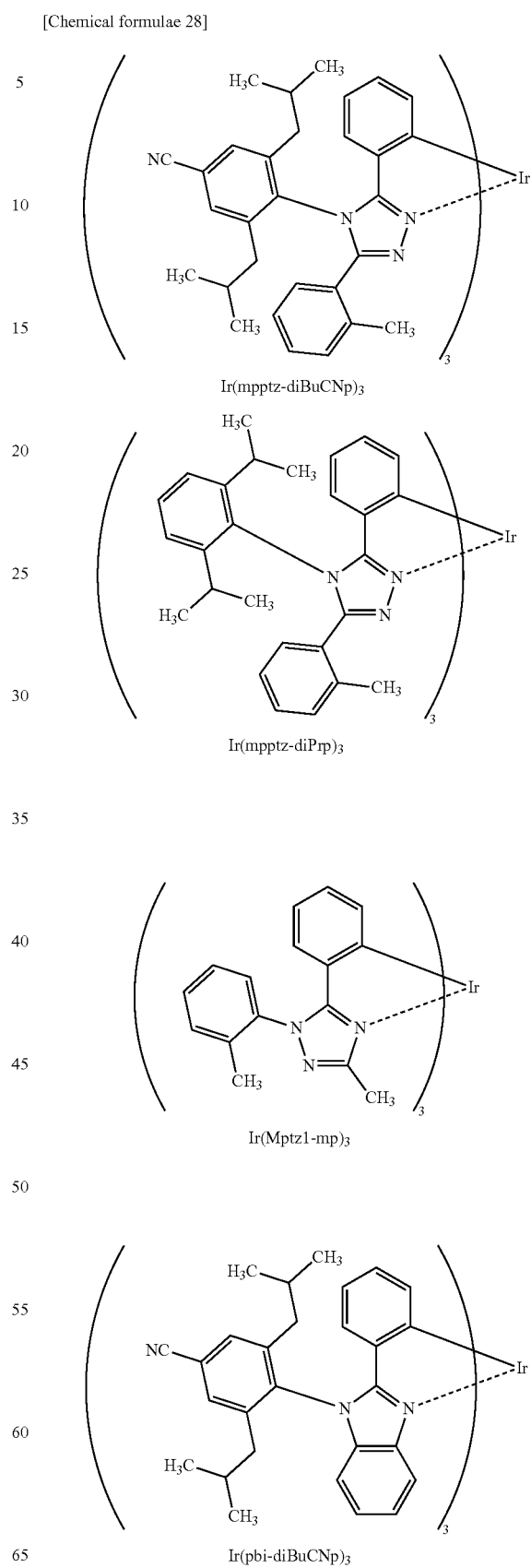
Ir(mpptz-diBuCNp)$_3$
Ir(mpptz-diPrp)$_3$
Ir(Mptz1-mp)$_3$
Ir(pbi-diBuCNp)$_3$

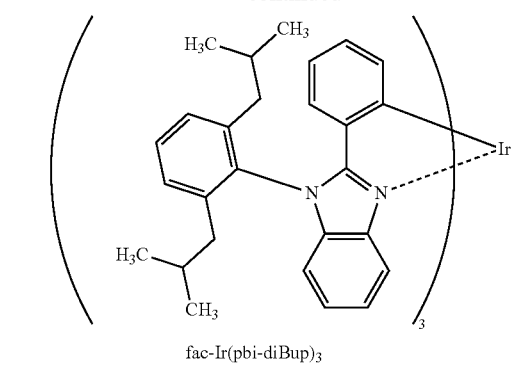

fac-Ir(pbi-diBup)₃

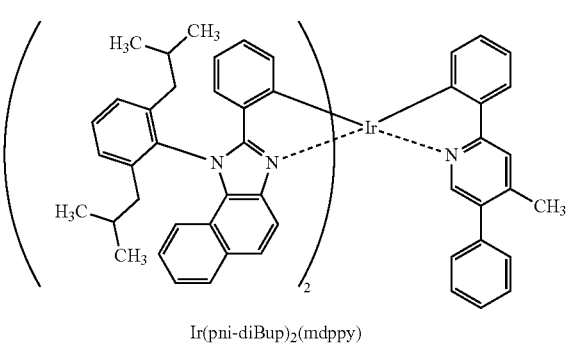

Ir(pni-diBup)₂(mdppy)

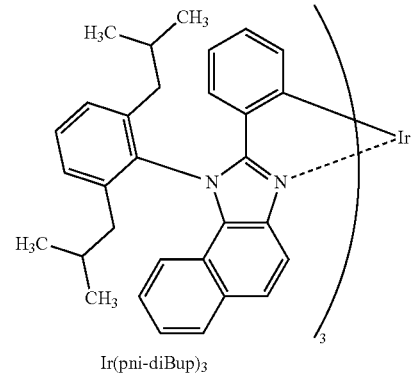

Ir(pni-diBup)₃

[Chemical formulae 29]

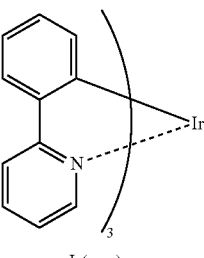

Ir(ppy)₃

TABLE 1

| | Layer | Numeral | Film thickness (nm) | Material | Weight ratio |
|---|---|---|---|---|---|
| Comparative light-emitting device 1 | Electrode | 102 | 200 | Al | — |
| | Electron-injection layer | 119 | 1 | LiF | — |
| | Electron-transport layer | 118(2) | 10 | NBphen | — |
| | | 118(1) | 20 | mPCCzPTzn-02 | — |
| | Light-emitting layer | 130(2) | 10 | mPCCzPTzn-02:PCCP:Ir(mpptz-diBuCNp)₃ | 0.8:0.2:0.1 |
| | | 130(1) | 30 | mPCCzPTzn-02 : PCCP:Ir(mpptz-diBuCNp)₃ | 0.5:0.5:0.1 |
| | Hole-transport layer | 112 | 20 | PCCP | — |
| | Hole-injection layer | 111 | 20 | DBT3P-II:MoO₃ | 1:0.5 |
| | Anode | 101 | 70 | ITSO | — |
| Light-emitting devices 2-5 | Electrode | 102 | 200 | Al | — |
| | Electron-injection layer | 119 | 1 | LiF | — |
| | Electron-transport layer | 118(2) | 10 | NBphen | — |
| | | 118(1) | 20 | mPCCzPTzn-02 | — |
| | Light-emitting layer | 130(2) | 10 | mPCCzPTzn-02:PCCP: Ir(mpptz-diBuCNp)₃:2tBu-ptBuDPhA2Anth | 0.8:0.2:0.1:$x_1$ |
| | | 130(1) | 30 | mPCCzPTzn-02:PCCP: Ir(mpptz-diBuCNp)₃:2tBu-ptBuDPhA2Anth | 0.5:0.5:0.1:$x_1$ |
| | Hole-transport layer | 112 | 20 | PCCP | — |
| | Hole-injection layer | 111 | 40 | DBT3P-II:MoO₃ | 1:0.5 |
| | Anode | 101 | 70 | ITSO | — |
| Comparative light-emitting device 6 | Electrode | 102 | 200 | Al | — |
| | Electron-injection layer | 119 | 1 | LiF | — |
| | Electron-transport layer | 118(2) | 10 | NBphen | — |
| | | 118(1) | 20 | 4,6mCzP2Pm | — |
| | Light-emitting layer | 130(2) | 20 | 4,6mCzP2Pm:PCCP:Ir(mpptz-diPrp)₃ | 0.8:0.2:0.1 |
| | | 130(1) | 20 | 4,6mCzP2Pm:PCCP:Ir(mpptz-diPrp)₃ | 0.5:0.5:0.1 |
| | Hole-transport layer | 112 | 20 | PCCP | — |

TABLE 1-continued

| | Layer | Numeral | Film thickness (nm) | Material | Weight ratio |
|---|---|---|---|---|---|
| Light-emitting devices 7-10 | Hole-injection layer | 111 | 20 | DBT3P-II:MoO$_3$ | 1:0.5 |
| | Anode | 101 | 70 | ITSO | — |
| | Electrode | 102 | 200 | Al | — |
| | Electron-injection layer | 119 | 1 | LiF | — |
| | Electron-transport layer | 118(2) | 10 | NBphen | — |
| | | 118(1) | 20 | 4,6mCzP2Pm | — |
| | Light-emitting layer | 130(2) | 20 | 4,6mCzP2Pm2:PCCP:Ir(mpptz-diPrp)$_3$:2tBu-ptBuDPhA2Anth | 0.8:0.2:0.1:$x_1$ |
| | | 130(1) | 20 | 4,6mCzP2Pm2PCCP:Ir(mpptz-diPrp)$_3$:2tBu-ptBuDPhA2Anth | 0.5:0.50.1:$x_1$ |
| | Hole-transport layer | 112 | 20 | PCCP | — |
| | Hole-injection layer | 111 | 40 | DBT3P-II:MoO$_3$ | 1:0.5 |
| | Anode | 101 | 70 | ITSO | — |

TABLE 2

| | Layer | Numeral | Film thickness (nm) | Material | Weight ratio |
|---|---|---|---|---|---|
| Comparative light-emitting device 11 | Electrode | 102 | 200 | Al | — |
| | Electron-intjection layer | 119 | 1 | LiF | — |
| | Electron-transport layer | 118(2) | 10 | NBphen | — |
| | | 118(1) | 20 | 4,6mCzP2Pm | — |
| | Light-emitting layer | 130 | 40 | 4,6mCzP2Pm:Ir(Mptzl-mp)$_3$ | 0.8:0.2 |
| | Hole-transport layer | 112 | 20 | PCCP | — |
| | Hole-injection layer | 111 | 40 | DBT3P-II:MoO$_3$ | 1:0.5 |
| | Anode | 101 | 70 | ITSO | — |
| Light-emitting devices 12-15 | Electrode | 102 | 200 | Al | — |
| | Electron-injection layer | 119 | 1 | LiF | — |
| | Electron-transport layer | 118(2) | 10 | NBphen | — |
| | | 118(1) | 20 | 4,6mCzP2Pm | — |
| | Light-emitting layer | 130 | 40 | 4,6mCzP2Pm:Ir(Mptzl-mp)$_3$:2tBu-ptBuDPhA2Anth | 0.8:0.2$x_1$ |
| | Hole-transport layer | 112 | 20 | PCCP | — |
| | Hole-injection layer | 111 | 40 | DBT3P-II:MoO$_3$ | 1:0.5 |
| | Anode | 101 | 70 | ITSO | — |
| Comparative light-emitting device 16 | Electrode | 102 | 200 | Al | — |
| | Electron-injection layer | 119 | 1 | LiF | — |
| | Electron-transport layer | 118(2) | 10 | NBphen | — |
| | | 118(1) | 20 | 4,6mCzP2Pm | — |
| | Light-emitting layer | 130 | 40 | mPCCzPTzn-02:PCCP:Ir(pbi-diBuCNp)$_3$ | 0.5:0.5:0.1 |
| | Hole-transport layer | 112 | 20 | PCBBi1BP | — |
| | Hole-injection layer | 111 | 40 | DBT3P-II:MoO$_3$ | 1:0.5 |
| | Anode | 101 | 70 | ITSO | — |
| Light-emitting devices 17-19 | Electrode | 102 | 200 | Al | — |
| | Electron-injection layer | 119 | 1 | LiF | — |
| | Electron-transport layer | 118(2) | 10 | NBphen | — |
| | | 118(1) | 20 | 4,6mCzP2Pm | — |
| | Light-emitting layer | 130 | 40 | mPCCzPTzn-02:PCCP:Ir(pbi-diBuCNp)$_3$:2tBu-ptBuDPhA2Anth | 0.5:0.5$x_2$ |
| | Hole-transport layer | 112 | 20 | PCBBi1BP | — |
| | Hole-injection layer | 111 | 40 | DBT3P-II:MoO$_3$ | 1:0.5 |
| | Anode | 101 | 70 | ITSO | — |

TABLE 3

| | Layer | Numeral | Film thickness (nm) | Material | Weight ratio |
|---|---|---|---|---|---|
| Comparative light-emitting device 20 | Electrode | 102 | 200 | Al | — |
| | Electron-injection layer | 119 | 1 | LiF | — |
| | Electron-transport layer | 118(2) | 10 | NBphen | — |
| | | 118(1) | 20 | mPCCzPTnz-02 | — |
| | Light-emitting layer | 130 | 40 | mPCCzPTzn-02:PCCP:fac-Ir(pbi-diBup)$_3$ | 0.5:0.5:0.1 |
| | Hole-transport layer | 112 | 20 | PCBBi1BP | — |
| | Hole-injection layer | 111 | 40 | DBT3P-II:MoO$_3$ | 1:0.5 |
| | Anode | 101 | 70 | ITSO | — |
| Light-emitting devices 21-24 | Electrode | 102 | 200 | Al | — |
| | Electron-injection layer | 119 | 1 | LiF | — |
| | Electron-transport layer | 118(2) | 10 | NBphen | — |
| | | 118(1) | 20 | mPCCzPTzn-02 | — |
| | Light-emitting layer | 130 | 40 | mPCCzPTzn-02:PCCP:fac-Ir(pbi-diBup)3: 2tBu-ptBuDPhA2Anth | 0.5:0.5:0.5x$_1$ |
| | Hole-transport layer | 112 | 20 | PCBBi1BP | — |
| | Hole-injection layer | 111 | 40 | DBT3P-II:MoO$_3$ | 1:0.5 |
| | Anode | 101 | 70 | ITSO | — |
| Comparative light-emitting device 25 | Electrode | 102 | 200 | Al | — |
| | Electron-injection layer | 119 | 1 | LiF | — |
| | Electron-transport layer | 118(2) | 10 | NBphen | — |
| | | 118(1) | 20 | mPCCzPTzn-02 | — |
| | Light-emitting layer | 130 | 40 | mPCCzPTzn-02:PCCP:Ir(pni-diBup)$_2$(mdppy) | 0.5:0.5:0.1 |
| | Hole-transport layer | 112 | 20 | PCBBi1BP | — |
| | Hole-injection layer | 111 | 40 | DBT3P-II:MoO$_3$ | 1:0.5 |
| | Anode | 101 | 70 | ITSO | — |
| Light-emitting devices 26-28 | Electrode | 102 | 200 | Al | — |
| | Electron-injection layer | 119 | 1 | LiF | — |
| | Electron-transport layer | 118(2) | 10 | NBphen | — |
| | | 118(1) | 20 | mPCCzPTzn-02 | — |
| | Light-emitting layer | 130 | 40 | mPCCzPTm-02PCCP:Ir(pni-diBup)$_2$(mdppy): 2tBu-ptBuDPhA2Anth | 0.5:0.5:0.1x$_2$ |
| | Hole-transport layer | 112 | 20 | PCBBi1BP | — |
| | Hole-injection layer | 111 | 40 | DBT3P-II:MoO$_3$ | 1:0.5 |
| | Anode | 101 | 70 | ITSO | — |

TABLE 4

| | Layer | Numeral | Film thickness (nm) | Material | Weight ratio |
|---|---|---|---|---|---|
| Comparative light-emitting device 29 | Electrode | 102 | 200 | Al | — |
| | Electron-injection layer | 119 | 1 | LiF | — |
| | Electron-transport layer | 118(2) | 10 | NBphen | — |
| | | 118(1) | 20 | mPCCzPTzn-02 | — |
| | Light-emitting layer | 130 | 40 | mPCCzPTzn-02:PCCP:Ir(pni-diBup)$_3$ | 0.5:0.5:0.1 |
| | Hole-transport layer | 112 | 20 | PCBBi1BP | — |
| | Hole-injection layer | 111 | 40 | DBT3P-II:MoO$_3$ | 1:0.5 |
| | Anode | 101 | 70 | ITSO | — |
| Light-emitting devices 30-33 | Electrode | 102 | 200 | Al | — |
| | Electron-injection layer | 119 | 1 | LiF | — |
| | Electron-transport layer | 118(2) | 10 | NBphen | — |
| | | 118(1) | 20 | mPCCzPTzn-02 | — |
| | Light-emitting layer | 130 | 40 | mPCCzPTzn-02:PCCP:Ir(pni-diBup)$_3$: 2tBu-ptBuDPhA2Anth | 0.5:0.5:0.5x$_1$ |
| | Hole-transport layer | 112 | 20 | PCBBi1BP | — |

TABLE 4-continued

| | Layer | Numeral | Film thickness (nm) | Material | Weight ratio |
|---|---|---|---|---|---|
| | Hole-injection layer | 111 | 40 | DBT3P-II:MoO$_3$ | 1:0.5 |
| | Anode | 101 | 70 | ITSO | — |
| Comparative light-emitting device 34 | Electrode | 102 | 200 | Al | — |
| | Electron-injection layer | 119 | 1 | LiF | — |
| | Electron-transport layer | 118(2) | 10 | NBphen | — |
| | | 118(1) | 20 | 4,6mCzP2Pm | — |
| | Light-emitting layer | 130 | 40 | mPCCzPTzn-02:PCCP:Ir(ppy)$_3$ | 0.5:0.5:0.1 |
| | Hole-transport layer | 112 | 20 | PCBBi1BP | — |
| | Hole-injection layer | 111 | 40 | DBT3P-II:MoO$_3$ | 1:0.5 |
| | Anode | 101 | 70 | ITSO | — |
| Comparative light-emitting devices 35-38 | Electrode | 102 | 200 | Al | — |
| | Electron-injection layer | 119 | 1 | LiF | — |
| | Electron-transport layer | 118(2) | 10 | NBphen | — |
| | | 118(1) | 20 | 4,6mCzP2Pm | — |
| | Light-emitting layer | 130 | 40 | mPCCzPTzn-02:PCCP:Ir(ppy)$_3$: 2tBu-ptBuDPhA2Anth | 0.5:0.5:0.1:x$_1$ |
| | Hole-transport layer | 112 | 20 | PCBBi1BP | — |
| | Hole-injection layer | 111 | 40 | DBT3P-II:MoO$_3$ | 1:0.5 |
| | Anode | 101 | 70 | ITSO | — |

TABLE 5

| | Light-emitting devices 2, 7, 12, 21, and 30 Comparative light-emitting device 35 | Light-emitting devices 3, 8, 13, 22, and 31 Comparative light-emitting device 36 | Light-emitting devices 4, 9, 14, 23, and 32 Comparative light-emitting device 37 | Light-emitting devices 5, 10, 15, 24 and 33 Comparative light-emitting device 38 |
|---|---|---|---|---|
| x$_1$ | 0.01 | 0.025 | 0.05 | 0.1 |

TABLE 6

| | Light-emitting devices 17 and 26 | Light-emitting devices 18 and 27 | Light-emitting devices 19 and 28 |
|---|---|---|---|
| x$_2$ | 0.01 | 0.05 | 0.1 |

<Fabrication of Light-Emitting Devices>

Fabrication methods of the light-emitting devices fabricated in this example will be described below.

<<Fabrication of Light-Emitting Device 2 to Light-Emitting Device 5>>

As the electrode 101, an ITSO film was formed to a thickness of 70 nm over a glass substrate. Note that the electrode area of the electrode 101 was set to 4 mm$^2$ (2 mm×2 mm).

Next, as the hole-injection layer 111, DBT3P-II and molybdenum oxide (MoO$_3$) were deposited to a thickness of 40 nm over the electrode 101 by co-evaporation in a weight ratio (DBT3P-II:MoO$_3$) of 1:0.5.

Then, as the hole-transport layer 112, PCCP was deposited to a thickness of 20 nm over the hole-injection layer 111 by evaporation.

Next, as the light-emitting layer 130, mPCCzPTzn-02, PCCP, Ir(mpptz-diBuCNp)$_3$, and 2tBu-ptBuDPhA2Anth were deposited to a thickness of 30 nm over the hole-transport layer 112 by co-evaporation at a weight ratio (mPCCzPTm-02:PCCP:Ir(mpptz-diBuCNp)$_3$:2tBu-ptBuDPhA2Anth) of 0.5:0.5:0.1:x$_1$. Subsequently, mPCCzPTzn-02, PCCP, Ir(mpptz-diBuCNp)$_3$, and 2tBu-ptBuDPhA2Anth were deposited to a thickness of 10 nm by co-evaporation at a weight ratio (mPCCzPTzn-02:PCCP:Ir(mpptz-diBuCNp)$_3$:2tBu-ptBuDPhA2Anth) of 0.8:0.2:0.1:x$_1$. In the light-emitting layer 130, Ir(mpptz-diBuCNp)$_3$ is a phosphorescent material having a five-membered ring. Furthermore, 2tBu-ptBuDPhA2Anth is a fluorescent material having protecting groups. Note that the value x$_1$ differs between the light-emitting devices, and Table 5 shows the values x$_1$ in the light-emitting devices.

Next, as the electron-transport layer 118, mPCCzPTzn-02 and NBPhen were sequentially deposited to a thickness of 20 nm and to a thickness of 10 nm, respectively, over the light-emitting layer 130 by evaporation. Next, as the electron-injection layer 119, LiF was deposited to a thickness of 1 nm over the electron-transport layer 118 by evaporation.

Next, as the electrode 102, aluminum (Al) was formed to a thickness of 200 nm over the electron-injection layer 119.

Then, in a glove box containing a nitrogen atmosphere, a light-emitting device 2 to a light-emitting device 5 were sealed by fixing a glass substrate for sealing to the glass substrate on which the organic materials were formed using a sealant for organic EL. Specifically, the sealant was applied to the periphery of the organic materials formed on the glass substrate, the glass substrate was bonded to the glass substrate for sealing, irradiation with ultraviolet light having a wavelength of 365 nm at 6 J/cm$^2$ was performed, and heat treatment at 80° C. for one hour was performed. Through the above process, the light-emitting device 2 to the light-emitting device 5 were obtained.

<<Fabrication of Light-Emitting Device 7 to Light-Emitting Device 10, Light-Emitting Device 12 to Light-Emitting Device 15, Light-Emitting Device 17 to Light-Emitting Device 19, Light-Emitting Device 21 to Light-Emitting Device 24, Light-Emitting Device 26 to Light-Emitting Device 28, Light-Emitting Device 30 to Light-Emitting Device 33, Comparative Light-Emitting Devices 1, 6, 11, 16, 20, 25, and 29, and Comparative Light-Emitting Device 34 to Comparative Light-Emitting Device 38>>

A light-emitting device 7 to a light-emitting device 10, a light-emitting device 12 to a light-emitting device 15, a light-emitting device 17 to a light-emitting device 19, a light-emitting device 21 to a light-emitting device 24, a light-emitting device 26 to a light-emitting device 28, a light-emitting device 30 to a light-emitting device 33, comparative light-emitting devices 1, 6, 11, 16, 20, 25, and 29, and a comparative light-emitting device 34 to a comparative light-emitting device 38 were fabricated by a vacuum evaporation method in a manner similar to that for the light-emitting device 2 to the light-emitting device 5 described above. Since the details of the structures of the light-emitting devices are shown in Table 1 to Table 4, the details of the fabrication method are omitted. Note that in Table 1 to Table 4, the value represented by $x_1$ is as shown in Table 5, and the value represented by $x_2$ is as shown in Table 6.

The comparative light-emitting devices 1, 6, 11, 16, 20, 25, and 29 and the comparative light-emitting device 34 are light-emitting devices that do not contain a fluorescent material in the light-emitting layers 130. Therefore, the phosphorescent material contained in each of the light-emitting layers of the light-emitting devices emits light. These light-emitting devices are light-emitting devices in which the phosphorescent material functions as a guest material (energy acceptor), and they are shown as comparative examples for the light-emitting device of one embodiment of the present invention, in which the phosphorescent material functions as an energy donor.

The light-emitting device 2 to the light-emitting device 5, the light-emitting device 7 to the light-emitting device 10, the light-emitting device 12 to the light-emitting device 15, the light-emitting device 21 to the light-emitting device 24, the light-emitting device 26 to the light-emitting device 28, and the light-emitting device 30 to the light-emitting device 33 are each the light-emitting device of one embodiment of the present invention. Each light-emitting layer 130 contains 2tBu-ptBuDPhA2Anth, which is a fluorescent material having protecting groups. Therefore, they are light-emitting devices exhibiting fluorescence. Similarly, the comparative light-emitting device 35 to the comparative light-emitting device 38 are also fluorescent light-emitting devices in which the light-emitting layers 130 contain 2tBu-ptBuDPhA2Anth, which is a fluorescent material having protecting groups.

Ir(mpptz-diBuCNp)$_3$ is used as a phosphorescent material having a five-membered ring in the light-emitting device 2 to the light-emitting device 5, Ir(mpptz-diPrp)$_3$ is used as a phosphorescent material having a five-membered ring in the light-emitting device 7 to the light-emitting device 10, Ir(Mptzl-mp)$_3$ is used as a phosphorescent material having a five-membered ring in the light-emitting device 12 to the light-emitting device 15, Ir(pbi-diBuCNp)$_3$ is used as a phosphorescent material having a five-membered ring in the light-emitting device 17 to the light-emitting device 19, fac-Ir(pbi-diBup)$_3$ is used as a phosphorescent material having a five-membered ring in the light-emitting device 20 to the light-emitting device 24, Ir(pni-diBup)$_2$(mdppy) is used as a phosphorescent material having a five-membered ring in the light-emitting device 26 to the light-emitting device 28, and Ir(pni-diBup)$_3$ is used as a phosphorescent material having a five-membered ring in the light-emitting device 30 to the light-emitting device 33. The above-described phosphorescent materials each having a five-membered ring skeleton are examples of a phosphorescent material having a triazole skeleton or an imidazole skeleton. Note that Ir(ppy)$_3$, which is a phosphorescent material that does not have a five-membered ring skeleton, is used in the comparative light-emitting device 35 to the comparative light-emitting device 38, which were fabricated for comparison of device characteristics with the light-emitting device of one embodiment of the present invention.

Note that mPCCzPTzn-02 and PCCP are a combination that forms an exciplex, and 4,6mCzP2Pm and PCCP are a combination that forms an exciplex.

<Characteristics of Light-Emitting Devices>

Next, the characteristics of the light-emitting device 2 to the light-emitting device 5, the light-emitting device 7 to the light-emitting device 10, the light-emitting device 12 to the light-emitting device 15, the light-emitting device 17 to the light-emitting device 19, the light-emitting device 21 to the light-emitting device 24, the light-emitting device 26 to the light-emitting device 28, the light-emitting device 30 to the light-emitting device 33, the comparative light-emitting devices 1, 6, 11, 16, 20, 25, and 29, and the comparative light-emitting device 34 to the comparative light-emitting device 38, which were fabricated in the above manner, were measured. Luminance and CIE chromaticity were measured with a luminance colorimeter (BM-5A manufactured by TOPCON TECHNOHOUSE CORPORATION), and electroluminescence spectra were measured with a multi-channel spectrometer (PMA-11 manufactured by Hamamatsu Photonics K.K.).

FIGS. 14, 16, 18, 20, 22, 24, 26, and 28 show the external quantum efficiency-luminance characteristics of the light-emitting device 2 to the light-emitting device 5, the light-emitting device 7 to the light-emitting device 10, the light-emitting device 12 to the light-emitting device 15, the light-emitting device 17 to the light-emitting device 19, the light-emitting device 21 to the light-emitting device 24, the light-emitting device 26 to the light-emitting device 28, the light-emitting device 30 to the light-emitting device 33, the comparative light-emitting devices 1, 6, 11, 16, 20, 25, and 29, and the comparative light-emitting device 34 to the comparative light-emitting device 38. FIGS. 15, 17, 19, 21, 23, 25, 27, and 29 show electroluminescence spectra obtained when current at a current density of 2.5 mA/cm$^2$ was applied to each of the light-emitting device 2 to the light-emitting device 5, the light-emitting device 7 to the light-emitting device 10, the light-emitting device 12 to the light-emitting device 15, the light-emitting device 17 to the light-emitting device 19, the light-emitting device 21 to the light-emitting device 24, the light-emitting device 26 to the light-emitting device 28, the light-emitting device 30 to the light-emitting device 33, the comparative light-emitting devices 1, 6, 11, 16, 20, 25, and 29, and the comparative light-emitting device 34 to the comparative light-emitting device 38. Note that the measurements of the light-emitting devices were performed at room temperature (in an atmosphere maintained at 23° C.).

Table 7 and Table 8 show the device characteristics at around 1000 cd/m$^2$ of the light-emitting device 2 to the light-emitting device 5, the light-emitting device 7 to the light-emitting device 10, the light-emitting device 12 to the light-emitting device 15, the light-emitting device 17 to the light-emitting device 19, the light-emitting device 21 to the light-emitting device 24, the light-emitting device 26 to the light-emitting device 28, the light-emitting device 30 to the light-emitting device 33, the comparative light-emitting devices 1, 6, 11, 16, 20, 25, and 29, and the comparative light-emitting device 34 to the comparative light-emitting device 38.

TABLE 7

| | Voltage (V) | Current density (mA/cm$^2$) | CIE chromaticity (x, y) | Luminance (cd/m$^2$) | Current efficiency (cd/A) | Power efficiency (lm/W) | External quantum efficiency (%) |
|---|---|---|---|---|---|---|---|
| Comparative light-emitting device 1 | 3.10 | 1.42 | (0.204, 0.516) | 981 | 69.0 | 69.9 | 25.9 |
| Light-emitting device 2 | 3.10 | 1.25 | (0.269, 0.638) | 980 | 78.2 | 79.2 | 22.6 |
| Light-emitting device 3 | 3.10 | 1.39 | (0.289, 0.655) | 1124 | 80.8 | 81.9 | 22.1 |
| Light-emitting device 4 | 3.10 | 1.47 | (0.300, 0.661) | 1178 | 80.0 | 81.1 | 21.3 |
| Light-emitting device 5 | 3.00 | 1.11 | (0.312, 0.659) | 839 | 75.6 | 79.2 | 19.9 |
| Comparative light-emitting device 6 | 3.50 | 1.72 | (0.220, 0.491) | 916 | 53.2 | 47.7 | 19.7 |
| Light-emitting device 7 | 3.40 | 1.24 | (0.287, 0.613) | 916 | 73.7 | 68.1 | 21.2 |
| Light-emitting device 8 | 3.40 | 1.14 | (0.296, 0.633) | 944 | 82.7 | 76.4 | 22.7 |
| Light-emitting device 9 | 3.40 | 1.32 | (0.306, 0.646) | 1114 | 84.5 | 78.1 | 22.4 |
| Light-emitting device 10 | 3.30 | 1.16 | (0.324, 0.646) | 893 | 77.2 | 73.5 | 20.0 |
| Comparative light-emitting device 11 | 3.50 | 2.22 | (0.213, 0.468) | 1087 | 49.0 | 44.0 | 18.4 |
| Light-emitting device 12 | 3.10 | 0.94 | (0.272, 0.613) | 839 | 88.8 | 90.0 | 25.4 |
| Light-emitting device 13 | 3.10 | 0.92 | (0.291, 0.639) | 892 | 96.8 | 98.1 | 26.3 |
| Light-emitting device 14 | 3.00 | 0.72 | (0.307, 0.647) | 696 | 97.0 | 101.6 | 25.6 |
| Light-emitting device 15 | 3.00 | 0.96 | (0.321, 0.648) | 821 | 85.2 | 89.2 | 22.0 |
| Comparative light-emitting device 16 | 3.00 | 1.02 | (0.305, 0.651) | 1010 | 98.9 | 103.5 | 27.7 |
| Light-emitting device 17 | 3.00 | 1.05 | (0.308, 0.653) | 992 | 94.8 | 99.3 | 25.9 |
| Light-emitting device 18 | 3.00 | 1.16 | (0.322, 0.650) | 943 | 81.4 | 85.3 | 21.4 |
| Light-emitting device 19 | 3.00 | 1.29 | (0.327, 0.649) | 912 | 70.6 | 73.9 | 18.3 |

TABLE 8

| | Voltage (V) | Current density (mA/cm$^2$) | CIE chromaticity (x, y) | Luminance (cd/m$^2$) | Current efficiency (cd/A) | Power efficiency (lm/W) | External quantum efficiency (%) |
|---|---|---|---|---|---|---|---|
| Comparative light-emitting device 20 | 3.40 | 1.00 | (0.310, 0.634) | 873 | 87.0 | 80.4 | 25.3 |
| Light-emitting device 21 | 3.20 | 0.99 | (0.304, 0.650) | 856 | 86.6 | 85.0 | 24.6 |
| Light-emitting device 22 | 3.20 | 1.17 | (0.310, 0.652) | 982 | 83.8 | 82.3 | 23.4 |
| Light-emitting device 23 | 3.20 | 1.19 | (0.320, 0.651) | 927 | 77.8 | 76.4 | 21.3 |
| Light-emitting device 24 | 3.20 | 1.39 | (0.324, 0.651) | 1002 | 72.1 | 70.8 | 18.7 |
| Comparative light-emitting device 25 | 3.20 | 1.23 | (0.331, 0.640) | 988 | 80.6 | 79.1 | 21.8 |
| Light-emitting device 26 | 3.20 | 1.52 | (0.328, 0.643) | 1167 | 76.6 | 75.2 | 20.5 |
| Light-emitting device 27 | 3.30 | 1.60 | (0.337, 0.640) | 1028 | 64.1 | 61.0 | 16.9 |

TABLE 8-continued

|  | Voltage (V) | Current density (mA/cm²) | CIE chromaticity (x, y) | Luminance (cd/m²) | Current efficiency (cd/A) | Power efficiency (lm/W) | External quantum efficiency (%) |
| --- | --- | --- | --- | --- | --- | --- | --- |
| Light-emitting device 28 | 3.20 | 1.73 | (0.339, 0.640) | 936 | 54.3 | 53.3 | 14.1 |
| Comparative light-emitting device 29 | 3.60 | 1.25 | (0.285, 0.628) | 977 | 77.9 | 68.0 | 23.6 |
| Light-emitting device 30 | 3.60 | 1.22 | (0.295, 0.647) | 990 | 81.3 | 71.0 | 23.1 |
| Light-emitting device 31 | 3.60 | 1.34 | (0.304, 0.654) | 1101 | 82.2 | 71.8 | 22.4 |
| Light-emitting device 32 | 3.60 | 1.41 | (0.315, 0.653) | 1120 | 79.5 | 69.4 | 21.2 |
| Light-emitting device 33 | 3.60 | 1.50 | (0.323, 0.652) | 1122 | 75.0 | 65.5 | 19.8 |
| Comparative light-emitting device 34 | 3.20 | 1.26 | (0.298, 0.656) | 1036 | 81.9 | 80.4 | 22.6 |
| Comparative light-emitting device 35 | 3.20 | 1.23 | (0.313, 0.647) | 908.3 | 74.1 | 72.7 | 20.0 |
| Comparative light-emitting device 36 | 3.30 | 1.73 | (0.320, 0.646) | 1074 | 62.2 | 59.3 | 16.5 |
| Comparative light-emitting device 37 | 3.30 | 1.90 | (0.326, 0.645) | 984 | 51.9 | 49.4 | 13.6 |
| Comparative light-emitting device 38 | 3.30 | 2.27 | (0.333, 0.642) | 908.7 | 40.0 | 38.0 | 10.3 |

<Energy Transfer from Energy Donor (Phosphorescent Material Having Five-Membered Ring Skeleton) to Energy Acceptor (Fluorescent Material Having Protecting Groups)>

Figure 15:
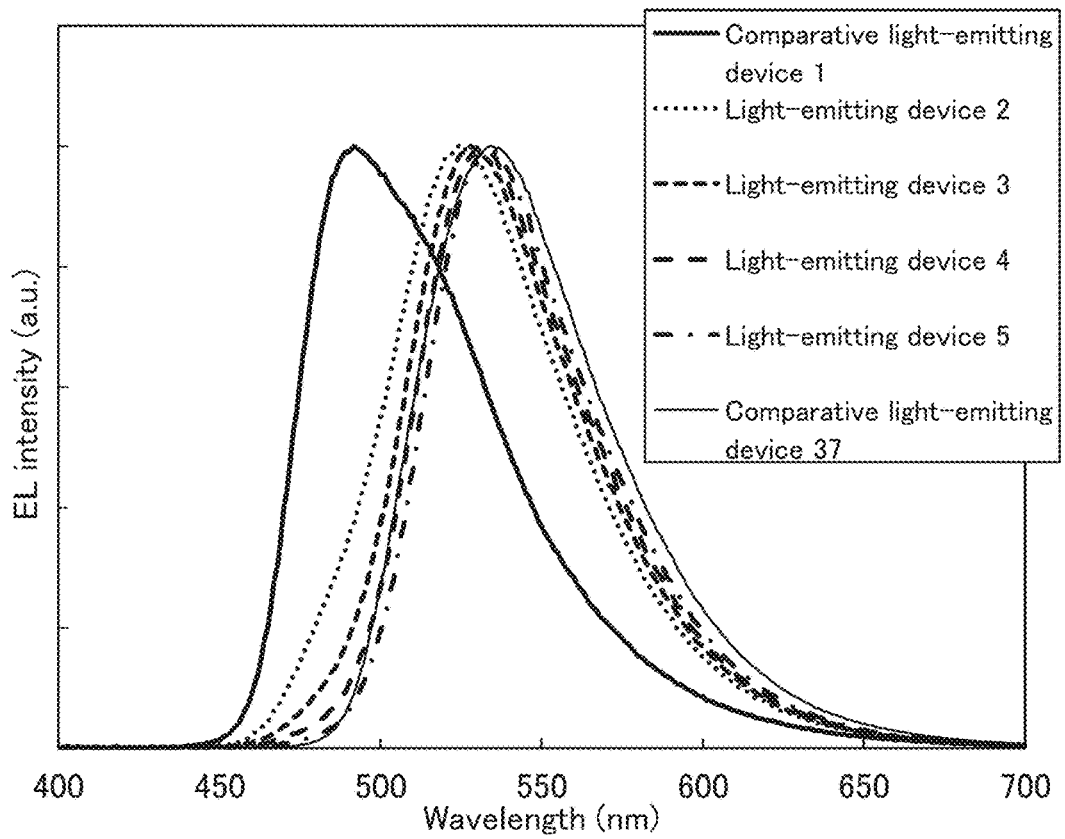
FIG. 15 is a diagram showing electroluminescence spectra of light-emitting devices in Example.
Figure 16:
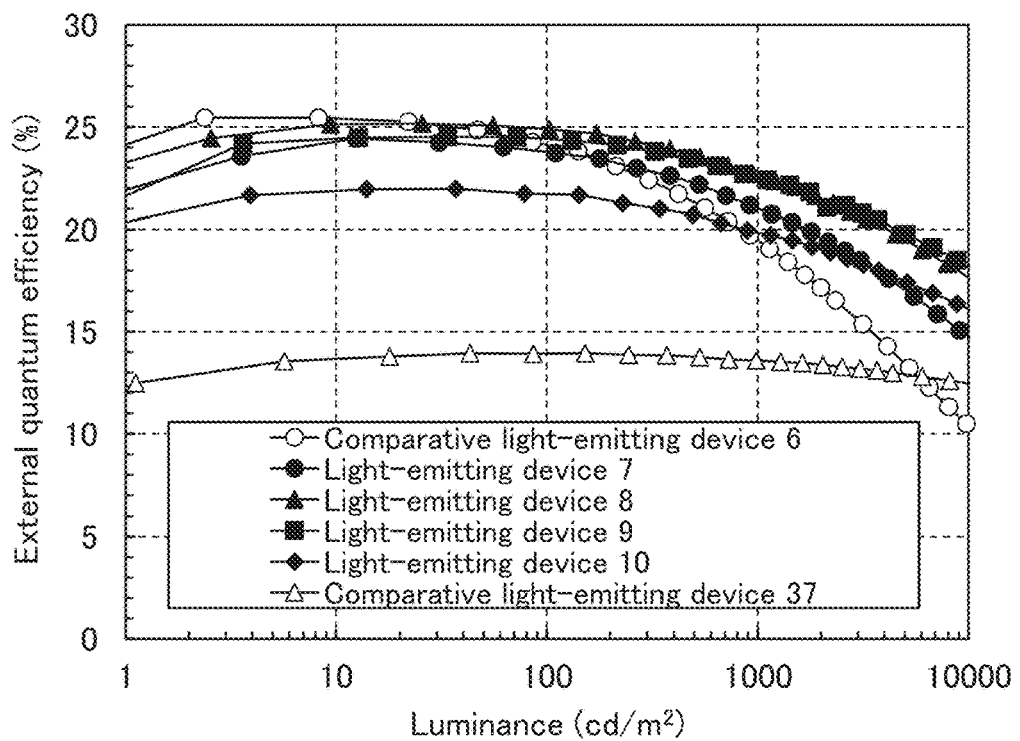
FIG. 16 is a diagram showing external quantum efficiency-luminance characteristics of light-emitting devices in Example.

As shown in FIG. 15, the emission spectra of the light-emitting device 2 to the light-emitting device 5 had a peak wavelength at approximately 528 nm and a full width at half maximum of approximately 62 nm, i.e., exhibited green light emission derived from 2tBu-ptBuDPhA2Anth. Meanwhile, the emission spectrum of the comparative light-emitting device 1 had a peak wavelength at 492 nm and a full width at half maximum of 67 nm, i.e., exhibited light emission derived from Ir(mpptz-diBuCNp)₃. Thus, it was found that energy transfer from the phosphorescent material to the fluorescent material was caused in the light-emitting device of one embodiment of the present invention.

Figure 17:
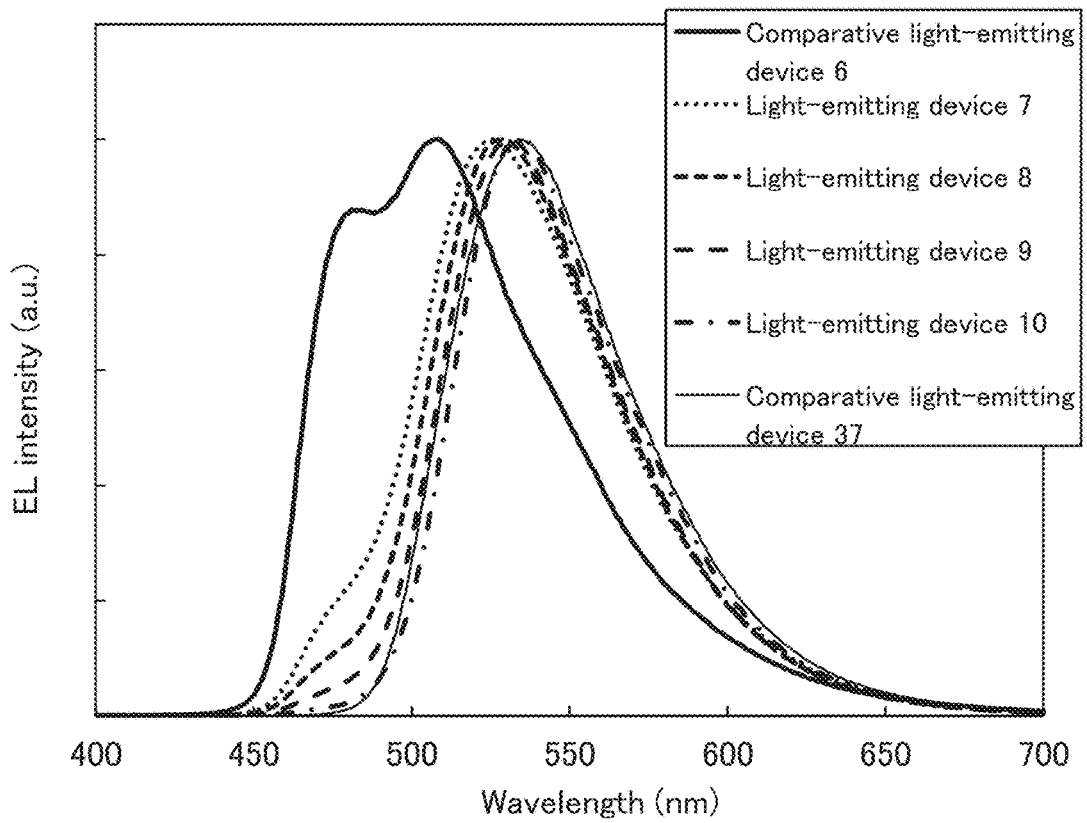
FIG. 17 is a diagram showing electroluminescence spectra of light-emitting devices in Example.
Figure 18:
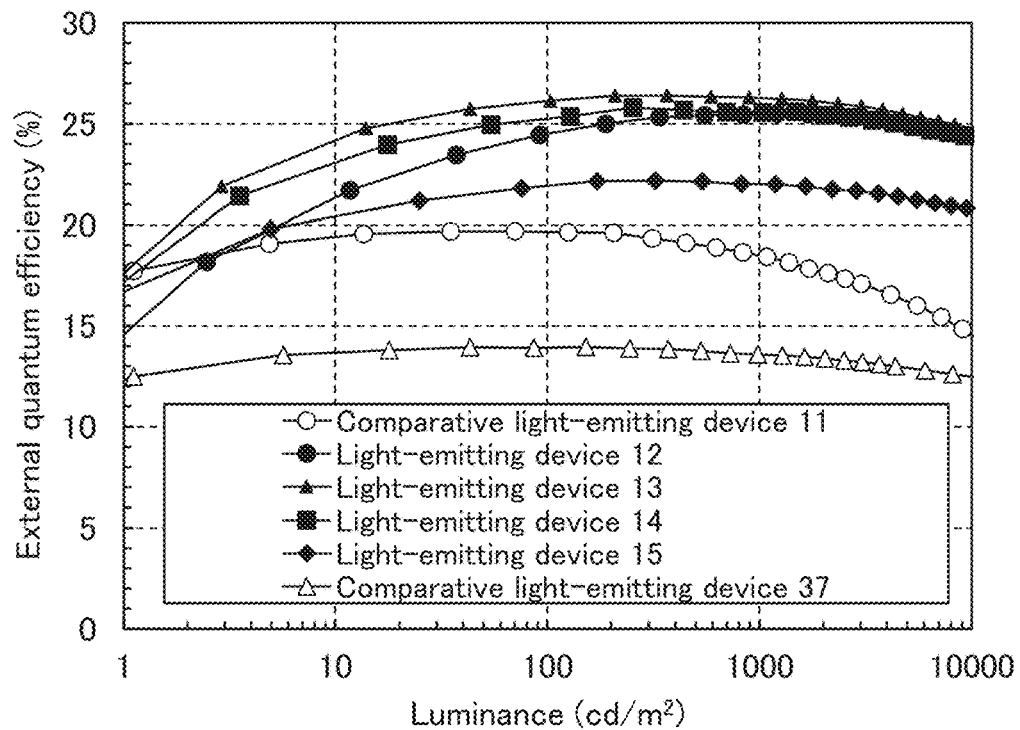
FIG. 18 is a diagram showing external quantum efficiency-luminance characteristics of light-emitting devices in Example.

As shown in FIG. 17, the emission spectra of the light-emitting device 7 to the light-emitting device 10 had a peak wavelength at approximately 530 nm and a full width at half maximum of approximately 66 nm, i.e., exhibited green light emission derived from 2tBu-ptBuDPhA2Anth. Meanwhile, the emission spectrum of the comparative light-emitting device 6 had a peak wavelength at 508 nm and a full width at half maximum of 85 nm, i.e., exhibited light emission derived from Ir(mpptz-diPrp)₃. Thus, it was found that energy transfer from the phosphorescent material to the fluorescent material was caused in the light-emitting device of one embodiment of the present invention.

Figure 19:
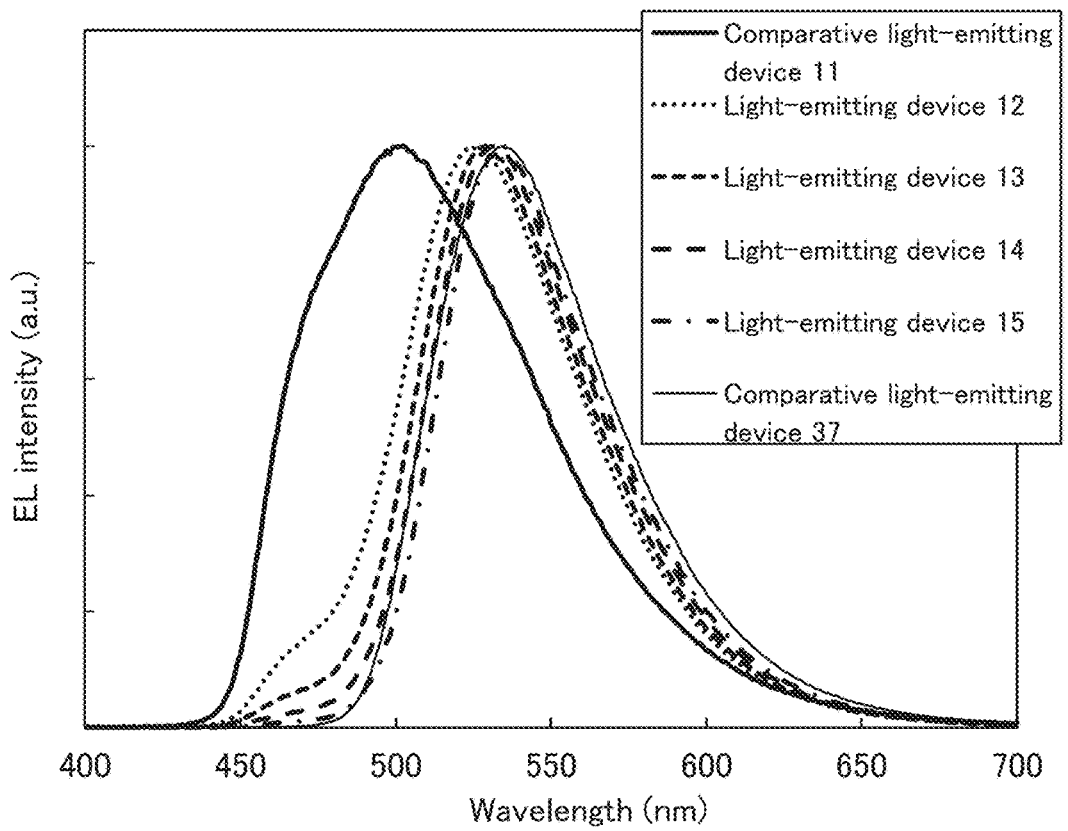
FIG. 19 is a diagram showing electroluminescence spectra of light-emitting devices in Example.
Figure 20:
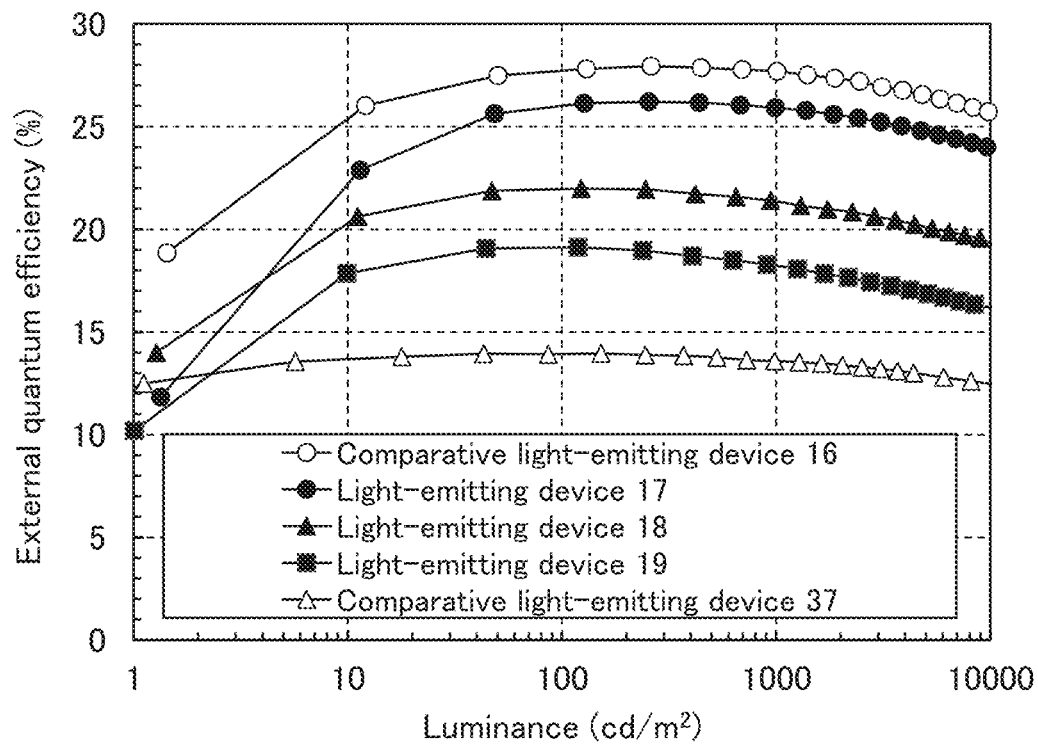
FIG. 20 is a diagram showing external quantum efficiency-luminance characteristics of light-emitting devices in Example.

As shown in FIG. 19, the emission spectra of the light-emitting device 12 to the light-emitting device 15 had a peak wavelength at approximately 529 nm and a full width at half maximum of approximately 64 nm, i.e., exhibited green light emission derived from 2tBu-ptBuDPhA2Anth. Meanwhile, the emission spectrum of the comparative light-emitting device 11 had a peak wavelength at 502 nm and a full width at half maximum of 91 nm, i.e., exhibited light emission derived from Ir(Mptzl-mp)₃. Thus, it was found that energy transfer from the phosphorescent material to the fluorescent material was caused in the light-emitting device of one embodiment of the present invention.

Figure 21:
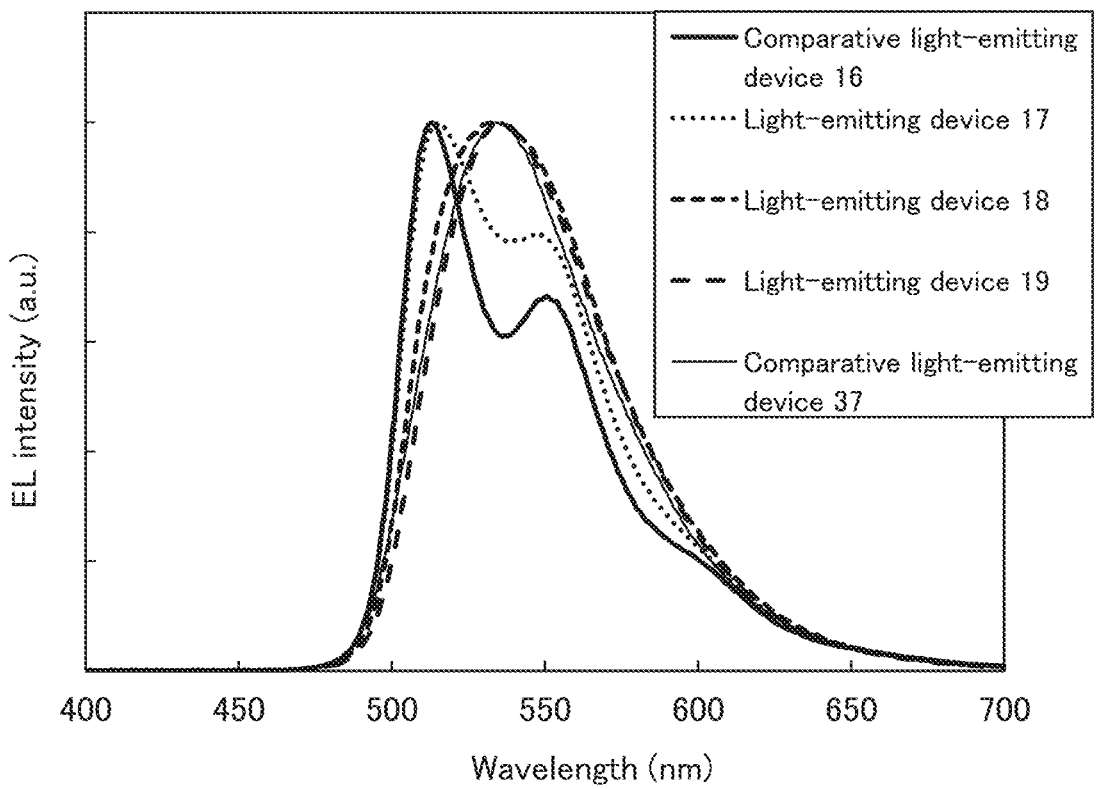
FIG. 21 is a diagram showing electroluminescence spectra of light-emitting devices in Example.
Figure 22:
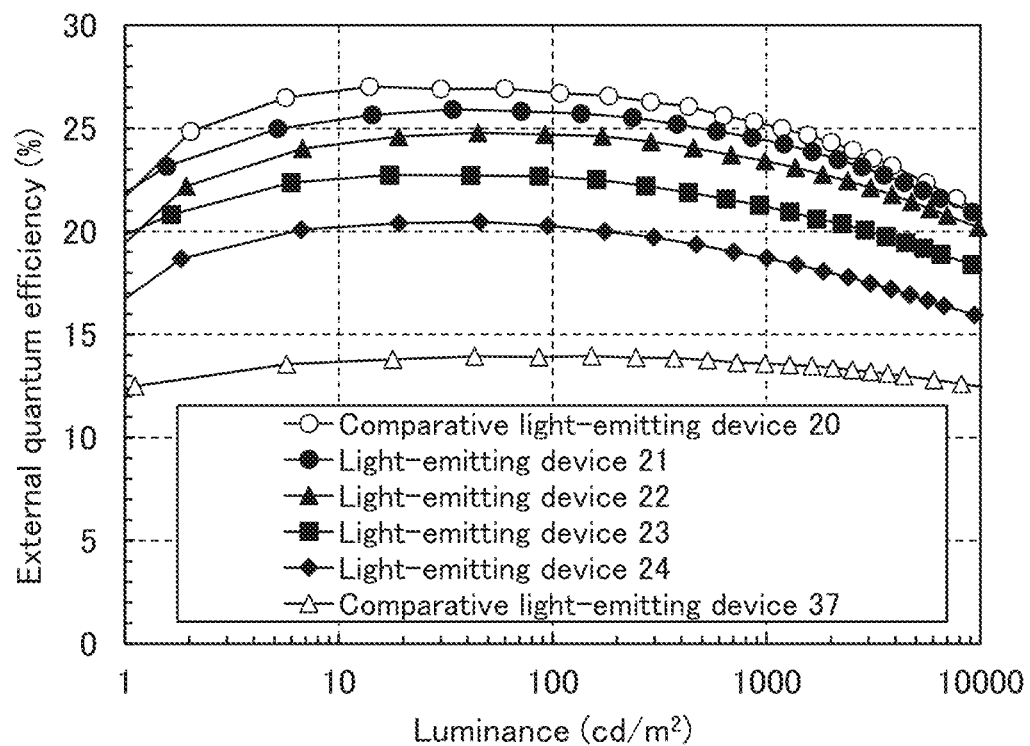
FIG. 22 is a diagram showing external quantum efficiency-luminance characteristics of light-emitting devices in Example.

As shown in FIG. 21, the emission spectrum of the comparative light-emitting device 16 had the maximum peak wavelength at 513 nm and a full width at half maximum of 64 nm, i.e., exhibited light emission derived from Ir(pbi-diBuCNp)₃. The emission spectrum of the light-emitting device 17 differs from the emission spectrum of the comparative light-emitting device 16. This is because both the light emission derived from Ir(pbi-diBuCNp)₃ and light emission derived from 2tBu-ptBuDPhA2Anth are observed. Thus, fluorescence is found to be obtained from the light-emitting device 17. The emission spectra of the light-emitting device 18 and the light-emitting device 19 had a peak wavelength at approximately 535 nm and a full width at half maximum of approximately 69 nm, i.e., exhibited green light emission derived from 2tBu-ptBuDPhA2Anth. Thus, it was found that energy transfer from the phosphorescent material to the fluorescent material was caused in the light-emitting device of one embodiment of the present invention.

Figure 23:
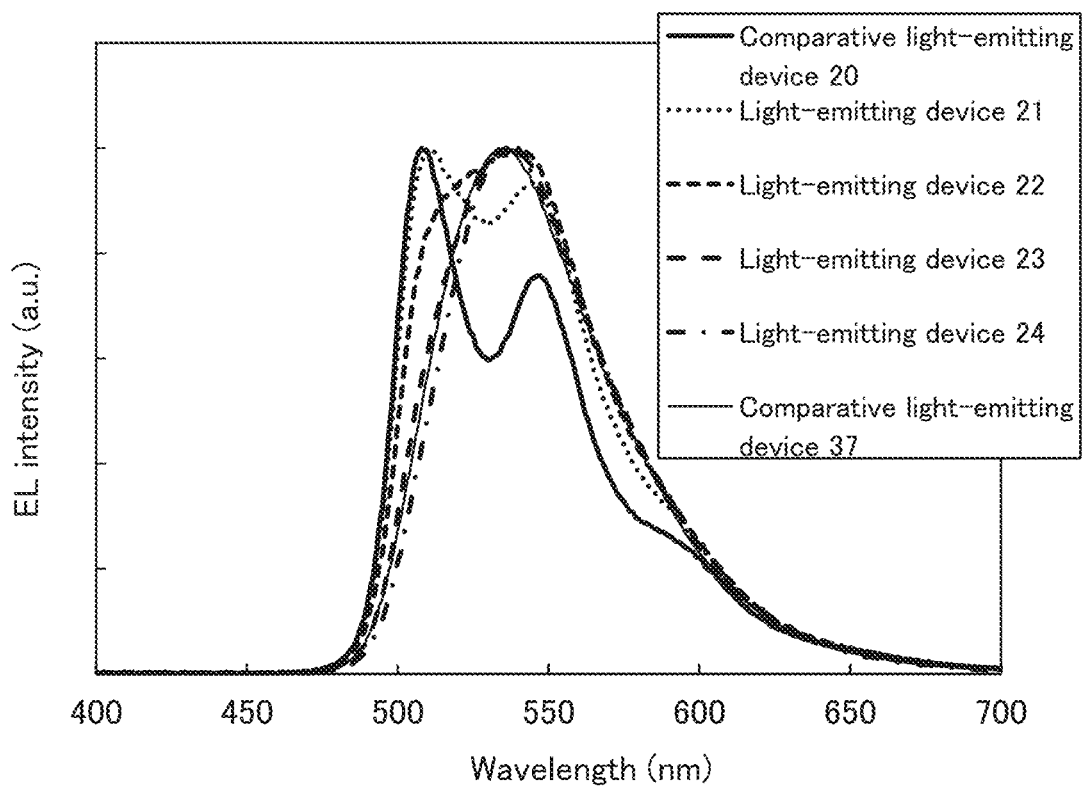
FIG. 23 is a diagram showing electroluminescence spectra of light-emitting devices in Example.
Figure 24:
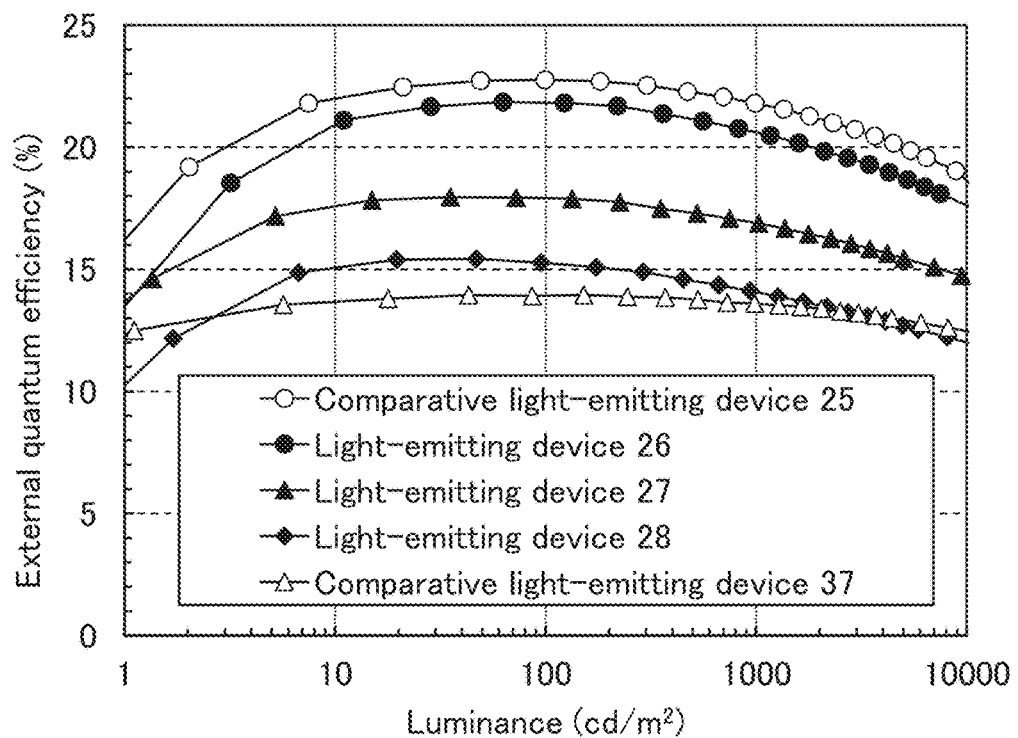
FIG. 24 is a diagram showing external quantum efficiency-luminance characteristics of light-emitting devices in Example.

As shown in FIG. 23, the emission spectrum of the comparative light-emitting device 20 had the maximum peak wavelength at 508 nm and a full width at half maximum of 64 nm, i.e., exhibited light emission derived from fac-Ir(pbi-diBup)₃. The emission spectrum of the light-emitting device 21 differs from the emission spectrum of the comparative light-emitting device 20. This is because both light emission derived from fac-Ir(pbi-diBup)₃ and light emission derived from 2tBu-ptBuDPhA2Anth are observed. Thus, fluorescence is found to be obtained from the light-emitting device 21. The emission spectra of the light-emitting device 22 to the light-emitting device 24 had a peak wavelength at approximately 538 nm and a full width at half maximum of approximately 69 nm, i.e., exhibited green light emission derived from 2tBu-ptBuDPhA2Anth. Thus, it was found that energy transfer from the phosphorescent material to the fluorescent material was caused in the light-emitting device of one embodiment of the present invention.

Figure 25:
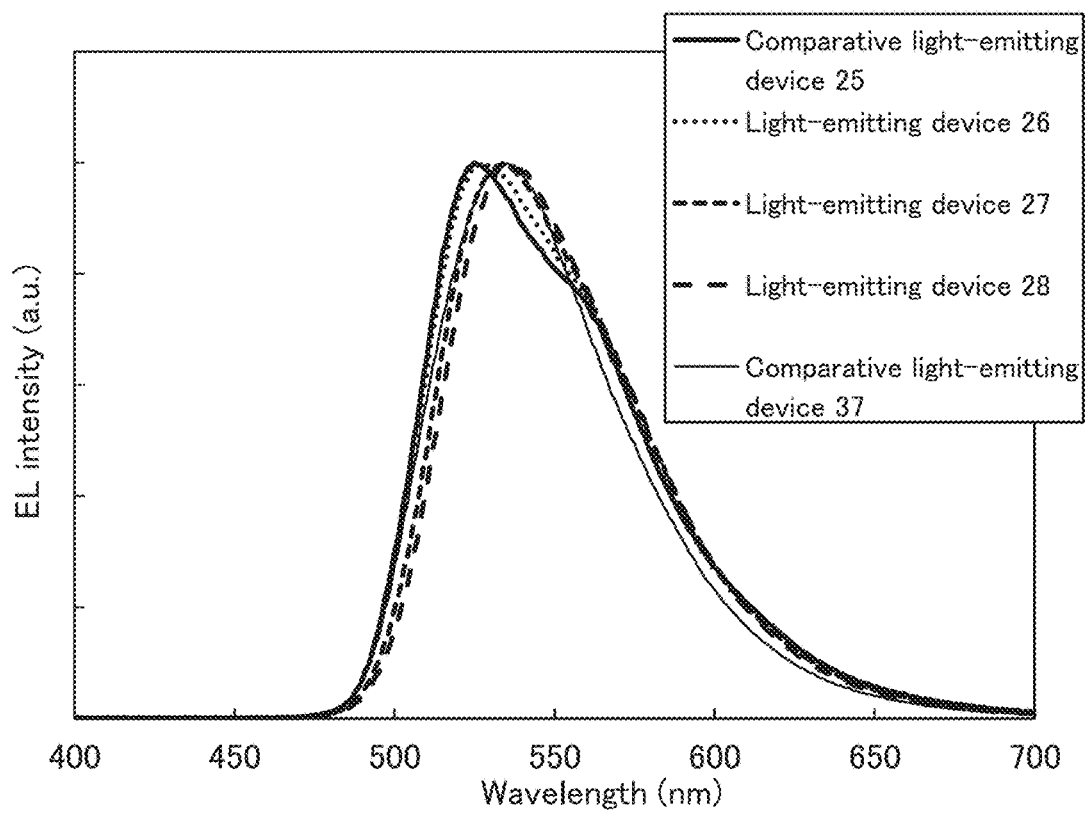
FIG. 25 is a diagram showing electroluminescence spectra of light-emitting devices in Example.
Figure 26:
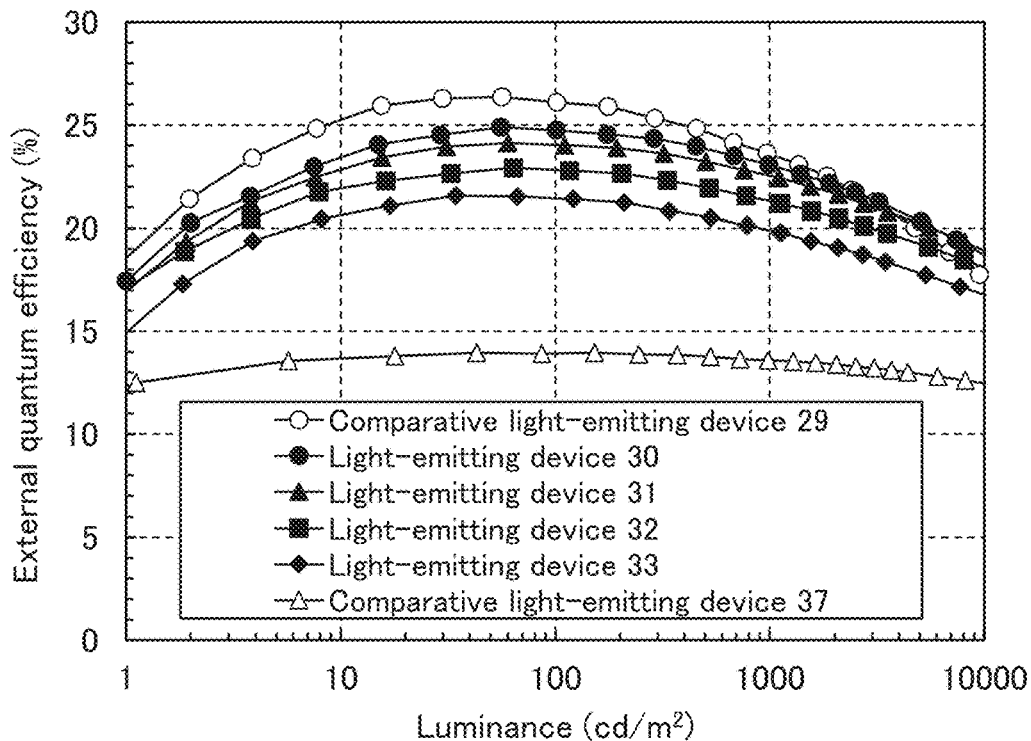
FIG. 26 is a diagram showing external quantum efficiency-luminance characteristics of light-emitting devices in Example.

As shown in FIG. 25, the emission spectrum of the comparative light-emitting device 25 had the maximum peak wavelength at 525 nm and a full width at half maximum of 73 nm, i.e., exhibited light emission derived from Ir(pni-diBup)$_2$(mdppy). The emission spectrum of the light-emitting device 26 differs from the emission spectrum of the comparative light-emitting device 25. This is because both light emission derived from Ir(pni-diBup)$_2$(mdppy) and light emission derived from 2tBu-ptBuDPhA2Anth are observed. Thus, fluorescence is found to be obtained from the light-emitting device 26. The emission spectra of the light-emitting device 27 and the light-emitting device 28 had a peak wavelength at approximately 535 nm and a full width at half maximum of approximately 69 nm, i.e., exhibited green light emission derived from 2tBu-ptBuDPhA2Anth. Thus, it was found that energy transfer from the phosphorescent material to the fluorescent material was caused in the light-emitting device of one embodiment of the present invention.

Figure 27:
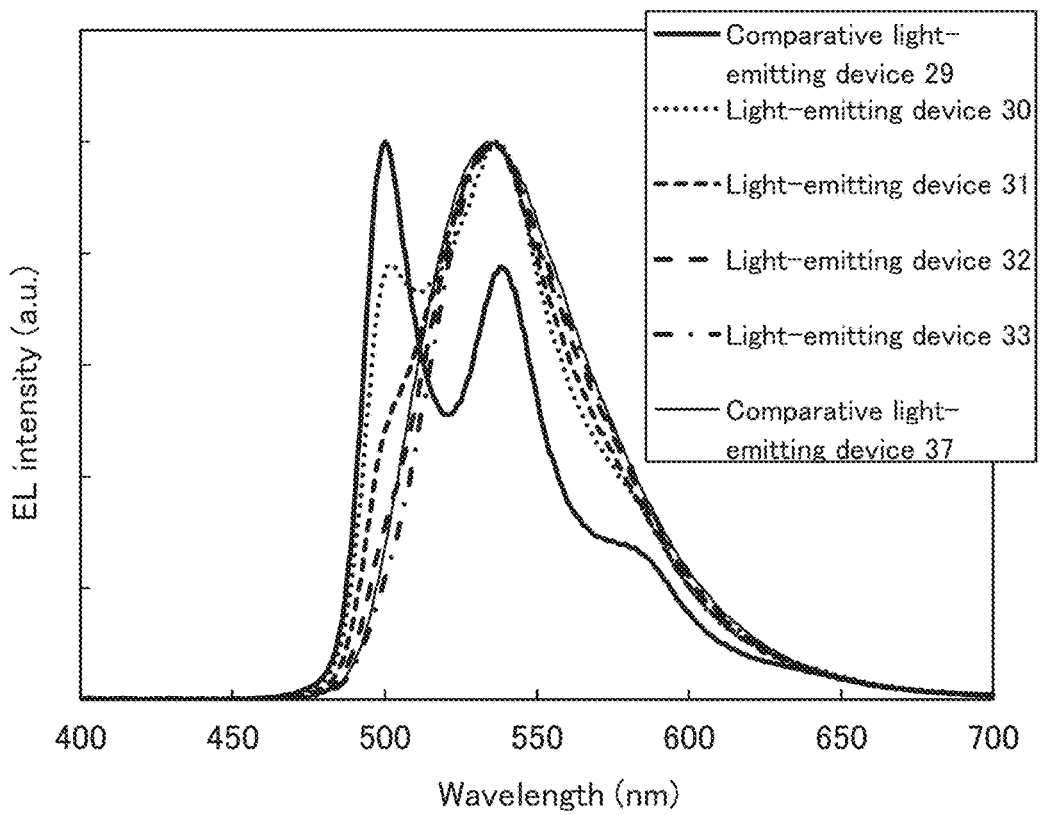
FIG. 27 is a diagram showing electroluminescence spectra of light-emitting devices in Example.
Figure 28:
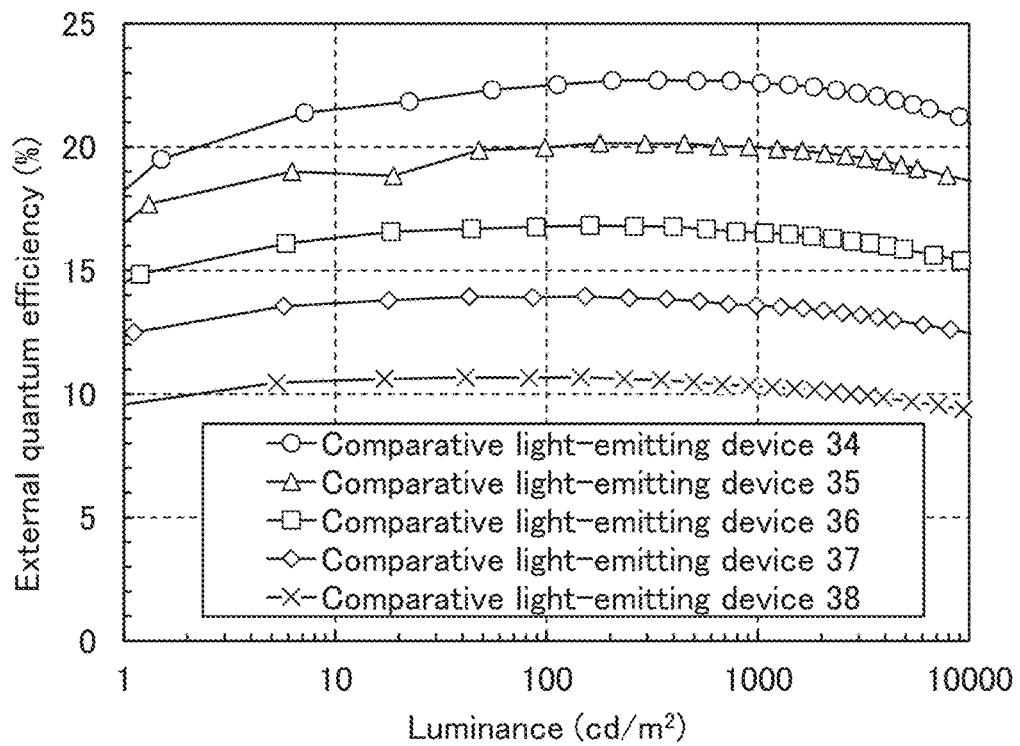
FIG. 28 is a diagram showing external quantum efficiency-luminance characteristics of comparative light-emitting devices in Example.

As shown in FIG. 27, the emission spectrum of the comparative light-emitting device 29 had the maximum peak wavelength at 500 nm and a full width at half maximum of 59 nm, i.e., exhibited light emission derived from Ir(pni-diBup)$_3$. The emission spectrum of the light-emitting device 30 differs from the emission spectrum of the comparative light-emitting device 29. This is because both light emission derived from Ir(pni-diBup)$_3$ and light emission derived from 2tBu-ptBuDPhA2Anth are observed. Thus, fluorescence is found to be obtained from the light-emitting device 29. The emission spectra of the light-emitting device 31 to the light-emitting device 33 had a peak wavelength at approximately 536 nm and a full width at half maximum of approximately 65 nm, i.e., exhibited green light emission derived from 2tBu-ptBuDPhA2Anth. Thus, it was found that energy transfer from the phosphorescent material to the fluorescent material was caused in the light-emitting device of one embodiment of the present invention.

Figure 29:
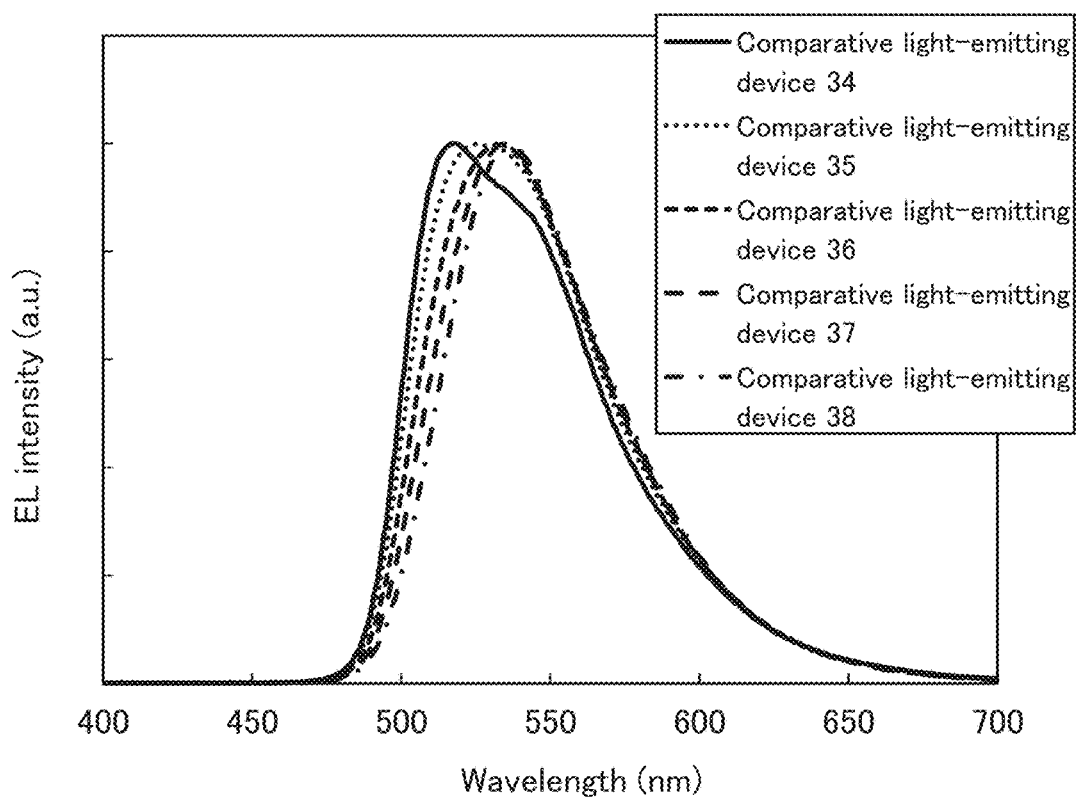
FIG. 29 is a diagram showing electroluminescence spectra of comparative light-emitting devices in Example.
Figure 30:
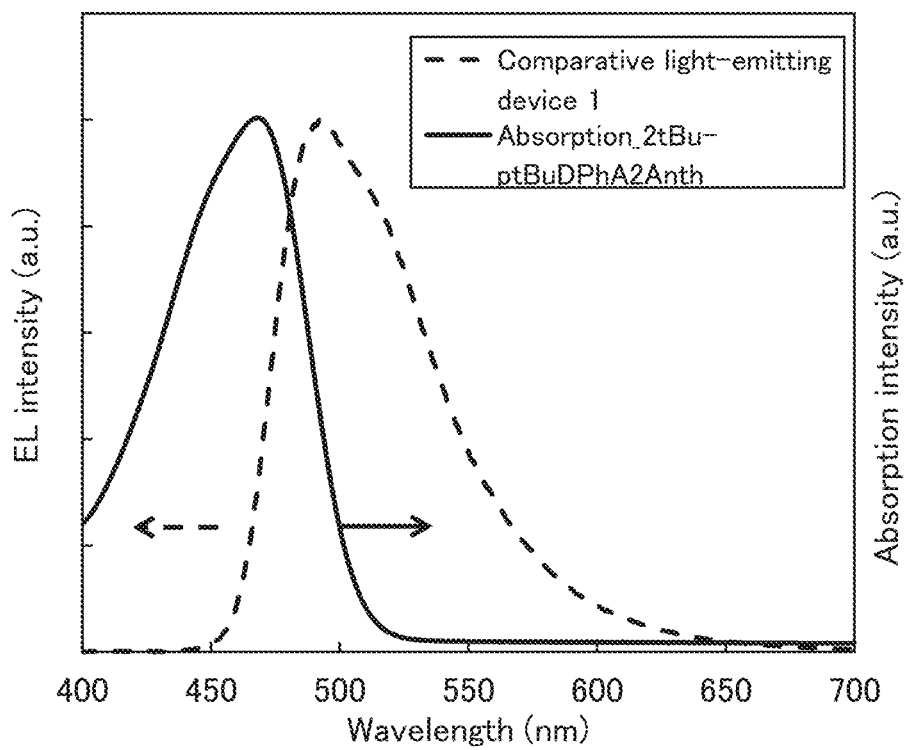
FIG. 30 is a diagram showing the relation between an emission spectrum and an absorption spectrum in Example.
Figure 31:
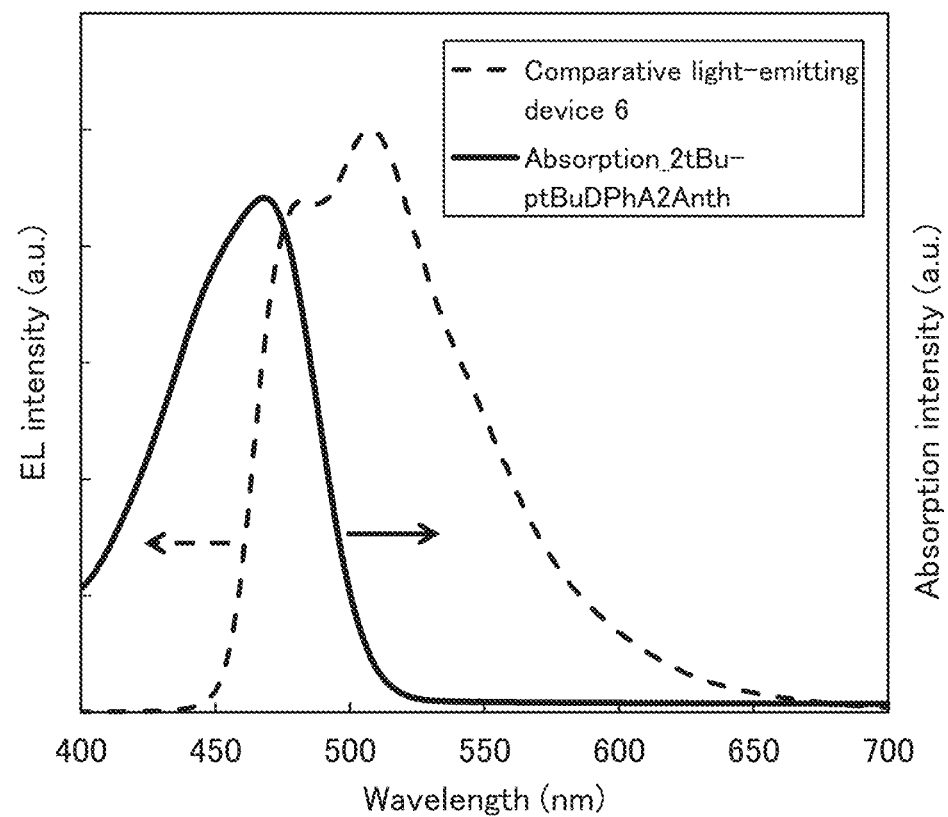
FIG. 31 is a diagram showing the relation between an emission spectrum and an absorption spectrum in Example.
Figure 32:
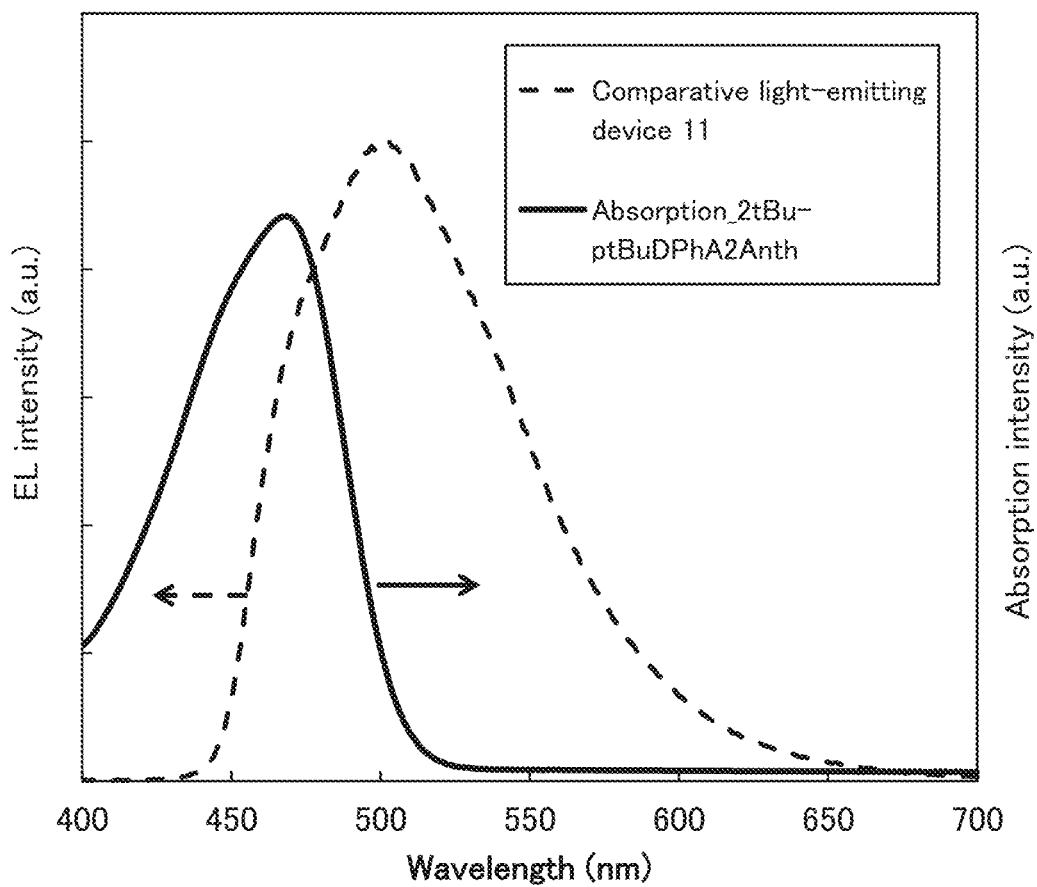
FIG. 32 is a diagram showing the relation between an emission spectrum and an absorption spectrum in Example.
Figure 33:
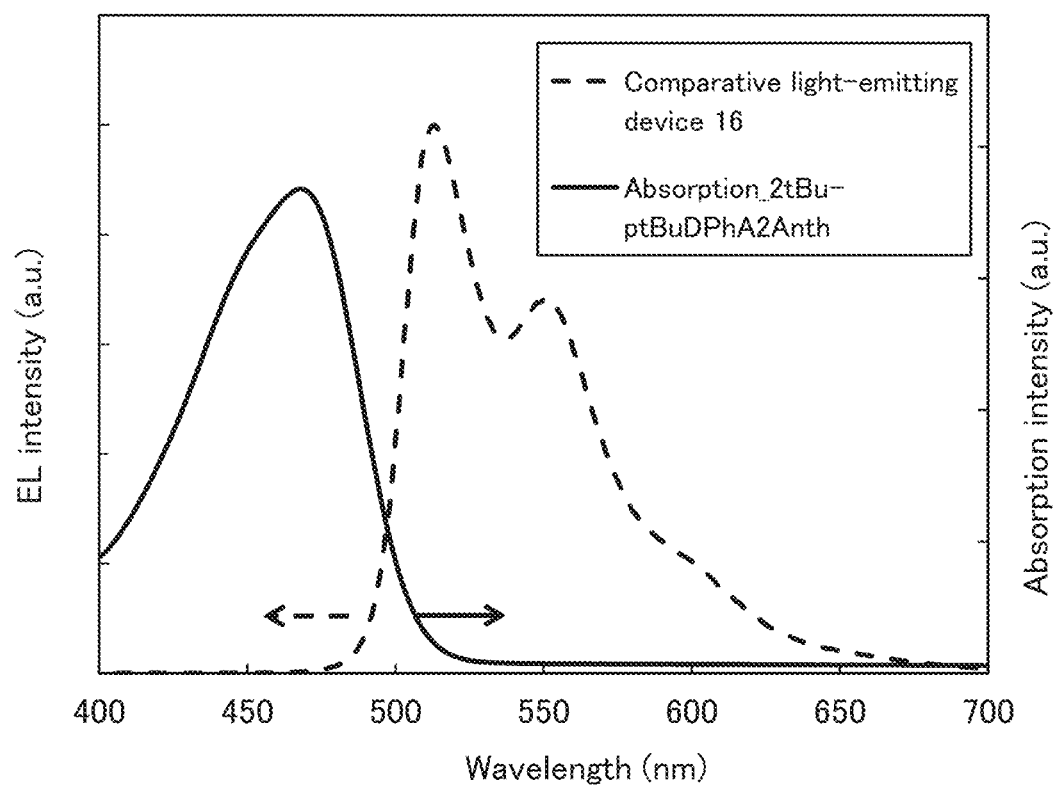
FIG. 33 is a diagram showing the relation between an emission spectrum and an absorption spectrum in Example.
Figure 34:
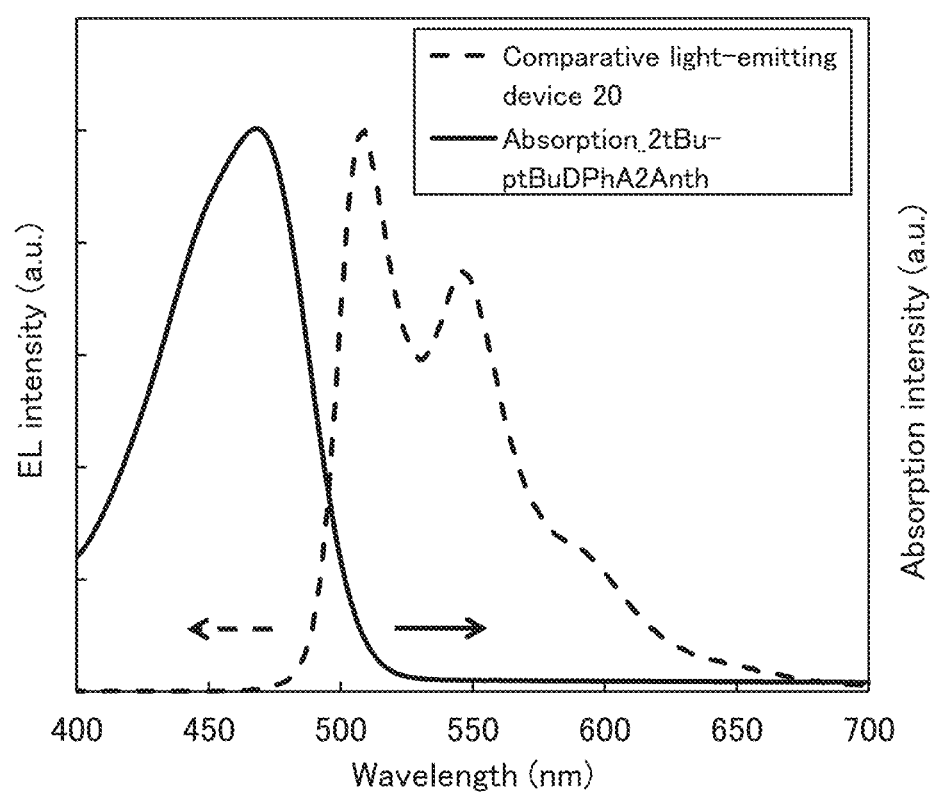
FIG. 34 is a diagram showing the relation between an emission spectrum and an absorption spectrum in Example.
Figure 35:
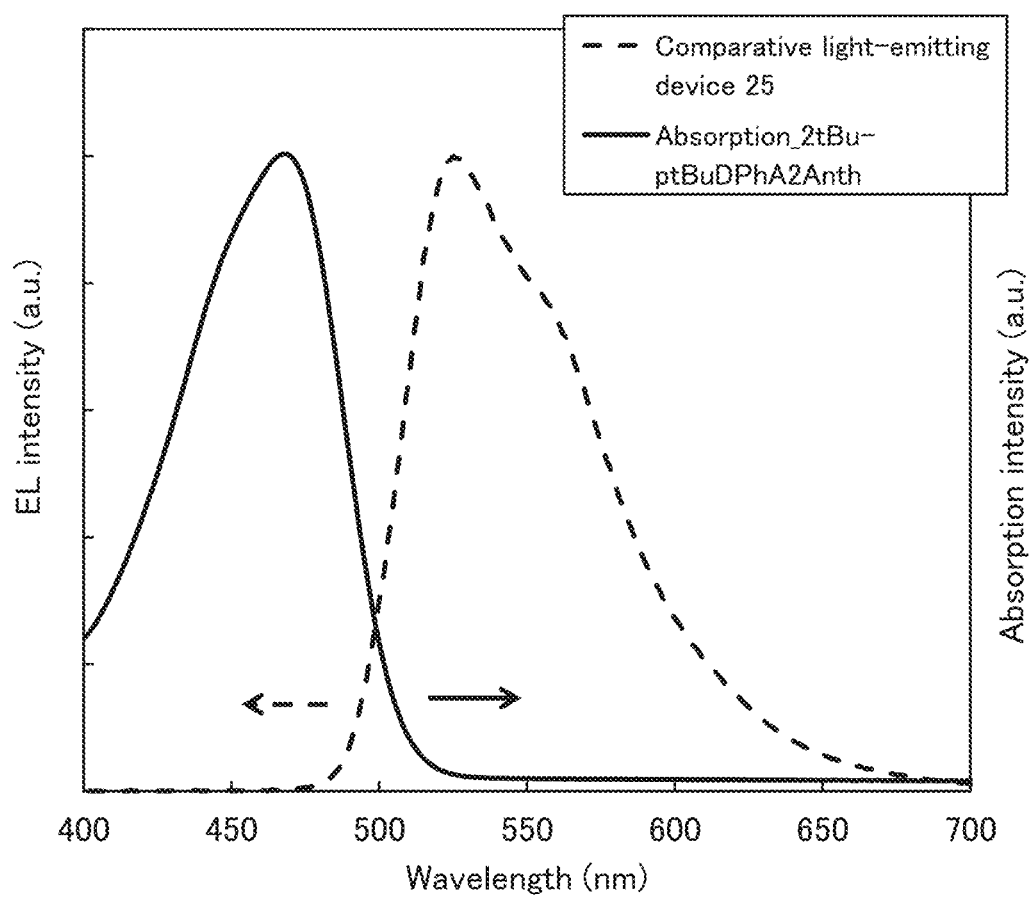
FIG. 35 is a diagram showing the relation between an emission spectrum and an absorption spectrum in Example.
Figure 36:
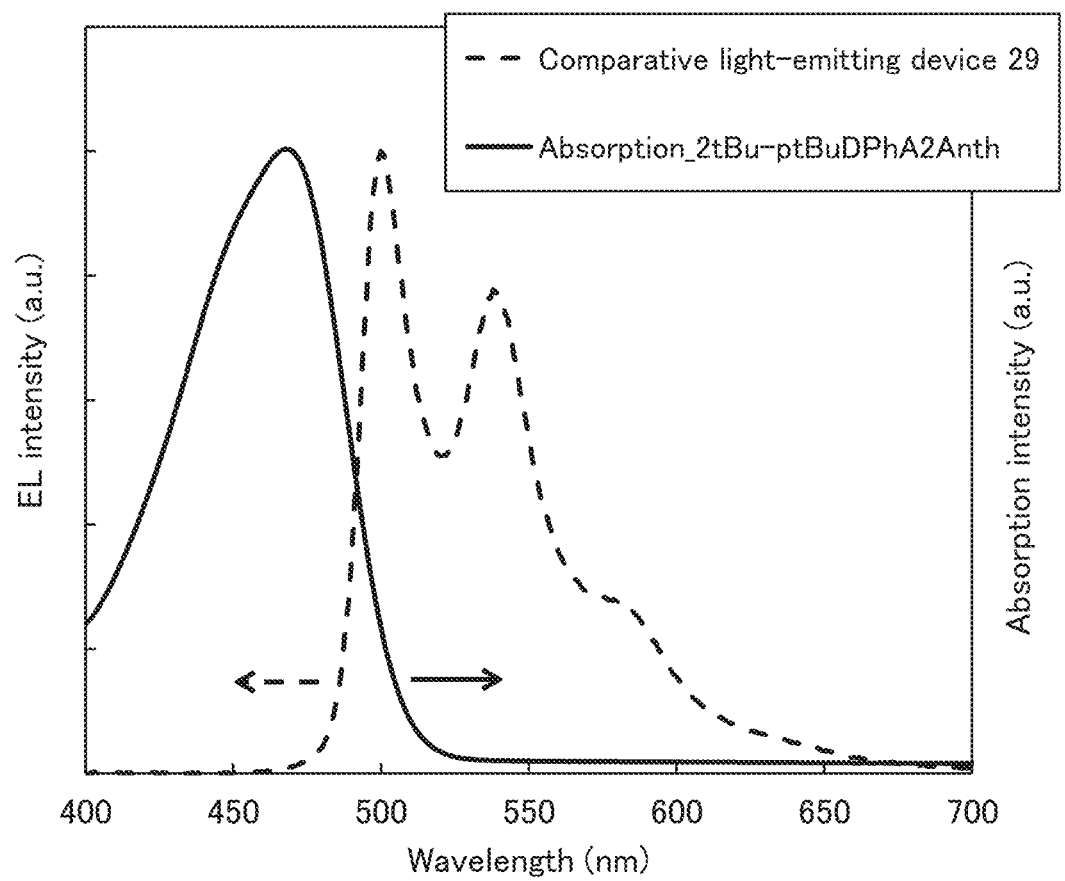
FIG. 36 is a diagram showing the relation between an emission spectrum and an absorption spectrum in Example.

As shown in FIG. 29, the emission spectrum of the comparative light-emitting device 34 had the maximum peak wavelength at 517 nm and a full width at half maximum of 70 nm, i.e., exhibited light emission derived from Ir(ppy)$_3$. The emission spectra of the comparative light-emitting device 35 to the comparative light-emitting device 38 had a peak wavelength at approximately 535 nm and a full width at half maximum of approximately 69 nm, i.e., exhibited green light emission derived from 2tBu-ptBuDPhA2Anth.

Although the light-emitting device 2 to the light-emitting device 5, the light-emitting device 7 to the light-emitting device 10, the light-emitting device 12 to the light-emitting device 15, the light-emitting device 17 to the light-emitting device 19, the light-emitting device 21 to the light-emitting device 24, the light-emitting device 26 to the light-emitting device 28, and the light-emitting device 30 to the light-emitting device 33 exhibited light emission derived from the fluorescent material, they exhibited high emission efficiency with external quantum efficiency exceeding at least 14% even with a high concentration of 2tBu-ptBuDPhA2Anth, which is a fluorescent material, as shown in FIG. 16, FIG. 18, FIG. 20, FIG. 22, FIG. 24, FIG. 26, Table 7, and Table 8. In addition, the light-emitting device 2 to the light-emitting device 5, the light-emitting device 7 to the light-emitting device 10, the light-emitting device 12 to the light-emitting device 15, the light-emitting device 17 to the light-emitting device 19, the light-emitting device 21 to the light-emitting device 24, the light-emitting device 26 to the light-emitting device 28, and the light-emitting device 30 to the light-emitting device 33, which are each the light-emitting device of one embodiment of the present invention, exhibited higher external quantum efficiency than the comparative light-emitting device 37 at any concentration.

The generation probability of singlet excitons which are generated by recombination of carriers (holes and electrons) injected from the pair of electrodes is at most 25%; therefore, the external quantum efficiency of a fluorescent light-emitting device in the case where the light extraction efficiency to the outside is 30% is at most 7.5%. However, the external quantum efficiency is higher than 7.5% in the light-emitting device 2 to the light-emitting device 5, the light-emitting device 7 to the light-emitting device 10, the light-emitting device 12 to the light-emitting device 15, the light-emitting device 21 to the light-emitting device 24, the light-emitting device 26 to the light-emitting device 28, and the light-emitting device 30 to the light-emitting device 33. This is because, in addition to light emission derived from singlet excitons generated by recombination of carriers (holes and electrons) injected from the pair of electrodes, light emission derived from energy transfer from triplet excitons is obtained from the fluorescent material. According to the results, in the light-emitting device of one embodiment of the present invention, non-radiative decay of the triplet excitons is inhibited with the use of the fluorescent material having protecting groups and the phosphorescent material having a five-membered ring skeleton, so that the singlet excitation energy and the triplet excitation energy that are generated in the light-emitting layer are both efficiently converted into light emission of the fluorescent material.

<Overlap Between Absorption Spectrum of Fluorescent Material and Emission Spectrum of Phosphorescent Material Having Five-Membered Ring>

Next, the relation between the absorption spectrum of 2tBu-ptBuDPhA2Anth, which is a fluorescent material, and the EL emission spectrum of the phosphorescent material used in each of the light-emitting devices was examined. FIG. 30 to FIG. 36 show the results.

As described above, the comparative light-emitting devices 1, 6, 11, 16, 20, 25, and 29 exhibit light emission derived from the phosphorescent materials used in the respective light-emitting layers. FIG. 30 to FIG. 36 show that the emission spectrum of each of the phosphorescent materials and the absorption spectrum of 2tBu-ptBuDPhA2Anth overlap with each other. Accordingly, in the case where both of the corresponding phosphorescent material and 2tBu-ptBuDPhA2Anth are used in the light-emitting layer, energy transfer from the phosphorescent material to 2tBu-ptBuDPhA2Anth can be caused. Here, as described above, the light-emitting device of one embodiment of the present invention exhibits high emission efficiency. That is, deactivation of triplet excitons in the light-emitting layer, which can be caused in a normal fluorescence element, is found to be inhibited. This is an effect by the use of the fluorescent material having protecting groups. In addition, this is an effect by the use of the phosphorescent material having a five-membered ring to inhibit recombination of carriers in the fluorescent material and inhibit the energy transfer of triplet excitons from phosphorescent material to the fluorescent material by the Dexter mechanism and deactivation of the energy of triplet excitons.

<Change in External Quantum Efficiency Depending on Guest Material Concentration>

Figure 37:
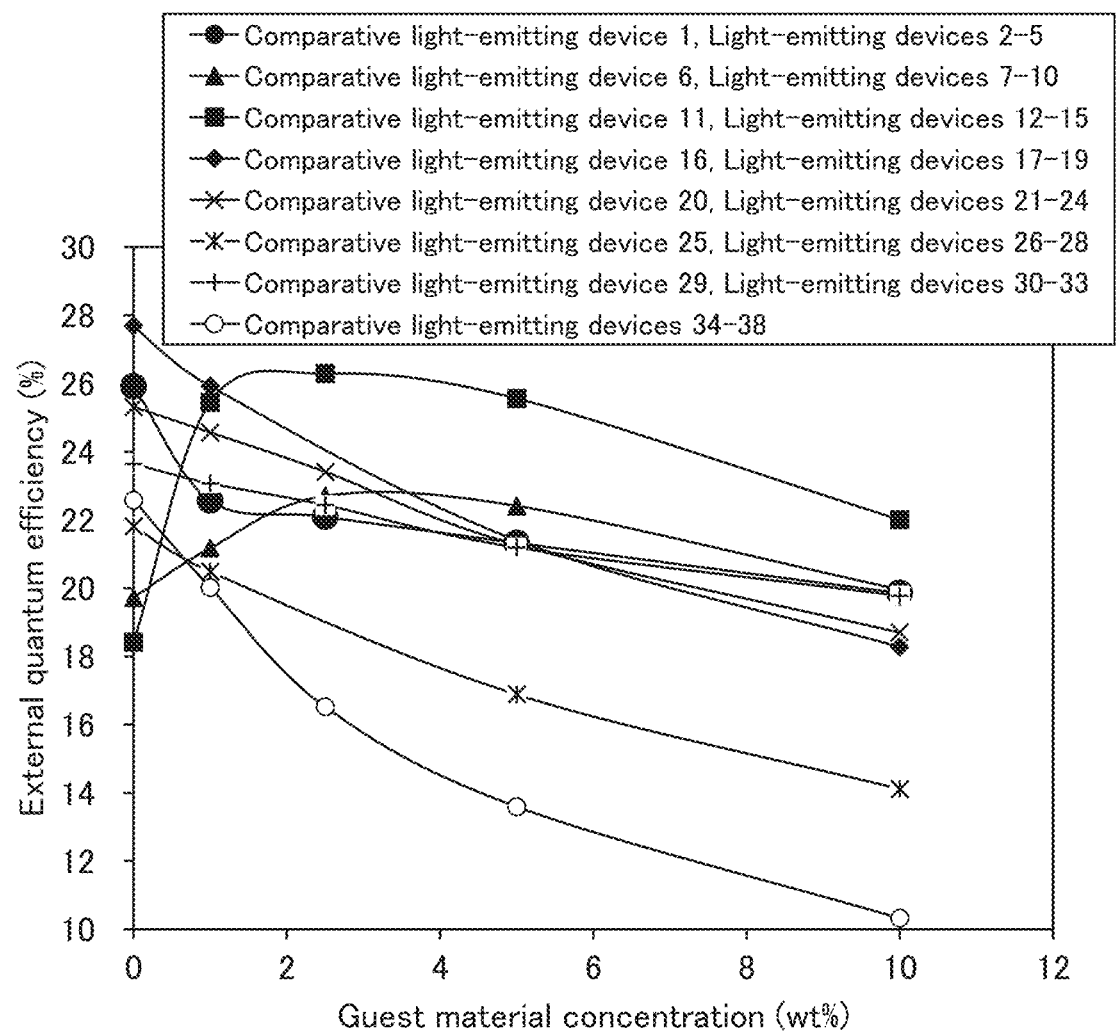
FIG. 37 is diagram showing the relation between external quantum efficiency and guest material concentration in Example.
Figure 38:
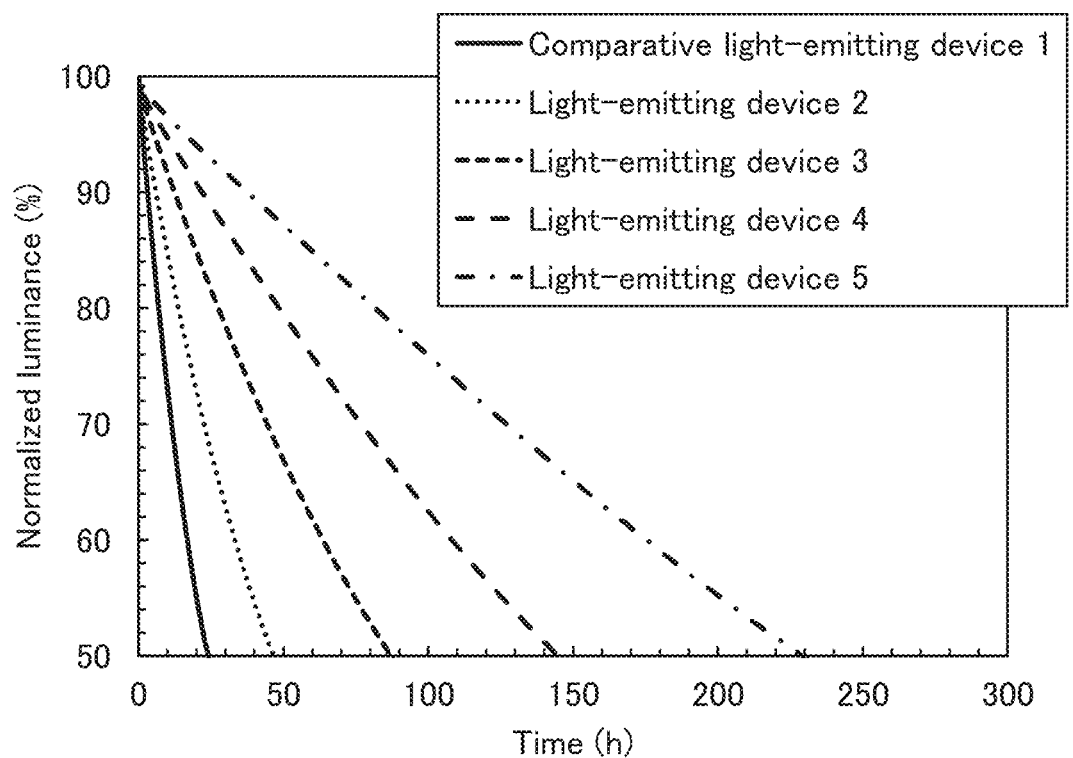
FIG. 38 is a diagram showing results of reliability tests in Example.
Figure 39:
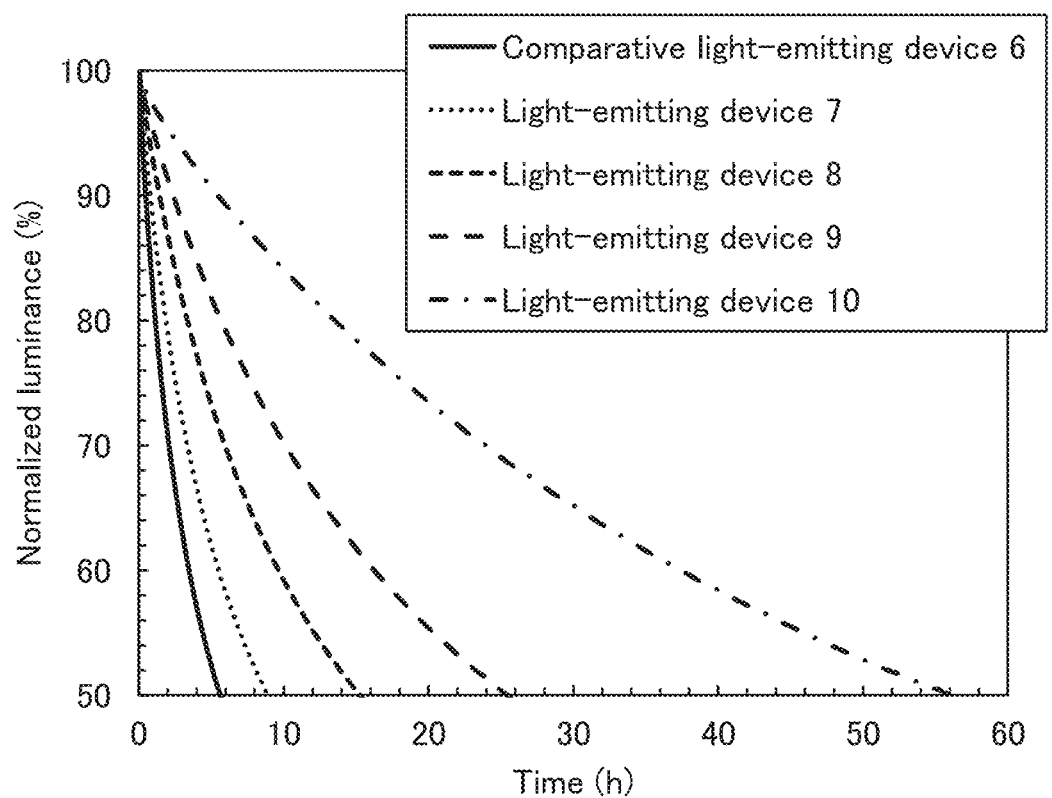
FIG. 39 is a diagram showing results of reliability tests in Example.
Figure 40:
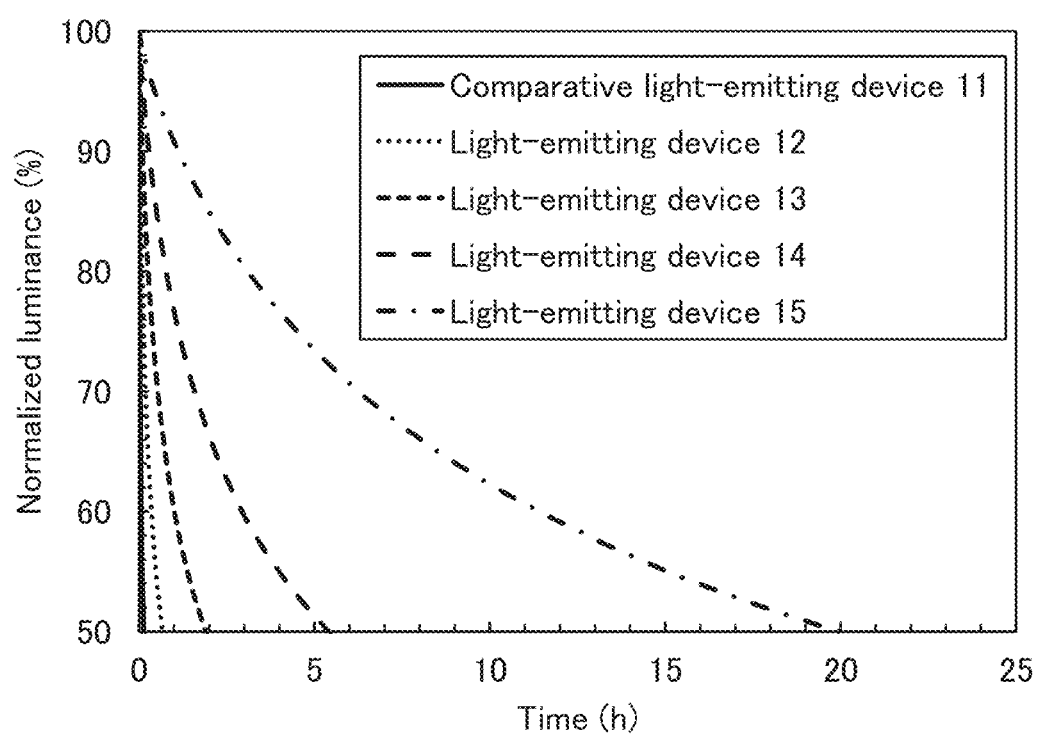
FIG. 40 is a diagram showing results of reliability tests in Example.
Figure 41:
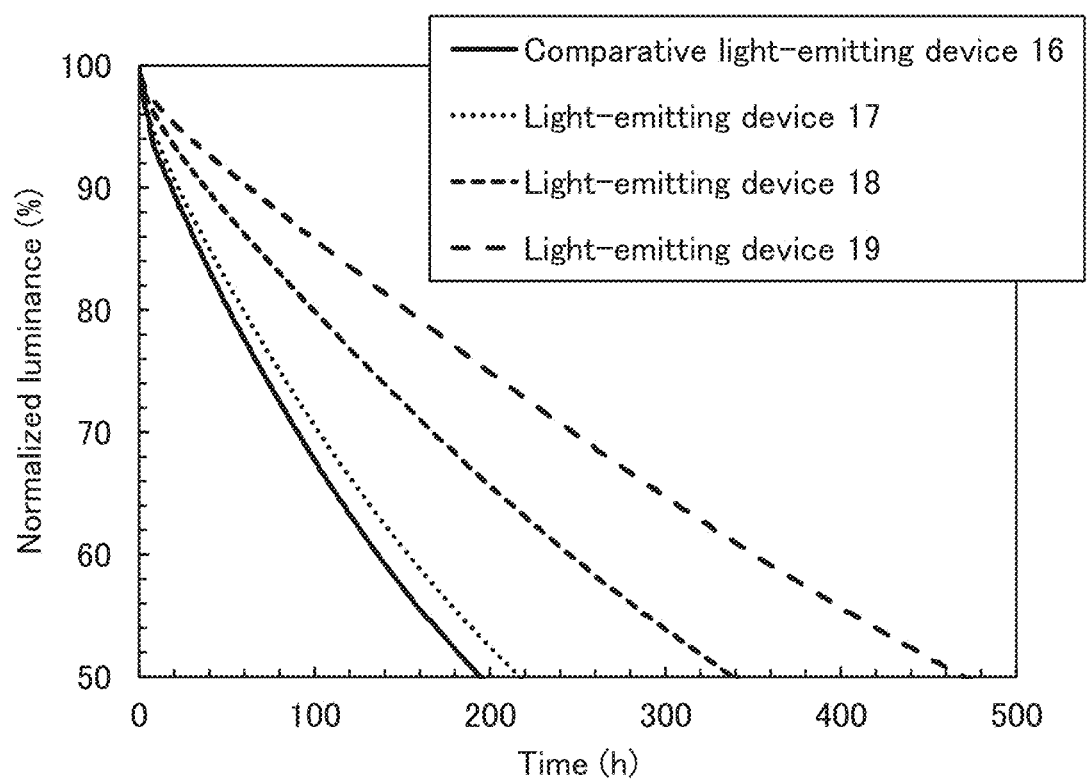
FIG. 41 is a diagram showing results of reliability tests in Example.
Figure 42:
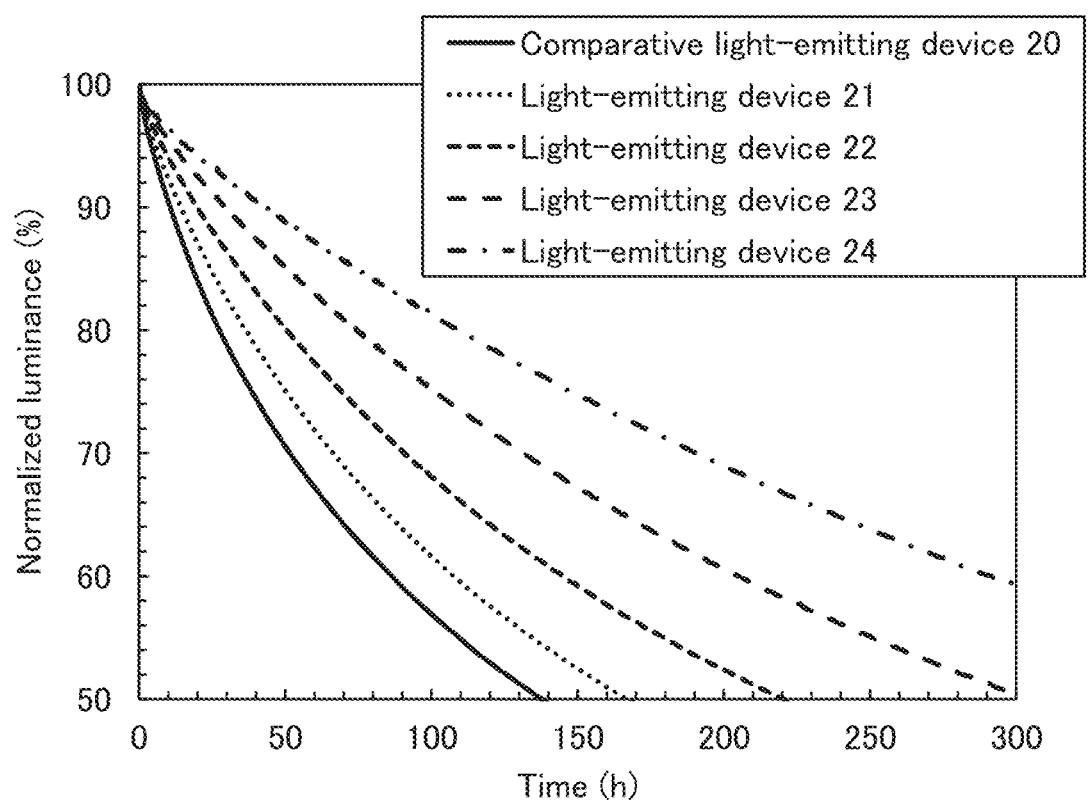
FIG. 42 is a diagram showing results of reliability tests in Example.
Figure 43:
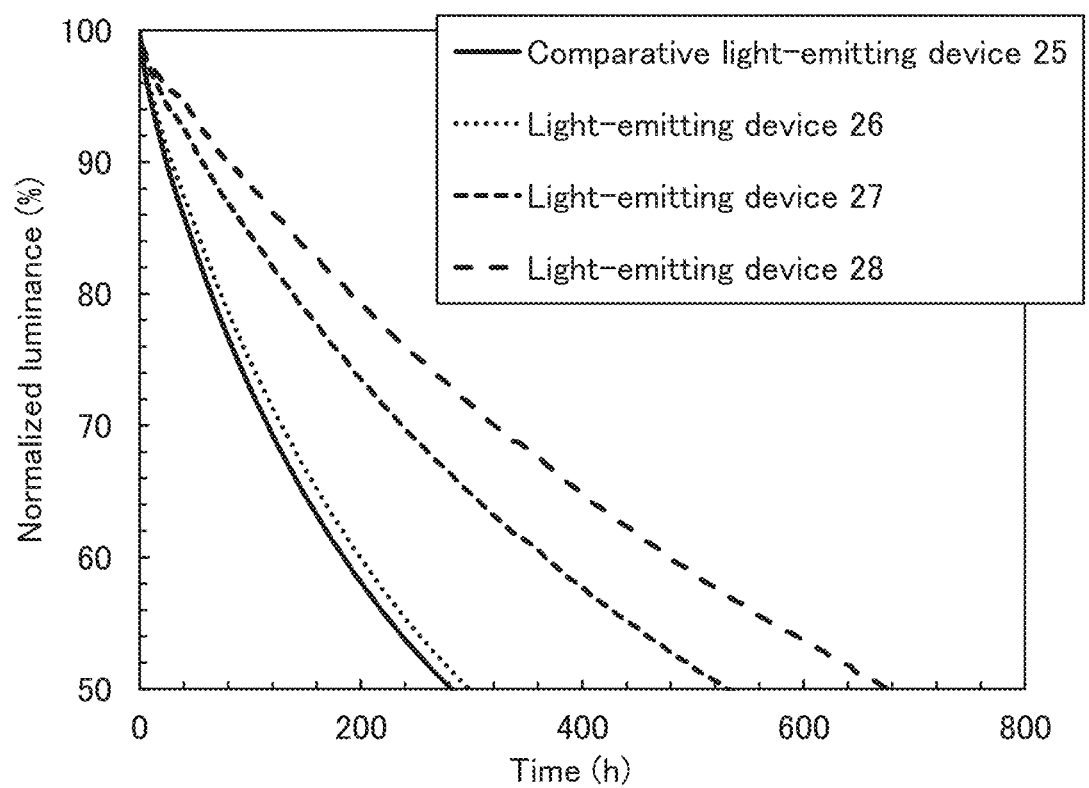
FIG. 43 is a diagram showing results of reliability tests in Example.
Figure 44:
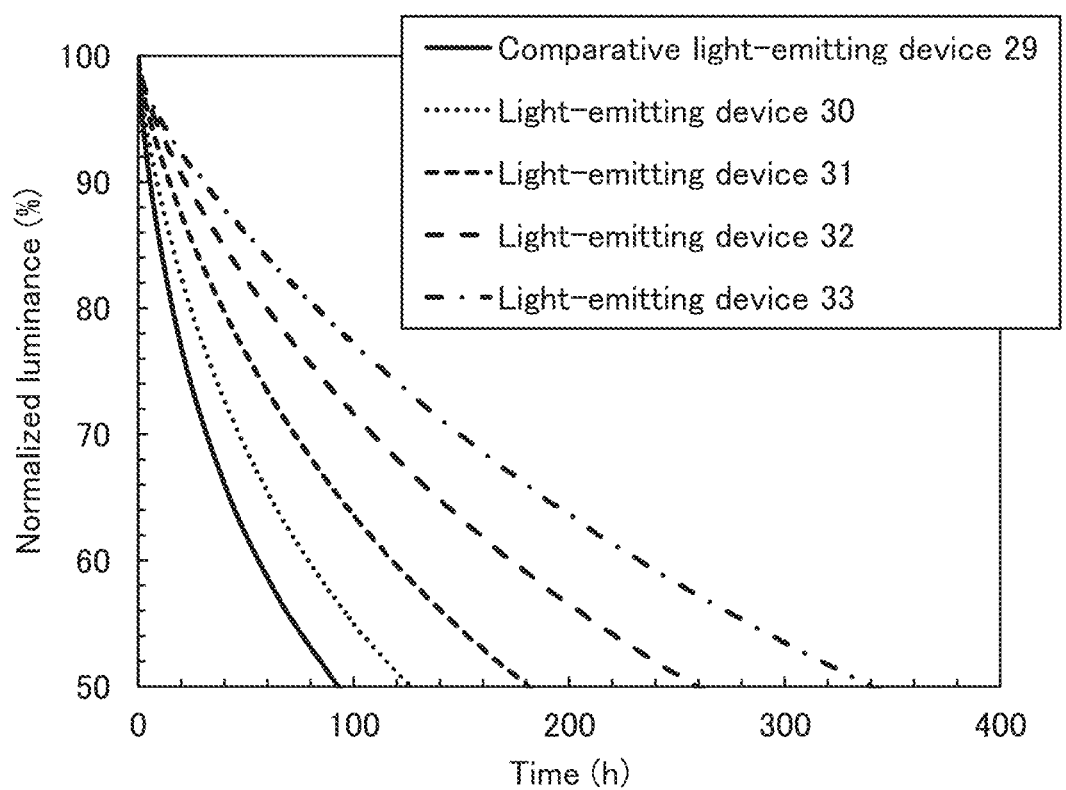
FIG. 44 is a diagram showing results of reliability tests in Example.

FIG. 37 shows the relation between the guest material concentration and the external quantum efficiency in the light-emitting devices using the phosphorescent materials. It is found from FIG. 37 that a reduction in the external quantum efficiency due to an increase in the concentration of the fluorescent material is more inhibited in the light-emitting device of one embodiment of the present invention that includes the phosphorescent material having a five-membered ring than in the comparative light-emitting devices 34 to 38 that include Ir(ppy)$_3$, which is a phosphorescent material that does not have a five-membered ring skeleton. This is because the use of the guest material having protecting groups in the light-emitting layer and the use of the phosphorescent material having a five-membered ring inhibit energy transfer of triplet excitation energy from the host material to the guest material by the Dexter mechanism and deactivation of the triplet excitation energy. Another reason is that an increase in the guest material concentration enables efficient utilization of energy transfer of excitation energy from the host material to the guest material by the Förster mechanism, and thus both the triplet excitation energy and the singlet excitation energy in the light-emitting layer can be efficiently converted into light emission of the fluorescent material. Accordingly, it was found that with the light-emitting device of one embodiment of the present invention, a light-emitting device with high guest material concentration and high emission efficiency can be obtained.

Note that it is also shown that the emission efficiency of the light-emitting devices including Ir(mpptz-diPrp)$_3$ or Ir(Mptz1-mp)$_3$ is increased by an increase in the guest material concentration.

<Reliability Measurements of Light-Emitting Devices>

Next, constant current driving tests at 2.0 mA were performed on the light-emitting device 2 to the light-emitting device 5, the light-emitting device 7 to the light-emitting device 10, the light-emitting device 12 to the light-emitting device 15, the light-emitting device 17 to the light-emitting device 19, the light-emitting device 21 to the light-emitting device 24, the light-emitting device 26 to the light-emitting device 28, the light-emitting device 30 to the light-emitting device 33, and the comparative light-emitting devices 1, 6, 11, 16, 20, 25, and 29. The results are shown in FIG. 38 to FIG. 44. It was found from FIG. 38 to FIG. 44 that as the guest material concentration was increased, the reliability became favorable. This indicates that when the guest material concentration is increased, excitation energy in the light-emitting layer can be converted into light emission of the guest material efficiently. In other words, it is suggested that the rate of energy transfer of triplet excitation energy by the Förster mechanism from the host material to the guest material can be increased by an increase in the guest material concentration.

Here, energy transfer from an energy donor to a guest material of a light-emitting layer, i.e., energy transfer related to light emission conflicts with a quenching process due to the influence of an impurity or a degraded material. Therefore, in order to obtain a highly reliable light-emitting device, it is important to increase the energy transfer rate related to light emission.

<Fluorescence Lifetime Measurements of Light-Emitting Devices>

Figure 49:
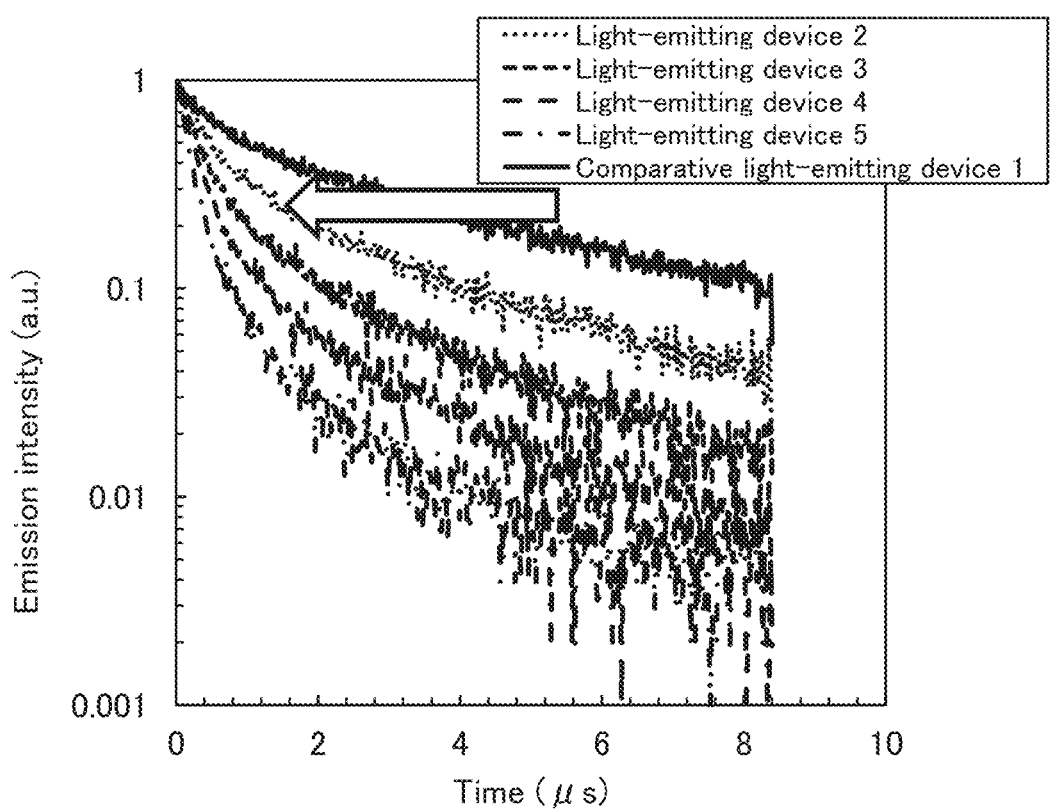
FIG. 49 is diagram showing emission lifetime measurement results of light-emitting devices in Example.
Figure 50:
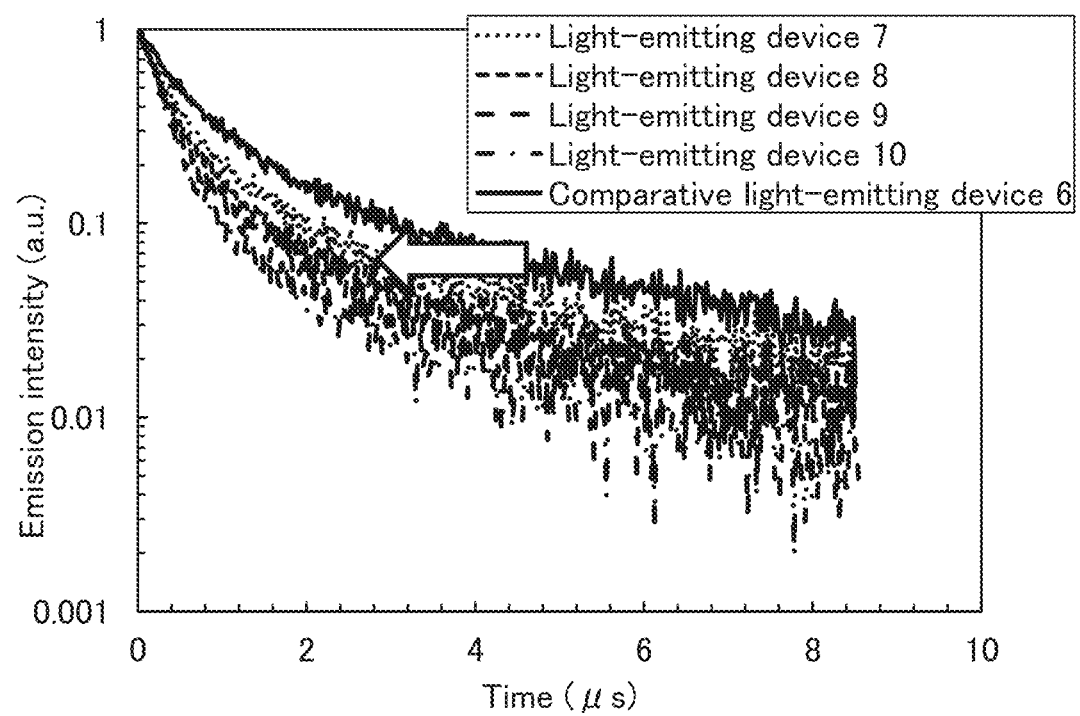
FIG. 50 is a diagram showing emission lifetime measurement results of light-emitting devices in Example.
Figure 51:
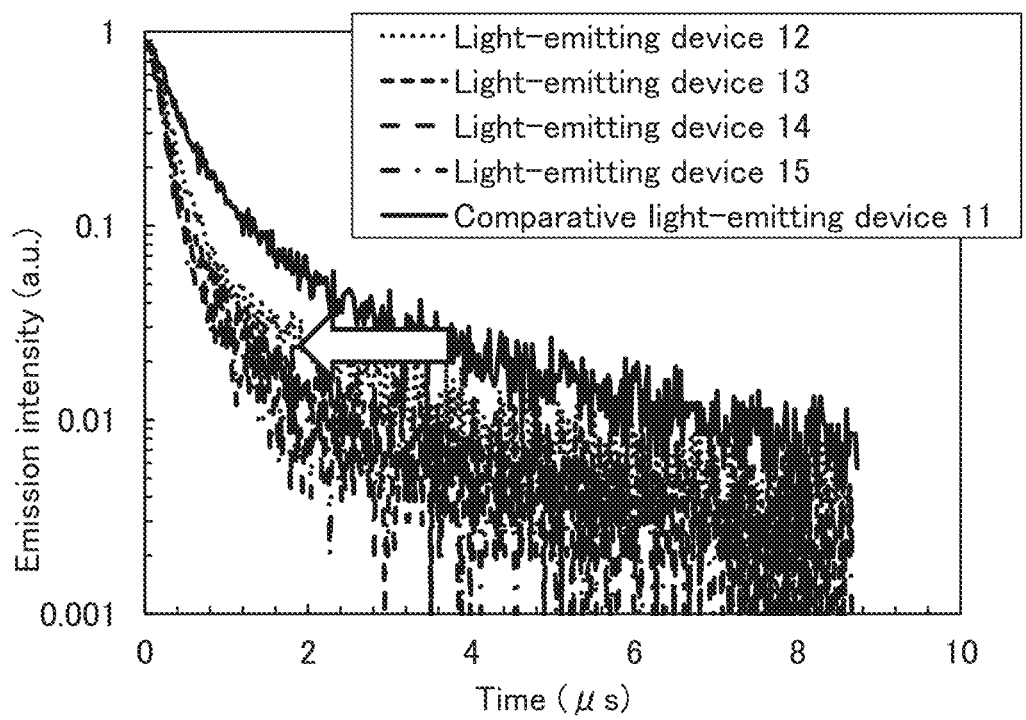
FIG. 51 is a diagram showing emission lifetime measurement results of light-emitting devices in Example.

Next, to examine a difference in light emission rate that depends on the guest material concentration, fluorescence lifetime measurements were performed on the light-emitting device 2 to the light-emitting device 5, the light-emitting device 7 to the light-emitting device 10, the light-emitting device 12 to the light-emitting device 15, and the comparative light-emitting devices 1, 6, and 11. A picosecond fluorescence lifetime measurement system (manufactured by Hamamatsu Photonics K.K.) was used for the measurements. In the measurements, to measure the fluorescence lifetime of the light-emitting device, a rectangular pulse voltage was applied to the light-emitting device, and time-resolved measurement of light emission, which was attenuated from the falling of the voltage, was performed with a streak camera. The pulse voltage was applied at a frequency of 10 Hz, and data with a high SN ratio was obtained by integrating data obtained by repeated measurements. The measurements were performed at room temperature (300 K) under the conditions of an applied pulse voltage of approximately 3 V to 4 V, a pulse time width of 100 μsec, a negative bias voltage of −5 V (when the elements were not driven), and a measurement time range of 10 μsec so that the luminance of the light-emitting devices becomes around 1000 cd/m$^2$. FIG. 49 to FIG. 51 show the measurement results. Note that in FIG. 49 to FIG. 51, the vertical axis represents the emission intensity normalized to that in a state where carriers are steadily injected (the pulse voltage is applied). The horizontal axis represents time elapsed after the falling of the pulse voltage.

Fitting of attenuation curves shown in FIG. 49 to FIG. 51 using an exponential function revealed that the light-emitting device 2 to the light-emitting device 5 and the light-emitting device 7 to the light-emitting device 10 exhibited light emission including a prompt fluorescence component of 0.4 μs or shorter and a delayed fluorescence component of approximately 2 μs; and the light-emitting device 12 to the light-emitting device 15 exhibited light emission including a prompt fluorescence component of 0.4 μs or shorter and a delayed fluorescence component of approximately 4 μs. Furthermore, it was also found that when a fluorescent material was added as a guest material, as the fluorescent material concentration was increased, the proportion of the prompt fluorescence component increased and the proportion of the delayed fluorescence component decreased. Moreover, it was found that the comparative light-emitting device 1 exhibited light emission from the phosphorescent material and exhibited light emission including a prompt fluorescence component of 0.5 μs or shorter and a delayed fluorescence component of approximately 4 μs, and the comparative light-emitting device 6 and the comparative light-emitting device 11 exhibited light emission from the phosphorescent material and exhibited light emission including a prompt fluorescence component of 0.5 μs or shorter and a delayed fluorescence component of approximately 2 μs.

These indicate that addition of the fluorescent material as a guest material to the light-emitting layer increases the light emission rate to increase the proportion of light emission of the prompt fluorescence component derived from the fluorescent material.

Here, as described above, the light-emitting device 2 to the light-emitting device 5, the light-emitting device 7 to the light-emitting device 10, and the light-emitting device 12 to the light-emitting device 15, which are each one embodiment of the present invention, exhibit high external quantum efficiency although they are light-emitting devices with a high concentration of the fluorescent material. That is, the light-emitting device of one embodiment of the present invention has high emission efficiency even when the proportion of light emission derived from the fluorescent material increases. Thus, it is suggested that, in the light-emitting device of one embodiment of the present invention, energy transfer of triplet excitation energy from the host material to the guest material by the Dexter mechanism and deactivation of the triplet excitation energy can be inhibited and thus the guest material concentration can be increased; accordingly, the efficiency of excitation energy transfer by the Förster mechanism can be improved. Thus, in the light-emitting device of one embodiment of the present invention, both the singlet excitation energy and the triplet excitation energy in the light-emitting layer can be utilized for light emission efficiently.

Furthermore, as shown in FIG. 49 to FIG. 51, the guest material concentration in the light-emitting layer is preferably increased in order to increase the energy transfer rate. In the light-emitting device of one embodiment of the present invention, the rate of energy transfer by the Förster mechanism can be increased while energy transfer by the Dexter mechanism is inhibited, and a light-emitting device with favorable emission efficiency and favorable reliability can be obtained by reducing the influence of conflict with a quenching process. In addition, the comparative light-emitting devices each have a long emission lifetime because phosphorescence is observed therein, whereas the light-emitting device of one embodiment of the present invention has a short emission lifetime because it exhibits fluorescence. Accordingly, the above-described influence of conflict with a quenching process can be reduced. Thus, the guest material concentration can be increased in the light-emitting device of one embodiment of the present invention, so that a light-emitting device with favorable emission efficiency and favorable reliability can be obtained.

Example 2

In this example, fabrication examples of light-emitting devices of one embodiment of the present invention and comparative light-emitting devices, which are different from those in Example 1, and the characteristics of the light-emitting devices will be described. The structure of each of the light-emitting devices fabricated in this example is the same as that in FIG. 1A. Table 9 shows the details of the device structures. The structures and abbreviations of compounds that were used are shown below. Note that the above examples and embodiments can be referred to for other organic compounds.

[Chemical formula 30]

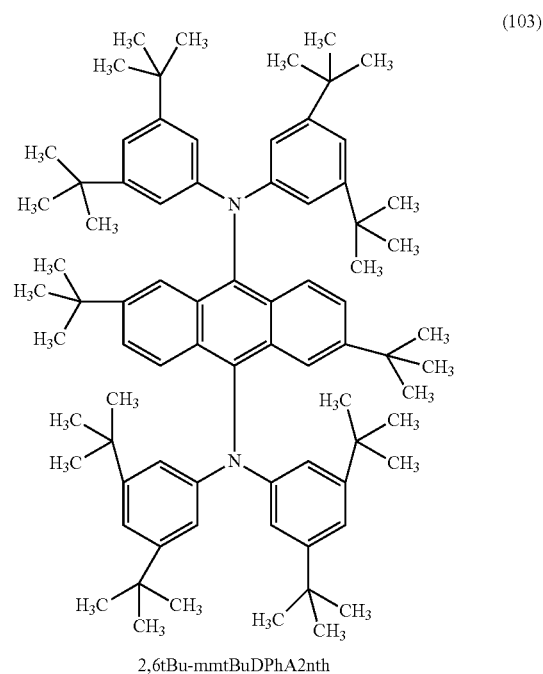

(103)

2,6tBu-mmtBuDPhA2nth

TABLE 9

| | Layer | Numeral | Film Thickness (nm) | Material | Weight ratio |
| --- | --- | --- | --- | --- | --- |
| Comparative light-emitting device 39 | Cathode | 102 | 200 | Al | — |
| | Electron-injection layer | 119 | 1 | LiF | — |
| | Electron-transport layer | 118(2) | 10 | NBPhen | — |
| | | 118(1) | 20 | 4,6mCzP2Pm | — |
| | Light-emitting layer | 130 | 40 | mPCCzPTzn-02:PCCP:Ir(pbi-diBuCNp)$_3$ | 0.5:0.5:0.1 |
| | Hole-transport layer | 112 | 20 | PCCP | — |
| | Hole-injection layer | 111 | 40 | DBT3P-II:MoO$_3$ | 1:0.5 |
| | Anode | 101 | 70 | ITSO | — |
| Light-emitting devices 40-43 | Cathode | 102 | 200 | Al | — |
| | Electron-injection layer | 119 | 1 | LiF | — |
| | Electron-transport layer | 118(2) | 10 | NBPhen | — |
| | | 118(1) | 20 | 4,6mCzP2Pm | — |
| | Light-emitting layer | 130 | 40 | mPCCzPTzn-02:PCCP:Ir(pbi-diBuCNp)$_3$: 2,6tBu-mmtBuDPhA2Anth | 0.5:0.5:0.1:x$_3$ |
| | Hole-transport layer | 112 | 20 | PCCP | — |
| | Hole-injection layer | 111 | 40 | DBT3P-II:MoO$_3$ | 1:0.5 |
| | Anode | 101 | 70 | ITSO | — |

TABLE 10

|  | Light-emitting device 40 | Light-emitting device 41 | Light-emitting device 42 | Light-emitting device 43 |
|---|---|---|---|---|
| $x_3$ | 0.05 | 0.10 | 0.15 | 0.2 |

<<Fabrication of Comparative Light-Emitting Device 39 and Light-Emitting Devices 40 to 43>>

A comparative light-emitting device 39 and light-emitting devices 40 to 43 were fabricated by a vacuum evaporation method in a manner similar to that for the light-emitting device 2 to the light-emitting device 5 described above. The details of the structures of the light-emitting devices are shown in Table 9 and Table 10; thus, the details of the fabrication methods are omitted. Note that a value represented by $x_3$ in Table 9 is as shown in Table 10.

Note that in the comparative light-emitting device 39, Ir(pbi-diBuCNp)$_3$, which is a phosphorescent material, functions as an energy acceptor. The comparative light-emitting device 39 is shown as a comparative example for the light-emitting device of one embodiment of the present invention, in which the phosphorescent material functions as an energy donor.

<Characteristics of Light-Emitting Devices>

Next, the characteristics of the fabricated comparative light-emitting device 39 and light-emitting devices 40 to 43 were measured. Note that the measurement method is the same as that in Example 1.

Figure 52:
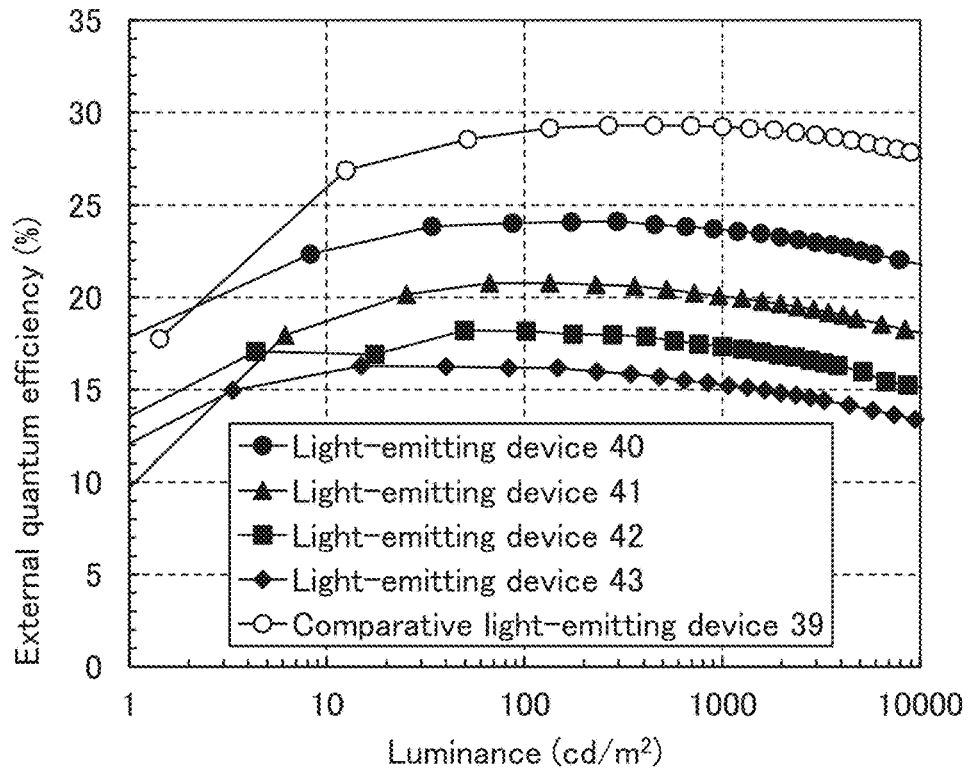
FIG. 52 is a diagram showing external quantum efficiency-luminance characteristics of light-emitting devices in Example.
Figure 53:
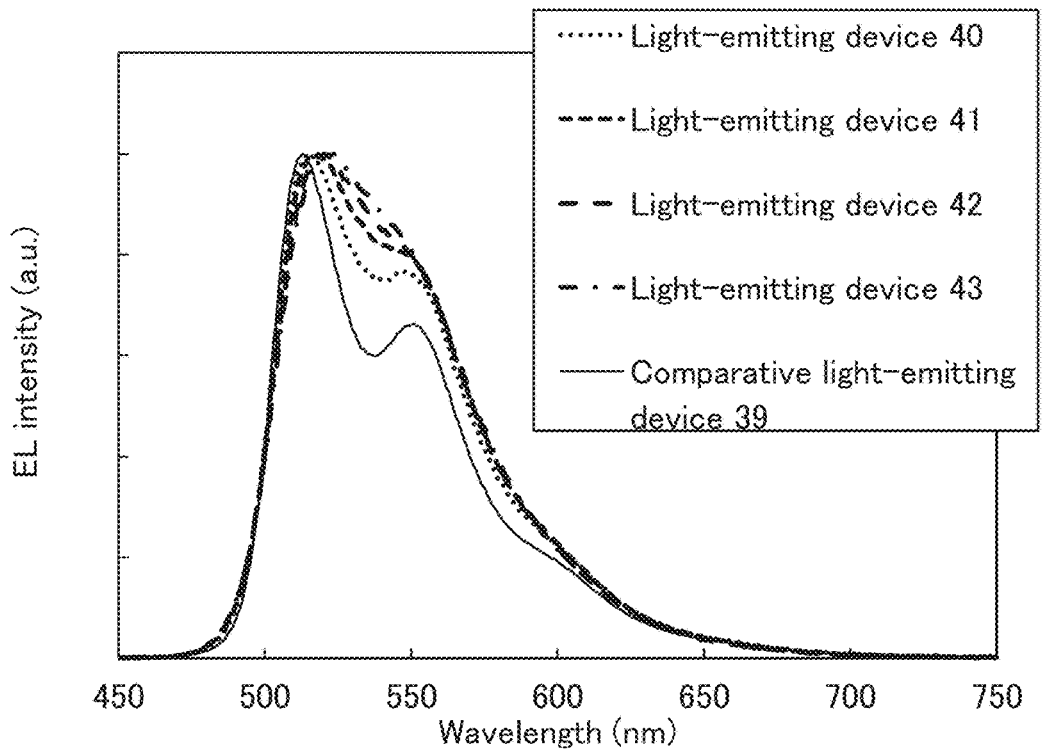
FIG. 53 is a diagram showing electroluminescence spectra of light-emitting devices in Example.

FIG. 52 shows the external quantum efficiency-luminance characteristics of the comparative light-emitting device 39 and the light-emitting devices 40 to 43. FIG. 53 shows electroluminescence spectra obtained when a current at a current density of 2.5 mA/cm$^2$ was applied to each of the comparative light-emitting device 39 and the comparative light-emitting devices 40 to 43. Note that the measurements of the light-emitting devices were performed at room temperature (in an atmosphere maintained at 23° C.).

Table 11 shows the device characteristics at around 1000 cd/m$^2$ of the comparative light-emitting device 39 and the comparative light-emitting devices 40 to 43.

TABLE 11

|  | Voltage (V) | Current density (mA/cm$^2$) | CIE chromaticity (x, y) | Luminance (cd/m$^2$) | Current efficiency (cd/A) | Power efficiency (lm/W) | External quantum efficiency (%) |
|---|---|---|---|---|---|---|---|
| Comparative light-emitting device 39 | 3.00 | 0.96 | (0.303, 0.652) | 1000 | 104.4 | 109.3 | 29.2 |
| Light-emitting device 40 | 3.10 | 1.05 | (0.315, 0.643) | 903 | 86.0 | 87.2 | 23.7 |
| Light-emitting device 41 | 3.20 | 1.31 | (0.313, 0.646) | 961 | 73.5 | 72.2 | 20.1 |
| Light-emitting device 42 | 3.30 | 1.56 | (0.309, 0.650) | 1001 | 64.2 | 61.1 | 17.3 |
| Light-emitting device 43 | 3.40 | 1.90 | (0.309, 0.650) | 1074 | 56.4 | 52.1 | 15.2 |

<Energy Transfer from Energy Donor (Phosphorescent Material Having Five-Membered Ring Skeleton) to Energy Acceptor (Fluorescent Material Having Protecting Groups)>

As shown in FIG. 53, the emission spectra of the light-emitting devices 40 to 43 had a peak wavelength at approximately 520 nm and a full width at half maximum of approximately 69 nm, i.e., exhibited green light emission derived from 2,6tBu-mmtBuDPhA2Anth. Meanwhile, the emission spectrum of the comparative light-emitting device 39 had a peak wavelength at 513 nm and a full width at half maximum of 63 nm, i.e., exhibited light emission derived from Ir(pbi-diBuCNp)$_3$. Thus, it was found that energy transfer from the phosphorescent material to the fluorescent material was caused in the light-emitting device of one embodiment of the present invention.

Although the light-emitting devices 40 to 43 exhibited light emission derived from the fluorescent material, they exhibited high emission efficiency with external quantum efficiency exceeding at least 15% even with a high concentration of the fluorescent material, as shown in FIG. 52 and Table 11. According to the results, in the light-emitting device of one embodiment of the present invention, non-radiative decay of the triplet excitons is inhibited with the use of the fluorescent material having protecting groups and the phosphorescent material having a five-membered ring skeleton, so that the singlet excitation energy and the triplet excitation energy that are generated in the light-emitting layer are both efficiently converted into light emission of the fluorescent material.

<Reliability Measurements of Light-Emitting Devices>

Figure 54:
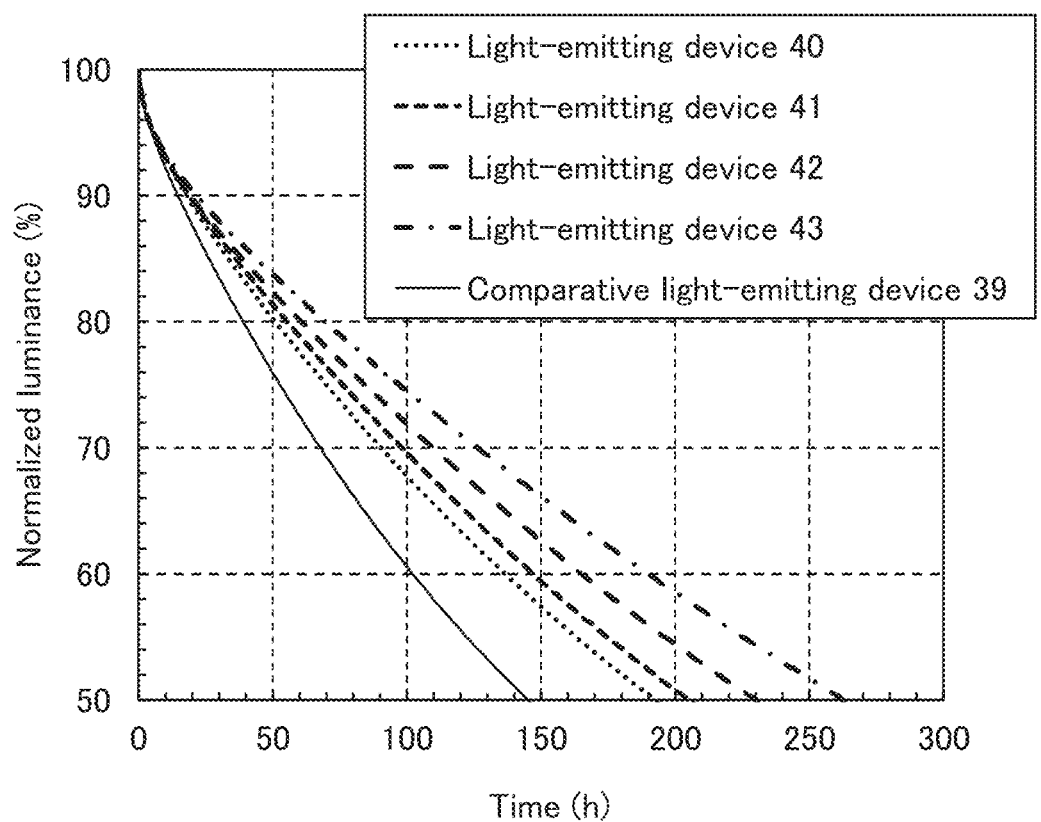
FIG. 54 is a diagram showing results of reliability tests in Example.

Next, constant current driving tests at 2.0 mA were performed on the comparative light-emitting device 39 and the light-emitting devices 40 to 43. FIG. 54 shows the results. It was found from FIG. 54 that as the guest material concentration is increased, the reliability becomes favorable. This indicates that when the guest material concentration is increased, excitation energy in the light-emitting layer can be converted into light emission of the guest material efficiently. In other words, it is suggested that the rate of energy transfer of triplet excitation energy by the Forster mechanism from the host material to the guest material can be increased by increasing the guest material concentration.

<Fluorescence Lifetime Measurements of Light-Emitting Devices>

Next, to examine a difference in light emission rate that depends on the guest material concentration, fluorescence lifetime measurements were performed on the comparative light-emitting device 39 and the light-emitting devices 40 to 43. The measurement was performed in a manner similar to that in Example 1. The results are shown in FIG. 55.

Figure 55:
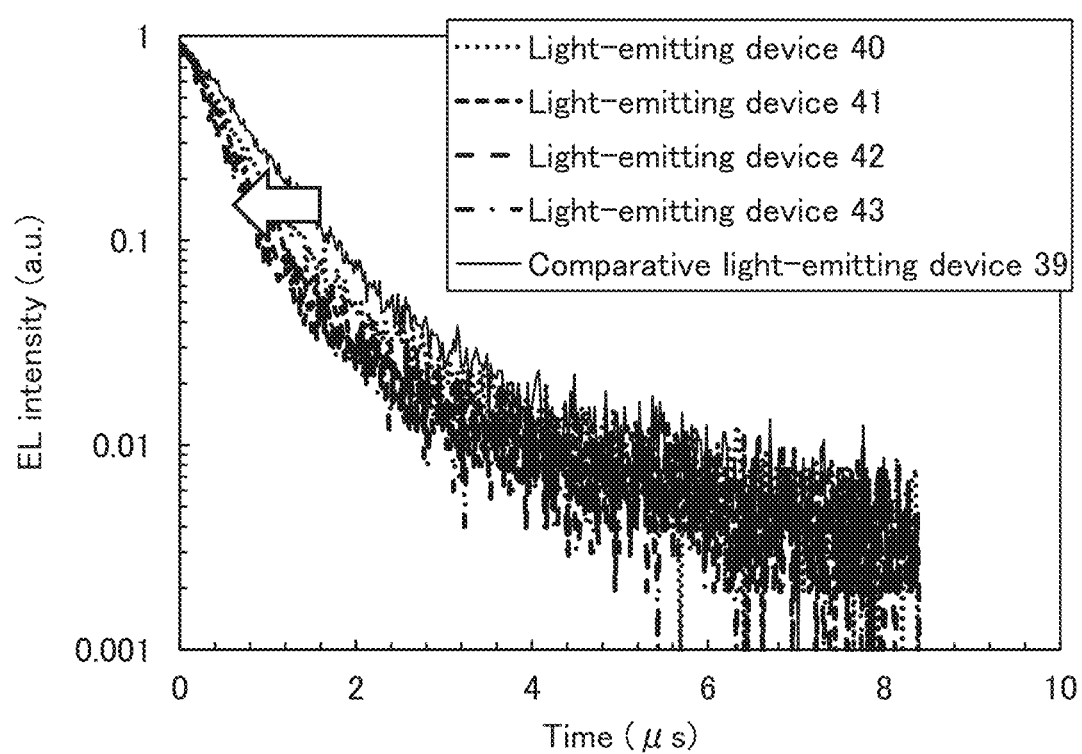
FIG. 55 is a diagram showing emission lifetime measurement results of light-emitting devices in Example.

It was found from FIG. 55 that as the fluorescent material (guest material) concentration was increased, the proportion of the fluorescence component with a high light emission rate was increased and the proportion of the delayed fluorescence component was decreased. These indicate that addition of the fluorescent material as a guest material to the light-emitting layer increases the light emission rate to increase the proportion of light emission of the prompt fluorescence component derived from the fluorescent material.

Here, as described above, the light-emitting device 40 to the light-emitting device 43, which are each one embodiment of the present invention, exhibit high external quantum efficiency although they are light-emitting devices with a high concentration of the fluorescent material. That is, the light-emitting device of one embodiment of the present invention has high emission efficiency even when the proportion of light emission derived from the fluorescent material increases. Thus, it is suggested that, in the light-emitting device of one embodiment of the present invention, energy transfer of triplet excitation energy from the host material to the guest material by the Dexter mechanism and deactivation of the triplet excitation energy can be inhibited and thus the guest material concentration can be increased; accordingly, the efficiency of excitation energy transfer by the Forster mechanism can be improved. Thus, in the light-emitting device of one embodiment of the present invention, both the singlet excitation energy and the triplet excitation energy in the light-emitting layer can be utilized for light emission efficiently.

Reference Example 1

In this reference example, a synthesis method of 2tBu-ptBuDPhA2Anth, which is a fluorescent material including protecting groups used in Example 1, will be described.

Into a 200 mL three-neck flask were put 1.2 g (3.1 mmol) of 2-tert-butylanthracene, 1.8 g (6.4 mmol) of bis(4-tert-butylphenyl)amine, 1.2 g (13 mmol) of sodium t-butoxide, and 60 mg (0.15 mmol) of 2-dicyclohexylphosphino-2',6'-dimethoxy-1,1'-biphenyl (abbreviation: SPhos), and the air in the flask was replaced with nitrogen. To this mixture was added 35 mL of mesitylene and the mixture was degassed under reduced pressure; then, 40 mg (70 μmol) of bis(dibenzylideneacetone)palladium(0) was added to the mixture and the mixture was stirred at 170° C. under a nitrogen stream for four hours.

After the stirring, 400 mL of toluene was added to the obtained mixture, which was then subjected to suction filtration through Florisil (Wako Pure Chemical Industries, Ltd., Catalog Number: 066-05265), Celite (Wako Pure Chemical Industries, Ltd., Catalog Number: 537-02305), and aluminum oxide to give a filtrate. The obtained filtrate was concentrated to give a brown solid.

This solid was purified by silica gel column chromatography (developing solvent: hexane:toluene=9:1) to obtain a target yellow solid. The obtained yellow solid was recrystallized with toluene, hexane, and ethanol to give 1.5 g of a target yellow solid in a yield of 61%. The synthesis scheme is shown in (A-1) below.

[Chemical formula 31]

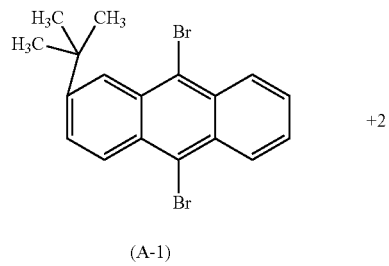

(A-1)

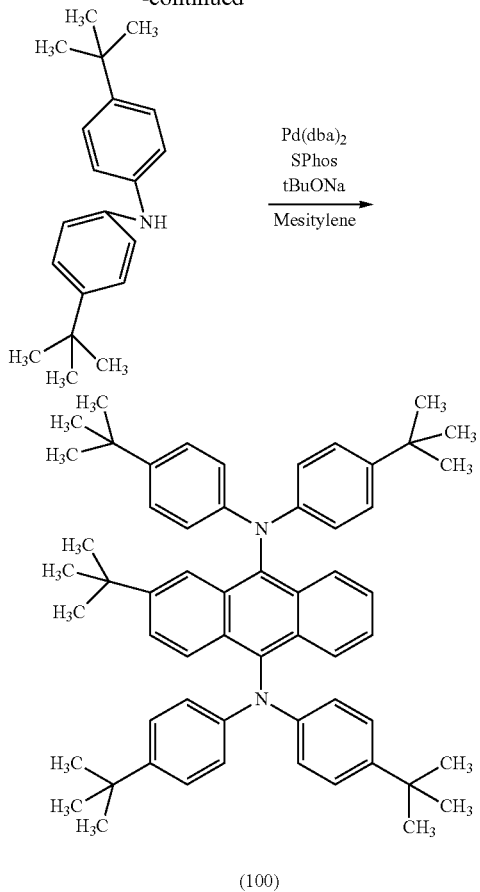

(100)

By a train sublimation method, 1.5 g of the obtained yellow solid was purified by sublimation. In the sublimation purification, the yellow solid was heated at 315° C. under a pressure of 4.5 Pa for 15 hours. After the sublimation purification, 1.3 g of a target yellow solid was obtained at a collection rate of 89%.

Figure 45A:
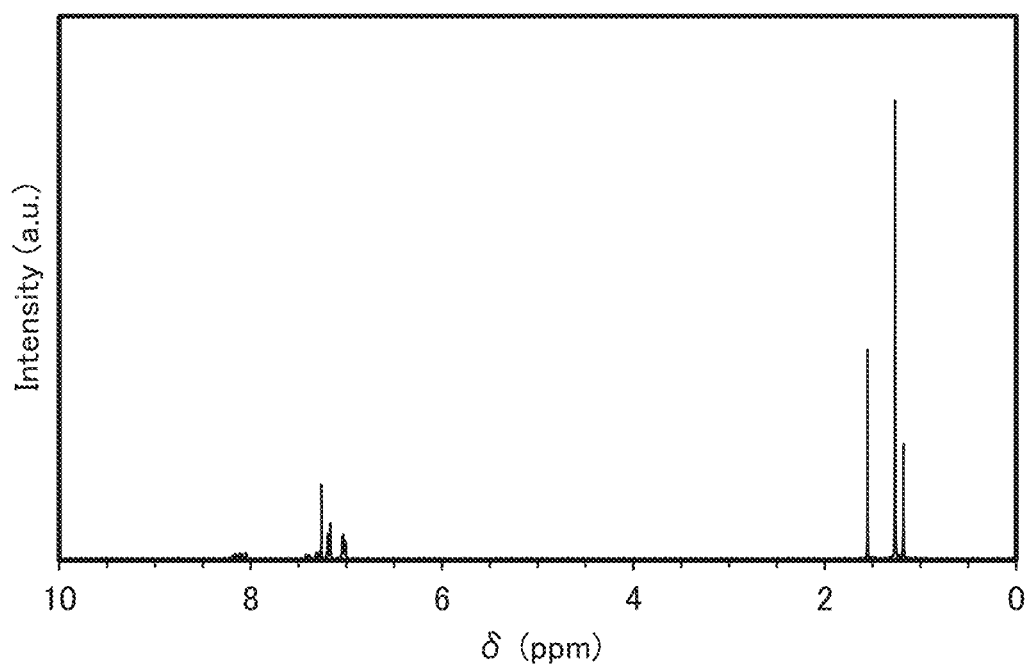
FIG. 45A and FIG. 45B are diagrams showing NMR charts of compounds in Reference example.
Figure 45B:
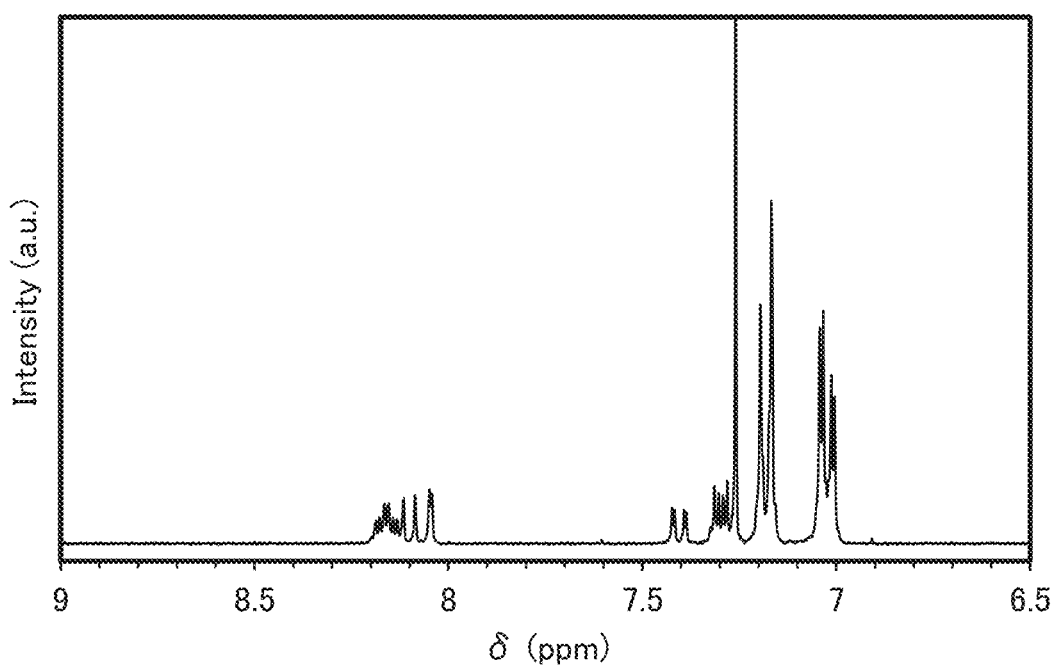
Figure 46:
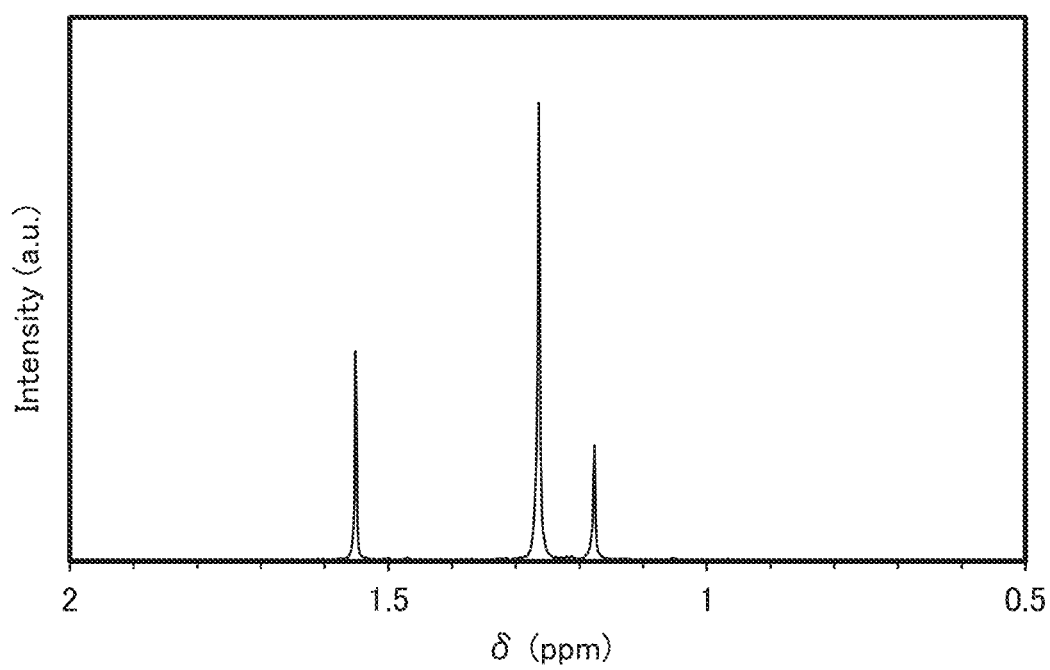
FIG. 46 is a diagram showing an NMR chart of a compound in Reference example.

Results of $^1$HNMR measurement of the yellow solid obtained in this synthesis are described below. FIG. 45 and FIG. 46 show $^1$H-NMR charts. Note that FIG. 45B is an enlarged diagram of the range of 6.5 ppm to 9.0 ppm of FIG. 45A. FIG. 46 is an enlarged diagram of the range of 0.5 ppm to 2.0 ppm of FIG. 45A. The results indicate that 2tBu-ptBuDPhA2Anth, which was the target substance, was obtained.

$^1$H-NMR (CDCl$_3$, 300 MHz): σ=8.20-8.13 (m, 2H), 8.12 (d, J=8.8 Hz, 1H), 8.05 (d, J=2.0 Hz, 1H), 7.42 (dd, J=9.3 Hz, 2.0 Hz, 1H), 7.32-7.26 (m, 2H) 7.20 (d, J=8.8 Hz, 8H), 7.04 (dd, J=8.8 Hz, 2.4 Hz, 8H), 1.26 (s, 36H), 1.18 (s, 9H).

Reference Example 2

In this reference example, a synthesis method of Ir(pni-diBup)$_3$, which is an example of the phosphorescent material having a five-membered ring that used in Example 1, will be described.

Step 1: Synthesis of 2,6-diisobutylaniline

Into a 5000 mL three-neck flask were put 100 g (617 mmol) of 2,6-dichloroaniline, 230 g (2256 mmol) of isobutylboronic acid, 479 g (2256 mmol) of tripotassium phosphate, 10 g (24.7 mmol) of 2-dicyclohexylphosphino-2',6'-dimethoxybiphenyl (S-phos), and 3000 mL of toluene, the atmosphere in the flask was replaced with nitrogen, and the mixture was degassed by being stirred while the pressure in the flask was reduced. After the degassing, 11 g (11.5 mmol) of tris(dibenzylideneacetone)dipalladium(0) was added, and the mixture was stirred under a nitrogen stream at 120° C. for 12 hours. After a predetermined time elapsed, the obtained reaction solution was subjected to suction filtration. The obtained filtrate was purified by extraction with toluene. Then, purification by silica gel column chromatography was performed. A developing solvent of hexane:toluene=15:1 was used. The obtained fraction was concentrated, so that 79 g of a target black oily substance was obtained in a yield of 62%. The synthesis scheme of Step 1 is shown in (B-1) below.

[Chemical formula 32]

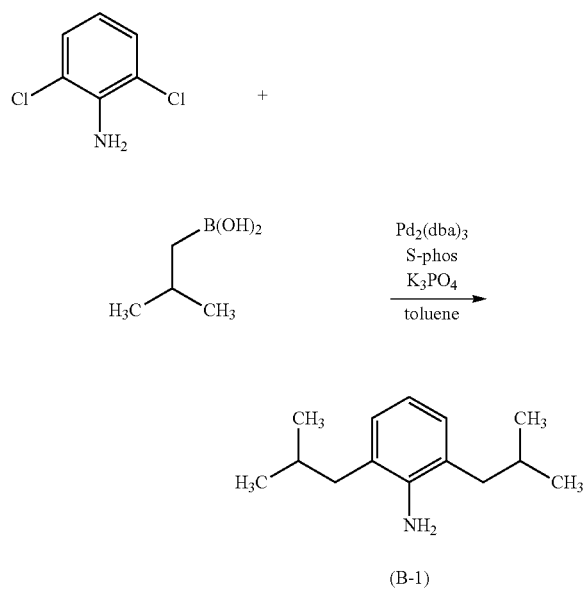

(B-1)

Step 2; Synthesis of 2-nitronaphthalene-1-trifluoromethanesulfonate

Into a 1000 mL three-neck flask were put 35 g (182 mmol) of 2-nitro-1-naphthol, 500 mL of dehydrated dichloromethane, and 51 mL (365 mmol) of triethylamine, the atmosphere in the flask was replaced with nitrogen, and the mixture was cooled down to 0° C. Here, 40 mL (243 mmol) of trifluoromethanesulfonic anhydride (abbreviation: Tf$_2$O) was dripped, and the mixture was stirred at 0° C. for one hour and then stirred at room temperature for 20 hours. After a predetermined time elapsed, 300 mL of water and 30 mL of 1M hydrochloric acid were added to the obtained mixture. After that, the mixture was purified by extraction with dichloromethane. Then, purification by silica gel column chromatography was performed. A developing solvent of hexane:dichloromethane=5:1 was used. The obtained fraction was concentrated, so that 47 g of a target yellow oily substance was obtained in a yield of 80%. The synthesis scheme of Step 2 is shown in (B-2) below.

[Chemical formula 33]

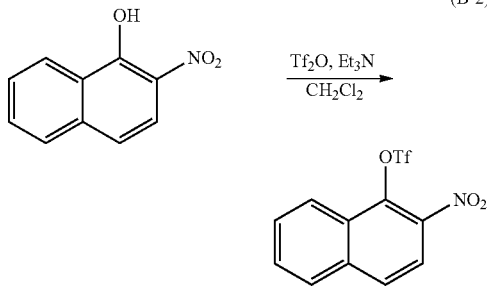

Step 3; Synthesis of N-(2,6-diisobutylphenyl)-2-nitro-1-naphthalenamine

Into a 2000 mL three-neck flask were put 30 g (146 mmol) of 2,6-diisobutylaniline synthesized in Step 1, 47 g (146 mmol) of 2-nitronaphthalene-1-trifluoromethanesulfonate synthesized in Step 2, 81 g (248 mmol) of cesium carbonate, and 750 mL of toluene, the atmosphere in the flask was replaced with nitrogen, and the mixture was degassed by being stirred while the pressure in the flask was reduced. After the degassing, 4.8 g (11.7 mmol) of S-phos and 2.7 g (2.9 mmol) of tris(dibenzylideneacetone)dipalladium(0) were added, and the mixture was stirred under a nitrogen stream at 130° C. for 28 hours. After a predetermined time elapsed, the obtained reaction mixture was purified by extraction with toluene. Then, purification by silica gel column chromatography was performed. A developing solvent of hexane:ethyl acetate=15:1 was used. The obtained fraction was concentrated, so that 13 g of a yellow oily substance was obtained in a yield of 23%. The synthesis scheme of Step 3 is shown in (B-3) below.

[Chemical fomula 34]

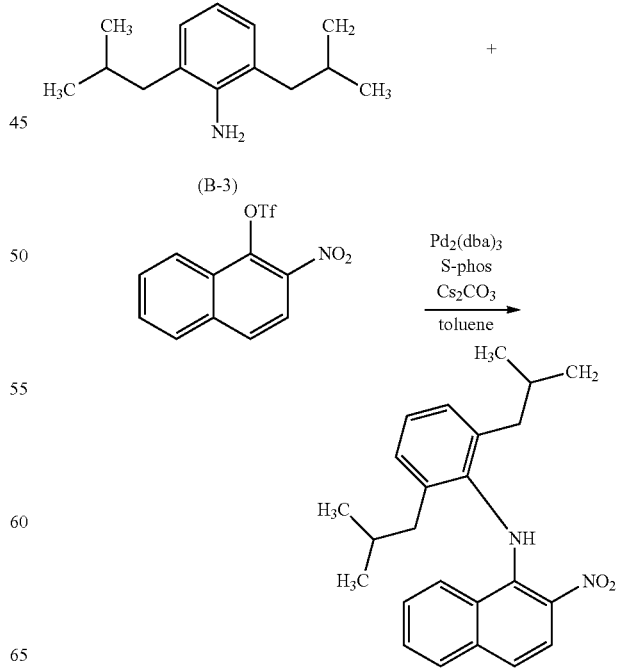

Step 4; Synthesis of N-(2,6-diisobutylphenyl)-1,2-naphthalenediamine

Into a 1000 mL three-neck flask were put 13 g (34 mmol) of N-(2,6-diisobutylphenyl)-2-nitro-1-naphthalenamine synthesized in Step 3, 6.1 mL (0.34 mol) of water, and 400 mL of ethanol, and the mixture was stirred. To this mixture was added 32 g (0.17 mol) of tin(II) chloride, and the mixture was stirred under a nitrogen stream at 80° C. for five hours. After a predetermined time elapsed, the obtained reaction mixture was poured into 500 mL of a 2M sodium hydroxide aqueous solution, and the solution was stirred at room temperature for two hours. A precipitated sediment was subjected to suction filtration, and washing with chloroform was performed, whereby a filtrate was obtained. The obtained filtrate was purified by extraction with chloroform. Then, purification by silica gel column chromatography was performed. A developing solvent of hexane:ethyl acetate=15:1 was used. The obtained fraction was concentrated, so that 9.5 g of a target black oily substance was obtained in a yield of 81%. The synthesis scheme of Step 4 is shown in (B-4) below.

[Chemical formula 35]

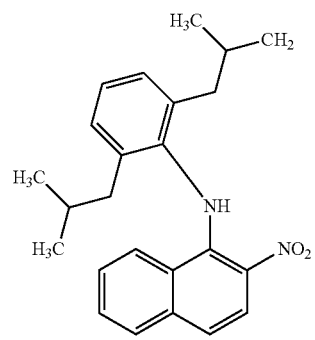

(B-4)

Step 5; Synthesis of 1-(2,6-diisobutylphenyl)-2-phenyl-1H-naphtho[1,2-d]imidazole (Abbreviation: Hpni-diBup)

Into a 300 mL recovery flask were put 9.5 g (27 mmol) of N-(2,6-diisobutylphenyl)-1,2-naphthalenediamine synthesized in Step 4, 100 mL of acetonitrile, and 2.9 g (27 mmol) of benzaldehyde, and the mixture was stirred at 100° C. for six hours. To this mixture was added 0.044 g (0.274 mmol) of iron(III) chloride, and the mixture was stirred at 100° C. for 16 hours. After a predetermined time elapsed, the obtained reaction mixture was subjected to extraction with ethyl acetate to give an oily substance, which was put into a 300 mL recovery flask with 100 mL of toluene and 10 g of manganese(IV) oxide and stirred at 130° C. for seven hours. After a predetermined time elapsed, the obtained reaction mixture was subjected to suction filtration through Celite (Wako Pure Chemical Industries, Ltd., Catalog No. 537-02305)/Florisil (Wako Pure Chemical Industries, Ltd., Catalog No. 066-05265)/aluminum oxide. The obtained filtrate was concentrated to give an oily substance. The obtained oily substance was purified by silica gel column chromatography. Toluene was used as the developing solvent. The obtained fraction was concentrated, so that 7.9 g of a target white solid was obtained in a yield of 66%. The synthesis scheme of Step 5 is shown in (B-5) below.

[Chemical formula 36]

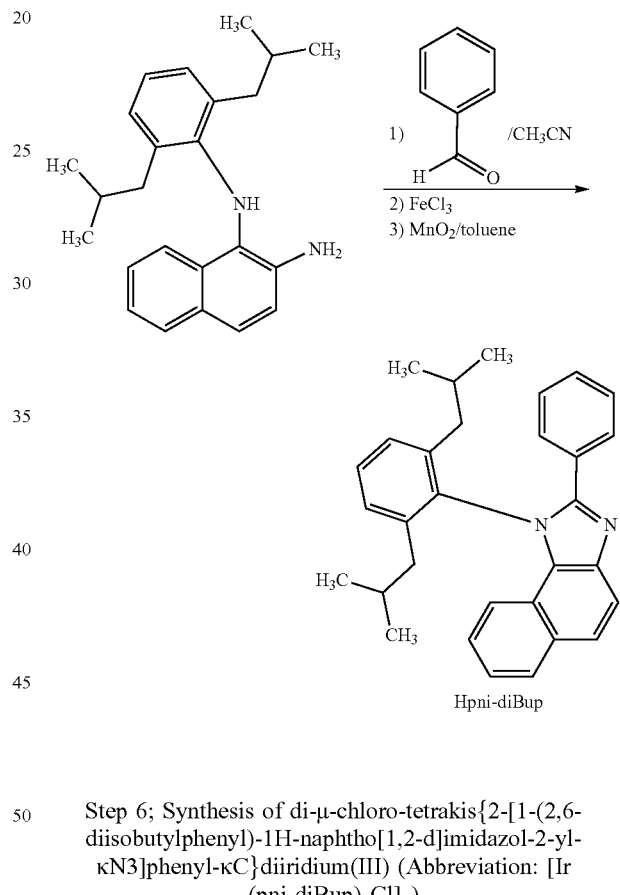

(B-5)

Step 6; Synthesis of di-μ-chloro-tetrakis{2-[1-(2,6-diisobutylphenyl)-1H-naphtho[1,2-d]imidazol-2-yl-κN3]phenyl-κC}diiridium(III) (Abbreviation: [Ir(pni-diBup)₂Cl]₂)

Into a 100 mL round-bottom flask were put 3.3 g (7.7 mmol) of 1-(2,6-diisobutylphenyl)-2-phenyl-1H-naphtho[1, 2-d]imidazole (abbreviation: Hpni-diBup) synthesized in Step 5, 1.6 g (3.7 mmol) of iridium chloride monohydrate, 30 mL of 2-ethoxyethanol, and 10 mL of water, and the atmosphere in the flask was replaced with argon. This reaction container was subjected to irradiation with microwaves (2.45 GHz, 100 W) for two hours to cause a reaction. After the reaction, the reaction solution was subjected to suction filtration, so that 2.8 g of a target yellow solid was obtained in a yield of 69%. The synthesis scheme of Step 6 is shown in (B-6) below.

[Chemical formula 37]

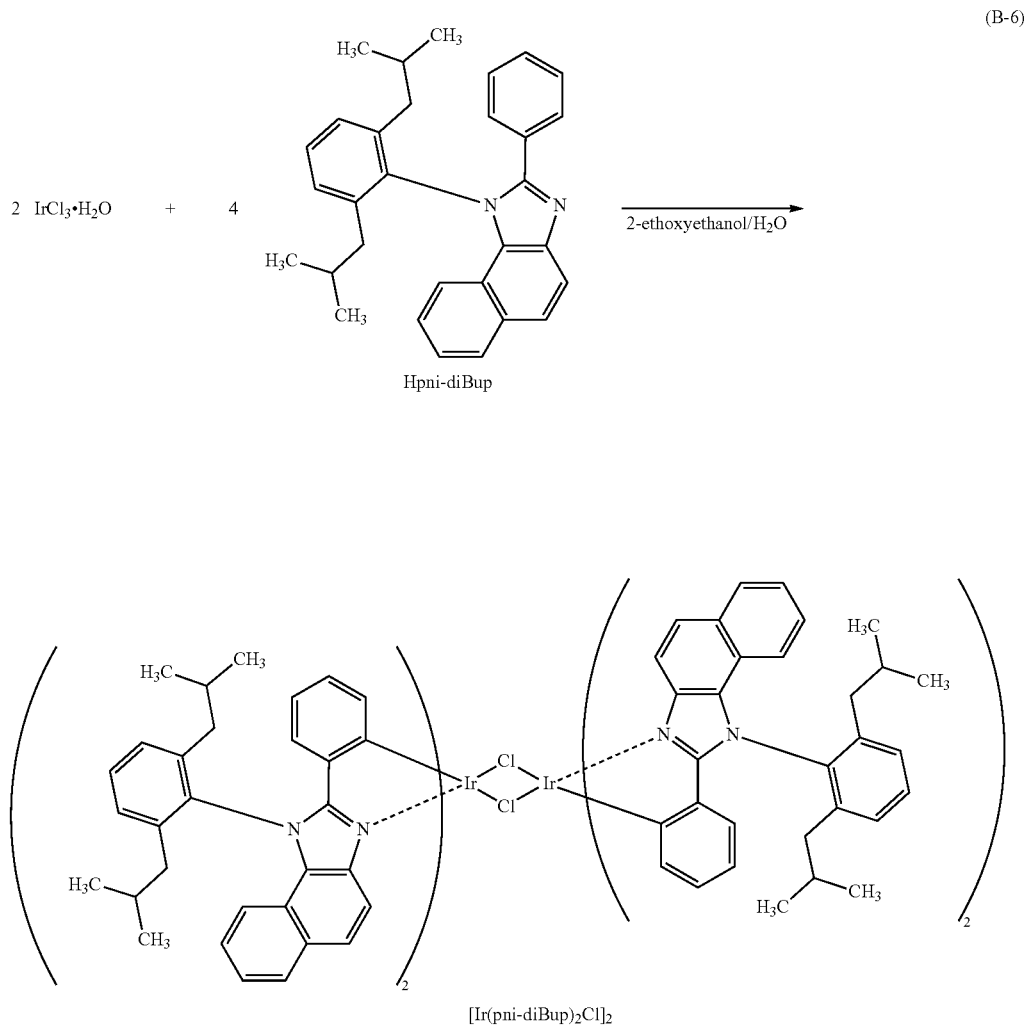

Step 7; Synthesis of tris{2-[1-(2,6-diisobutylphenyl)-1H-naphtho[1,2-d]imidazol-2-yl-κN3]phenyl-κC}iridium(III) (Abbreviation: [Ir(pni-diBup)₃])

Into a 500 mL three-neck flask were put 2.0 g (0.92 mmol) of di-μ-chloro-tetrakis{2-[1-(2,6-diisobutylphenyl)-1H-naphtho[1,2-d]imidazol-2-yl-κN3]phenyl-κC}diiridium(III) (abbreviation: [Ir(pni-diBup)₂Cl]₂) synthesized by the method of Steps 1 to 6 and 150 mL of dichloromethane, and the mixture was stirred under a nitrogen stream. To this mixed solution was dripped a mixed solution of 0.72 g (2.8 mmol) of silver trifluoromethanesulfonate and 150 mL of methanol, and the mixed solution was stirred for three days in a dark environment. After the reaction for a predetermined time, the reaction mixture was filtered through Celite. The obtained filtrate was concentrated, so that 2.7 g of a yellow solid was obtained. Into a 500 mL recovery flask were put 2.7 g of the obtained solid, 50 mL of ethanol, and 1.6 g (3.7 mmol) of 1-(2,6-diisobutylphenyl)-2-phenyl-1H-naphtho[1,2-d]imidazole (abbreviation: Hpni-diBup) synthesized by the method of Steps 1 to 5, and the mixture was heated and refluxed under a nitrogen stream for 20 hours. After the reaction for a predetermined time, the reaction mixture was subjected to suction filtration, so that a solid was obtained. The obtained solid was dissolved in dichloromethane, and suction filtration through Celite/neutral silica/Celite was performed. The obtained filtrate was concentrated to give a solid. The obtained solid was purified by silica gel column chromatography. A developing solvent of dichloromethane: hexane=1:3 was used. The obtained fraction was concentrated to give a solid. The obtained solid was recrystallized with ethyl acetate/hexane, so that 1.1 g of a solid was obtained in a yield of 40%. The synthesis scheme is shown in (B-7) below.

[Chemical formula 38]

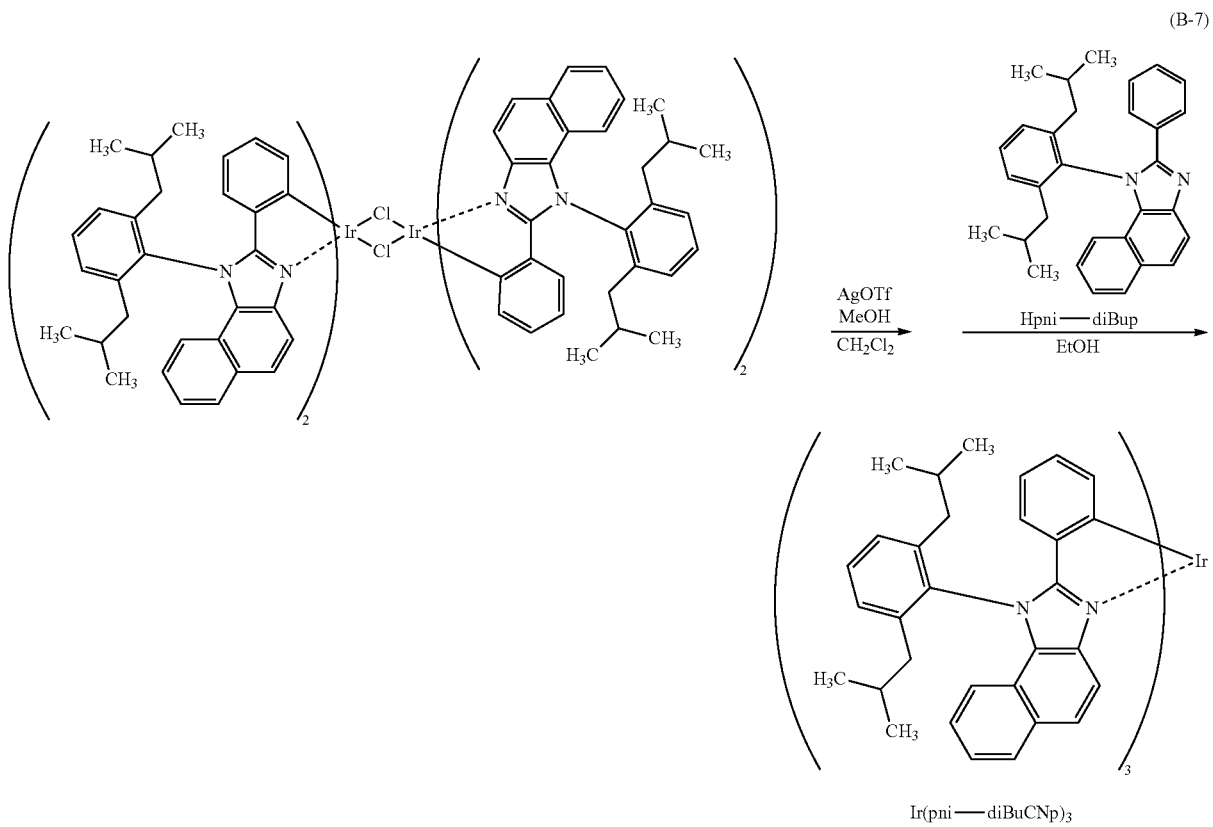

By a train sublimation method, 1.1 g of the obtained solid was sublimated and purified. In the purification by sublimation, the obtained solid was heated at 340° C. under a pressure of 2.6 Pa with an argon flow rate of 10.5 mL/min for 41 hours. After the purification by sublimation, 0.93 g of a yellow solid was obtained at a collection rate of 88%.

Figure 47:
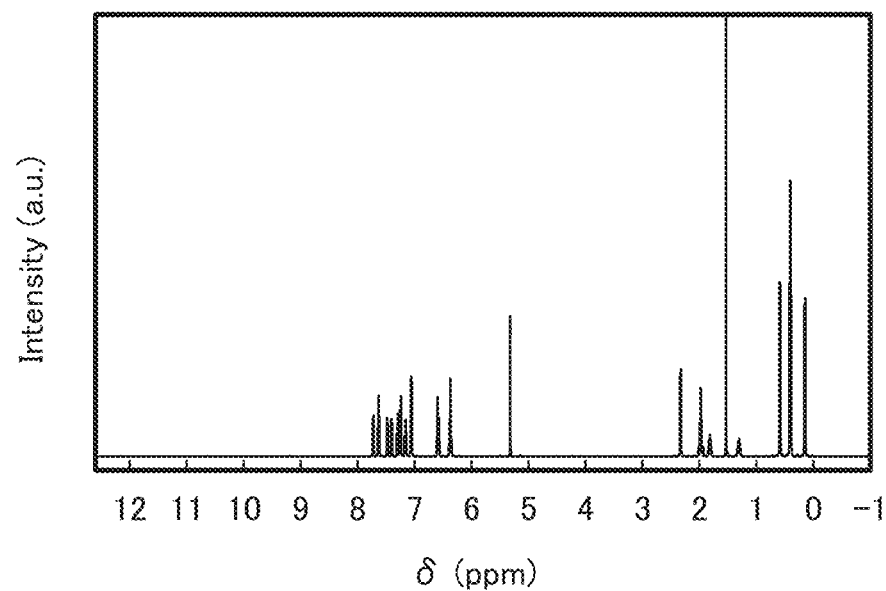
FIG. 47 is a diagram showing an NMR chart of a compound in Reference example.

The obtained yellow solid was subjected to proton NMR ($^1$H-NMR) measurement. The obtained values are shown below. FIG. 47 shows a $^1$H-NMR chart. It was found from FIG. 47 that Ir(pni-diBup)$_3$, which is the organometallic complex of one embodiment of the present invention, was obtained.

$^1$H-NMR. δ (CD$_2$Cl$_2$): 0.15 (d, 9H), 0.39-0.42 (m, 18H), 0.59 (d, 9H), 1.27-1.35 (m, 3H), 1.78-1.86 (m, 3H), 1.93-2.02 (m, 6H), 2.33 (d, 6H), 6.35-6.40 (m, 6H), 6.56-6.61 (m, 6H), 7.04-7.07 (m, 6H), 7.16 (t, 3H), 7.25 (d, 3H), 7.30 (t, 3H), 7.40 (d, 3H), 7.48 (d, 3H), 7.63 (t, 3H), 7.73 (d, 3H).

Reference Example 3

In this reference example, a synthesis method of Ir(pni-diBup)$_2$(mdppy), which is an example of the phosphorescent material having a five-membered ring used in Example 1, will be described.

Step 1; Synthesis of bis{2-[1-(2,6-diisobutylphenyl)-1H-naphtho[1,2-d]imidazol-2-yl-κN3]phenyl-κC}[2-(4-methyl-5-phenyl-2-pyridyl-κN2)phenyl-κC]iridium(III) (Abbreviation: [Ir(pni-diBup)$_2$(mdppy)])

In a 500 mL three-neck flask were put 1.3 g (0.9 mmol) of [Ir(mdppy)$_2$Cl]$_2$ and 180 mL of dichloromethane, and the mixture was stirred under a nitrogen stream. To this mixed solution was dripped a mixed solution of 0.7 g (2.7 mmol) of silver trifluoromethanesulfonate and 35 mL of methanol, and the mixed solution was stirred for 18 hours in a dark environment. After the reaction for a predetermined time, the reaction mixture was filtered through Celite. The obtained filtrate was concentrated, so that 1.9 g of a yellow solid was obtained. Into a 300 mL recovery flask were put 1.9 g of the obtained yellow solid, 30 mL of methanol, 30 mL of ethanol, and 1.6 g (3.6 mmol) of Hpni-diBup, and the mixture was heated and refluxed under a nitrogen stream for 23 hours. After the reaction for a predetermined time, the reaction mixture was subjected to suction filtration to remove an insoluble matter and the filtrate was concentrated, so that a solid was obtained. To the obtained solid was added 60 mL of 1-butanol, and the mixture was heated and refluxed under a nitrogen stream for 22 hours. After the reaction for a predetermined time, the reaction mixture was subjected to suction filtration, so that a solid was obtained. The obtained solid was purified by silica gel column chromatography. As the developing solvent, a mixed solvent of hexane:dichloromethane=3:1 was used. The obtained fraction was concentrated to give a solid. The obtained solid was recrystallized with ethyl acetate/hexane, so that 0.20 g of a target yellow solid was obtained in a yield of 9%. The synthesis scheme is shown in (C-1) below.

[Chemical formula 39]

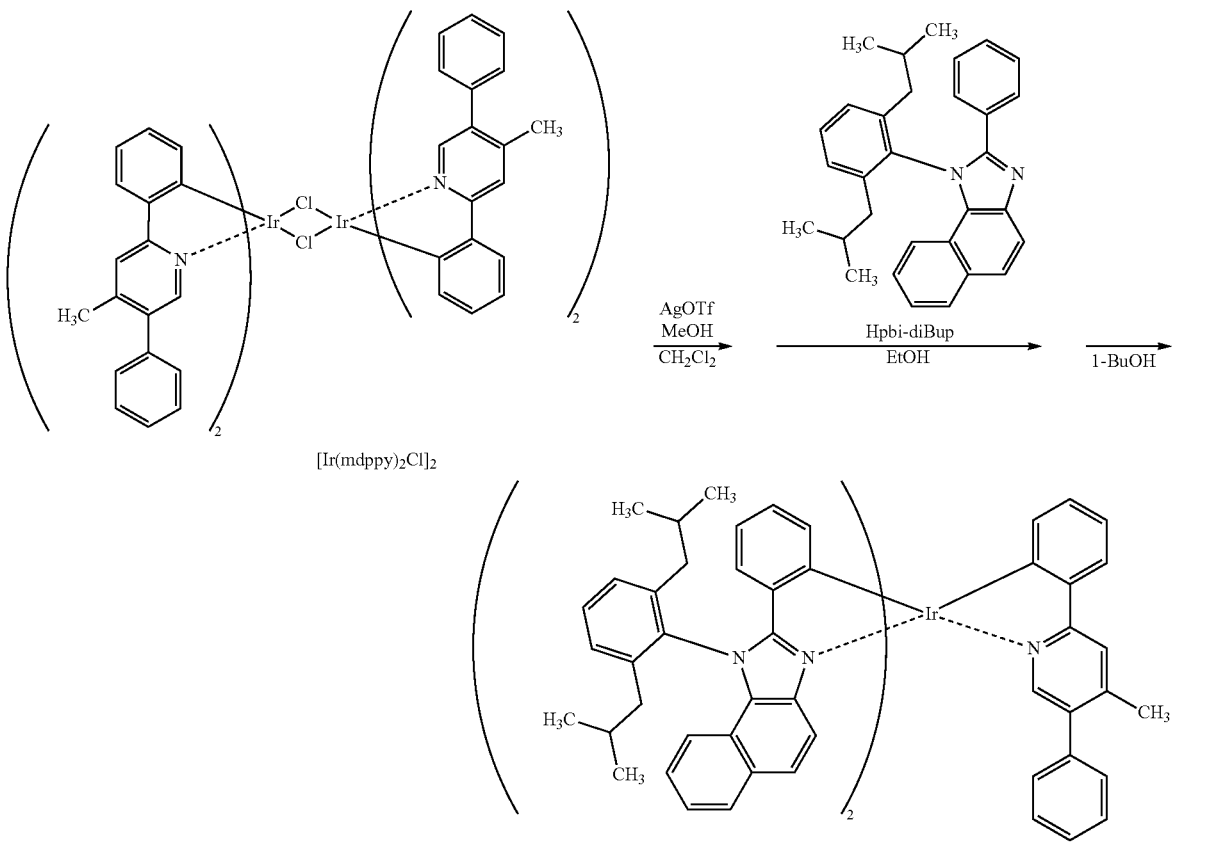

By a train sublimation method, 0.19 g of the obtained solid was sublimated and purified. In the purification by sublimation, the obtained solid was heated at 320° C. under a pressure of 2.5 Pa with an argon flow rate of 10.3 mL/min for 18 hours. After the sublimation purification, 0.14 g of a target yellow solid was obtained at a collection rate of 72%.

Figure 48:
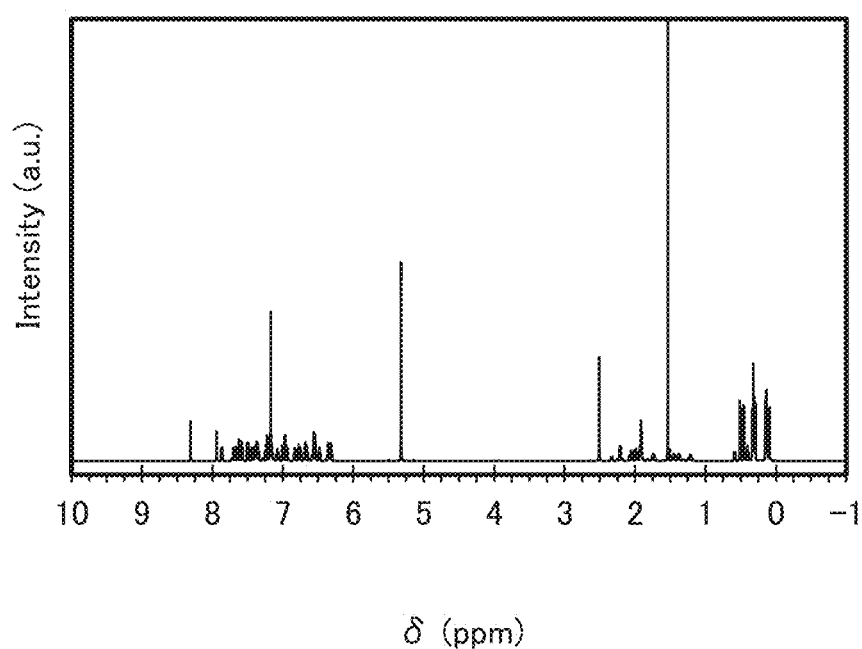
FIG. 48 is a diagram showing an NMR chart of a compound in Reference example.

The obtained yellow solid was subjected to $^1$H-NMR measurement. The obtained values are shown below. FIG. 48 shows a $^1$H-NMR chart. It was found from FIG. 48 that [Ir(pni-diBup)$_2$(mdppy)], which is the organometallic complex of one embodiment of the present invention, was obtained.

$^1$H-NMR. δ (CD$_2$Cl$_2$): 0.09-0.15 (m, 9H), 0.29-0.34 (m, 9H), 0.40 (t, 1H), 0.45 (d, 3H), 0.51 (d, 3H), 1.18-1.24 (m, 1H), 1.34-1.49 (m, 1H), 1.70-1.78 (m, 1H), 1.88-2.09 (m, 6H), 2.17-2.25 (m, 2H), 2.51 (s, 3H), 6.30-6.40 (m, 3H), 6.48 (t, 1H), 6.61-6.52 (m, 3H), 6.64-6.69 (m, 2H), 6.74-6.79 (m, 2H), 6.83 (t, 1H), 6.93-7.01 (m, 3H), 7.08 (t, 1H), 7.13-7.25 (m, 8H), 7.34-7.51 (m, 6H), 7.57-7.73 (m, 4H), 7.87 (d, 1H), 7.94 (s, 1H), 8.31 (s, 1H).

Reference Example 4

In this reference example, a synthesis method of 2,6tBu-mmtBuDPhA2Anth, which is a fluorescent material having protecting groups used in Example 2, will be described.

Into a 200 mL three-neck flask were put 1.1 g (2.5 mmol) of 2,6-di-tert-butylanthracene, 2.3 g (5.8 mmol) of bis(3,5-tert-butylphenyl)amine, 1.1 g (11 mmol) of sodium t-butoxide, and 60 mg (0.15 mmol) of SPhos, and the air in the flask was replaced with nitrogen. To this mixture was added 25 mL of xylene, and the mixture was degassed under reduced pressure; then, 40 mg (70 µmol) of bis(dibenzylideneacetone)palladium(0) was added to the mixture and the mixture was stirred at 150° C. under a nitrogen stream for six hours.

After the stirring, 400 mL of toluene was added to the obtained mixture, which was then subjected to suction filtration through Florisil, Celite, and aluminum oxide to give a filtrate. The obtained filtrate was concentrated to give a brown solid.

This solid was purified by silica gel column chromatography (developing solvent; hexane:toluene=9:1) to obtain a target yellow solid. The obtained yellow solid was recrystallized with hexane and methanol to give 0.45 g of a target yellow solid in a yield of 17%. The synthesis scheme of Step 1 is shown in (D-1) below.

[Chemical formula 40]

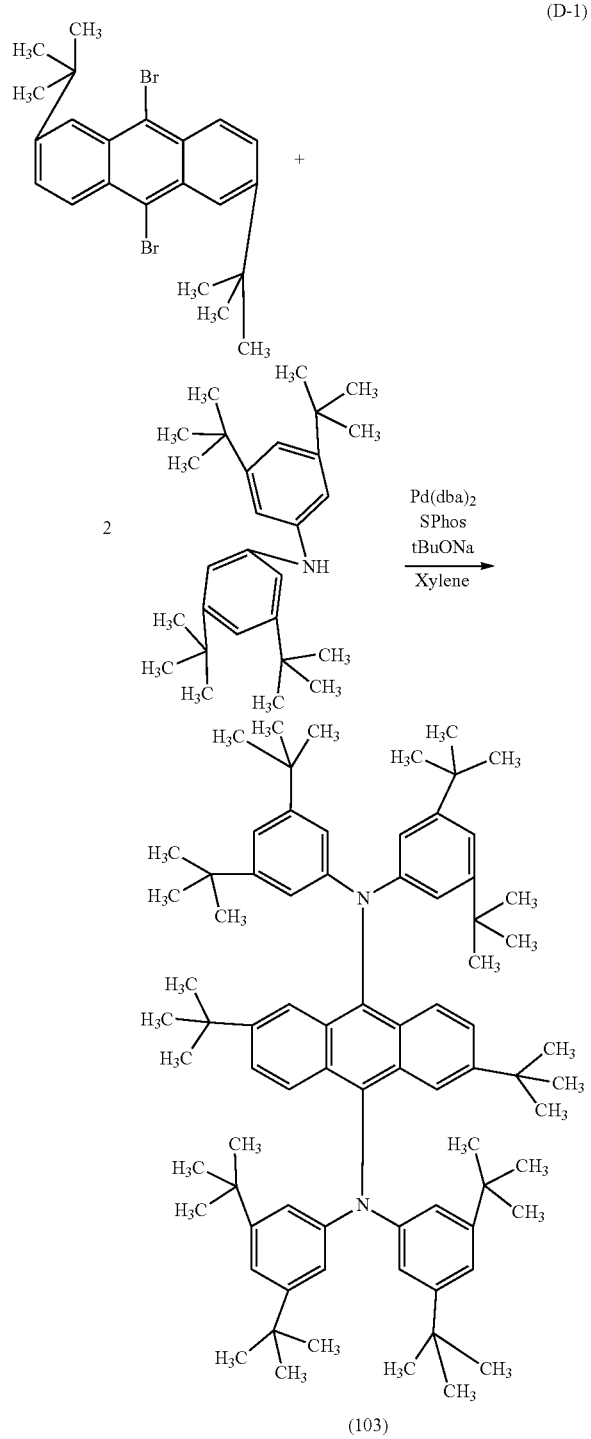

By a train sublimation method, 0.45 g of the obtained yellow solid was purified by sublimation. In the sublimation purification, the yellow solid was heated at 275° C. under a pressure of 5.0 Pa for 15 hours. After the sublimation purification, 0.37 g of a target yellow solid was obtained at a collection rate of 82%.

Figure 56A:
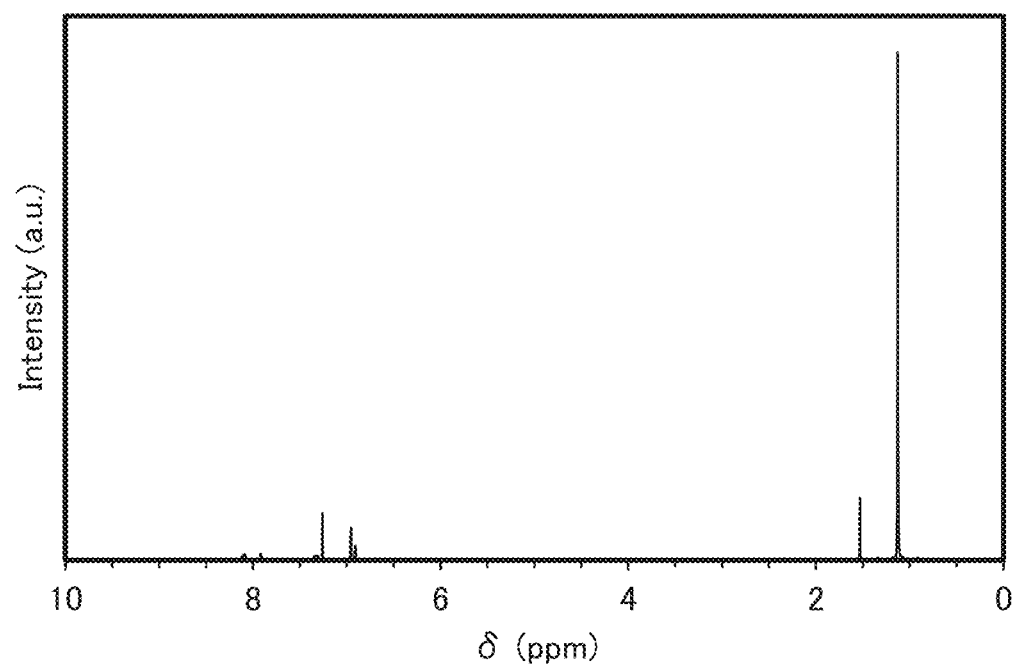
FIG. 56A and FIG. 56B are diagrams showing NMR charts of compounds in Reference example.
Figure 56B:
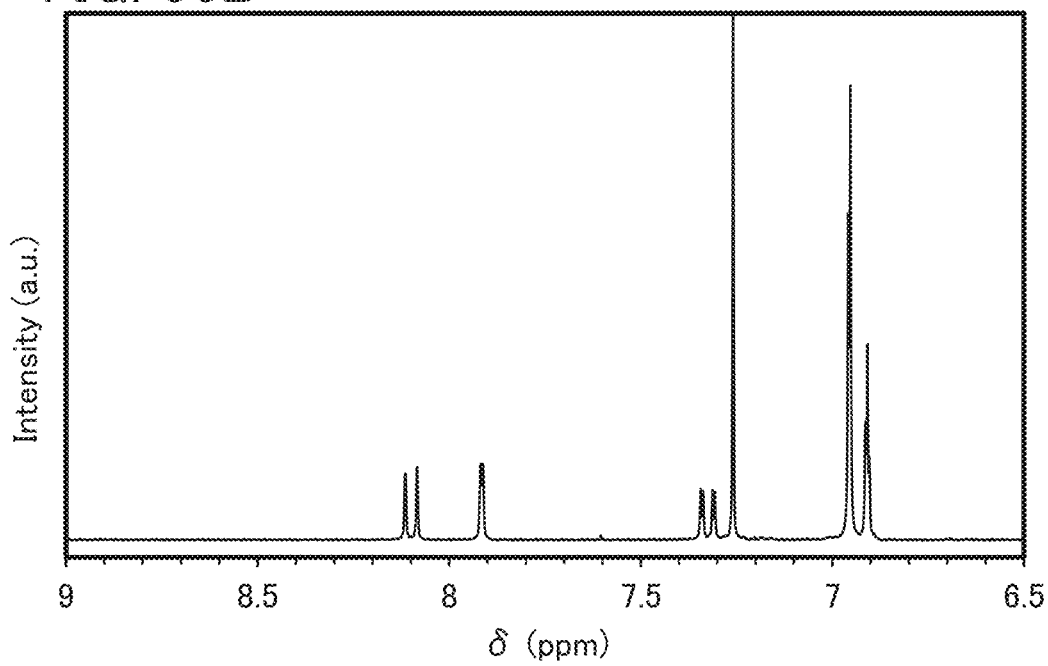
Figure 57:
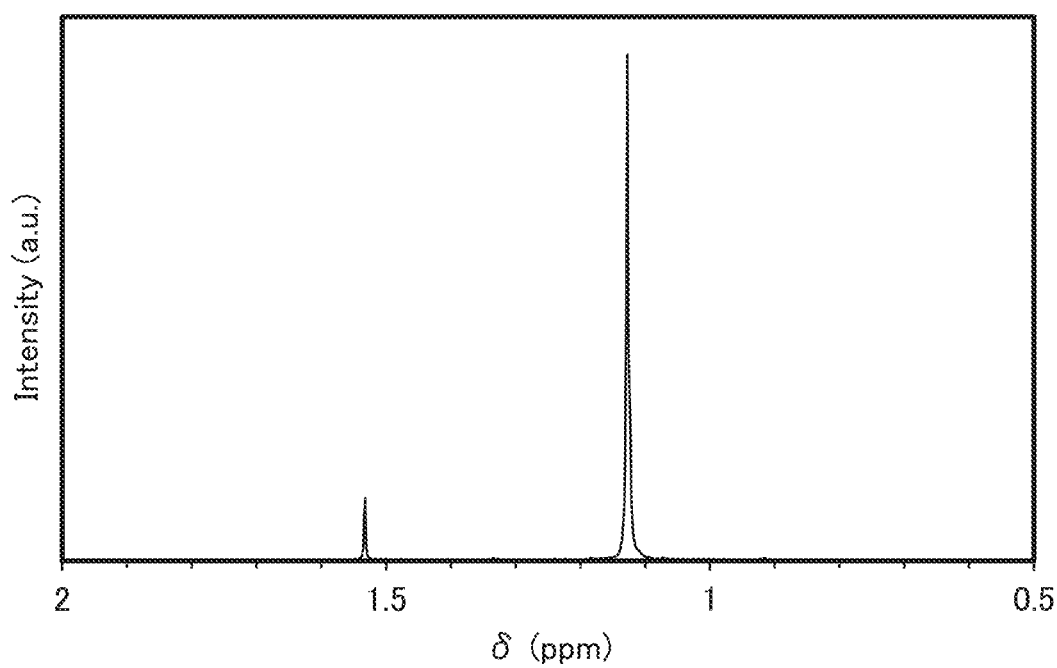
FIG. 57 is a diagram showing an NMR chart of a compound in Reference example.

Results of $^1$H-NMR measurement of the yellow solid obtained in Step 1 described above will be described below. FIG. 56A, FIG. 56B, and FIG. 57 are the $^1$H-NMR charts.

Note that FIG. 56B is an enlarged chart of the range of 6.5 ppm to 9.0 ppm of FIG. 56A. FIG. 57 is an enlarged chart of the range of 0.5 ppm to 2.0 ppm of FIG. 56A. The results indicate that 2,6tBu-mmtBuDPhA2Anth was obtained.

$^1$H-NMR (CDCl$_3$, 300 MHz): σ=8.11 (d, J=9.3 Hz, 2H), 7.92 (d, J=1.5 Hz, 1H), 7.34 (dd, J=9.3 Hz, 2.0 Hz, 2H), 6.96-6.95 (m, 8H), 6.91-6.90 (m, 4H), 1.13-1.12 (m, 90H).

REFERENCE NUMERALS

100: EL layer, 101: electrode, 102: electrode, 106: light-emitting unit, 108: light-emitting unit, 111: hole-injection layer, 112: hole-transport layer, 113: electron-transport layer, 114: electron-injection layer, 115: charge-generation layer, 116: hole-injection layer, 117: hole-transport layer, 118: electron-transport layer, 119: electron-injection layer, 120: light-emitting layer, 130: light-emitting layer, 131: compound, 132: compound, 133: compound, 134: compound, 135: compound, 150: light-emitting device, 170: light-emitting layer, 250: light-emitting device, 301: guest material, 302: guest material, 310: luminophore, 320: protecting group, 330: host material, 601: source side driver circuit, 602: pixel portion, 603: gate side driver circuit, 604: sealing substrate, 605: sealant, 607: space, 608: wiring, 610: substrate, 611: switching TFT, 612: current controlling TFT, 613: electrode, 614: insulator, 616: EL layer, 617: electrode, 618: light-emitting device, 623: n-channel TFT, 624: p-channel TFT, 900: portable information terminal, 901: housing, 902: housing, 903: display portion, 905: hinge portion, 910: portable information terminal, 911: housing, 912: display portion, 913: operation button, 914: external connection port, 915: speaker, 916: microphone, 917: camera, 920: camera, 921: housing, 922: display portion, 923: operation button, 924: shutter button, 926: lens, 1001: substrate, 1002: base insulating film, 1003: gate insulating film, 1006: gate electrode, 1007: gate electrode, 1008: gate electrode, 1020: interlayer insulating film, 1021: interlayer insulating film, 1022: electrode, 1024B: electrode, 1024G: electrode, 1024R: electrode, 1024W: electrode, 1025 Blower electrode, 1025G: lower electrode, 1025R: lower electrode, 1025W: lower electrode, 1026: partition wall, 1028: EL layer, 1029: electrode, 1031: sealing substrate, 1032: sealant, 1033: base material, 1034B: coloring layer, 1034G: coloring layer, 1034R: coloring layer, 1036: overcoat layer, 1037: interlayer insulating film, 1040: pixel portion, 1041: driver circuit portion, 1042: peripheral portion, 1044R: red pixel, 1044G: green pixel, 1044B: blue pixel, 1044W: white pixel, 2100: robot, 2101: illuminance sensor, 2102: microphone, 2103: upper camera, 2104: speaker, 2105: display, 2106: lower camera, 2107: obstacle sensor, 2108: moving mechanism, 2110: arithmetic device, 5000: housing, 5001: display portion, 5002: display portion, 5003: speaker, 5004: LED lamp 5006: connection terminal, 5007: sensor, 5008: microphone, 5012: support, 5013: support, 5100: cleaning robot, 5101: display, 5102: camera, 5103: brush, 5104: operation button, 5120: dust, 5140: portable electronic appliance, 5150: portable information terminal, 5151: housing, 5152: display region, 5153: bend portion, 8501: lighting device, 8502: lighting device, 8503: lighting device, 8504: lighting device

The invention claimed is:
1. A light-emitting device comprising:
a light-emitting layer between a pair of electrodes,
wherein the light-emitting layer comprises a first material and a second material, wherein the first material is capable of converting triplet excitation energy into light emission and comprises a metal complex comprising a five-membered ring skeleton, wherein the five-membered ring skeleton comprises at least one of a pyrrole skeleton, a tetrazole skeleton, a benzimidazole skeleton, and a naphthoimidazole skeleton, wherein the second material is capable of converting singlet excitation energy into light emission and comprises a luminophore and five or more protecting groups, wherein the luminophore is a condensed aromatic ring or a condensed heteroaromatic ring, wherein the five or more protecting groups each independently comprise any one of an alkyl group having 3 to 10 carbon atoms, a substituted or unsubstituted cycloalkyl group having 3 to 10 carbon atoms, and a trialkylsilyl group having 3 to 12 carbon atoms, and wherein a T1 level of the first material is higher than an S1 level of the second material.

2. The light-emitting device according to claim 1, wherein at least four of the five or more protecting groups are each independently any one of an alkyl group having 3 to 10 carbon atoms, a substituted or unsubstituted cycloalkyl group having 3 to 10 carbon atoms, and a trialkylsilyl group having 3 to 12 carbon atoms.

3. The light-emitting device according to claim 1, wherein at least one of atoms of the five or more protecting groups is positioned directly on one plane of the condensed aromatic ring or the condensed heteroaromatic ring, and at least one of the atoms of the five or more protecting groups is positioned directly on another plane of the condensed aromatic ring or the condensed heteroaromatic ring.

4. The light-emitting device according to claim 1, wherein the alkyl group is a branched-chain alkyl group.

5. The light-emitting device according to claim 1, wherein the condensed aromatic ring or the condensed heteroaromatic ring comprises any one of naphthalene, anthracene, fluorene, chrysene, triphenylene, tetracene, pyrene, perylene, coumarin, quinacridone, and naphthobisbenzofuran.

6. The light-emitting device according to claim 1, wherein the light-emitting layer further comprises a third material, and
wherein the first material and the third material form an exciplex.

7. The light-emitting device according to claim 1, wherein an emission spectrum of the first material overlaps with an absorption band on the longest wavelength side of the second material.

8. An electronic appliance comprising:
the light-emitting device according to claim 1; and
at least one of a housing and a touch sensor.

9. A lighting device comprising:
the light-emitting device according to claim 1; and
at least one of a housing and a touch sensor.

10. A light-emitting device comprising:
a light-emitting layer between a pair of electrodes,
wherein the light-emitting layer comprises a first material and a second material,
wherein the first material is capable of converting triplet excitation energy into light emission and comprises a metal complex comprising a five-membered ring skeleton, wherein the five-membered ring skeleton comprises at least one of a pyrrole skeleton, a tetrazole skeleton, a benzimidazole skeleton, and a naphthoimidazole skeleton, wherein the second material is capable of converting singlet excitation energy into light emission and comprises a luminophore and at least four protecting groups, wherein the luminophore is a condensed aromatic ring or a condensed heteroaromatic ring, wherein the four protecting groups are not directly bonded to the condensed aromatic ring or the condensed heteroaromatic ring, wherein the four protecting groups each independently comprise any one of an alkyl group having 3 to 10 carbon atoms, a substituted or unsubstituted cycloalkyl group having 3 to 10 carbon atoms, and a trialkylsilyl group having 3 to 12 carbon atoms, and wherein a T1 level of the first material is higher than an S1 level of the second material.

11. The light-emitting device according to claim 10, wherein the alkyl group is a branched-chain alkyl group.

12. A light-emitting device comprising:
a light-emitting layer between a pair of electrodes,
wherein the light-emitting layer comprises a first material and a second material,
wherein the first material is capable of converting triplet excitation energy into light emission and comprises a metal complex comprising a five-membered ring skeleton, wherein the five-membered ring skeleton comprises at least one of a pyrrole skeleton, a tetrazole skeleton, a benzimidazole skeleton, and a naphthoimidazole skeleton, wherein the second material is capable of converting singlet excitation energy into light emission, wherein the second material comprises a luminophore and two or more diarylamino groups, wherein the luminophore is a condensed aromatic ring or a condensed heteroaromatic ring, wherein the condensed aromatic ring or the condensed heteroaromatic ring is bonded to the two or more diarylamino groups, wherein aryl groups in the two or more diarylamino groups each independently comprise at least one protecting group, wherein the protecting group comprises any one of an alkyl group having 3 to 10 carbon atoms, a substituted or unsubstituted cycloalkyl group having 3 to 10 carbon atoms, and a trialkylsilyl group having 3 to 12 carbon atoms, and wherein a T1 level of the first material is higher than an S1 level of the second material.

13. The light-emitting device according to claim 12, wherein the aryl groups in the two or more diarylamino groups each independently comprise at least two protecting groups.

14. The light-emitting device according to claim 12, wherein the diarylamino groups are diphenylamino groups.

15. The light-emitting device according to claim 14, wherein phenyl groups of the two or more diphenylamino groups each independently comprise protecting groups at 3- and 5-positions.

16. The light-emitting device according to claim 12, wherein the alkyl group is a branched-chain alkyl group.

17. The light-emitting device according to claim 1, wherein a nitrogen atom that is not involved in a double bond included in the tetrazole skeleton, the benzoimidazole skeleton and the naphthoimidazole skeleton is bonded to a substituted or unsubstituted aromatic hydrocarbon group having 6 to 13 carbon atoms.

18. A light-emitting device comprising a light-emitting layer between a pair of electrodes,
wherein the light-emitting layer comprises a first material and a second material,
wherein the first material is capable of converting triplet excitation energy into light emission,
wherein the second material is capable of converting singlet excitation energy into light emission and comprises a luminophore and two or more protecting groups,
wherein the luminophore is a condensed aromatic ring or a condensed heteroaromatic ring,
wherein the two or more protecting groups each independently comprise any one of an alkyl group having 1 to 10 carbon atoms, a substituted or unsubstituted cycloalkyl group having 3 to 10 carbon atoms, and a trialkylsilyl group having 3 to 12 carbon atoms,
wherein the first material comprises a five-membered ring skeleton,
wherein the five-membered ring skeleton comprises at least one of a benzoimidazole skeleton and a naphthoimidazole skeleton,
wherein a nitrogen atom that is not involved in a double bond included in the benzoimidazole skeleton and the naphthoimidazole skeleton is bonded to a substituted or unsubstituted aromatic hydrocarbon group having 6 to 13 carbon atoms, and
wherein a T1 level of the first material is higher than an S1 level of the second material.

19. The light-emitting device according to claim 18, wherein the aromatic hydrocarbon group is a phenyl group.

* * * * *